US012772649B2

(12) United States Patent
Kubota et al.

(10) Patent No.: US 12,772,649 B2
(45) Date of Patent: Oct. 20, 2026

(54) PHOTOELECTRIC CONVERSION DEVICE AND LIGHT-EMITTING AND LIGHT-RECEIVING APPARATUS

(71) Applicant: SEMICONDUCTOR ENERGY LABORATORY CO., LTD., Atsugi (JP)

(72) Inventors: Daisuke Kubota, Atsugi (JP); Akio Yamashita, Atsugi (JP); Kazuya Sugimoto, Hadano (JP); Taisuke Kamada, Niiza (JP); Sachiko Kawakami, Atsugi (JP); Kazuki Kajiyama, Atsugi (JP); Yasutaka Nakazawa, Tochigi (JP); Kaori Ikada, Kawachi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 678 days.

(21) Appl. No.: 18/306,841

(22) Filed: Apr. 25, 2023

(65) Prior Publication Data

US 2023/0354625 A1 Nov. 2, 2023

(30) Foreign Application Priority Data

Apr. 29, 2022 (JP) ................................ 2022-075615

(51) Int. Cl.
*H10K 39/32* (2026.01)
*H10K 39/38* (2026.01)
*H10K 59/80* (2023.01)

(52) U.S. Cl.
CPC ............ *H10K 39/32* (2023.02); *H10K 39/38* (2023.02); *H10K 59/80517* (2023.02); *H10K 59/80523* (2023.02)

(58) Field of Classification Search
CPC ......... H10K 65/00; H10K 59/00; H10K 59/90
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Sophia T Nguyen
(74) *Attorney, Agent, or Firm* — Fish & Richardson P.C.

(57) ABSTRACT

A photoelectric conversion device in which an increase in driving voltage is inhibited is provided. The photoelectric conversion device includes a first electrode, a second electrode, and an organic compound layer; the organic compound layer is positioned between the first electrode and the second electrode; the organic compound layer includes a first layer; a structure body including projections is included between the first layer and the second electrode; and the structure body contains a first organic compound.

5 Claims, 24 Drawing Sheets

(56) References Cited

U.S. PATENT DOCUMENTS 6,239,449 B1* 5/2001 Fafard ........ B82Y 10/00 257/17
7,915,611 B2* 3/2011 Yamazaki ........ H10F 77/1645 136/258
8,003,976 B2* 8/2011 Nakayama ........ H10F 55/16 257/642
8,101,943 B2* 1/2012 Yukawa ........ H10K 10/50 257/40
8,216,872 B1* 7/2012 Shieh ........ H10F 77/48 438/69
8,637,766 B2* 1/2014 Takayasu ........ H01G 9/2031 136/263
9,190,628 B2* 11/2015 Becker ........ H10K 10/88
10,199,589 B2* 2/2019 Umehara ........ H10K 85/655
11,804,064 B2* 10/2023 Kusunoki ........ G06V 40/1365
11,900,721 B2* 2/2024 Kubota ........ G09F 9/30
12,058,878 B2* 8/2024 Yamazaki ........ H10K 50/13
12,514,004 B2* 12/2025 Kubota ........ H10F 39/12
2002/0072139 A1 6/2002 Kashiwabara
2003/0073258 A1* 4/2003 Mukai ........ H10H 20/812 257/E29.071
2004/0099307 A1* 5/2004 Sun ........ H10K 85/114 136/263
2008/0012005 A1* 1/2008 Yang ........ H10K 30/211 438/94
2009/0065769 A1* 3/2009 Yukawa ........ H10B 99/00 257/E51.001
2009/0102359 A1* 4/2009 Miyata ........ B82Y 30/00 257/E33.001
2009/0128024 A1* 5/2009 Fukuoka ........ H05B 33/14 313/504
2009/0217980 A1* 9/2009 Pfeiffer ........ B82Y 10/00 136/263
2009/0308458 A1* 12/2009 Aramaki ........ H10K 30/451 257/E51.026
2010/0218822 A1* 9/2010 Yamasaki ........ H10F 71/138 136/256
2011/0045392 A1* 2/2011 Lemmer ........ H10K 50/854 430/127
2011/0049367 A1* 3/2011 Forrest ........ H10K 85/615 250/340
2011/0088782 A1* 4/2011 Shirata ........ H10F 10/167 136/265
2011/0089412 A1* 4/2011 Fujimori ........ B41M 5/38214 257/E51.027
2011/0127561 A1* 6/2011 Ide ........ H10K 50/19 438/46
2011/0132440 A1* 6/2011 Sivarajan ........ B82Y 10/00 977/734
2011/0186119 A1* 8/2011 Atwater ........ H10F 77/48 257/E31.032
2011/0259409 A1* 10/2011 Naito ........ H10K 30/353 136/255
2012/0025185 A1* 2/2012 Kasamatsu ........ H10K 50/11 257/40
2012/0043532 A1* 2/2012 Yasuda ........ B82Y 30/00 257/40
2012/0056205 A1* 3/2012 Allard ........ G01N 21/253 257/E33.077
2012/0097225 A1* 4/2012 Nomura ........ H10F 77/146 136/255
2012/0205685 A1 8/2012 Seo et al.
2012/0256204 A1 10/2012 Yoshizumi et al.
2012/0273804 A1 11/2012 Hatano
2012/0276484 A1 11/2012 Izumi et al.
2012/0312375 A1* 12/2012 Seok ........ H10K 30/151 136/263
2013/0075761 A1* 3/2013 Akiyama ........ H10F 55/25 257/E31.095
2013/0084531 A1 4/2013 Hamaguchi et al.
2013/0084664 A1 4/2013 Yoshitoku et al.
2013/0084666 A1 4/2013 Oshige
2013/0174902 A1* 7/2013 Hayashi ........ H10F 77/488 136/256
2013/0213477 A1* 8/2013 Nakayama ........ H10K 30/35 136/263
2013/0269766 A1* 10/2013 Park ........ H10K 30/152 977/948
2013/0280839 A1 10/2013 Sonoda et al.
2013/0295705 A1 11/2013 Sonoda et al.
2014/0004640 A1 1/2014 Hamaguchi et al.
2014/0004642 A1 1/2014 Otsuka et al.
2014/0008636 A1* 1/2014 Fukuura ........ H10K 50/85 257/40
2014/0109965 A1* 4/2014 Goto ........ H10F 10/14 136/259
2014/0158203 A1* 6/2014 Etori ........ B82Y 20/00 428/401
2014/0366948 A1* 12/2014 Hayakawa ........ H10K 85/1135 136/263
2015/0000745 A1* 1/2015 Hayakawa ........ H10K 30/10 136/263
2015/0034160 A1* 2/2015 Wu ........ H10F 19/30 136/265
2015/0060826 A1 3/2015 Matsumoto et al.
2015/0069360 A1 3/2015 Sato
2015/0076476 A1 3/2015 Odaka et al.
2015/0200312 A1* 7/2015 Watanabe ........ H10P 14/3461 136/261
2016/0149148 A1* 5/2016 Gau ........ H10K 30/30 136/263
2016/0172595 A1 6/2016 Malinowski et al.
2016/0276110 A1* 9/2016 Suzuka ........ H01G 9/20
2016/0276607 A1* 9/2016 Gotanda ........ H10K 30/81
2016/0315133 A1 10/2016 Sato
2017/0018369 A1* 1/2017 Nakamura ........ H01G 9/2009
2017/0019054 A1* 1/2017 Minichetti ........ H10N 30/702
2017/0110604 A1* 4/2017 Fonash ........ H10F 77/219
2017/0141167 A1 5/2017 Naganuma
2017/0256754 A1 9/2017 Defranco et al.
2018/0190908 A1 7/2018 Ke et al.
2019/0065815 A1* 2/2019 Park ........ H10K 65/00
2020/0203662 A1 6/2020 Mollard et al.
2021/0005669 A1* 1/2021 Kamada ........ H10K 59/40
2021/0294009 A1* 9/2021 Misawa ........ G02B 5/22
2021/0327979 A1* 10/2021 Kamada ........ H05B 33/02
2022/0068181 A1* 3/2022 Watanabe ........ G09G 3/3233
2022/0285460 A1* 9/2022 Kim ........ H10K 59/873
2022/0327857 A1* 10/2022 Kusunoki ........ G06V 40/1318
2022/0335747 A1* 10/2022 Kubota ........ G06V 40/1318
2022/0376182 A1* 11/2022 Kubota ........ C07D 333/76
2022/0393123 A1* 12/2022 Kubota ........ H10K 59/60
2023/0140380 A1* 5/2023 Shin ........ G06V 40/1318 257/84
2024/0234612 A1* 7/2024 Zhang ........ H10K 30/35
2025/0359422 A1* 11/2025 Tombs ........ H10K 30/40
2026/0033118 A1* 1/2026 Khanam ........ H10K 30/57

FOREIGN PATENT DOCUMENTS

JP 2008-098106 A 4/2008
JP 2008-147072 A 6/2008
JP 2008-251270 A 10/2008
JP 2014-120218 A 6/2014
JP 2014-135251 A 7/2014
JP 2014-232568 A 12/2014
JP 2015-115178 A 6/2015
JP 2016-197494 A 11/2016
JP 2019-179696 A 10/2019
JP 2020-160305 A 10/2020
WO WO-2020-152556 A1 7/2020

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

(56) References Cited

OTHER PUBLICATIONS

Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and Beol IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 22A ETL 10nm
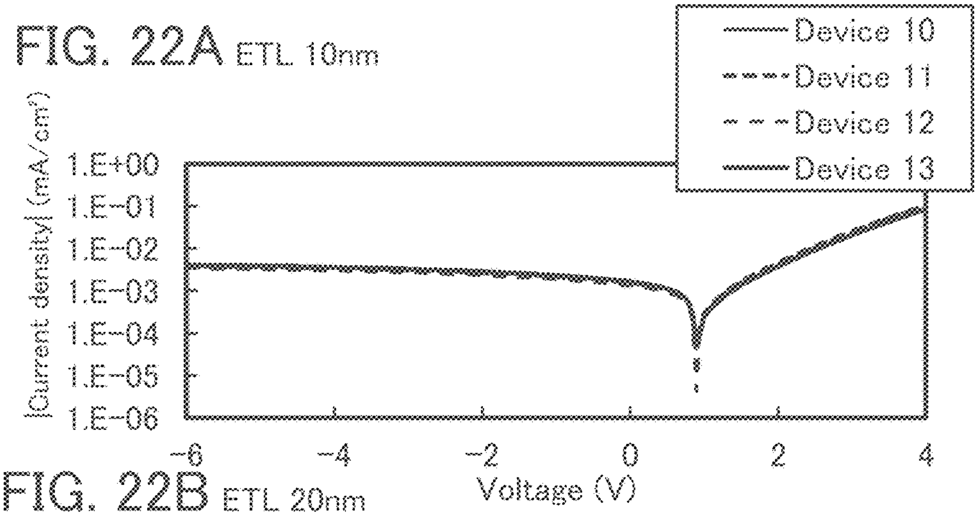
FIG. 22B ETL 20nm
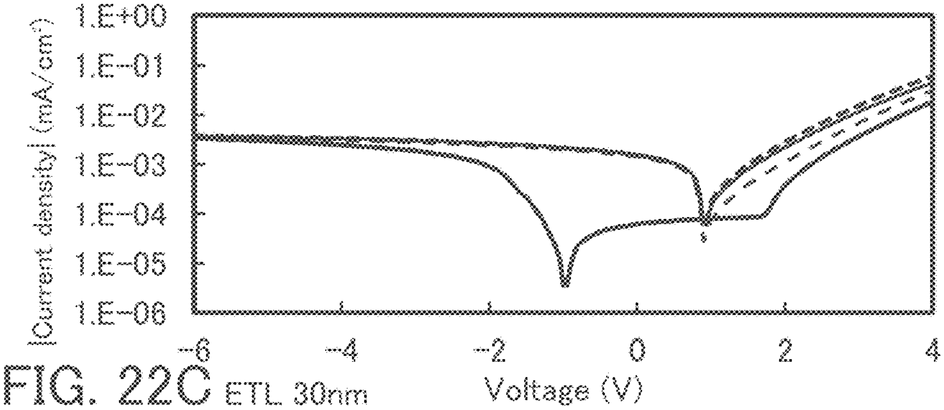
FIG. 22C ETL 30nm
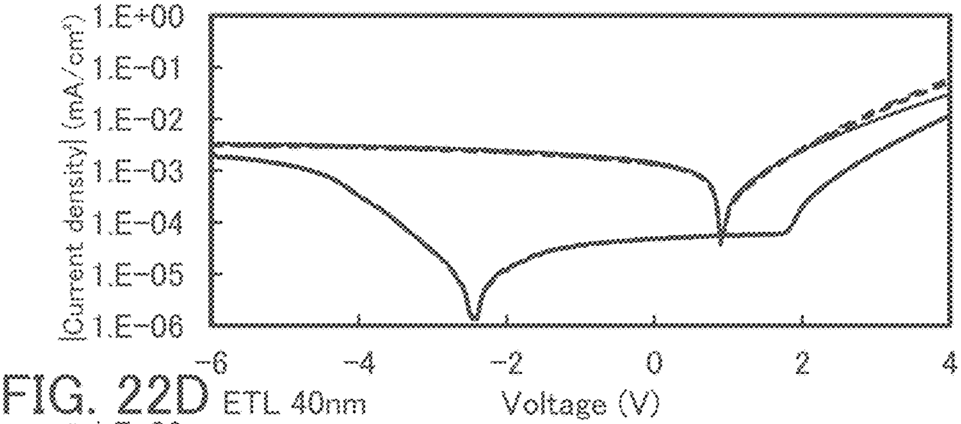
FIG. 22D ETL 40nm
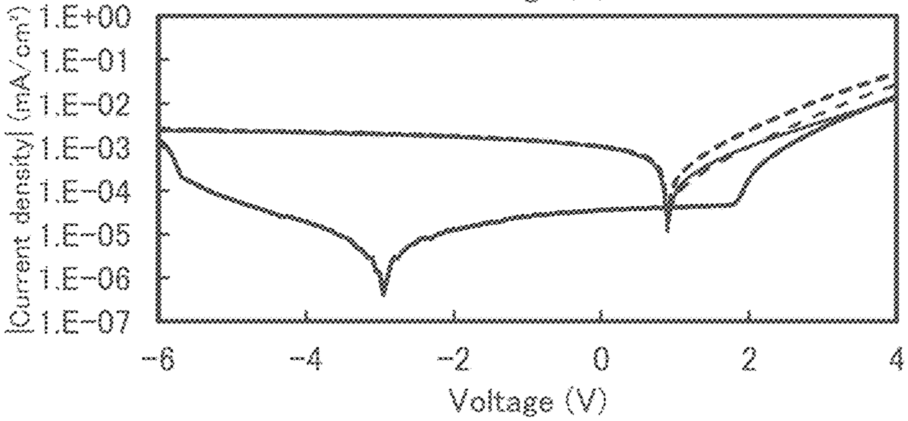

PHOTOELECTRIC CONVERSION DEVICE AND LIGHT-EMITTING AND LIGHT-RECEIVING APPARATUS

BACKGROUND OF THE INVENTION

1. Field of the Invention

One embodiment of the present invention relates to a photoelectric conversion device, a light-emitting and light-receiving apparatus, an electronic device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a light-emitting apparatus, a power storage device, a memory device, a method for driving any of them, and a method for manufacturing any of them.

2. Description of the Related Art

A functional panel in which a pixel provided in a display region includes a light-emitting element and a photoelectric conversion element is known (Patent Document 1). For example, the functional panel includes a first driver circuit, a second driver circuit, and a region. The first driver circuit supplies a first selection signal, the second driver circuit supplies a second selection signal and a third selection signal, and the region includes a pixel. The pixel includes a first pixel circuit, a light-emitting element, a second pixel circuit, and a photoelectric conversion element. The first pixel circuit is supplied with the first selection signal, the first pixel circuit obtains an image signal on the basis of the first selection signal, the light-emitting element is electrically connected to the first pixel circuit, and the light-emitting element emits light on the basis of the image signal. The second pixel circuit is supplied with the second selection signal and the third selection signal in a period during which the first selection signal is not supplied, the second pixel circuit obtains an imaging signal on the basis of the second selection signal and supplies the imaging signal on the basis of the third selection signal, and the photoelectric conversion element is electrically connected to the second pixel circuit and generates the imaging signal.

REFERENCE

Patent Document

[Patent Document 1] PCT International Publication No. WO2020/152556

SUMMARY OF THE INVENTION

An object of one embodiment of the present invention is to provide a photoelectric conversion device in which an increase in the driving voltage is inhibited. Another object of one embodiment of the present invention is to provide a light-emitting and light-receiving apparatus in which an increase in power consumption is inhibited. Another object of one embodiment of the present invention is to provide an electronic device in which an increase in power consumption is inhibited. Another object of one embodiment of the present invention is to provide a novel photoelectric conversion device, a novel light-emitting and light-receiving apparatus, or a novel electronic device.

Note that the description of these objects does not preclude the existence of other objects. In one embodiment of the present invention, there is no need to achieve all these objects. Other objects will be apparent from and can be derived from the description of the specification, the drawings, the claims, and the like.

One embodiment of the present invention is a photoelectric conversion device including a first electrode, a second electrode, and an organic compound layer, in which the organic compound layer is positioned between the first electrode and the second electrode; the organic compound layer includes a first layer; a structure body having a projection is positioned between the first layer and the second electrode; and the structure body contains a first organic compound.

Another embodiment of the present invention is the photoelectric conversion device having the above structure, in which the structure body has a shape satisfying one or both of a width of greater than or equal to 30 nm and a height of greater than or equal to 30 nm.

Another embodiment of the present invention is the photoelectric conversion device having the above structure, including both a region where the first electrode, the first layer, the structure body, and the second electrode are stacked with each other and a region where the first electrode, the first layer, and the second electrode are stacked with each other.

Another embodiment of the present invention is the photoelectric conversion device having the above structure, in which the organic compound layer further includes a second layer, and both a region where the first electrode, the first layer, the structure body, the second layer, and the second electrode are stacked with each other and a region where the first electrode, the first layer, the second layer, and the second electrode are stacked with each other are included.

Another embodiment of the present invention is the photoelectric conversion device having the above structure, in which the thickness of the second layer is greater than or equal to 15 nm and less than or equal to 100 nm.

Another embodiment of the present invention is the photoelectric conversion device having the above structure, in which the second layer includes a third organic compound, the third organic compound has an electron-transport property, and the LUMO level of the first organic compound is lower than the LUMO level of the third organic compound.

Another embodiment of the present invention is the photoelectric conversion device having the above structure, in which the second layer includes the third organic compound, the third organic compound has an electron-transport property, and the difference between the LUMO level of the first organic compound and the LUMO level of the third organic compound is less than or equal to 1 eV.

Another embodiment of the present invention is the photoelectric conversion device having the above structure, in which the LUMO level of the first organic compound is greater than or equal to −4.5 eV and less than or equal to −3.0 eV.

Another embodiment of the present invention is the photoelectric conversion device having the above structure, in which the first layer includes an active layer, the active layer contains a second organic compound, and the LUMO level of the first organic compound is higher than the LUMO level of the second organic compound.

Another embodiment of the present invention is the photoelectric conversion device having the above structure, in which the active layer contains the second organic compound, and the difference between the LUMO level of the first organic compound and the LUMO level of the second organic compound is less than or equal to 0.5 eV.

Another embodiment of the present invention is the photoelectric conversion device having the above structure, in which the structure body density is greater than or equal to $0.04/\mu m^2$ in a region where the first electrode, the active layer, and the second electrode are overlapped with each other.

Another embodiment of the present invention is a light-emitting and light-receiving apparatus including any of the above photoelectric conversion devices and a light-emitting device.

Another embodiment of the present invention is a light-emitting and light-receiving apparatus including any of the above photoelectric conversion devices and a light-emitting device, in which an organic compound layer in the photoelectric conversion device further includes a second layer; the second layer is positioned between the first layer and the second electrode and between the structure body and the second electrode; the second layer includes a third organic compound having an electron-transport property; the light-emitting device includes a third electrode, a fourth electrode, a light-emitting layer positioned between the third electrode and the fourth electrode, and a third layer; the third layer is positioned between the light-emitting layer and the fourth electrode; the third layer includes a fourth organic compound having an electron-transport property; and the third organic compound and the fourth organic compound are the same organic compound.

Another embodiment of the present invention is the light-emitting and light-receiving apparatus having the above structure, in which the second electrode and the fourth electrode are formed of a continuous conductive material.

Another embodiment of the present invention is the light-emitting and light-receiving apparatus having the above structure, in which the photoelectric conversion device and the light-emitting device have a substantially same structure except structures of the active layer and the light-emitting layer and whether the structure body is formed or not. Note that the expression "substantially same" means fabrication at the same time in this specification, and a difference in the fabrication such as the difference in in-plane distribution is tolerated.

Although the block diagram in drawings attached to this specification shows components classified based on their functions in independent blocks, it is difficult to classify actual components based on their functions completely, and one component can have a plurality of functions.

According to one embodiment of the present invention, a photoelectric conversion device in which an increase in the driving voltage is inhibited can be provided. According to one embodiment of the present invention, a light-emitting and light-receiving apparatus in which an increase in power consumption is inhibited can be provided. According to one embodiment of the present invention, an electronic device in which an increase in power consumption is inhibited can be provided. According to one embodiment of the present invention, a novel photoelectric conversion device, a novel light-emitting and light-receiving apparatus, or a novel electronic device can be provided.

Note that the description of these effects does not preclude the existence of other effects. One embodiment of the present invention does not necessarily have all these effects. Other effects will be apparent from and can be derived from the description of the specification, the drawings, the claims, and the like.

BRIEF DESCRIPTION OF THE DRAWINGS

In the accompanying drawings:

FIGS. 22A to 22D show voltage-current density characteristics of devices 10 to 13 in the state of being irradiated with light;

DETAILED DESCRIPTION OF THE INVENTION

Figure 1A:
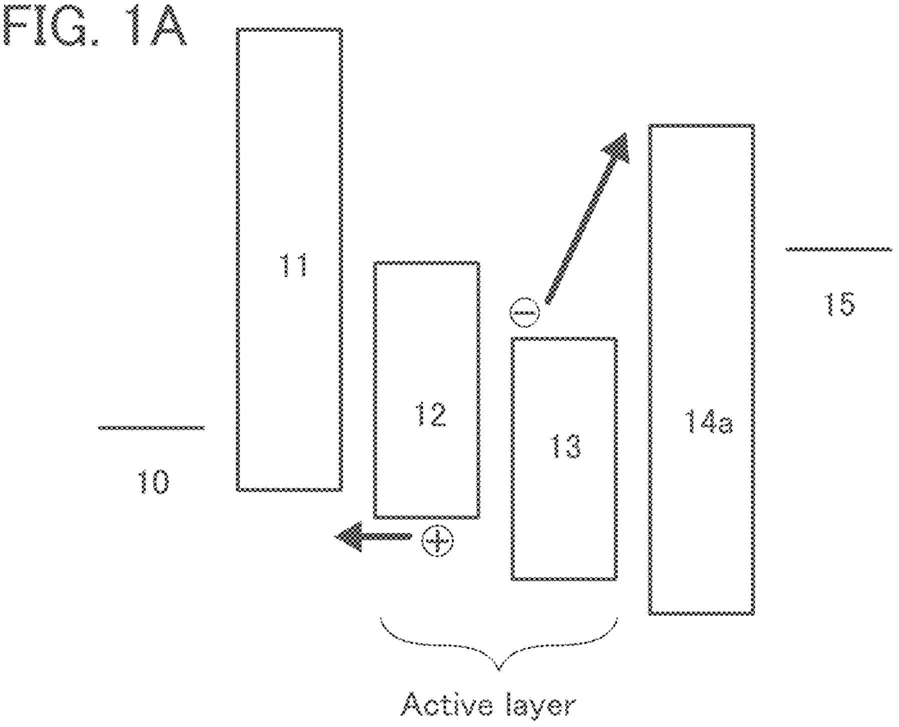
FIGS. 1A and 1B are energy band diagrams of a photoelectric conversion device.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In a functional panel including a light-emitting device and a photoelectric conversion device, such as a panel disclosed in Patent Document 1, using a material in common for the light-emitting device and the photoelectric conversion device enables the panel to be manufactured easily at low costs with reduced number of steps.

Examples of a functional layer that can be shared between a light-emitting device and a photoelectric conversion device include a carrier- (hole- or electron-) transport layer and a carrier- (hole- or electron-) injection layer. However, a light-emitting layer taking on light emission in the light-emitting device and an active layer taking on charge separation in the photoelectric conversion device need to be formed separately.

The above functional panel including a light-emitting device and a photoelectric conversion device is used for a display apparatus in most cases. That is, the display apparatus is recognized to include a sensor, and thus the performance of the display apparatus should be assigned higher priority. Therefore, in the case where the same material is used for the light-emitting device and the photoelectric conversion device, the material should be selected to improve the performance of the display apparatus.

However, in that case, the difference between the lowest unoccupied molecular orbital (LUMO) level of a material contained in a light-emitting layer and the LUMO level of an acceptor material contained in an active layer is large. Therefore, the driving voltage of the photoelectric conversion device that shares an electron-transport layer selected based on the light-emitting device with the light-emitting device is significantly increased, which is a problem.

FIG. 1A is an example of an energy band diagram of a photoelectric conversion device sharing a carrier-transport material with a light-emitting device. A first electrode/hole-injection layer 10, a hole-transport layer 11, a donor 12, an acceptor 13, an electron-transport layer 14*a*, a structure body 14*b*, and an electron-injection layer/second electrode 15 are illustrated in the diagram. As in FIG. 1A, when an energy barrier is large between the LUMO level of an acceptor material and the LUMO level of an electron-transport layer in the photoelectric conversion device, the driving voltage of the photoelectric conversion device sharing a material of the electron-transport layer with the light-emitting device is increased.

Here, the present inventors have found that the formation of a structure body having a projection over an organic compound layer (here, a photoelectric conversion layer including an active layer) can inhibit an increase in the driving voltage of the photoelectric conversion device sharing the carrier-transport material with the light-emitting device. Note that in the present invention, the structure body means an island-shaped object that is provided over the photoelectric conversion layer and formed using a material different from that of the photoelectric conversion layer. Having a projection means that the structure body has height with respect to a surface of the photoelectric conversion layer, and the number of height peaks of the structure body is not limited to one. That is, the structure body may have a plurality of peaks or may have a depression and a projection with a valley or a hole.

The width of the structure body is greater than or equal to 30 nm, preferably greater than or equal to 50 nm, and preferably less than or equal to 5000 nm. The height of the structure body is greater than or equal to 30 nm, preferably greater than or equal to 50 nm, and preferably less than or equal to 5000 nm.

Note that in this specification, the width of the structure body means the distance between two points on an outline of the structure body at a position where the distance between the two points is the largest when the structure body is seen in the direction perpendicular to an electrode surface. Alternatively, the width of the structure body means the largest distance, in the case where a line parallel to the electrode is considered in a cross-sectional view of the structure body, between the outlines of the structure body on the line.

In this specification, the height of the structure body means the distance between a surface where the structure body is formed and the outline of an upper portion of the structure body in the direction perpendicular to the electrode surface in the cross-sectional view of the structure body.

The structure body preferably has an electron-transport property, and a first organic compound having an electron-transport property is preferably contained. Furthermore, the LUMO level of the first organic compound is preferably greater than or equal to the LUMO level of the acceptor material (second organic compound) in the active layer and less than or equal to the work function of a second electrode, and preferably greater than or equal to −4.5 eV and less than or equal to −3.0 eV.

The LUMO level of the first organic compound is preferably less than the LUMO level of an organic compound having an electron-transport property (third organic compound) contained in the electron-transport layer of the light-emitting device. Accordingly, an energy barrier in electron flow from the active layer to the structure body becomes small, and thus the driving voltage can be decreased. Furthermore, the difference between the LUMO level of the first organic compound and the LUMO level of the third organic compound is preferably less than or equal to 1 eV.

As the first organic compound contained in the structure body, any of organic compounds represented by General Formulae (G1) to (G4) below can be used.

[Chemical Formula 1]

(G1)

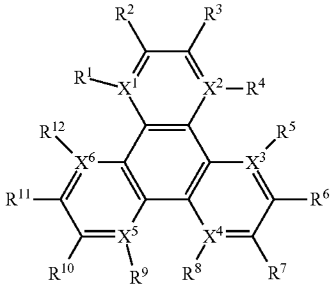

Note that in the organic compound represented by General Formula (G1) above, $X^1$ to $X^6$ each independently represent a carbon atom or a nitrogen atom. Furthermore, $R^1$ to $R^{12}$ each independently represent any of hydrogen, halogen, a substituted or unsubstituted alkyl halide group having 1 to 6 carbon atoms, a substituted or unsubstituted alkoxy group having 1 to 6 carbon atoms, a substituted or unsubstituted alkoxy halide group having 1 to 6 carbon atoms, a cyano group, a nitro group, a carbonyl group, and a carboxylic acid group; and adjacent substituents may be bonded to each other to form a ring. Note that when $X^1$ to $X^6$ each represent nitrogen, $R^1$, $R^4$, $R^5$, $R^8$, $R^9$, and $R^{12}$ respectively corresponding to $X^1$ to $X^6$ are ignored because nitrogen does not have hydrogen and a substituent. When $R^1$ to $R^{12}$ each represent a carboxylic acid group, dehydration condensation may occur between adjacent carboxylic acid groups and they may form an acid anhydride ring.

[Chemical Formula 2]

(G2)

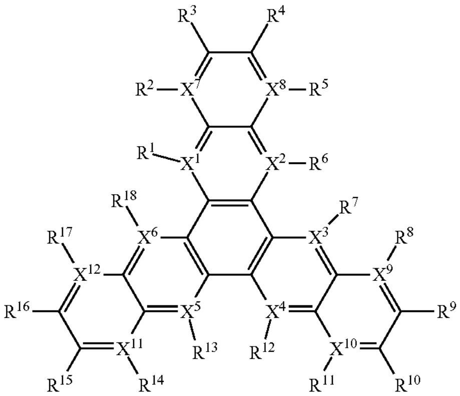

Note that in the organic compound represented by General Formula (G2) above, $X^1$ to $X^2$ each independently represent a carbon atom or a nitrogen atom. Furthermore, $R^1$ to $R^{18}$ each independently represent any of hydrogen, halogen, a substituted or unsubstituted alkyl halide group having 1 to 6 carbon atoms, a substituted or unsubstituted alkoxy group having 1 to 6 carbon atoms, a substituted or unsubstituted alkoxy halide group having 1 to 6 carbon atoms, a cyano group, a nitro group, a carbonyl group, and a carboxylic acid group; and adjacent substituents may be bonded to each other to form a ring. Note that when $X^1$ to $X^{12}$ each represent nitrogen, $R^1$, $R^2$, $R^5$ to $R^8$, $R^{11}$ to $R^{14}$, $R^{17}$, and $R^{18}$ corresponding to $X^1$ to $X^{12}$ are ignored because nitrogen does not have hydrogen and a substituent. When $R^1$ to $R^{18}$ each represent a carboxylic acid group, dehydration condensation may occur between adjacent carboxylic acid groups and they may form an acid anhydride ring.

[Chemical Formula 3]

(G3)

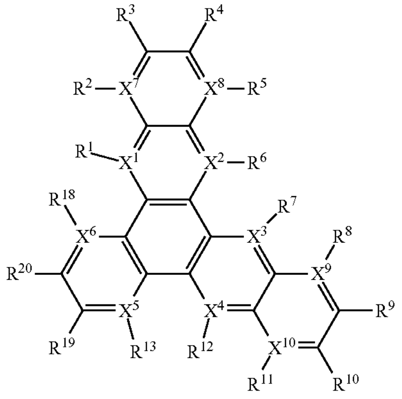

Note that in the organic compound represented by General Formula (G3) above, $X^1$ to $X^{10}$ each independently represent a carbon atom or a nitrogen atom. Furthermore, $R^1$ to $R^{13}$ and $R^{18}$ to $R^{20}$ each independently represent any of hydrogen, halogen, a substituted or unsubstituted alkyl halide group having 1 to 6 carbon atoms, a substituted or unsubstituted alkoxy group having 1 to 6 carbon atoms, a substituted or unsubstituted alkoxy halide group having 1 to 6 carbon atoms, a cyano group, a nitro group, a carbonyl group, and a carboxylic acid group; and adjacent substituents may be bonded to each other to form a ring. Note that when $X^1$ to $X^{10}$ each represent nitrogen, $R^1$, $R^2$, $R^5$ to $R^8$, $R^{11}$ to $R^{13}$, and $R^{18}$ corresponding to $X^1$ to $X^{10}$ are ignored because nitrogen does not have hydrogen and a substituent. When $R^1$ to $R^{13}$ and $R^{18}$ to $R^{20}$ each represent a carboxylic acid group, dehydration condensation may occur between adjacent carboxylic acid groups and they may form an acid anhydride ring.

[Chemical Formula 4]

(G4)

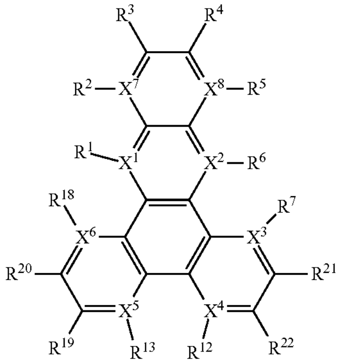

Note that in the organic compound represented by General Formula (G4) above, $X^1$ to $X^8$ each independently represent a carbon atom or a nitrogen atom. Furthermore, $R^1$ to $R^7$, $R^{12}$, $R^{13}$, and $R^{18}$ to $R^{22}$ each independently represent any of hydrogen, halogen, a substituted or unsubstituted alkyl halide group having 1 to 6 carbon atoms, a substituted or unsubstituted alkoxy group having 1 to 6 carbon atoms, a substituted or unsubstituted alkoxy halide group having 1 to 6 carbon atoms, a cyano group, a nitro group, a carbonyl group, and a carboxylic acid group; and adjacent substituents may be bonded to each other to form a ring. Note that when $X^1$ to $X^8$ each represent nitrogen, $R^1$, $R^2$, $R^5$ to $R^7$, $R^{12}$, $R^{13}$, and $R^{18}$ corresponding to $X^1$ to $X^8$ are ignored because nitrogen does not have hydrogen and a substituent. When $R^1$ to $R^7$, $R^{12}$, $R^{13}$, and $R^{18}$ to $R^{22}$ each represent a carboxylic acid group, dehydration condensation may occur between adjacent carboxylic acid groups and they may form an acid anhydride ring.

Among the organic compounds represented by General Formulae (G1) to (G4) above, it is preferable to use an organic compound in which the dipole moment is less than 20 debyes because in that case, aggregation of the organic compound easily occurs and the structure body is easily formed. It is particularly preferable to use an organic compound with the dipole moment less than 11 debyes. Furthermore, among the organic compounds represented by General Formulae (G1) to (G4) above, a compound in which a glass transition point is not observed in differential scanning calorimetry (DSC) is preferably used because in that case, the structure body is easily formed. In the case where the glass transition point is observed, the glass transition point is preferably less than 120° C. because in that case, the structure body is easily formed. Furthermore, it is preferable that in thermogravimetry-differential thermal analysis (TG-DTA), thermal behavior of melting be not observed at a temperature lower than a temperature at which the mass changes, and the mass change occurs due to sublimation because in that case, the structure body is easily formed. The TG-DTA is preferably performed in the range from an atmospheric pressure to $1\times10^{-4}$ Pa, further preferably performed under a reduced pressure (less than or equal to 10 Pa) as in the case of forming a thin film.

Examples of the organic compounds represented by the above general formulae include organic compounds represented by Structural Formulae (1) to (40) below.

[Chemical Formula 5]

(1)

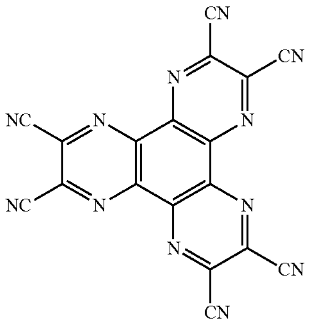

-continued (2)

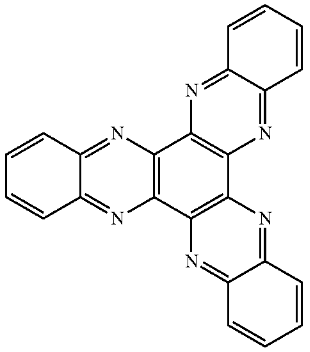

(3)

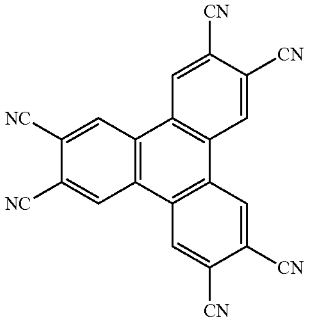

(4)

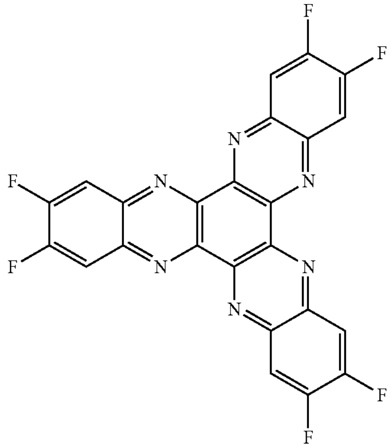

(5)

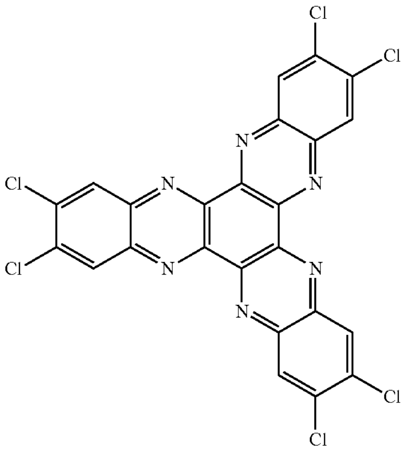

-continued
(6)
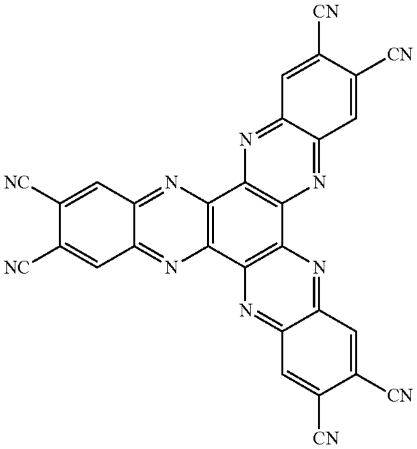
(7)
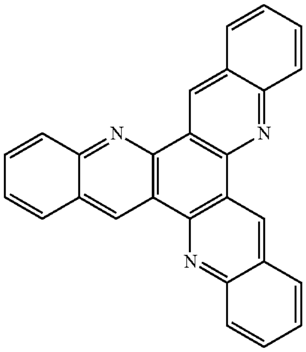
(8)
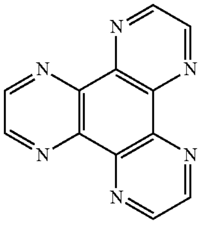
(9)
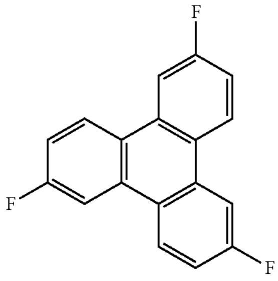
(10)
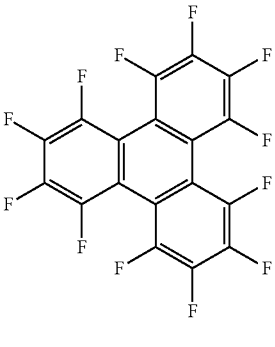
-continued
(11)
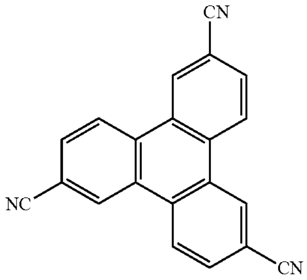
(12)
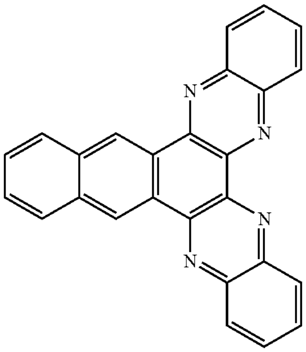
(13)
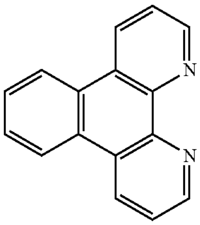
(14)
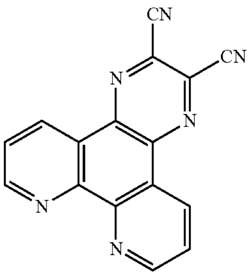
(15)
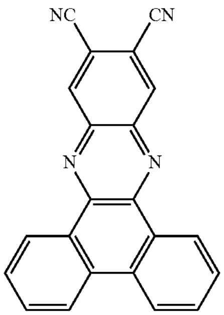

-continued
(16)
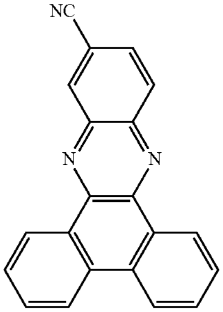
(17)
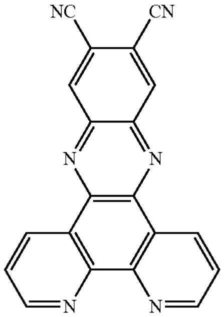
[Chemical Formula 6]
(18)
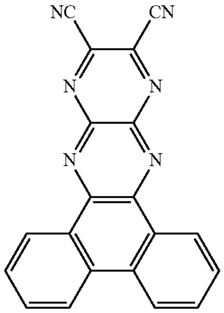
(19)
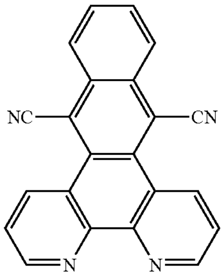
(20)
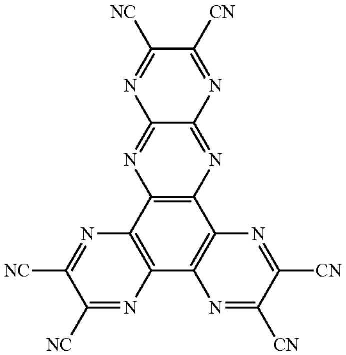
-continued
(21)
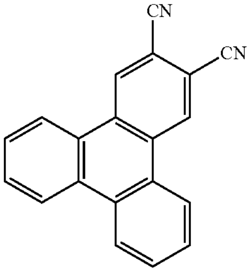
(22)
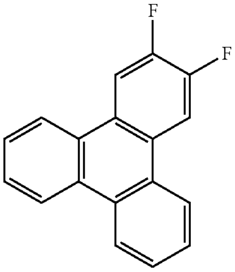
(23)
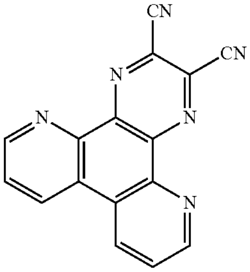
(24)
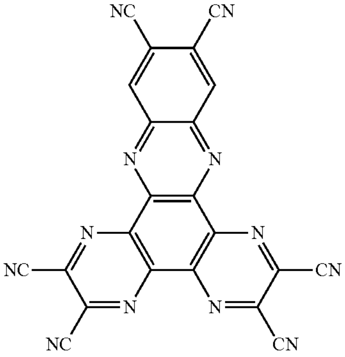
(25)
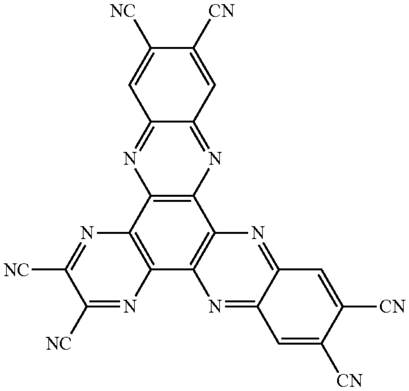

-continued
(26)
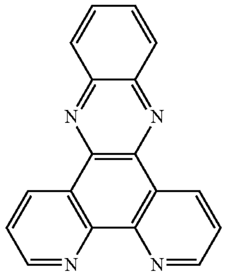
(27)
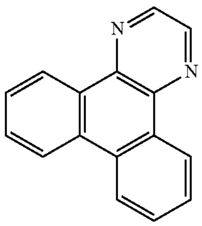
(28)
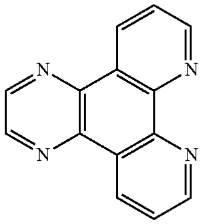
(29)
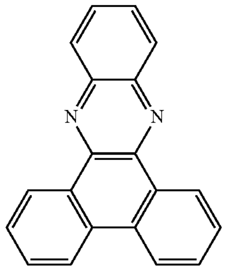
(30)
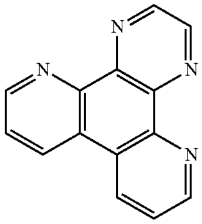
(31)
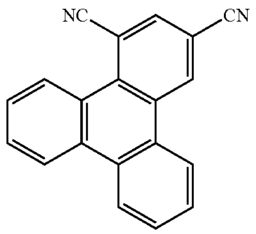
-continued
(32)
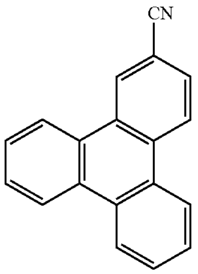
(33)
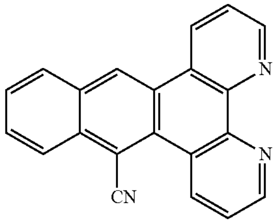
(34)
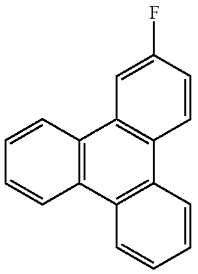
(35)
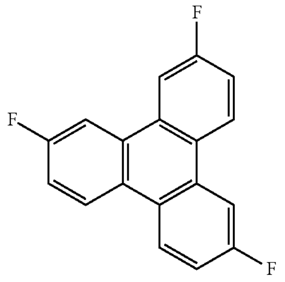
(36)
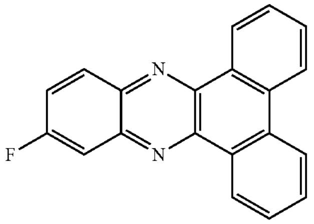
(37)
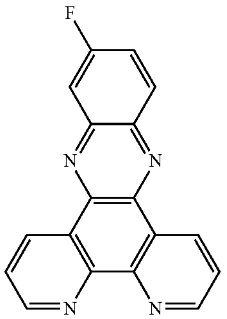

-continued (38)

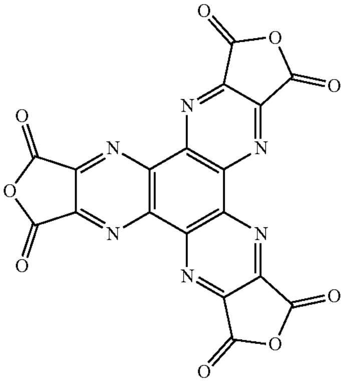

(39)

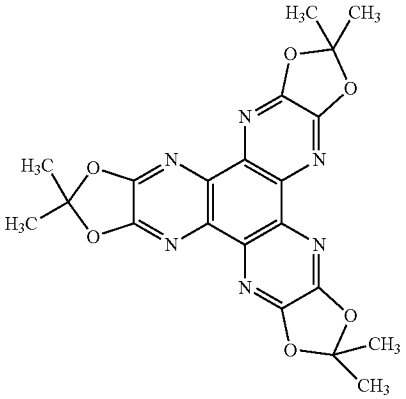

(40)

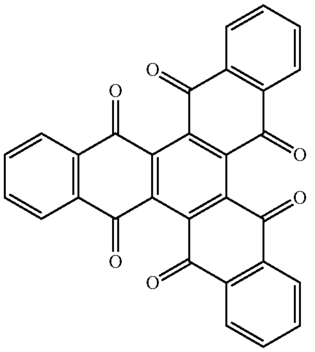

In the organic compound represented by any of General Formulae (G1) to (G4) above, a film corresponding to a thickness of 1 nm to 30 nm is deposited over an active layer by a vacuum evaporation method, whereby the above structure body is formed. Note that a material for forming the above structure body does not form a flat film. Therefore, the deposition amount of the structure body is determined using a given material forming a flat film as a reference material. For example, 4,4'-bis[N-(1-naphthyl)-N-phenylamino]biphenyl (abbreviation: NPB) is used as the reference material, and a film is formed using a calibration curve of NPB. The use of the calibration curve of the same substance every time makes it possible to control a deposition amount even though a correct deposition amount is not clear. In this consideration, NPB is used as the reference material, and the organic compound represented by any of General Formulae (G1) to (G4) is deposited with the amount corresponding to the NPB thickness of 1 nm to 30 nm, whereby the above structure body is formed. That is, the deposition amount corresponding to the thickness of 1 nm to 30 nm can be represented as the deposition amount corresponding to the NPB thickness of 1 nm to 30 nm accurately.

The above structure body is preferably provided over the active layer. Furthermore, when the active layer is in contact with the second electrode, the characteristics are decreased; thus, after forming the structure body, a carrier-transport layer (electron-transport layer) that is used in common with the light-emitting device is preferably formed over the active layer and the structure body.

Figure 1B:
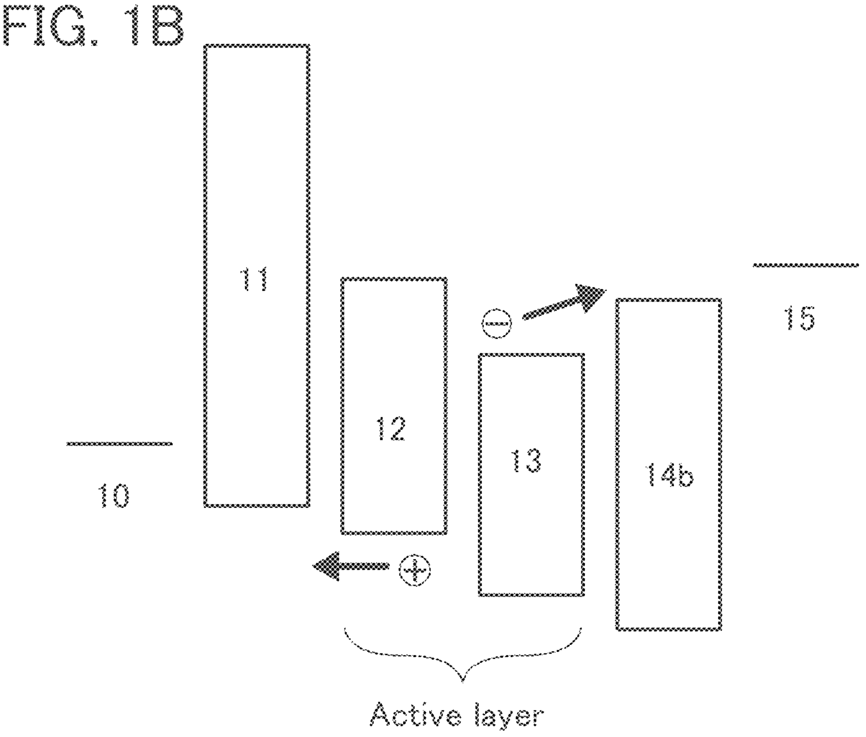

With such a structure of the structure body, electrons reach the second electrode not through the electron-transport layer but through the structure body, and the influence of an energy barrier can be small as in FIG. 1B; thus, an increase in the driving voltage can be inhibited.

In the case where an electron-transport layer is formed over the structure body, the electron-transport layer is disconnected or becomes extremely thin over the structure body, and electrons generated in the active layer reach the second electrode through those portions. When the electron-transport layer is disconnected or becomes extremely thin as described above, an increase in the driving voltage can be inhibited by the connection of the structure body with the second electrode or the tunnel effect.

Note that the above structure body is formed not in the light-emitting device but only in the photoelectric conversion device. In the photoelectric conversion device, charge separation occurs at the timing of exposure to light, and when a low-resistance portion is found, the charges are injected into the electrode smoothly through the portion; therefore, one photoelectric conversion device includes at least one structure body described above. Note that the structure body density is preferably greater than or equal to $0.04/\mu m^2$, further preferably greater than or equal to $0.4/\mu m^2$, in a region where the first electrode, the active layer, and the second electrode in the photoelectric conversion device are overlapped with each other.

Note that the organic compounds represented by General Formulae (G1) to (G4) above can form the structure body only by being deposited by an evaporation method. The structure body is formed as a result of aggregation derived from crystallization or the like of the organic compound. Usually, a highly-amorphous organic compound in which such a change does not occur in deposition is used as an organic compound for an organic semiconductor device. In one embodiment of the present invention, such a material is used intentionally to achieve low driving voltage of the photoelectric conversion device.

Figures 2A, 2B:
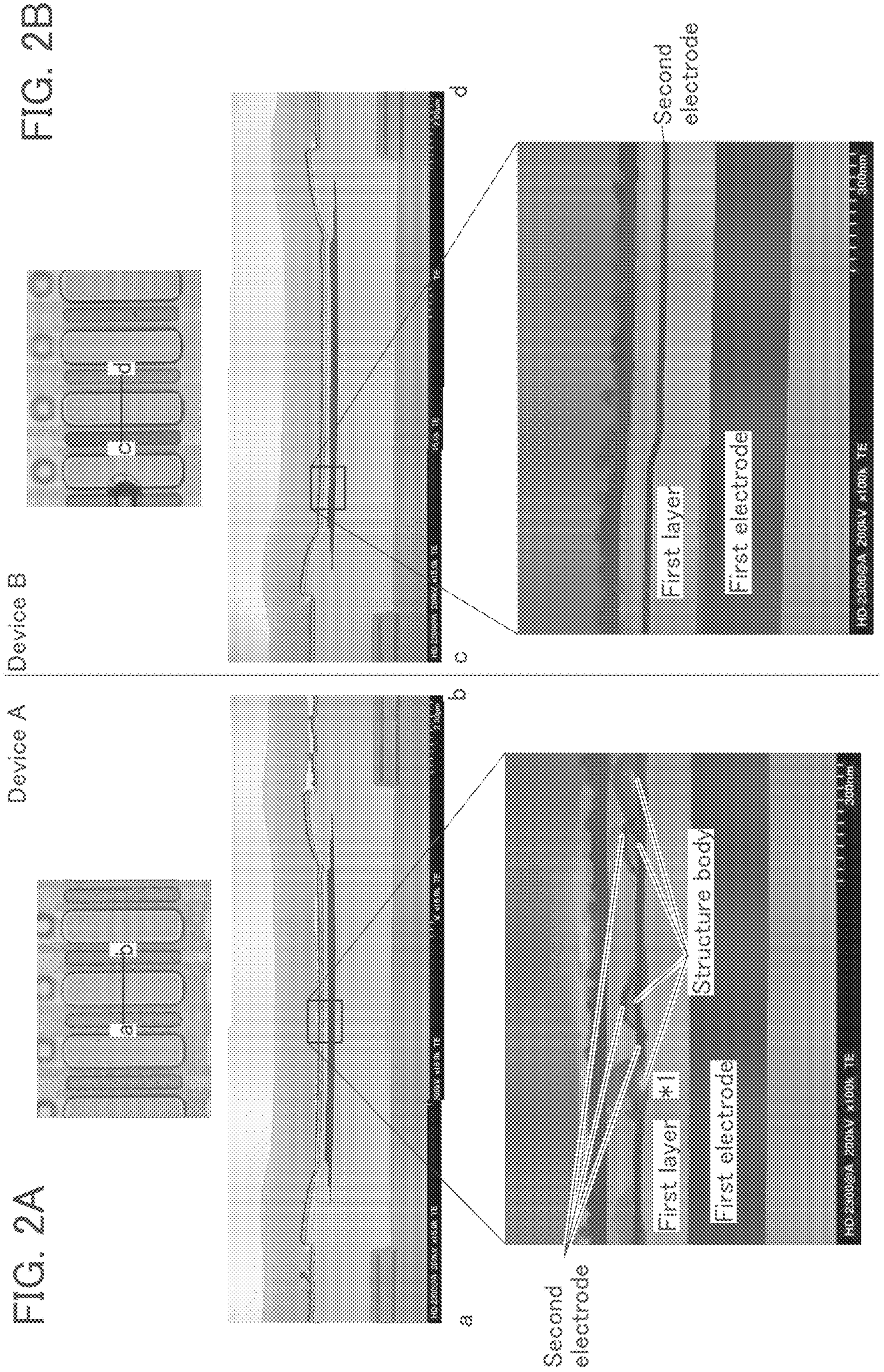
FIGS. 2A and 2B show micrographs and cross-sectional TEM images of photoelectric conversion devices.

Here, FIGS. 2A and 2B show optical micrographs and images taken by a transmission electron microscope (TEM) (cross-sectional TEM images) of the photoelectric conversion device (a device A) of one embodiment of the present invention including the above structure body and a photoelectric conversion device (a device B) not including the above structure body. Although the structures of the devices A and B are almost the same, the only difference is whether or not the structure body is included (in the device A, an active layer is formed, any of the materials represented by General Formulae (G1) to (G4) above is deposited by evaporation to a thickness corresponding to 15 nm to form the structure body, and then an electron-transport layer is formed; in the device B, an electron-transport layer is formed immediately after forming an active layer).

FIG. 2A shows optical micrographs and a cross-sectional TEM image of the device A. In FIG. 2A, the top picture is an optical micrograph, the second top picture is a cross-sectional TEM image of portions indicated by a-b in the optical micrograph, and the bottom picture is an enlarged cross-sectional TEM image of a region surrounded by a square in the cross-sectional TEM image in the second top picture. Furthermore, FIG. 2B shows optical micrographs and a cross-sectional TEM image of the device B. In FIG. 2B, the top picture is an optical micrograph, the second top picture is a cross-sectional TEM image of portions indicated by c-d in the optical micrograph, and the bottom picture is an enlarged cross-sectional TEM image of a region surrounded by a square in the cross-sectional TEM image in the second top picture.

It is found from FIGS. 2A and 2B that the projection of the structure body formed in the device A is sufficiently smaller than the electrode area and does not cause variation between pixels. Note that although in the bottom picture in FIG. 2A, the structure body seems to be formed over the second electrode because the bottom picture in FIG. 2A shows the depth direction; when the cross section of the structure body is captured as in *1, the structure body is found to be provided over the first layer and below the second electrode. When any of the materials represented by General Formulae (G1) to (G4) above is deposited by evaporation, such a structure body can be obtained and the driving voltage can be decreased.

Note that in this specification, the expression "hydrogen" includes deuterium.

Embodiment 2

In this embodiment, a photoelectric conversion device of one embodiment of the present invention will be described.

The photoelectric conversion device of one embodiment of the present invention has a function of sensing light (hereinafter, also referred to as a light-receiving function).

Figure 3A:
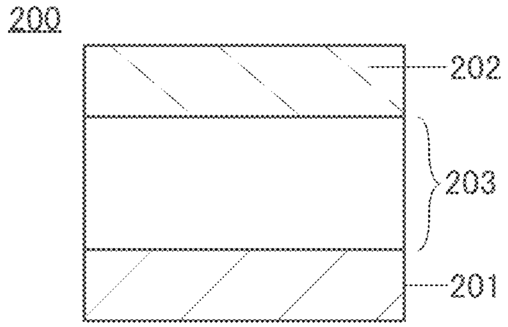
FIGS. 3A to 3C illustrate a photoelectric conversion device of one embodiment of the present invention.
Figure 3B:
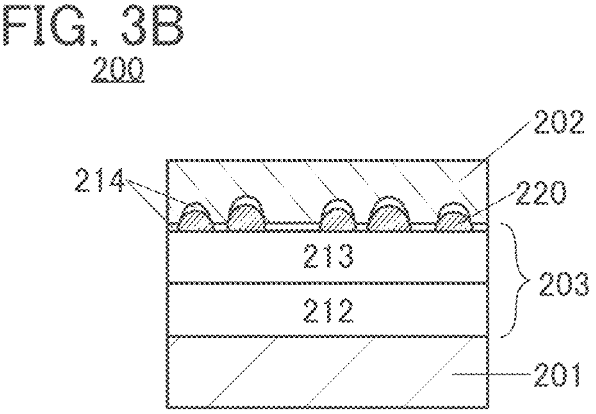
Figure 3C:
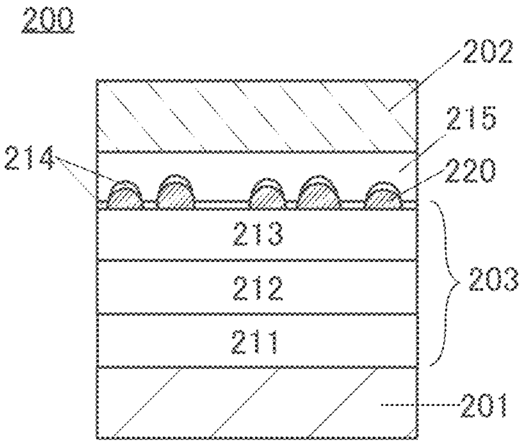

FIGS. 3A to 3C are each a schematic cross-sectional view of a photoelectric conversion device 200 of one embodiment of the present invention.

<<Basic Structure of Photoelectric Conversion Device>>

Basic structures of the photoelectric conversion device will be described. FIG. 3A illustrates a photoelectric conversion device 200 including at least a photoelectric conversion layer 203 including an active layer and a carrier-transport layer between a pair of electrodes. Specifically, the photoelectric conversion layer 203 is interposed between a first electrode 201 and a second electrode 202. The photoelectric conversion layer 203 includes at least the active layer, the structure body described in Embodiment 1 over the active layer, and a carrier transport layer.

FIG. 3B illustrates an example of a stacked-layer structure of the photoelectric conversion layer 203 in the photoelectric conversion device 200 of one embodiment of the present invention. The photoelectric conversion layer 203 has a structure in which a first carrier-transport layer 212, an active layer 213, a structure body 220, and a second carrier-transport layer 214 are sequentially stacked over the first electrode 201. That is, the structure body 220 is positioned between the active layer 213 and the second carrier-transport layer 214 and is in contact with the active layer 213. That is, the structure body 220 is positioned over the active layer 213 and in contact with the active layer 213, the second carrier-transport layer 214, and the second electrode 202.

FIG. 3C illustrates another example of a stacked-layer structure of the photoelectric conversion layer 203 in the photoelectric conversion device 200 of one embodiment of the present invention. The photoelectric conversion layer 203 has a structure in which a first carrier-injection layer 211, the first carrier-transport layer 212, the active layer 213, the structure body 220, the second carrier-transport layer 214, and a second carrier-injection layer 215 are sequentially stacked over the first electrode 201. That is, the structure body 220 is positioned over the active layer 213 and in contact with the active layer 213, the second carrier-transport layer 214, and the second carrier-injection layer 215.

Providing the structure body 220 in the photoelectric conversion device 200 of one embodiment of the present invention can inhibit an increase in the driving voltage of the photoelectric conversion device 200.

<<Specific Structure of Photoelectric Conversion Device>>

Next, a specific structure of the photoelectric conversion device 200 of one embodiment of the present invention will be described. Here, description is made with reference to FIG. 3C.

<First Electrode and Second Electrode>

The first electrode 201 and the second electrode 202 can be formed using materials that can be used for a first electrode 101 and a second electrode 102 of a light-emitting device, which will be described in Embodiment 3.

Note that a microcavity structure can be obtained when the first electrode 201 is a reflective electrode and the second electrode 202 is a semi-transmissive and semi-reflective electrode, for example. The microcavity structure can intensify light with a specific wavelength to be sensed, thereby achieving a photoelectric conversion device with high sensitivity.

<First Carrier-Injection Layer>

The first carrier-injection layer 211 injects holes from the photoelectric conversion layer 203 to the first electrode 201, and contains a material with a high hole-injection property. Examples of the material with a high hole-injection property include an aromatic amine compound and a composite material containing a hole-transport material and an acceptor material (electron-accepting material).

The first carrier-injection layer 211 can be formed using a material that can be used for a hole-injection layer 111 of the light-emitting device, which will be described in Embodiment 3.

<First Carrier-Transport Layer>

The first carrier-transport layer 212 transports holes generated in the active layer 213 on the basis of incident light to the first electrode 201, and contains a hole-transport material. The hole-transport material preferably has a hole mobility of $1\times10^{-6}$ $cm^2/Vs$ or higher. Note that other substances can also be used as long as the substances have a hole-transport property higher than an electron-transport property. In this specification and the like, the first carrier-transport layer is also referred to as a hole-transport layer in some cases.

As the hole-transport material, a π-electron rich heteroaromatic compound or an aromatic amine (a compound having an aromatic amine skeleton) can be used.

Alternatively, a carbazole derivative, a thiophene derivative, or a furan derivative can be used as the hole-transport material.

The hole-transport material is an aromatic monoamine compound or a heteroaromatic monoamine compound having at least one structure of aniline, biphenylamine, terphenylamine, carbazolylamine, dibenzofuranylamine, dibenzothiophenylamine, benzonaphthofuranylamine, fluorenylamine, and spirobifluorenylamine.

Alternatively, the hole-transport material is an aromatic monoamine compound or a heteroaromatic monoamine compound having two or more structures selected from aniline, biphenylamine, terphenylamine, carbazolylamine, dibenzofuranylamine, dibenzothiophenylamine, benzonaphthofuranylamine, fluorenylamine, and spirobifluorenylamine.

In the case where the hole-transport material is an aromatic monoamine compound or a heteroaromatic monoamine compound having two or more structures selected from aniline, biphenylamine, terphenylamine, carbazolylamine, dibenzofuranylamine, dibenzothiophenylamine, benzonaphthofuranylamine, fluorenylamine, and spirobifluorenylamine, one nitrogen atom may be shared by two or more structures. For example, in the case where fluorene and biphenyl are bonded to a nitrogen atom of a monoamine in an aromatic monoamine compound, the compound can be regarded as an aromatic monoamine compound having a fluorenylamine structure and a biphenylamine structure.

Note that each of aniline, biphenylamine, terphenylamine, carbazolylamine, dibenzofuranylamine, dibenzothiophenylamine, benzonaphthofuranylamine, fluorenylamine, and spirobifluorenylamine listed above as the structure included in the hole-transport material may include a substituent. Examples of the substituent include a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, and a substituted or unsubstituted heteroaryl group having 4 to 30 carbon atoms.

The hole-transport material is preferably a monoamine compound having a triarylamine structure (a heteroaryl group is also included as an aryl group in a triarylamine compound). For example, the hole-transport material is an organic compound represented by General Formula (Gh-1) below.

[Chemical Formula 7]

(Gh-1)

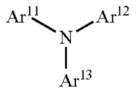

In General Formula (Gh-1), each of $Ar^{11}$ to $Ar^{13}$ independently represents hydrogen, a substituted or unsubstituted aryl group having 6 to 30 carbon atoms, or a substituted or unsubstituted heteroaryl group having 4 to 30 carbon atoms.

Alternatively, the hole-transport material is an organic compound represented by General Formula (Gh-2) below.

[Chemical Formula 8]

(Gh-2)

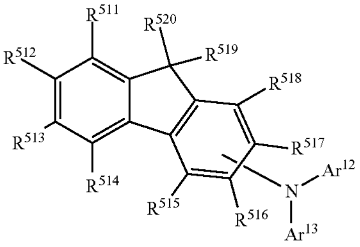

In General Formula (Gh-2), $Ar^{12}$ and $Ar^{13}$ each independently represent hydrogen, a substituted or unsubstituted aryl group having 6 to 30 carbon atoms, or a substituted or unsubstituted heteroaryl group having 4 to 30 carbon atoms. $R^{511}$ to $R^{520}$ each independently represent hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms. Substituents of $R^{519}$ and $R^{520}$ may be bonded to each other to form a ring.

Alternatively, the hole-transport material is an organic compound represented by General Formula (Gh-3) below.

[Chemical Formula 9]

(Gh-3)

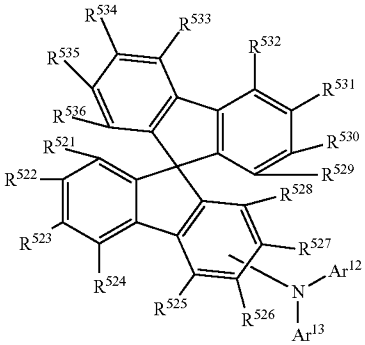

In General Formula (Gh-3), each of $Ar^{12}$ and $Ar^{13}$ independently represents a substituted or unsubstituted aryl group having 6 to 30 carbon atoms or a substituted or unsubstituted heteroaryl group having 4 to 30 carbon atoms. Each of $R^{521}$ to $R^{536}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms.

Alternatively, the hole-transport material is an organic compound represented by General Formula (Gh-4) below.

[Chemical Formula 10]

(Gh-4)

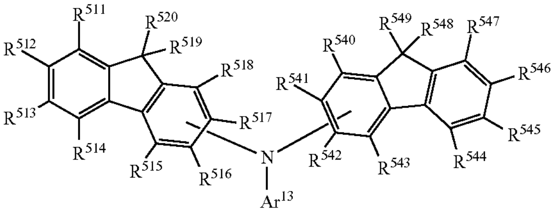

In General Formula (Gh-4), $Ar^{13}$ represents a substituted or unsubstituted aryl group having 6 to 30 carbon atoms or a substituted or unsubstituted heteroaryl group having 4 to 30 carbon atoms. Each of $R^{511}$ to $R^{520}$ and $R^{540}$ to $R^{549}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms. Substituents of $R^{519}$ and $R^{520}$ may be bonded to each other to form a ring, and substituents of $R^{548}$ and $R^{549}$ may be bonded to each other to form a ring.

Alternatively, the hole-transport material is an organic compound represented by General Formula (Gh-5) below.

[Chemical Formula 11]

(Gh-5)

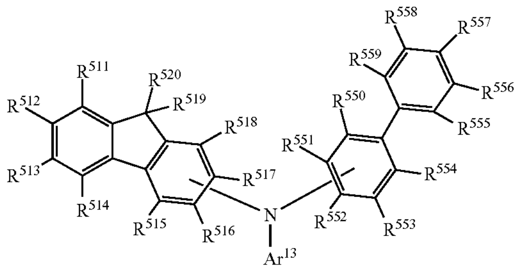

In General Formula (Gh-5), $Ar^{13}$ represents a substituted or unsubstituted aryl group having 6 to 30 carbon atoms or a substituted or unsubstituted heteroaryl group having 4 to 30 carbon atoms. Each of $R^{511}$ to $R^{520}$ and $R^{550}$ to $R^{559}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms. Substituents of $R^{519}$ and $R^{520}$ may be bonded to each other to form a ring.

Alternatively, the hole-transport material is an organic compound represented by General Formula (Gh-6) below.

[Chemical Formula 12]

(Gh-6)

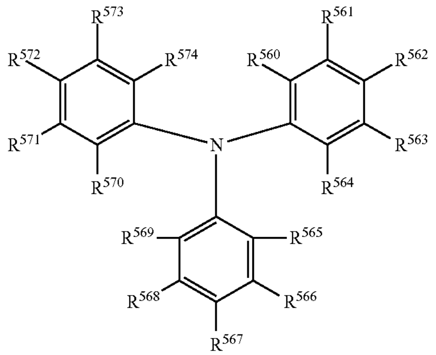

In General Formula (Gh-6), each of $R^{560}$ to $R^{574}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms.

Each of $R^{511}$ to $R^{520}$ in General Formula (Gh-2), $R^{521}$ to $R^{536}$ in General Formula (Gh-3), $R^{511}$ to $R^{520}$ and $R^{540}$ to $R^{549}$ in General Formula (Gh-4), $R^{511}$ to $R^{520}$ and $R^{550}$ to $R^{559}$ in General Formula (Gh-5), and $R^{560}$ to $R^{574}$ in General Formula (Gh-6) represents, other than the above-described substituents, halogen, a substituted or unsubstituted alkyl halide group having 1 to 13 carbon atoms, a cyano group, or a substituted or unsubstituted alkoxy group having 1 to 13 carbon atoms.

Specifically, it is preferable that each of $R^{511}$ to $R^{520}$ in General Formula (Gh-2), $R^{521}$ to $R^{536}$ in General Formula (Gh-3), $R^{511}$ to $R^{520}$ and $R^{540}$ to $R^{549}$ in General Formula (Gh-4), $R^{511}$ to $R^{520}$ and $R^{550}$ to $R^{559}$ in General Formula (Gh-5), and $R^{560}$ to $R^{574}$ in General Formula (Gh-6) be a substituent represented by any of Formulae (R-1) to (R-38) and Formulae (R-41) to (R-117) below. Note that * in the formula represents a bond.

It is also preferable that each of $Ar^{11}$ to $Ar^{13}$ in General Formula (Gh-1), $Ar^{12}$ and $Ar^{13}$ in General Formulae (Gh-2) and (Gh-3), and $Ar^{13}$ in General Formulae (Gh-4) and (Gh-5) be a substituent represented by any of Formulae (R-41) to (R-117) below. Note that * in the formula represents a bond.

[Chemical Formula 13]

(R-1)

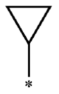

(R-2)

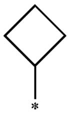

(R-3)

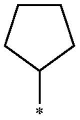

(R-4)

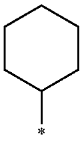

(R-5)

(R-6)

(R-7)

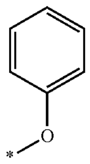

(R-8)

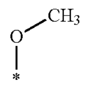

(R-9)

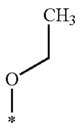

(R-10)

-continued
(R-11)
(R-12)
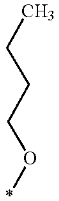
(R-13)
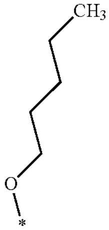
(R-14)
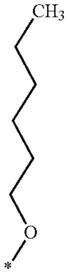
(R-15)
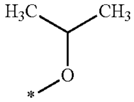
(R-16)
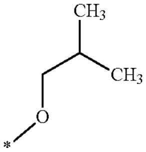
(R-17)
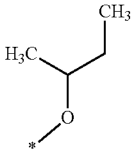
(R-18)
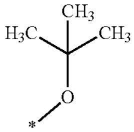
(R-19)
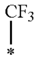
-continued
(R-20)
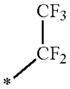
(R-21)
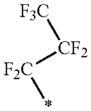
(R-22)
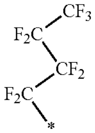
(R-23)
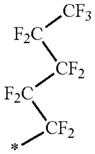
(R-24)
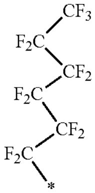
(R-25)
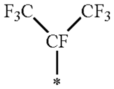
(R-26)
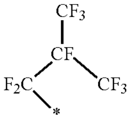
(R-27)
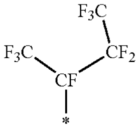
(R-28)
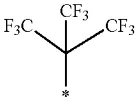
(R-29)
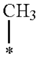
(R-30)
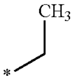
(R-31)

-continued
(R-32)
(R-33)
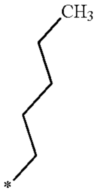
(R-34)
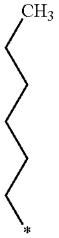
(R-35)
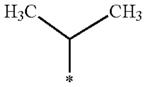
(R-36)
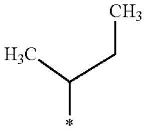
(R-37)
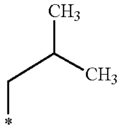
(R-38)
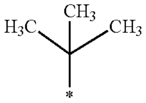
[Chemical Formula 14]
(R-41)
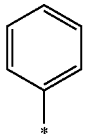
(R-42)
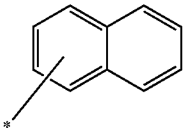
(R-43)
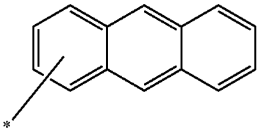
-continued
(R-44)
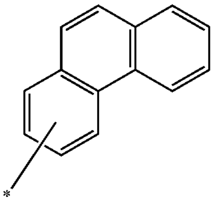
(R-45)
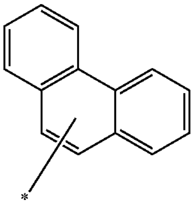
(R-46)
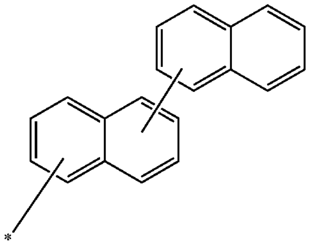
(R-47)
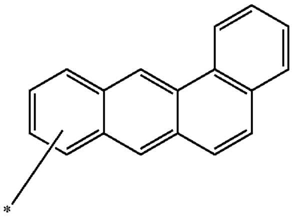
(R-48)
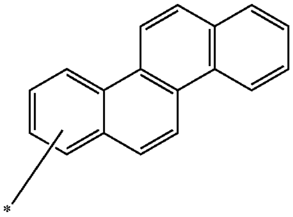
(R-49)
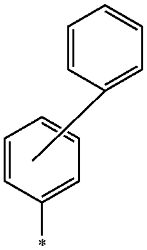

-continued
(R-50)
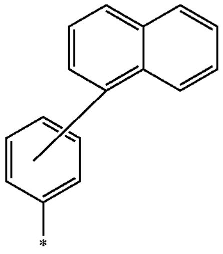
(R-51)
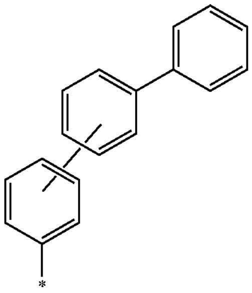
(R-52)
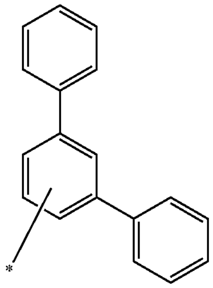
(R-53)
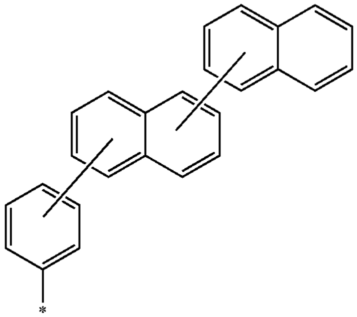
(R-54)
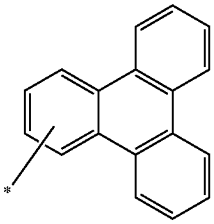
-continued
(R-55)
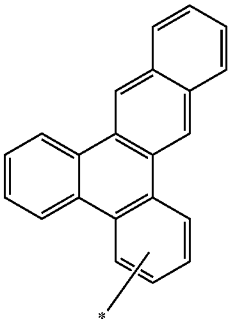
(R-56)
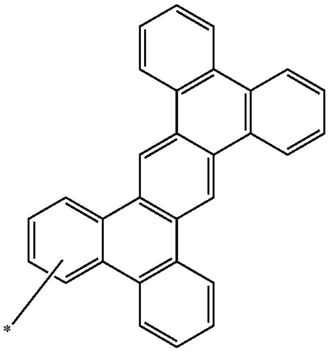
(R-57)
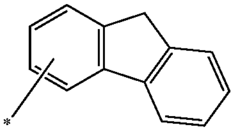
(R-58)
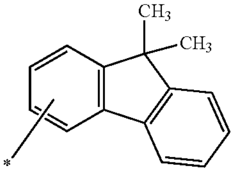
(R-59)
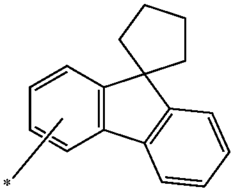
(R-60)
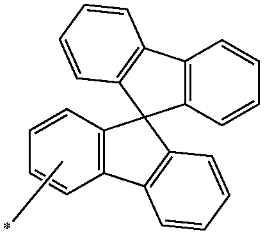

-continued
(R-61)
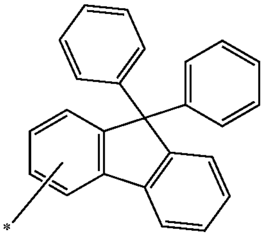
(R-62)
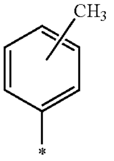
(R-63)
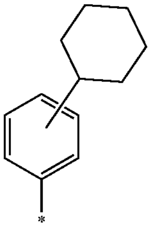
[Chemical Formula 15]
(R-64)
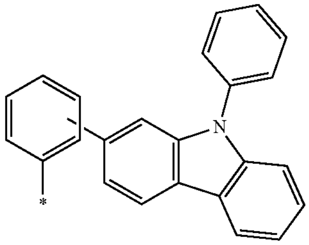
(R-65)
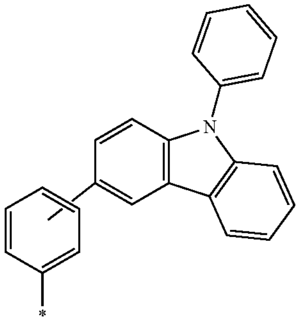
(R-66)
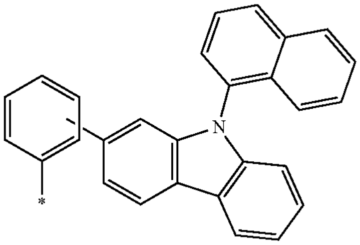
-continued
(R-67)
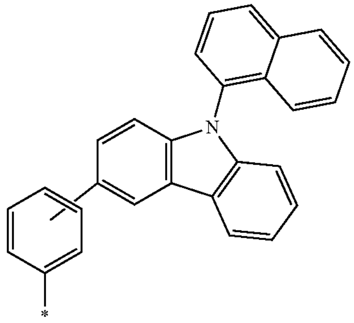
(R-68)
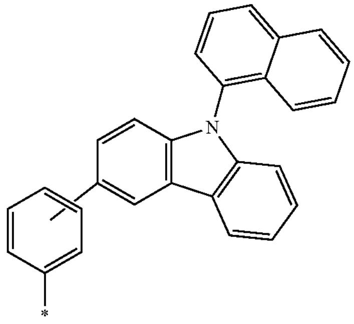
(R-69)
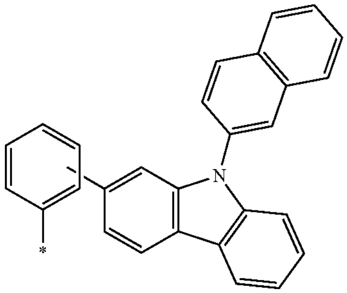
(R-70)
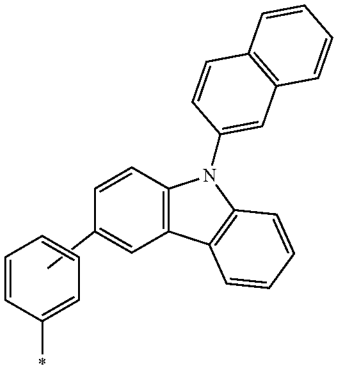
(R-71)
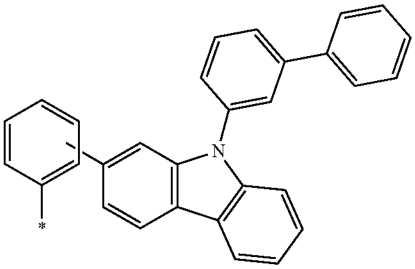

-continued
(R-72)
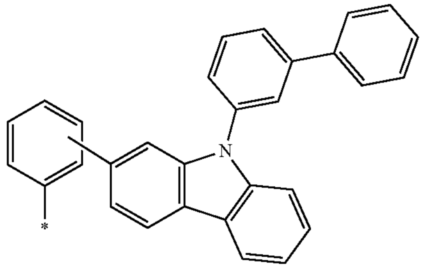
(R-72)
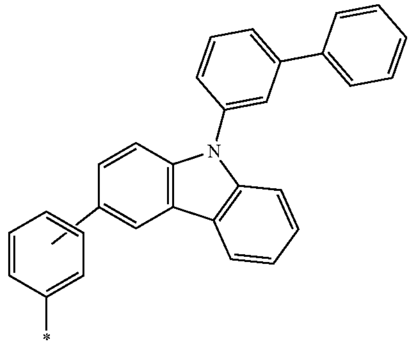
(R-73)
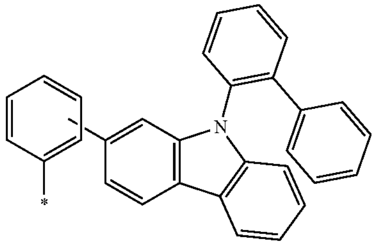
(R-74)
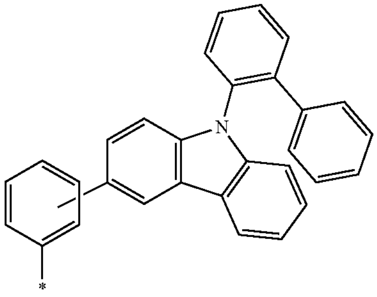
(R-75)
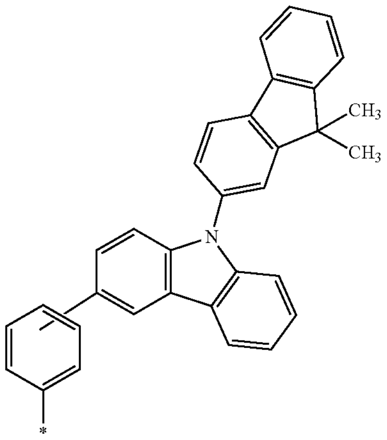
-continued
(R-76)
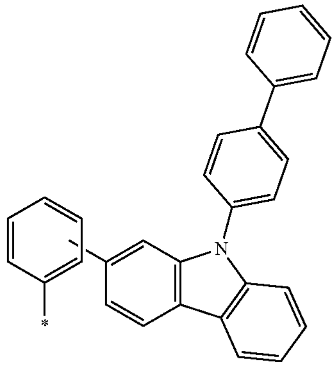
(R-77)
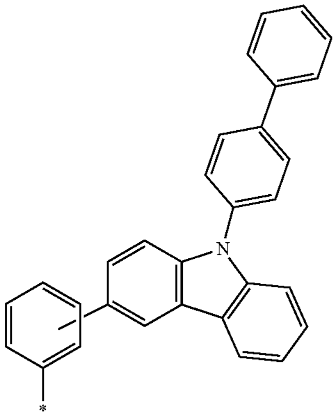
(R-78)
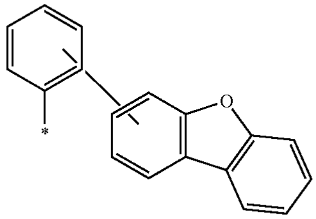
(R-79)
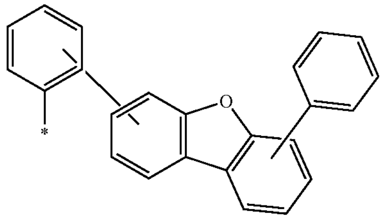
(R-80)
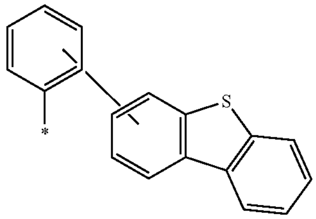

-continued
(R-81)
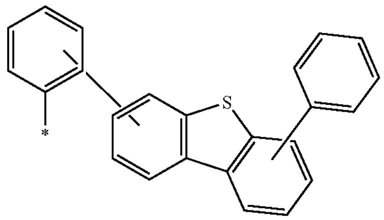
(R-82)
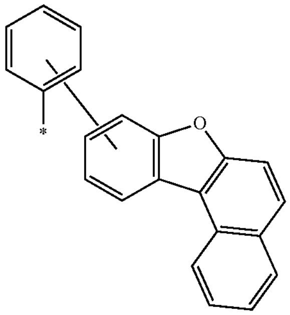
(R-83)
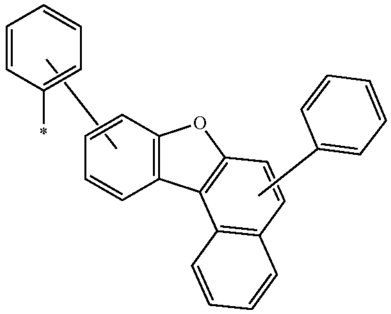
[Chemical Formula 16]
(R-84)
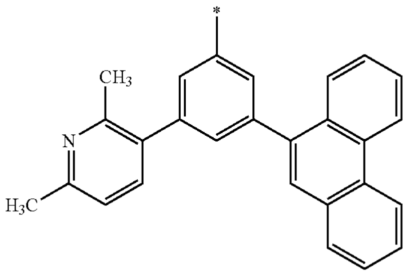
(R-85)
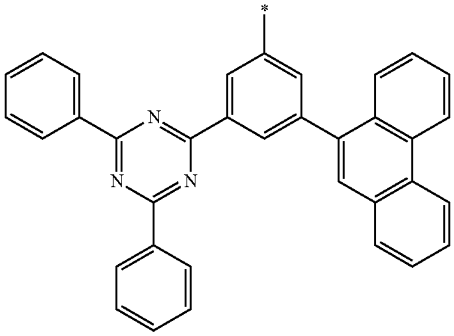
-continued
(R-86)
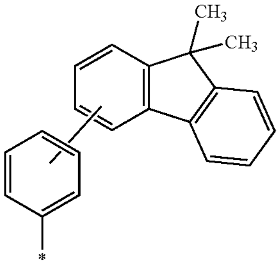
(R-87)
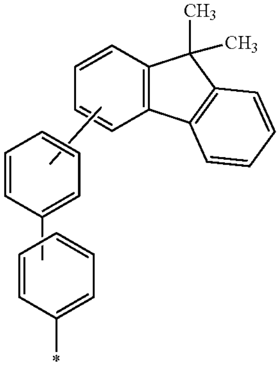
(R-88)
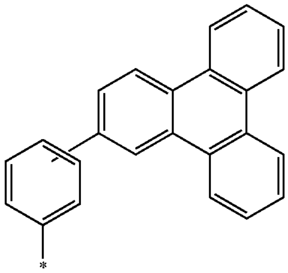
(R-89)
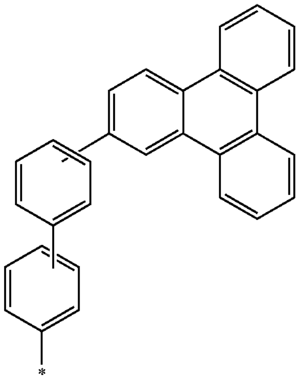
(R-90)
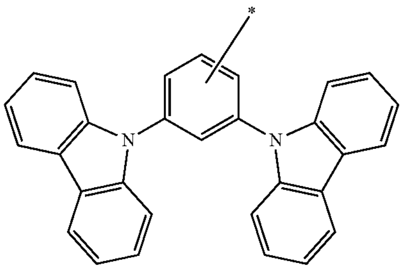

-continued
(R-91)
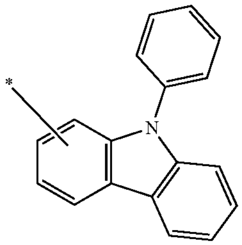
(R-92)
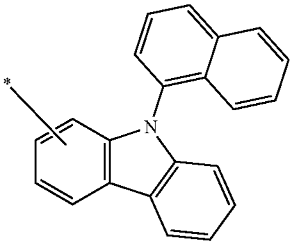
(R-93)
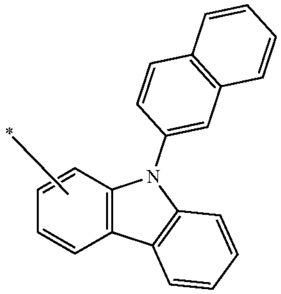
(R-94)
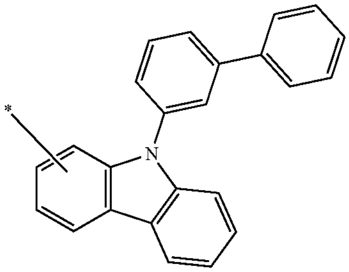
(R-95)
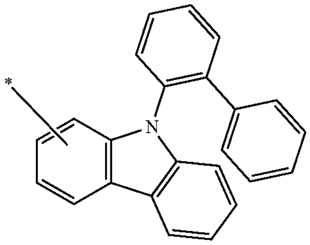
-continued
(R-96)
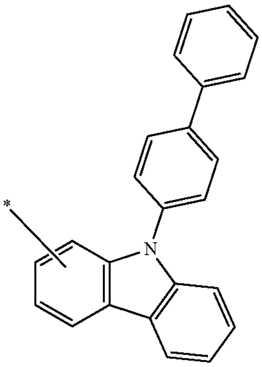
(R-97)
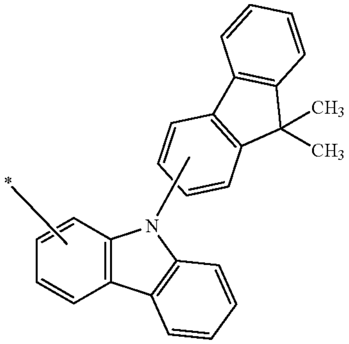
(R-98)
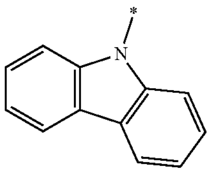
(R-99)
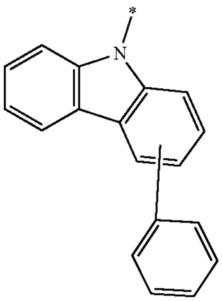
(R-100)
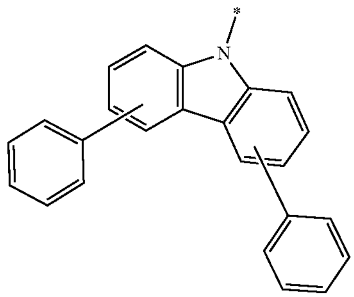

-continued
(R-101)
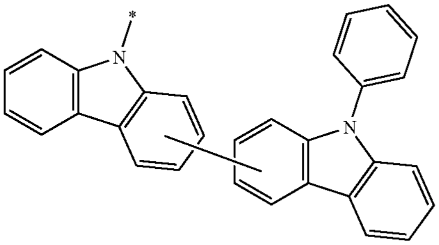
[Chemical Formula 17]
(R-102)
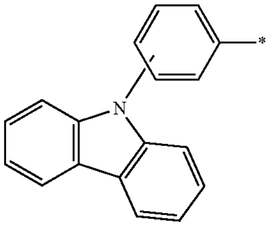
(R-103)
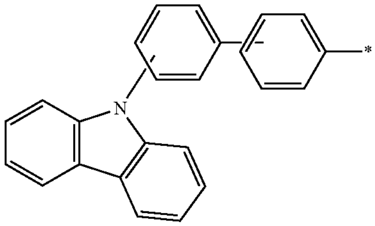
(R-104)
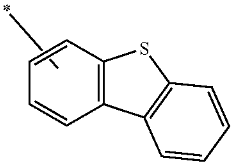
(R-105)
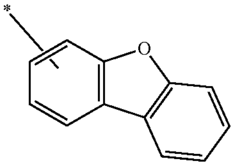
(R-106)
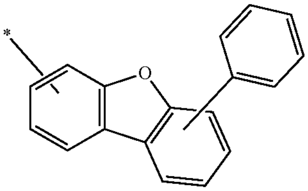
(R-107)
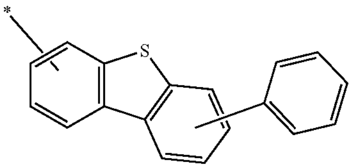
-continued
(R-108)
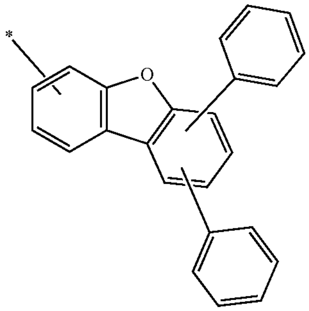
(R-109)
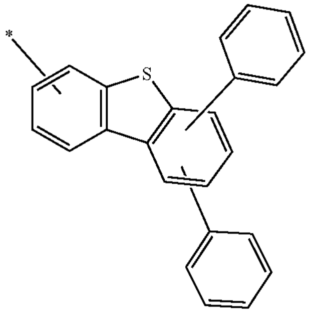
(R-110)
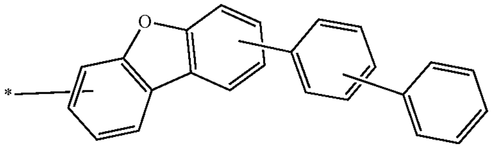
(R-111)
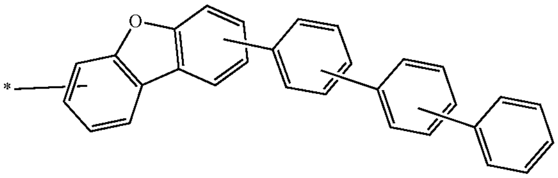
(R-112)
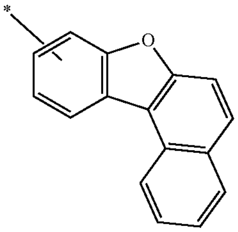
(R-113)
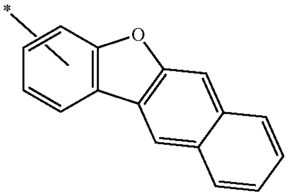
(R-114)
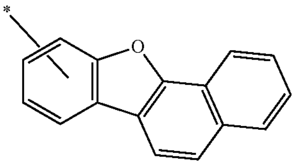

-continued
(R-115)
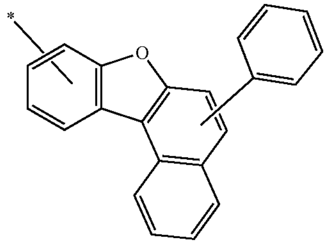
(R-116)
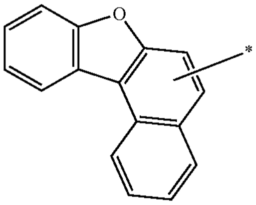
(R-117)
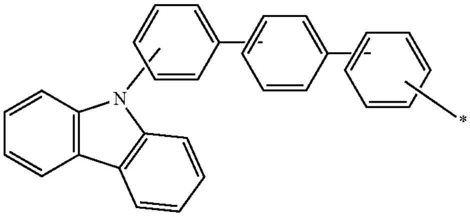
Next, specific examples of the organic compounds (the hole-transport materials) represented by General Formulae (Gh-1) to (Gh-6) are shown below.
[Chemical Formula 18]
(201)
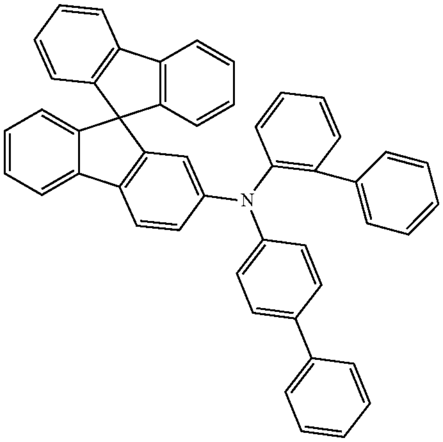
-continued
(202)
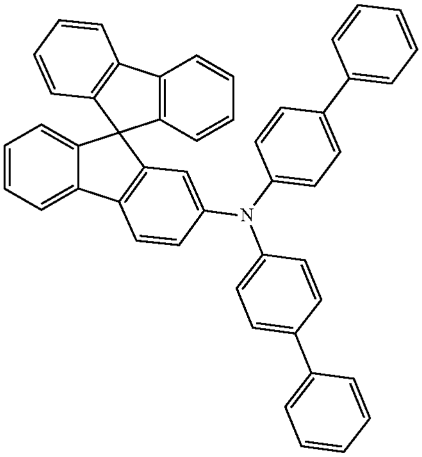
(203)
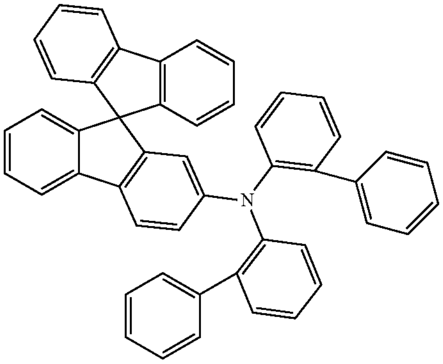
(204)
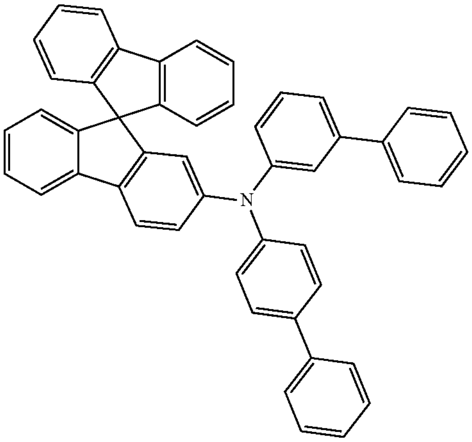
(205)
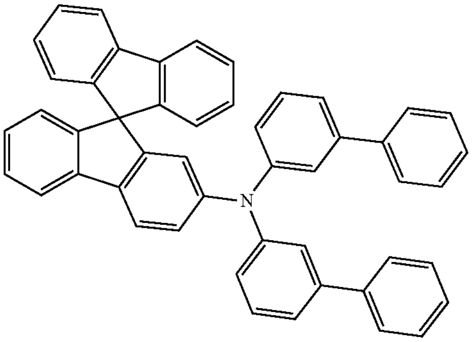

-continued
(206)
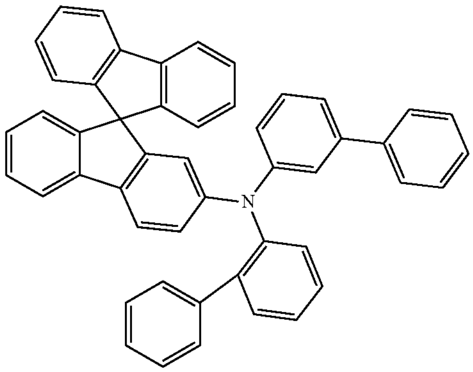
(207)
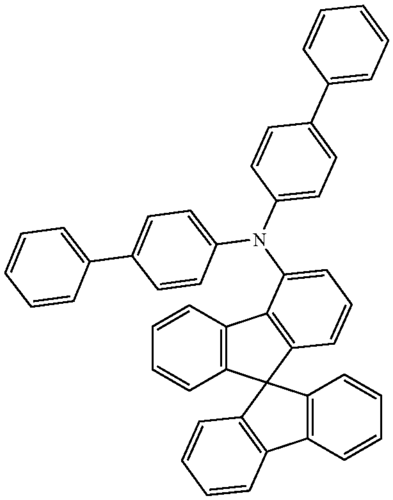
(208)
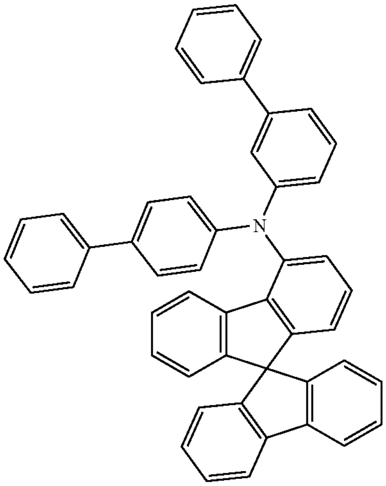
-continued
(209)
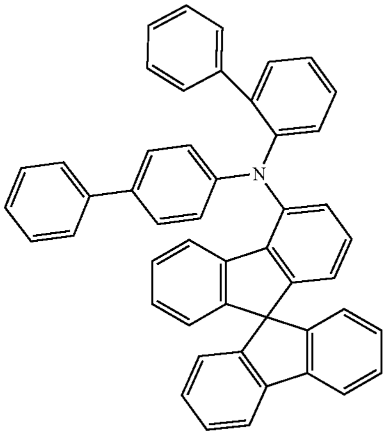
(210)
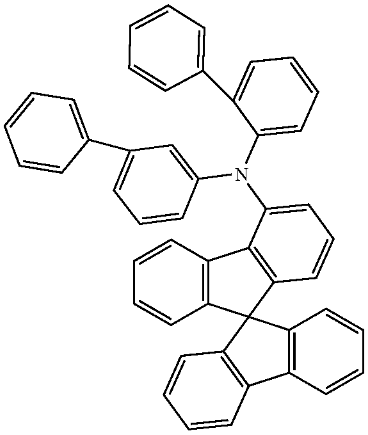
(211)
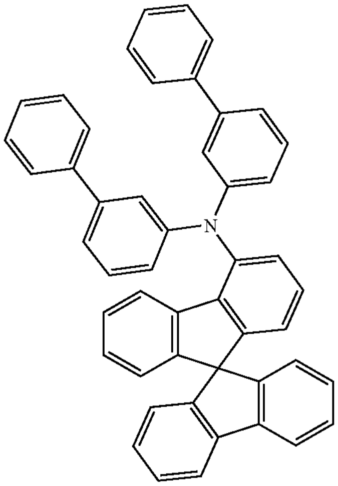

-continued
(212)
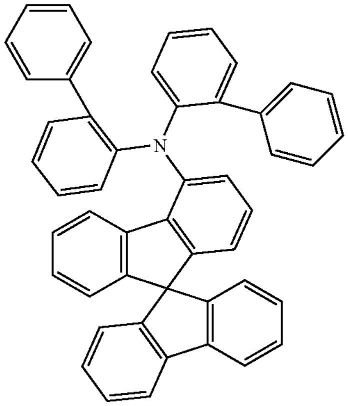
[Chemical Formula 19]
(213)
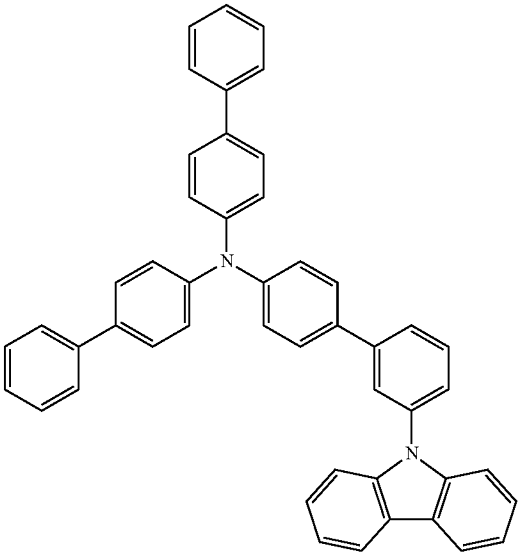
(214)
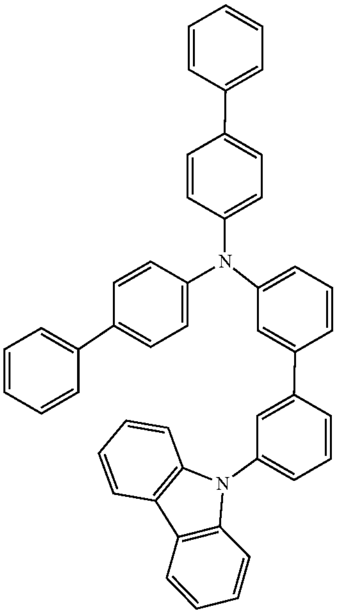
-continued
(215)
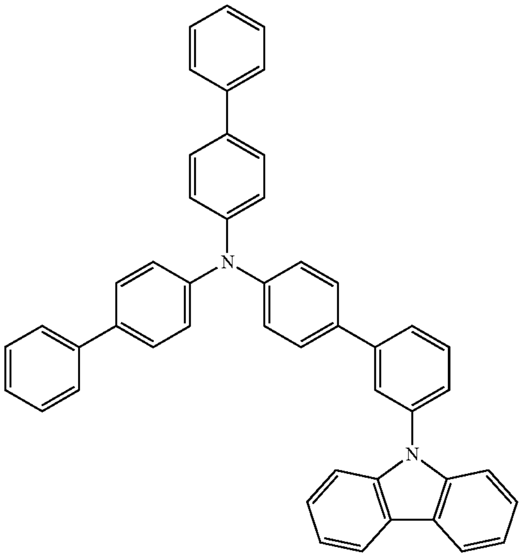
(216)
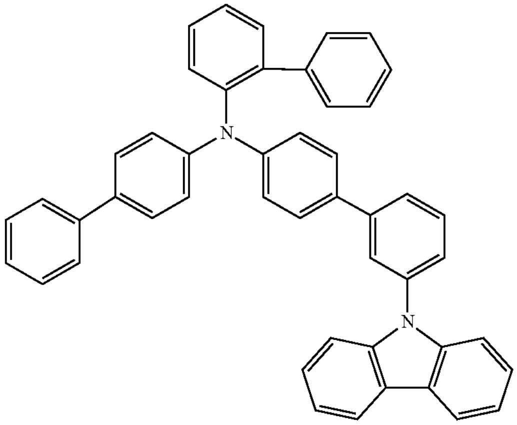
(217)
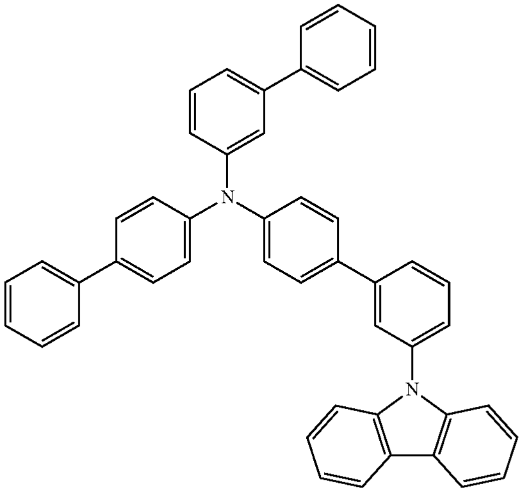

-continued
(218)
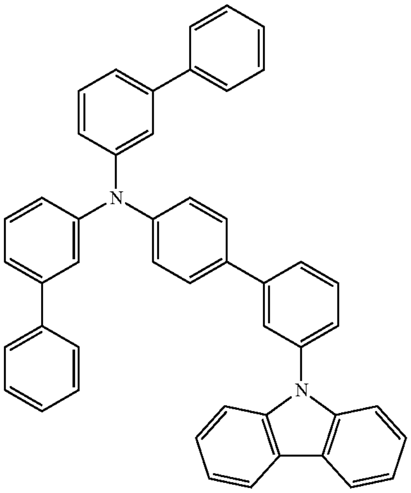
(219)
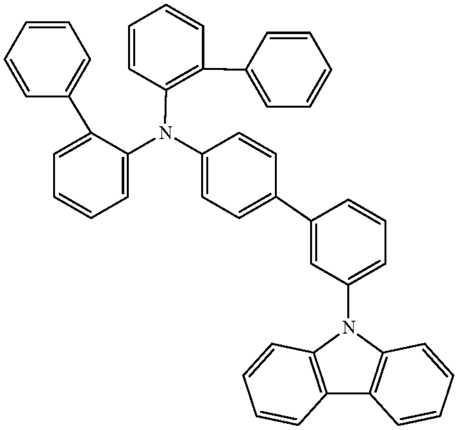
(220)
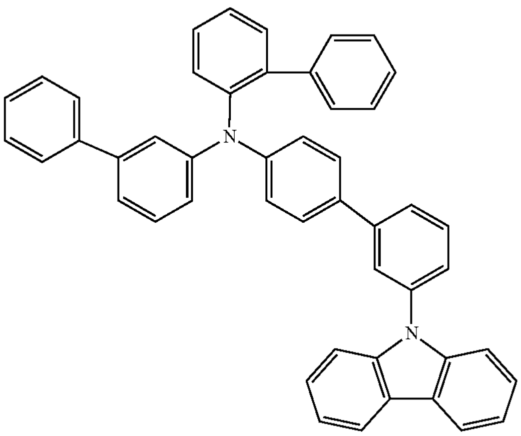
-continued
(221)
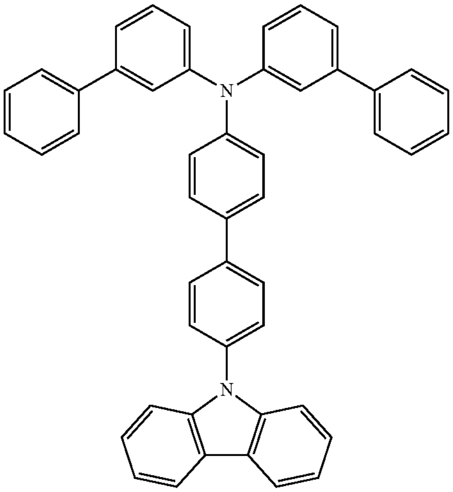
(222)
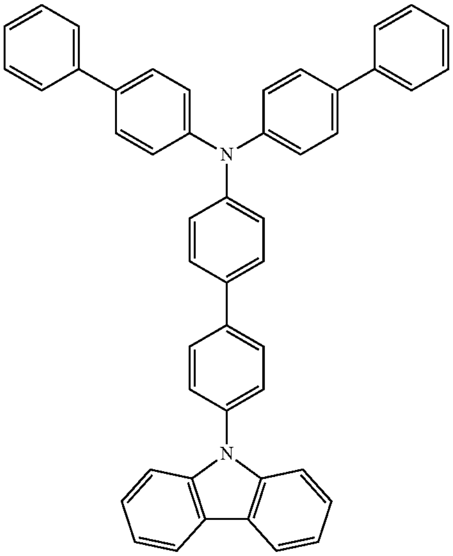
(223)
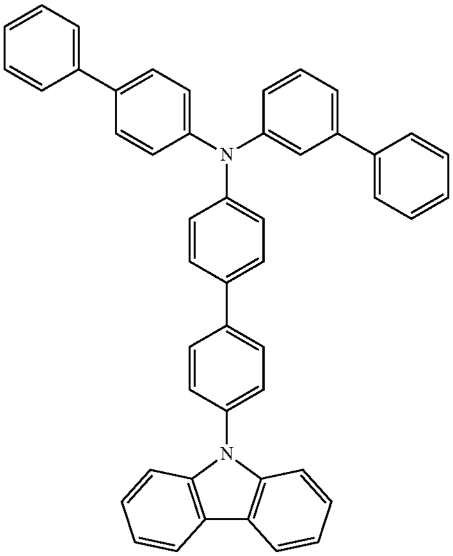

-continued
(224)
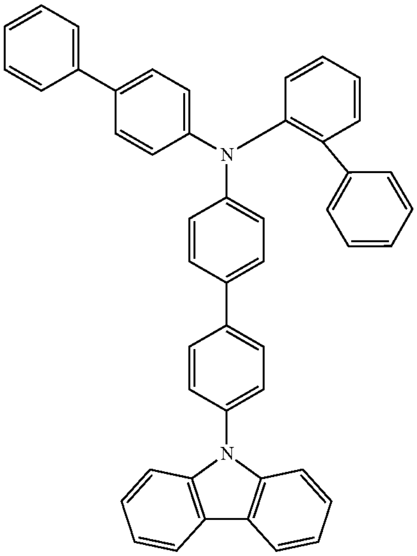
[Chemical Formula 20]
(225)
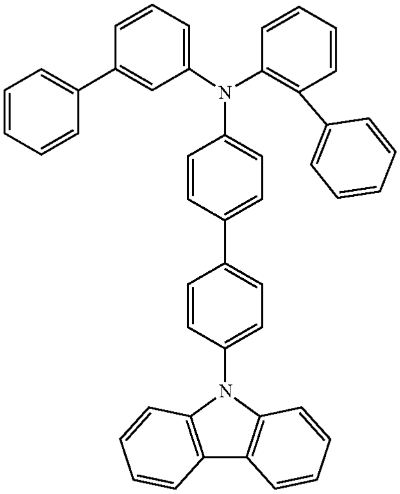
(226)
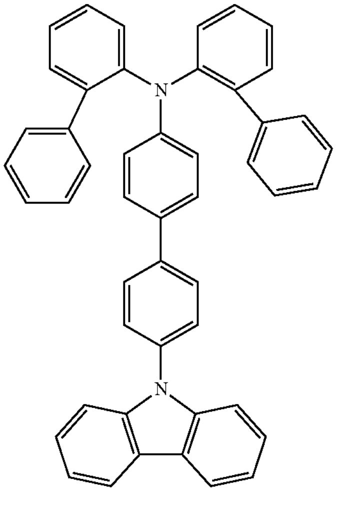
-continued
(227)
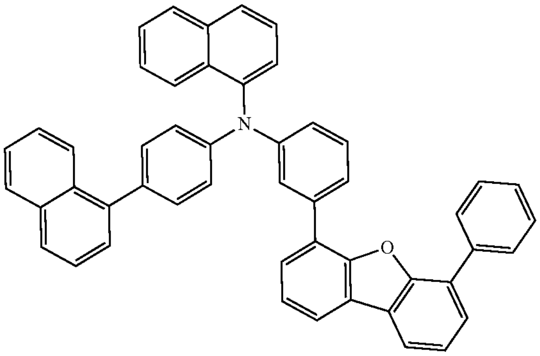
(228)
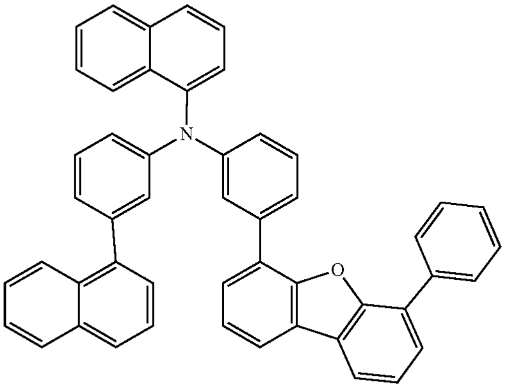
(229)
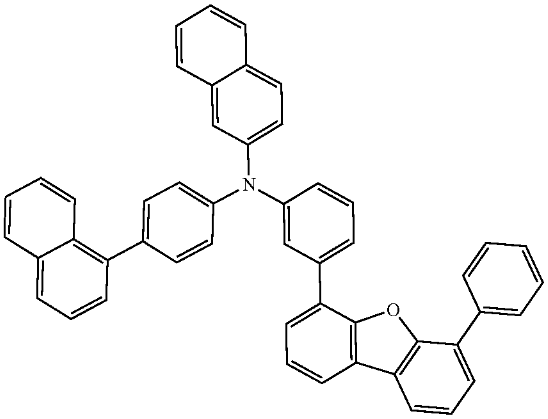
(230)
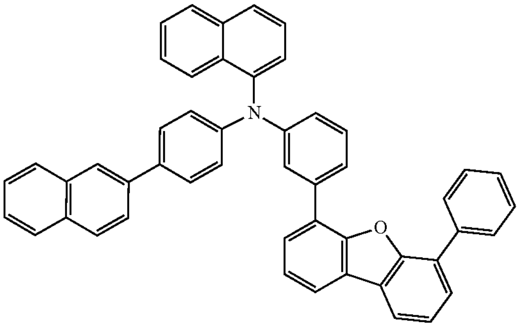

-continued
(231)
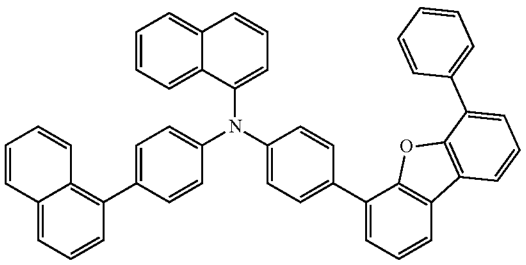
(232)
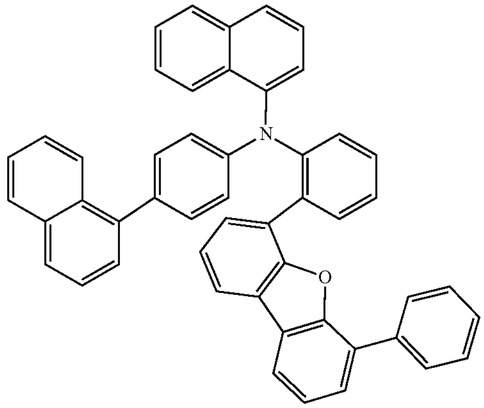
(233)
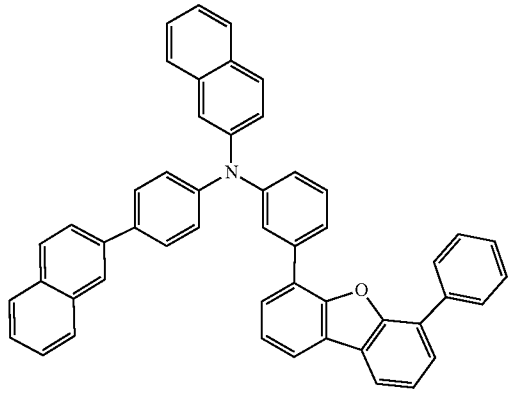
(234)
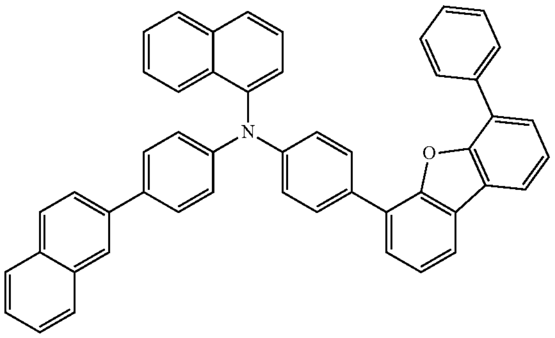
-continued
(235)
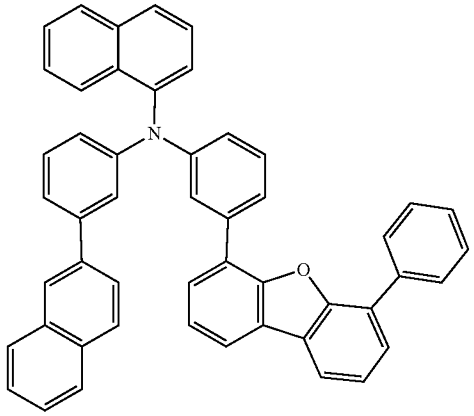
(236)
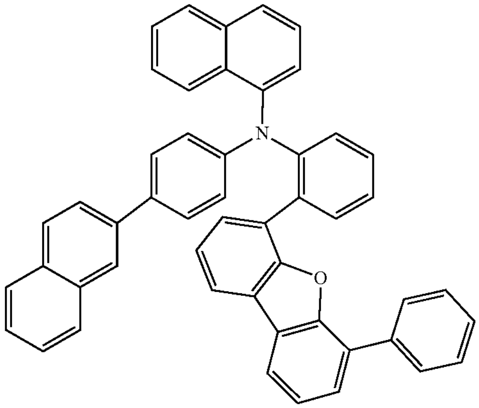
(237)
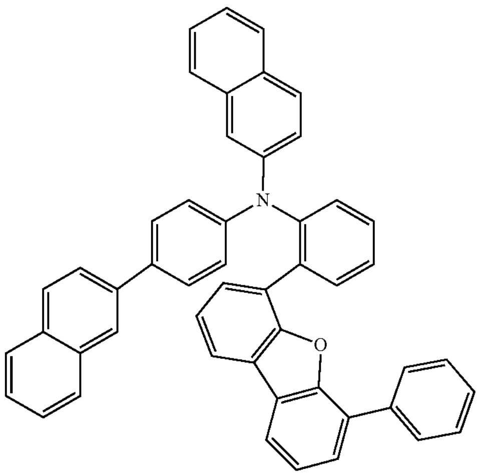

-continued
(238)
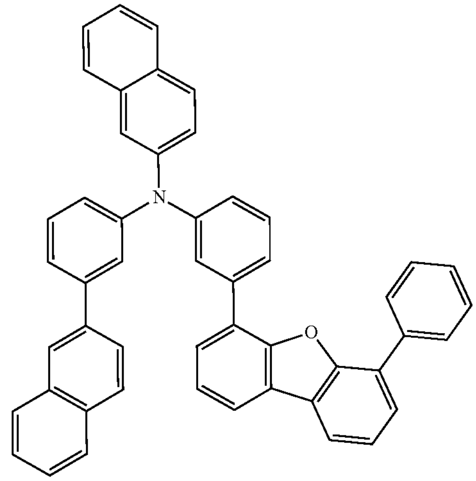
[Chemical Formula 21]
(239)
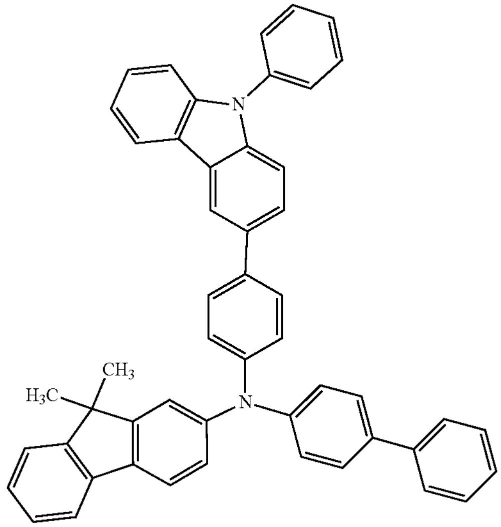
(240)
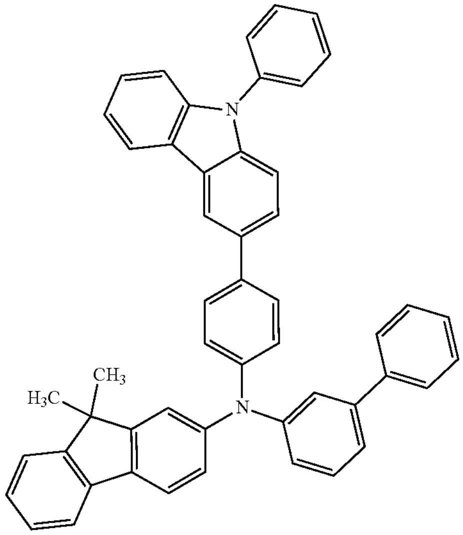
-continued
(241)
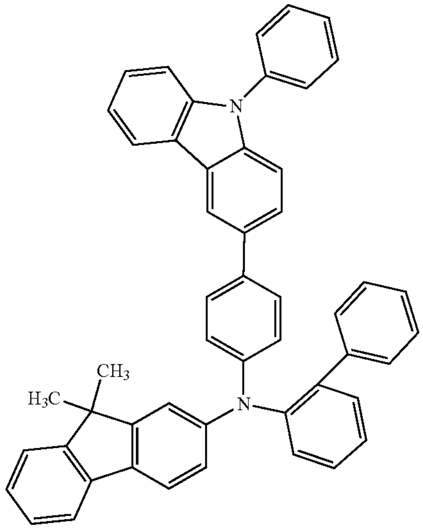
(242)
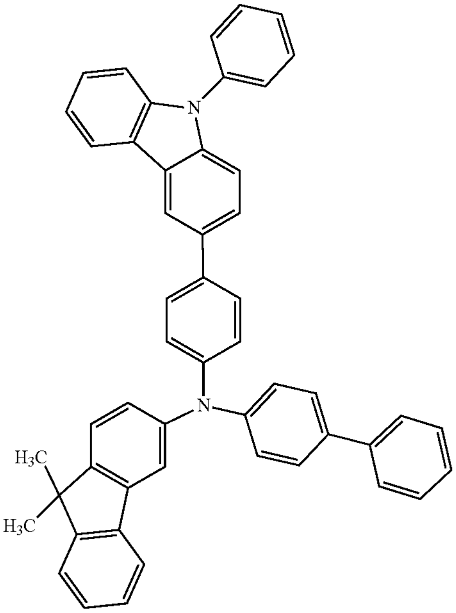
(243)
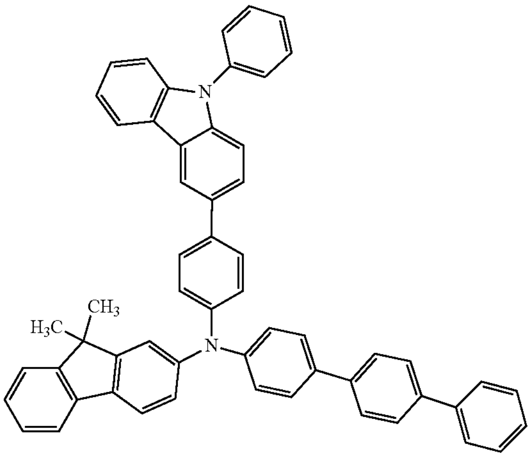

-continued
(244)
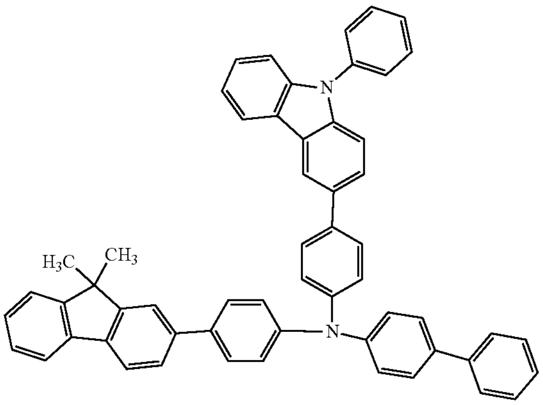
(245)
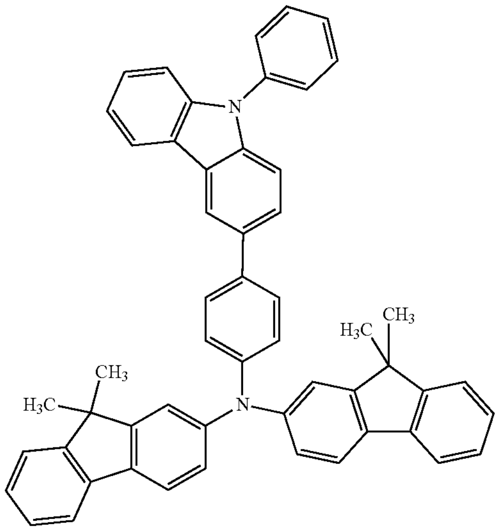
(246)
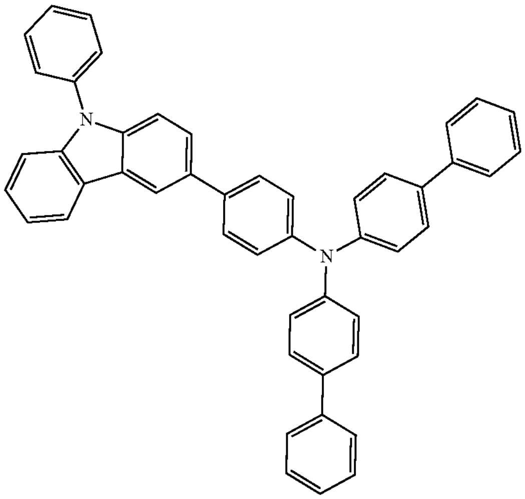
-continued
(247)
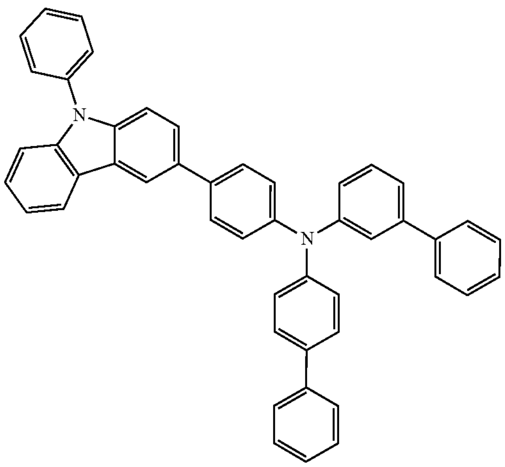
(248)
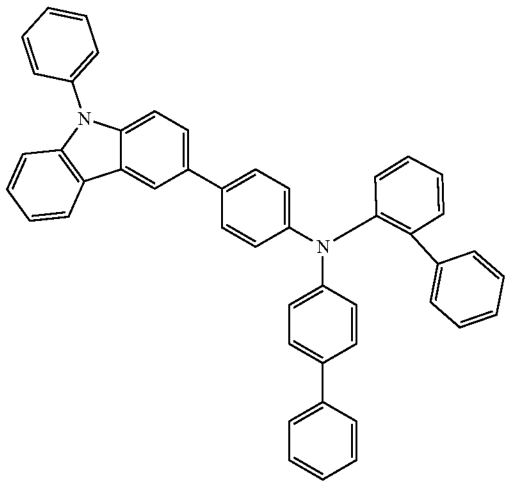
(249)
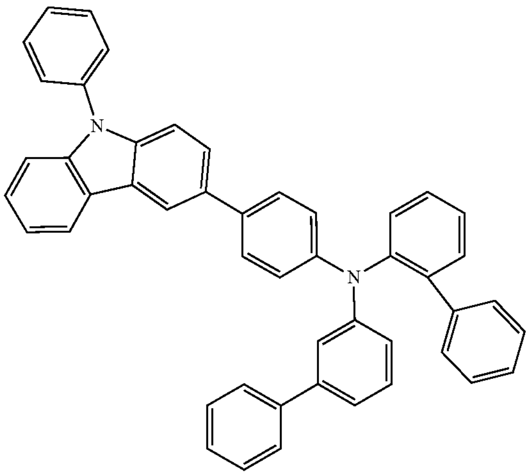

-continued
(250)
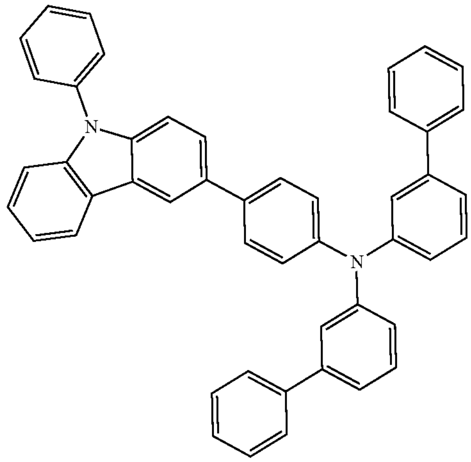
[Chemical Formula 22]
(251)
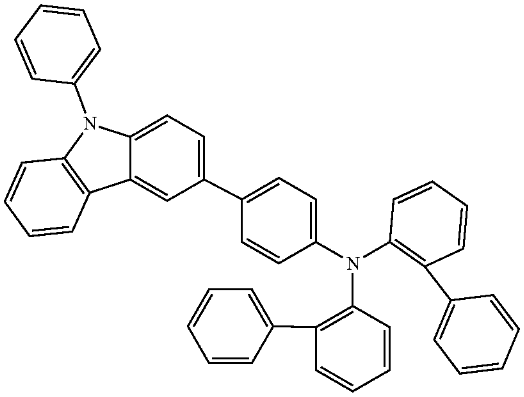
(252)
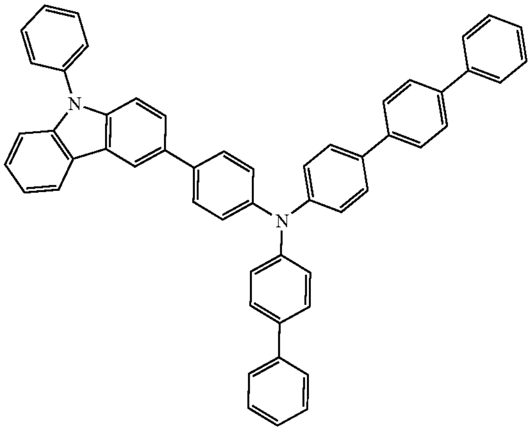
-continued
(253)
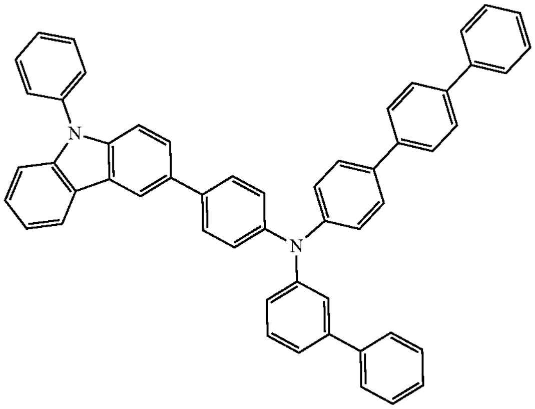
(254)
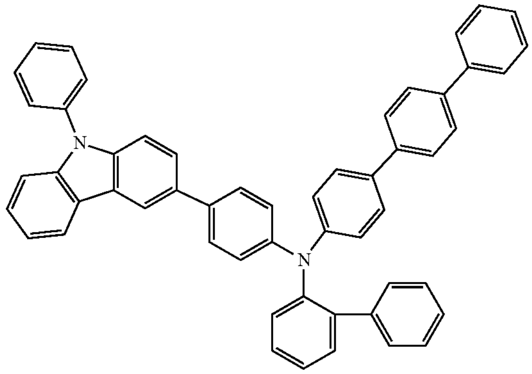
(255)
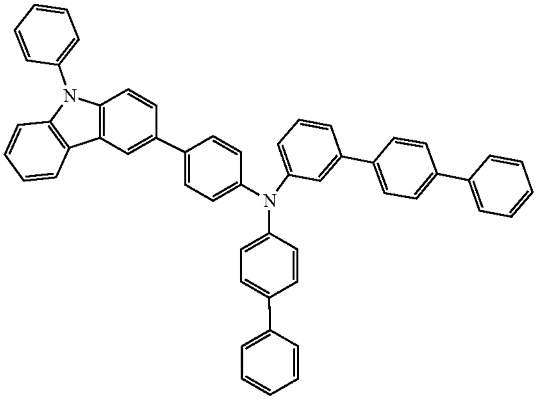

-continued
[Chemical Formula 23]
(256)
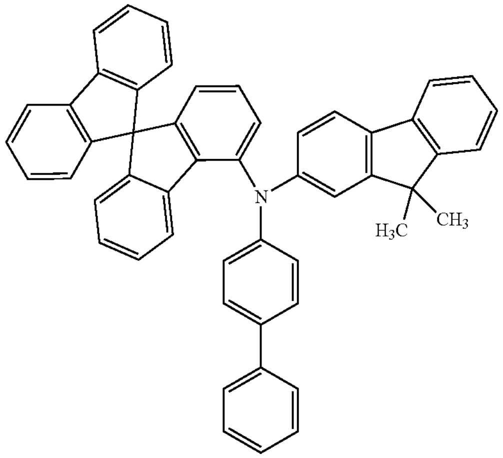
(257)
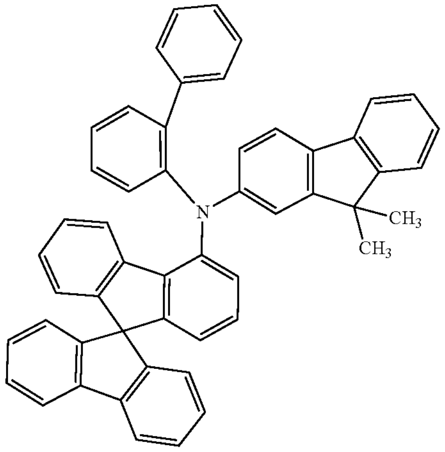
(258)
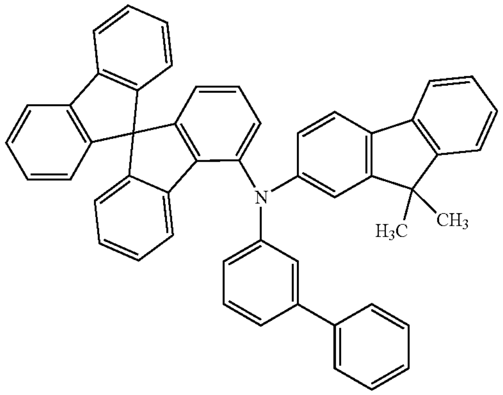
-continued
(259)
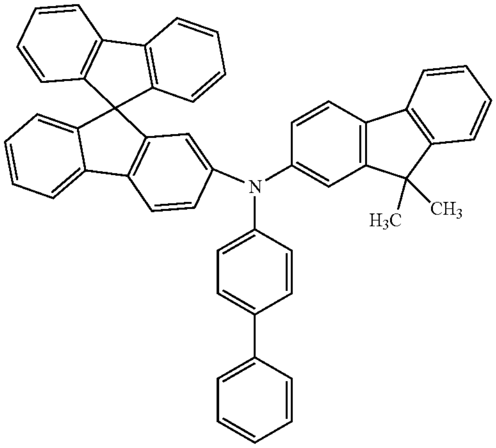
(260)
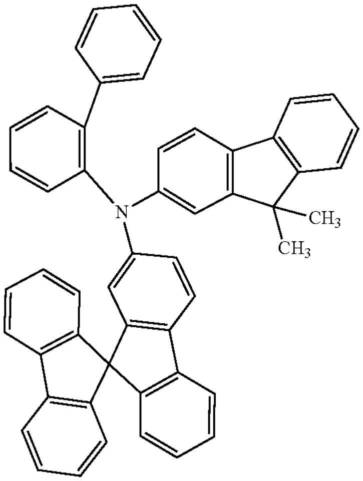
(261)
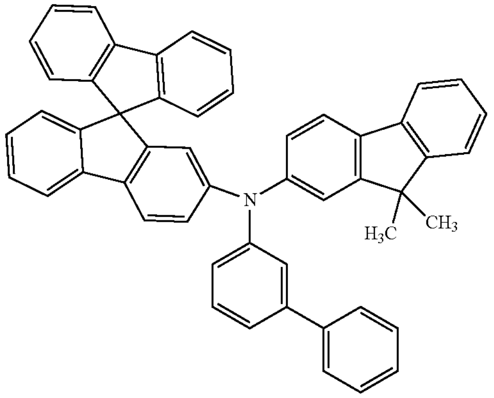

-continued
(262)
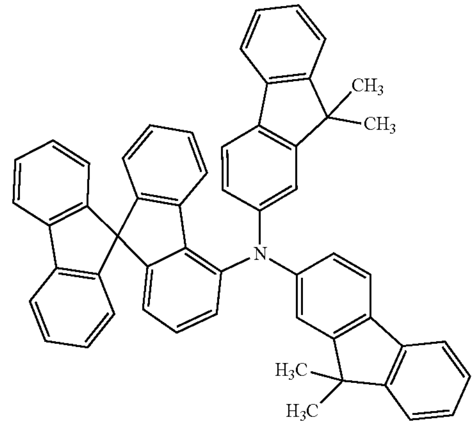
(263)
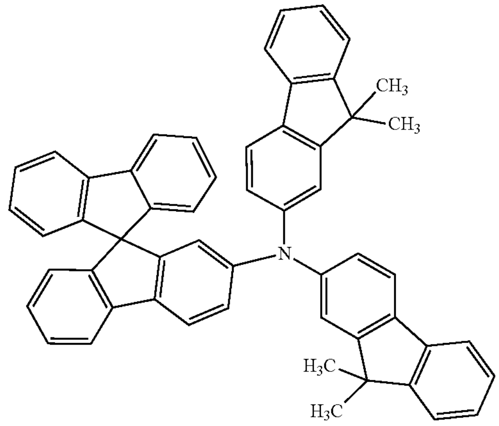
(264)
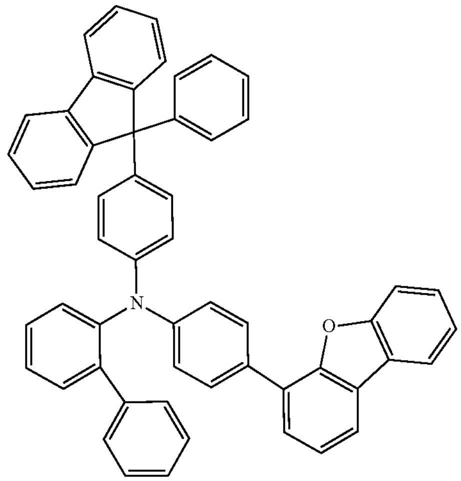
-continued
(265)
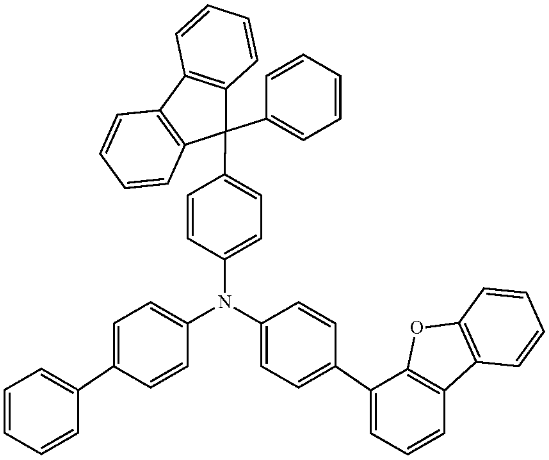
(266)
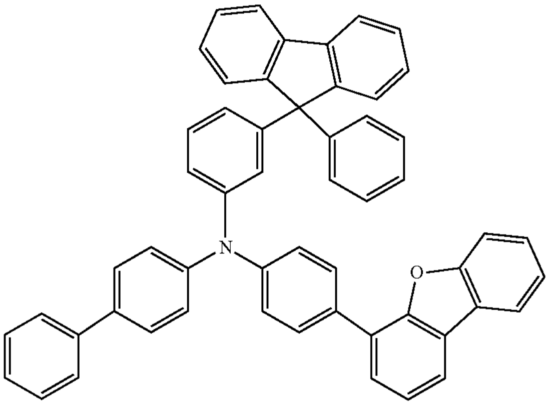
(267)
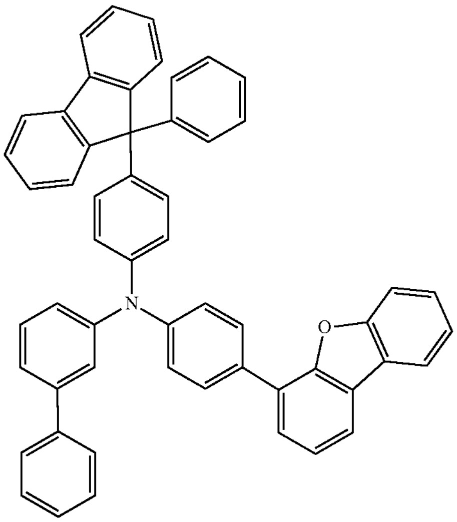

-continued
[Chemical Formula 24]
(268)
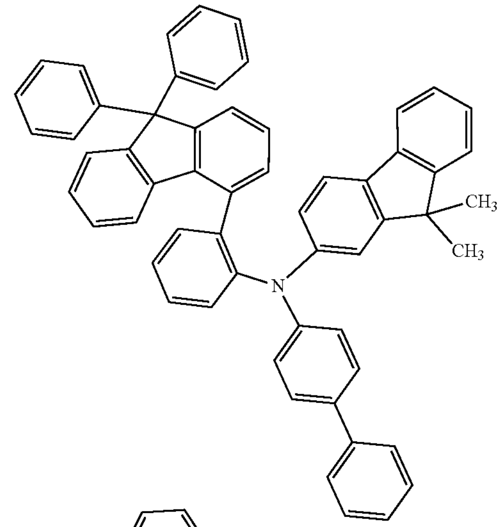
(269)
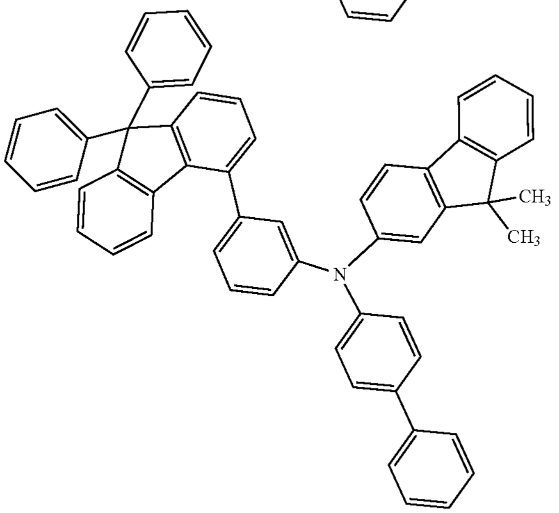
(270)
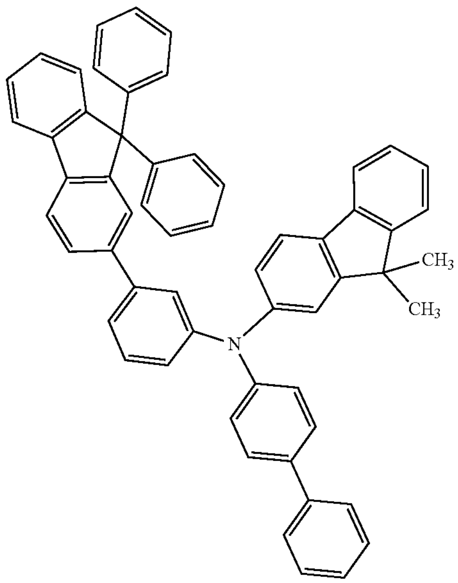
-continued
(271)
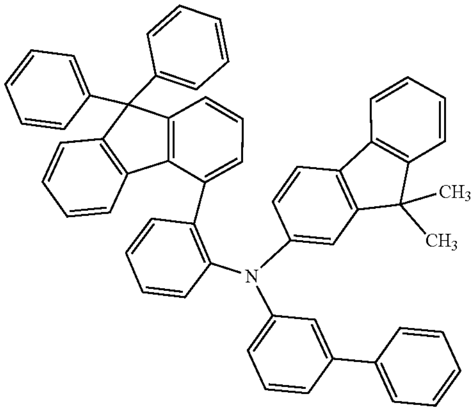
(272)
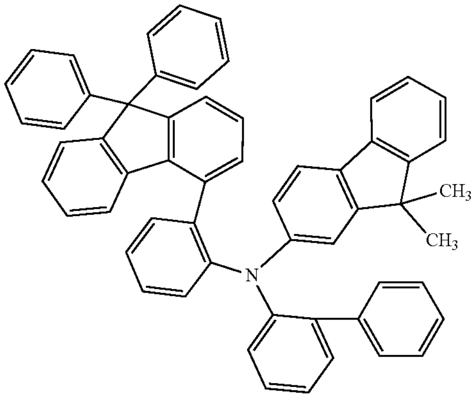
(273)
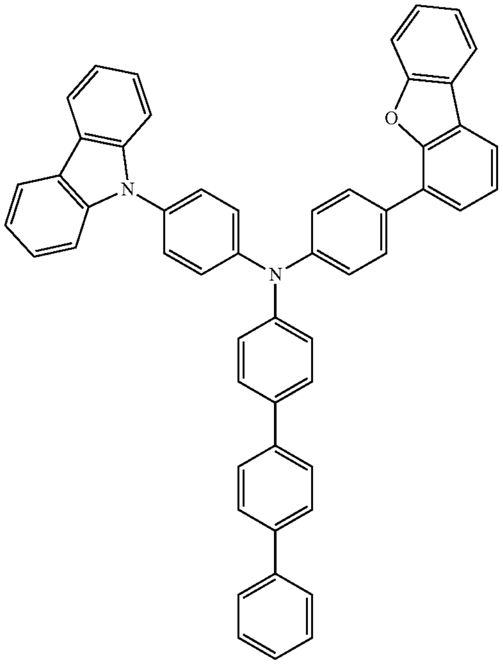

-continued
(274)
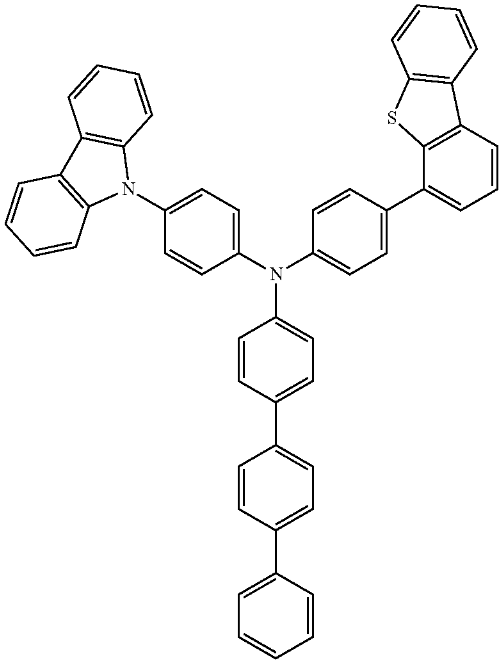
(275)
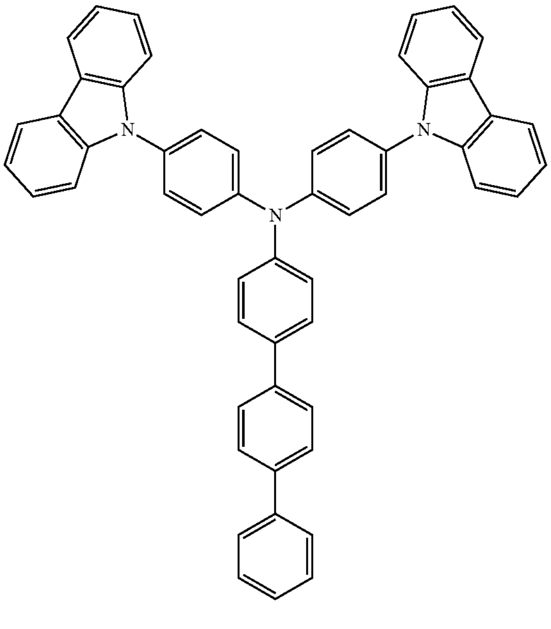
-continued
(276)
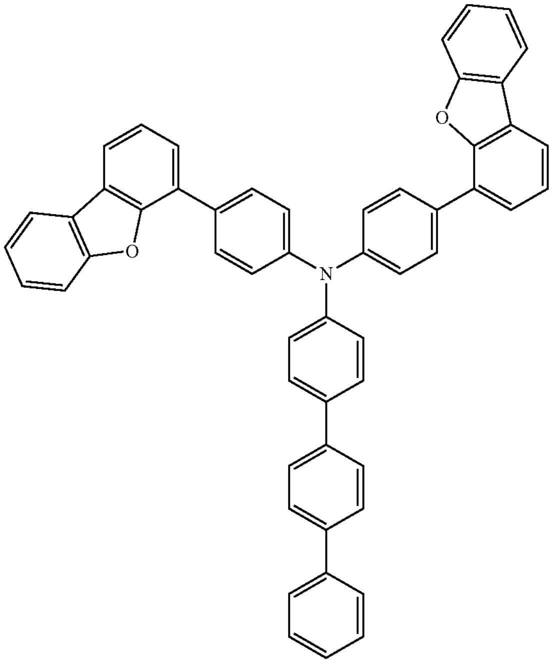
[Chemical Formula 25]
(277)
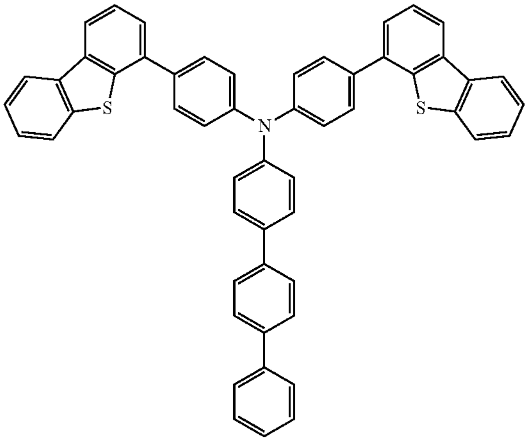
(278)
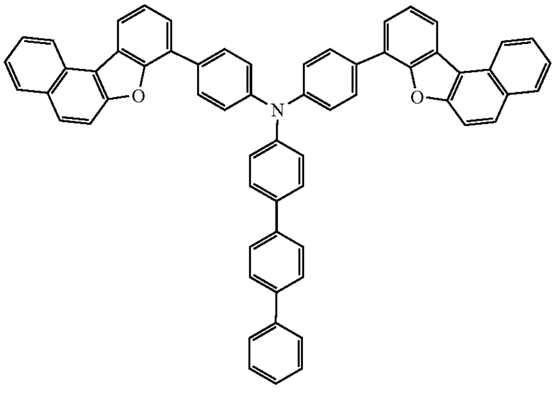

-continued
(279)
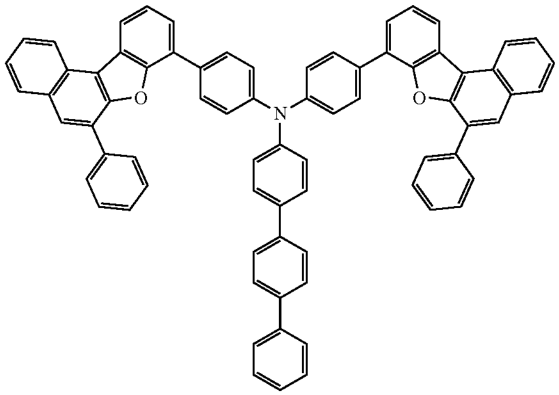
(280)
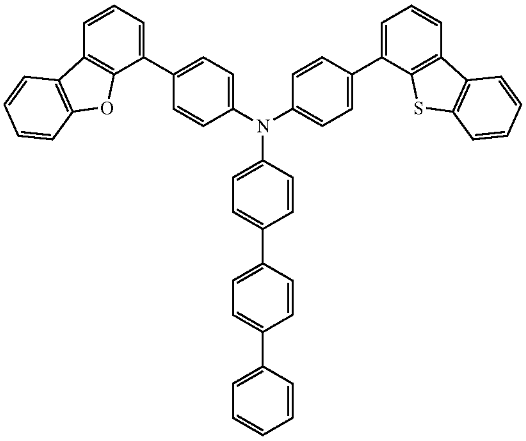
(281)
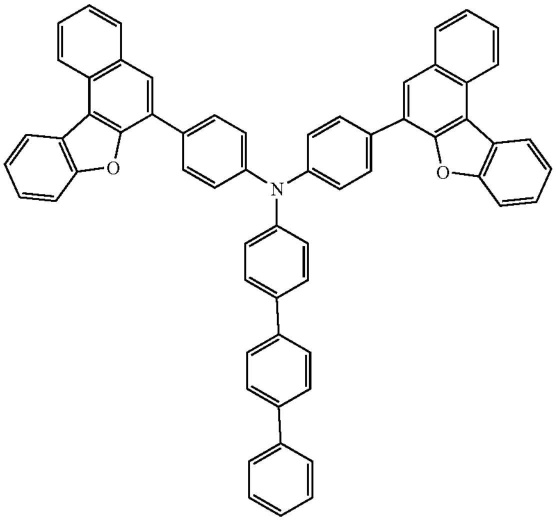
-continued
(282)
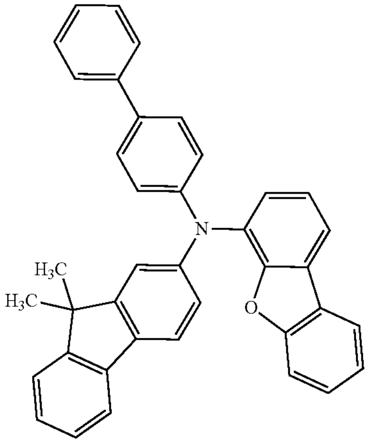
(283)
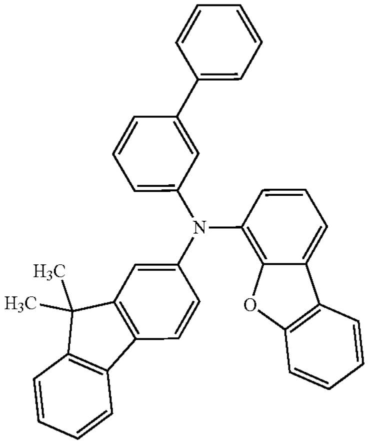
(284)
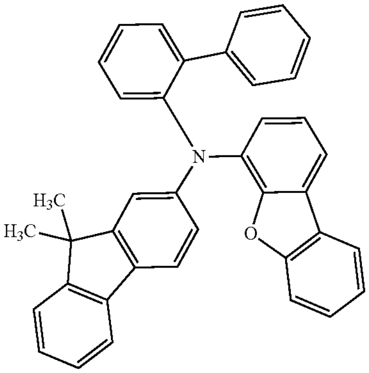

-continued
(285)
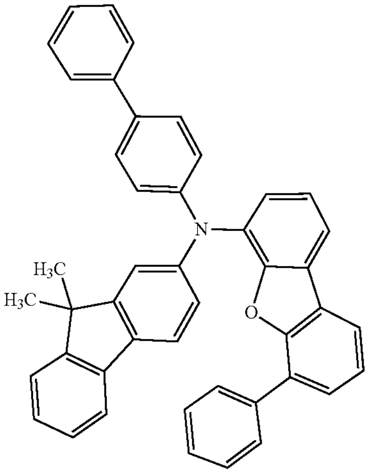
(286)
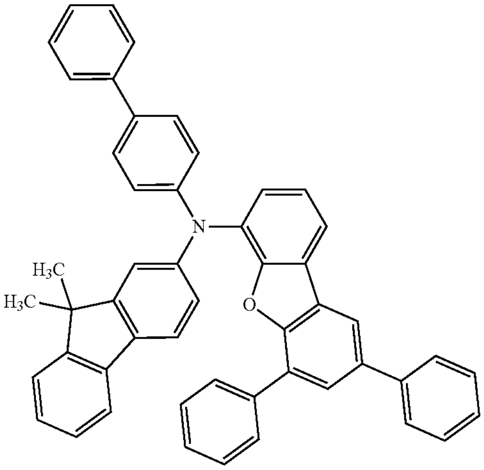
(287)
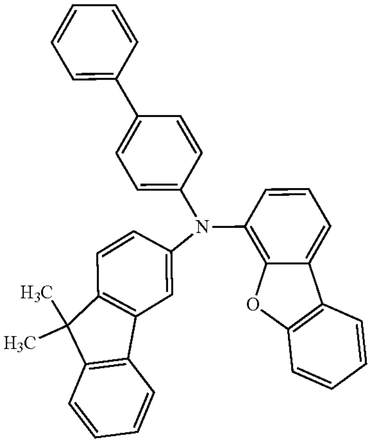
-continued
[Chemical Formula 26]
(288)
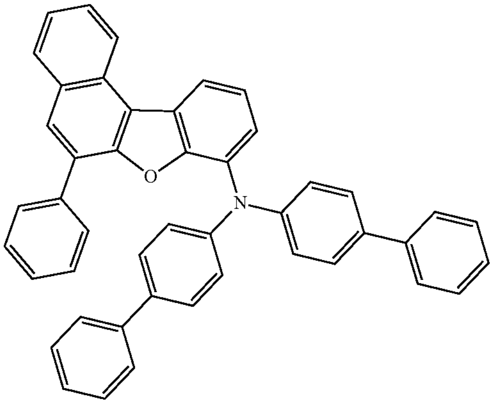
(289)
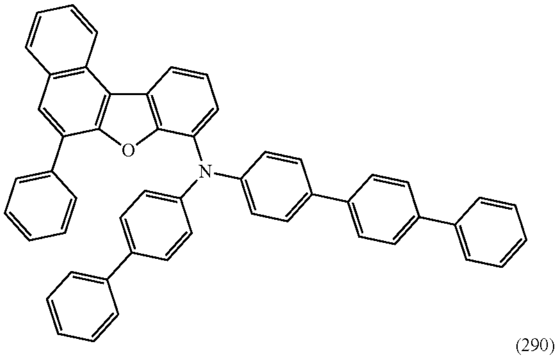
(290)
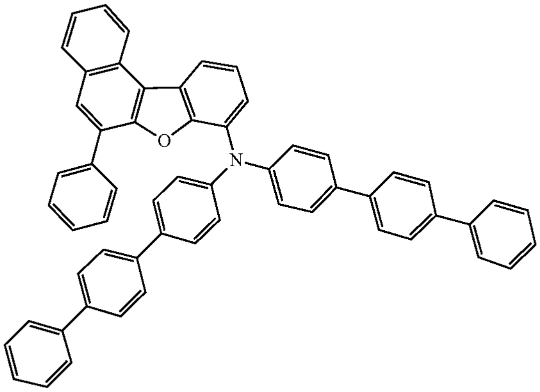
(291)
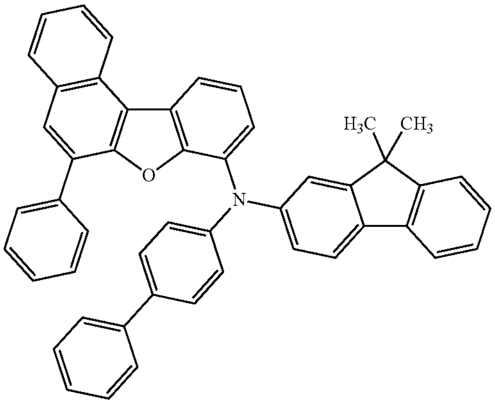

(292)
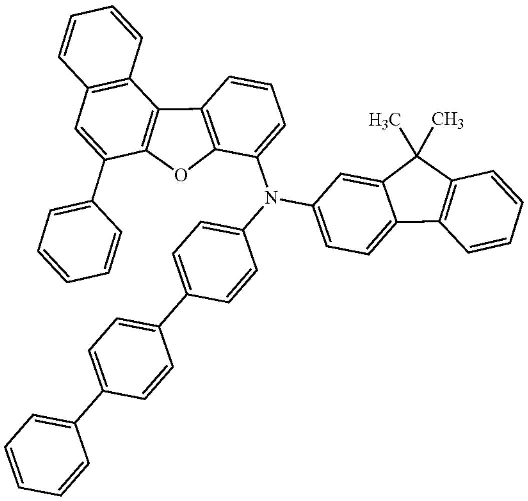
(293)
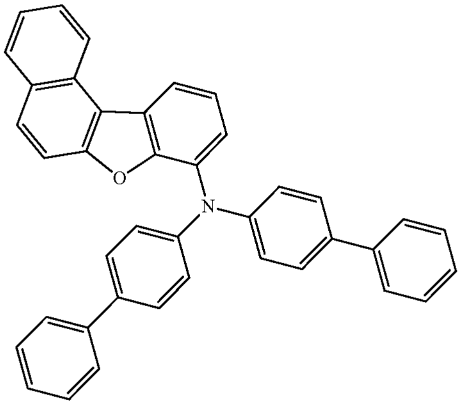
(294)
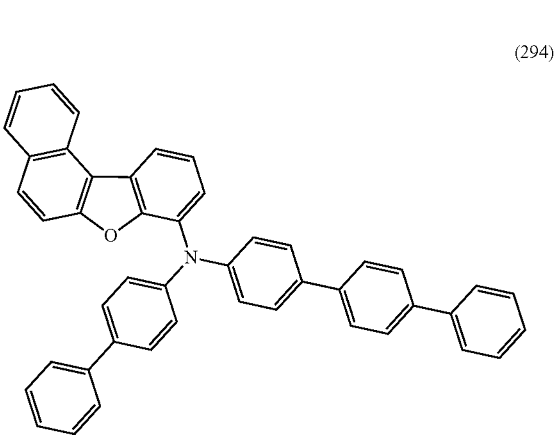
(295)
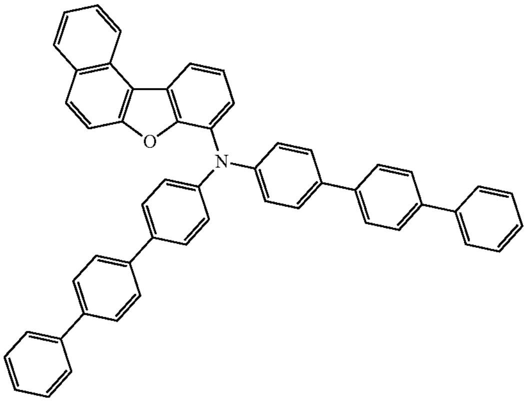
(296)
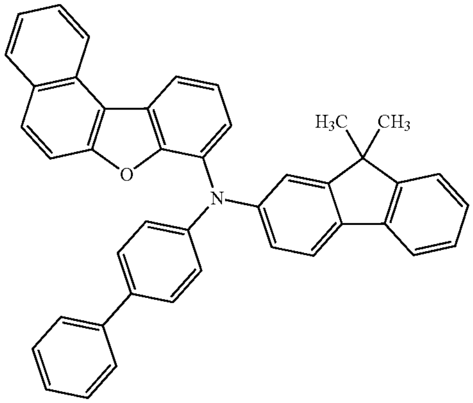
(297)
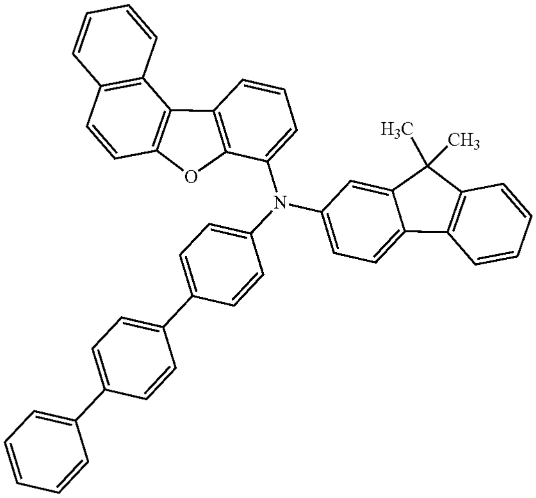

-continued
[Chemical Formula 27]
(298)
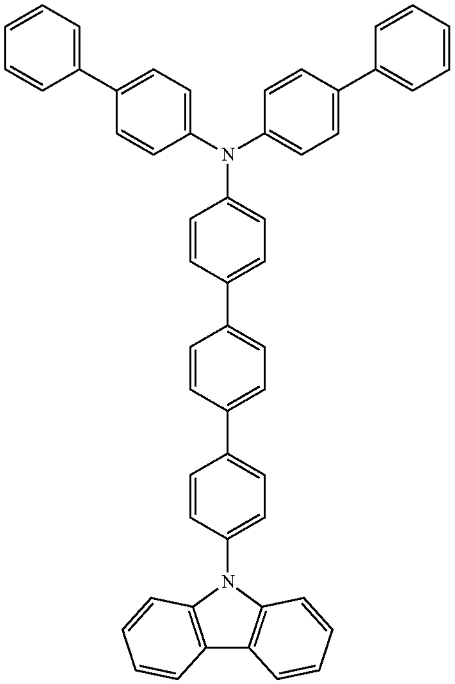
(299)
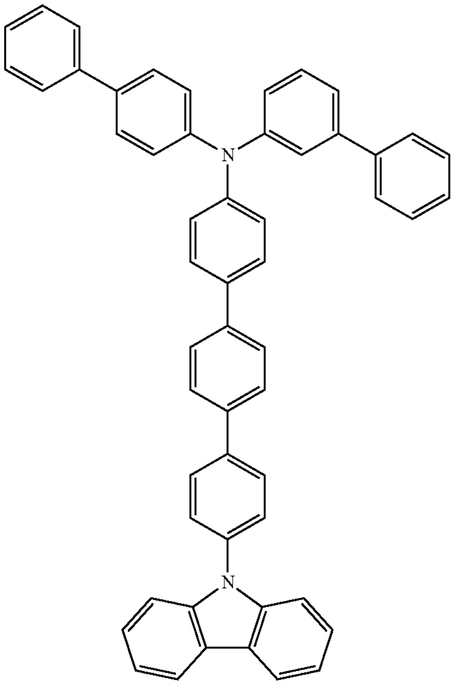
-continued
(300)
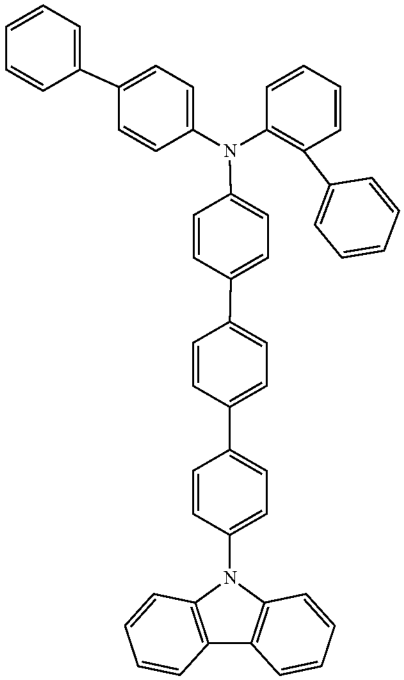
(301)
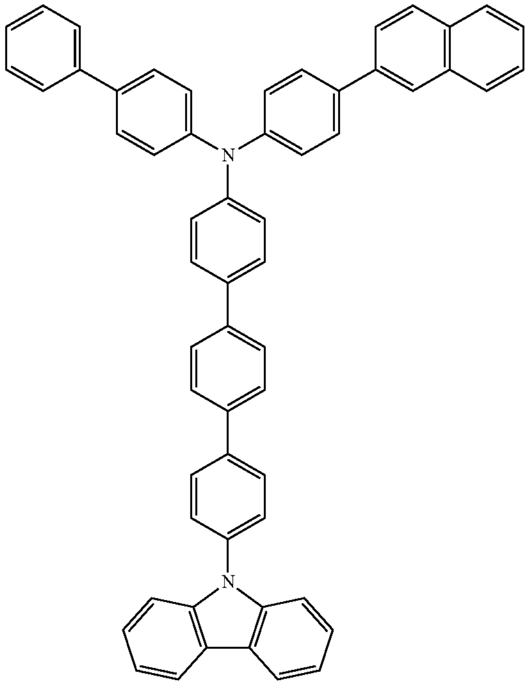

-continued (302)

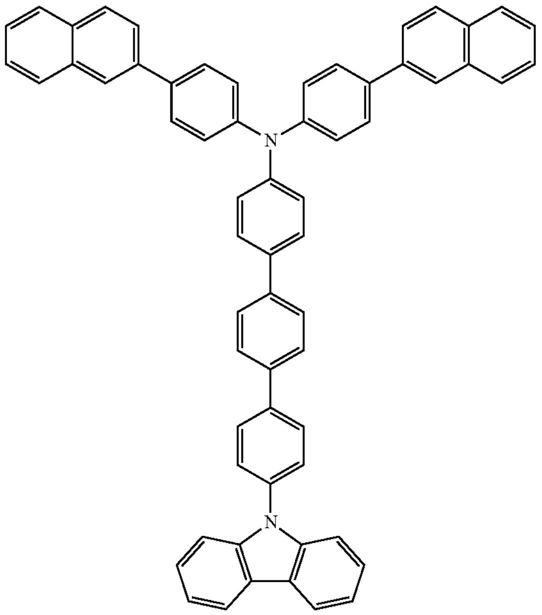

(303)

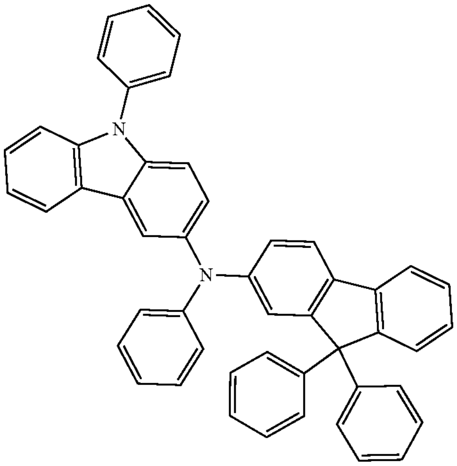

(304)

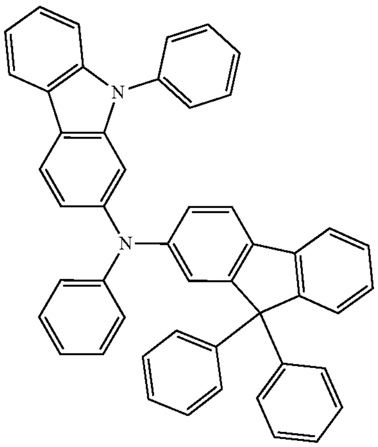

The organic compounds represented by Structural Formulae (201) to (302) are examples of the organic compounds (the hole-transport materials) represented by General Formulae (Gh-1) to (Gh-6), and the specific examples are not limited thereto.

The first carrier-transport layer 212 can also be formed using a material that can be used for a hole-transport layer 112 of the light-emitting device, which will be described in Embodiment 3.

The first carrier-transport layer 212 is not limited to a single layer, and may be a stack of two or more layers each containing any of the above substances.

In the photoelectric conversion device described in this embodiment, the active layer 213 can be formed using the same organic compound as the first carrier-transport layer 212. The use of the same organic compound for the first carrier-transport layer 212 and the active layer 213 is preferable, in which case carriers can be efficiently transported from the first carrier-transport layer 212 to the active layer 213.

<Active Layer>

The active layer 213 generates carriers on the basis of incident light and contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

The active layer 213 contains at least a p-type semiconductor material and an n-type semiconductor material.

Examples of the p-type semiconductor material include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The p-type semiconductor material is preferably an organic compound represented by General Formula (Ga-1) below.

[Chemical Formula 28]

(Ga-1)

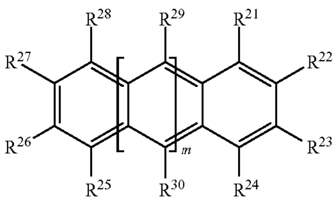

In General Formula (Ga-1), each of $R^{21}$ to $R^{30}$ independently represents hydrogen, a substituted or unsubstituted alkyl group having 1 to 13 carbon atoms, a cycloalkyl group having 3 to 13 carbon atoms, halogen, a substituted or unsubstituted alkyl halide group having 1 to 13 carbon atoms, a cyano group, a substituted or unsubstituted alkoxy group having 1 to 13 carbon atoms, a substituted or unsubstituted aryl group having 6 to 30 carbon atoms, or a substituted or unsubstituted heteroaryl group having 2 to 30 carbon atoms, and m represents an integer of 2 to 5.

In General Formula (Ga-1), each of $R^{21}$ to $R^{30}$ is preferably a substituent represented by any of Formulae (Ra-1) to (Ra-77) below. Note that * in the formula represents a bond.

[Chemical Formula 29]

(Ra-1)

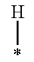

(Ra-2)

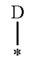

(Ra-3)

(Ra-4)

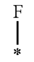

(Ra-5)

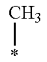

(Ra-6)

(Ra-7)

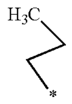

(Ra-8)

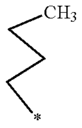

(Ra-9)

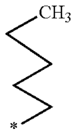

(Ra-10)

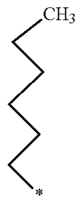

-continued (Ra-11)

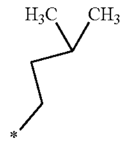

(Ra-12)

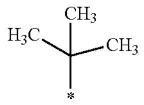

(Ra-13)

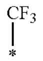

(Ra-14)

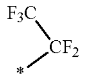

(Ra-15)

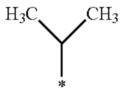

(Ra-16)

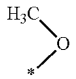

(Ra-17)

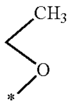

(Ra-18)

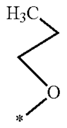

(Ra-19)

(Ra-20)

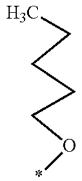

(Ra-21)

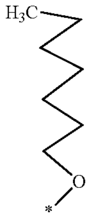

(Ra-22)

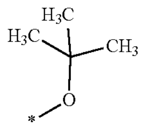

-continued
(Ra-23)
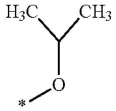
[Chemical Formula 30]
(Ra-24)
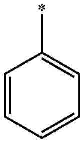
(Ra-25)
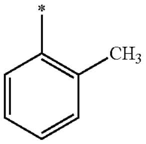
(Ra-26)
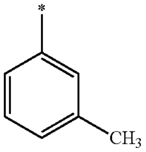
(Ra-27)
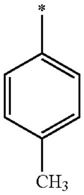
(Ra-28)
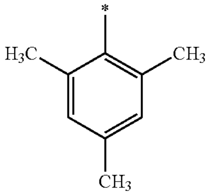
(Ra-29)
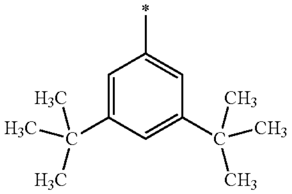
(Ra-30)
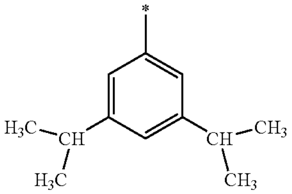
(Ra-31)
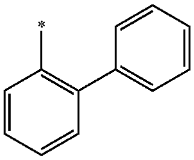
-continued
(Ra-32)
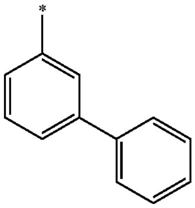
(Ra-33)
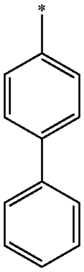
(Ra-34)
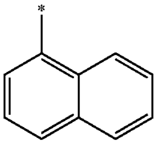
(Ra-35)
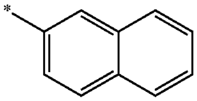
(Ra-36)
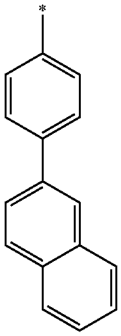
(Ra-37)
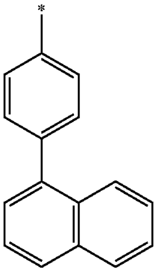

-continued
(Ra-38)
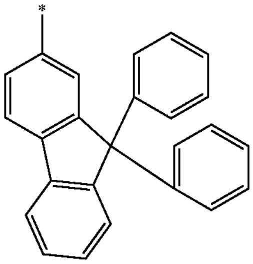
(Ra-39)
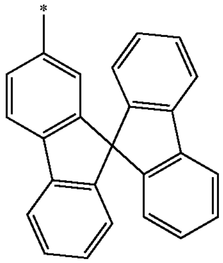
[Chemical Formula 31]
(Ra-40)
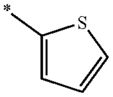
(Ra-41)
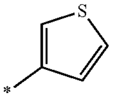
(Ra-42)
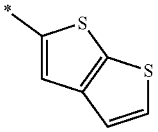
(Ra-43)
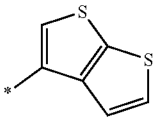
(Ra-44)
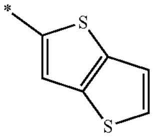
(Ra-45)
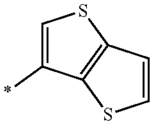
(Ra-46)
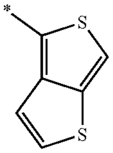
-continued
(Ra-47)
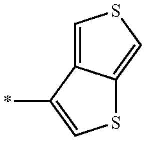
(Ra-48)
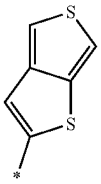
(Ra-49)
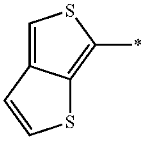
(Ra-50)
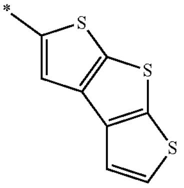
(Ra-51)
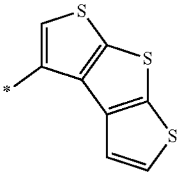
(Ra-52)
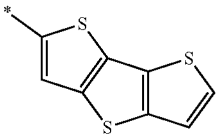
(Ra-53)
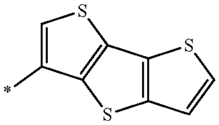
(Ra-54)
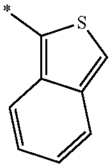
(Ra-55)
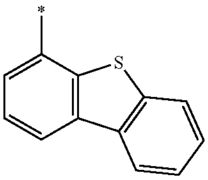

-continued
(Ra-56)
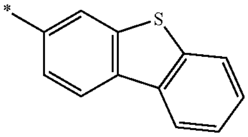
(Ra-57)
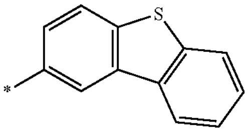
(Ra-58)
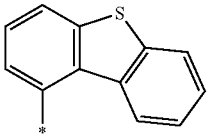
(Ra-59)
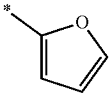
(Ra-60)
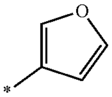
(Ra-61)
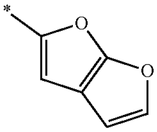
(Ra-62)
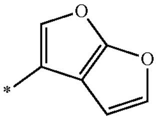
(Ra-63)
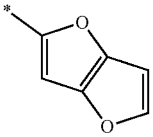
(Ra-64)
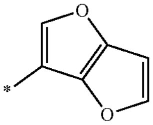
(Ra-65)
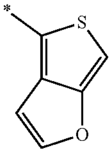
(Ra-66)
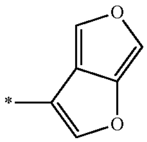
-continued
(Ra-67)
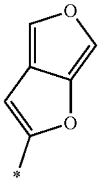
(Ra-68)
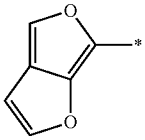
(Ra-69)
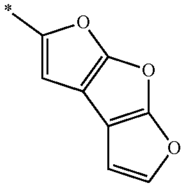
(Ra-70)
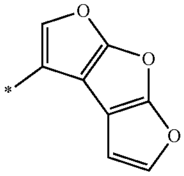
(Ra-71)
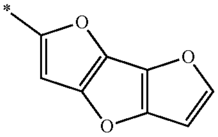
(Ra-72)
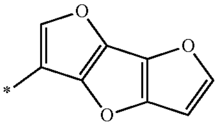
(Ra-73)
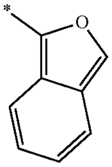
(Ra-74)
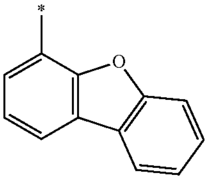
(Ra-75)
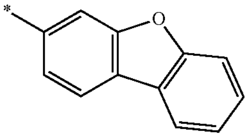

-continued
(Ra-76)
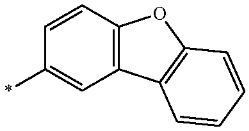
(Ra-77)
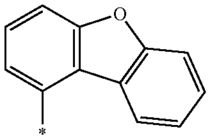
Next, specific examples of the p-type semiconductor material represented by General Formula (Ga-1) are shown below.
[Chemical Formula 32]
(101)
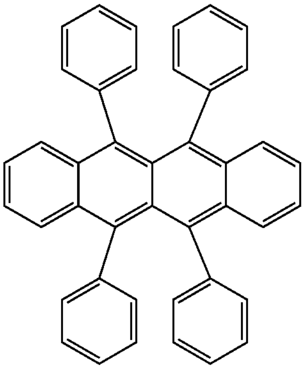
(102)
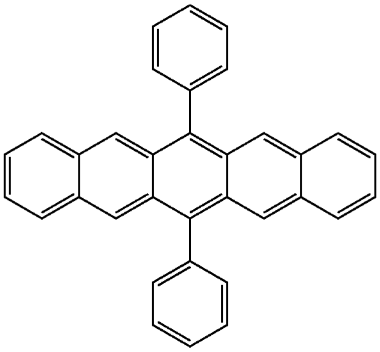
(103)
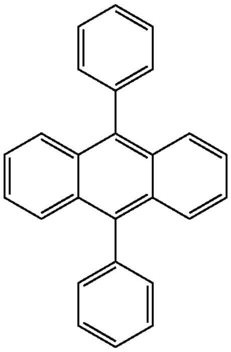
-continued
(104)
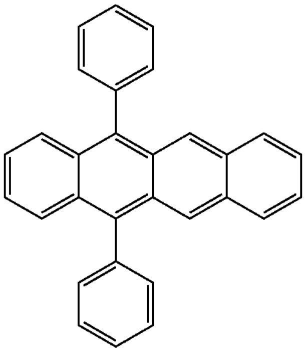
(105)
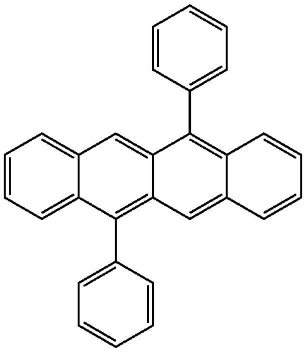
(106)
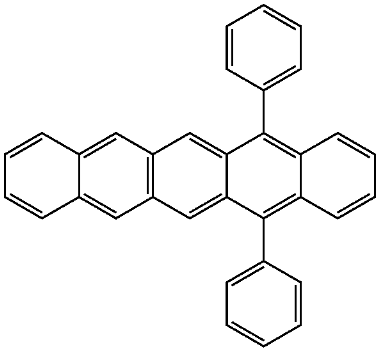
(107)
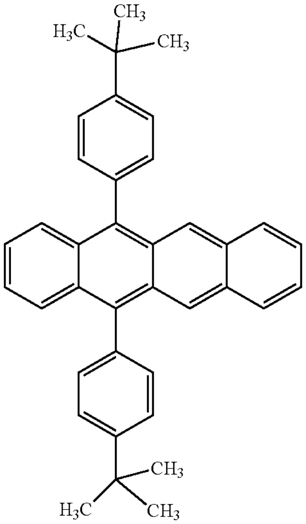

-continued
(108)
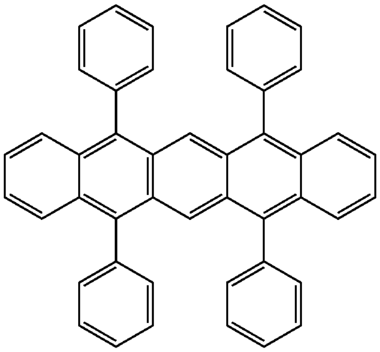
(109)
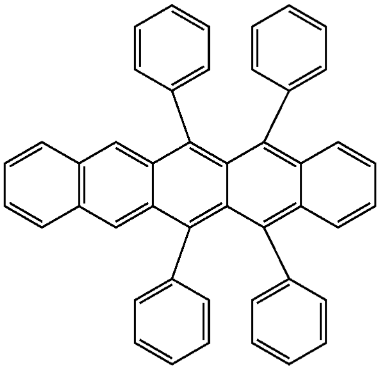
(110)
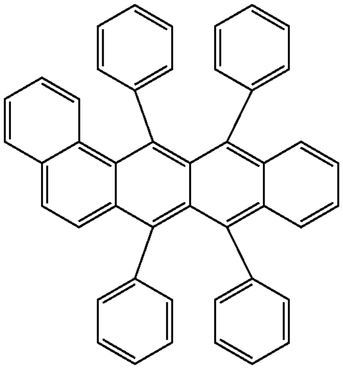
[Chemical Formula 33]
(111)
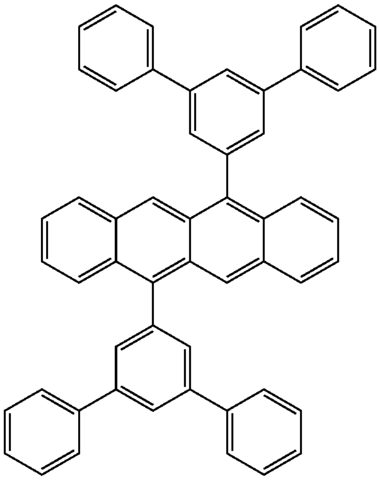
-continued
(112)
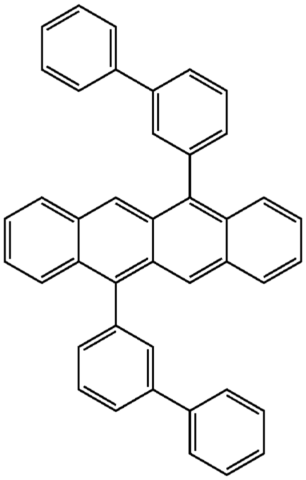
(113)
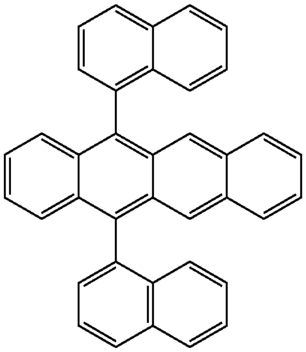
(114)
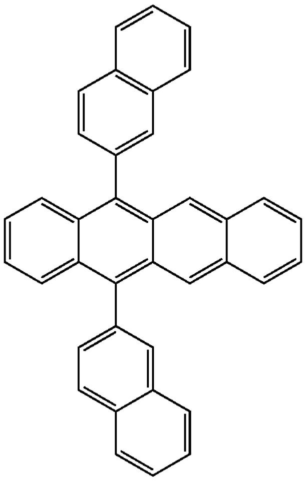

-continued (115)

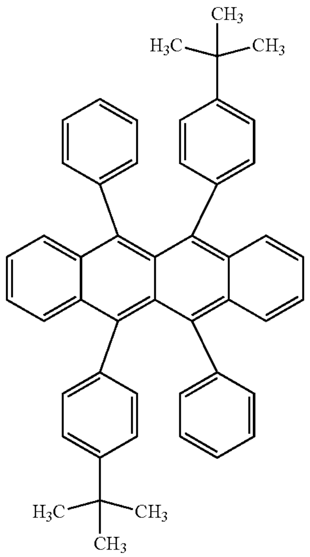

(116)

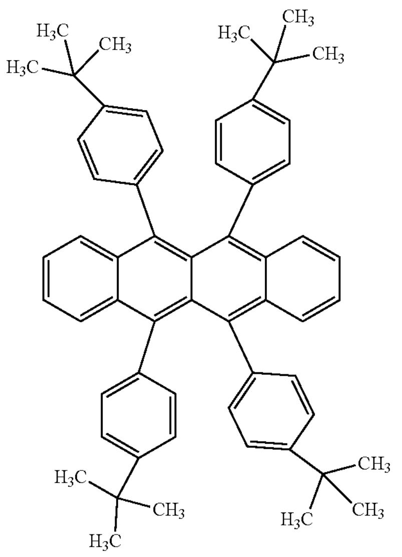

The organic compounds represented by Structural Formulae (101) to (116) are examples of the organic compound represented by General Formula (Ga-1), and the specific examples of the p-type semiconductor material are not limited thereto.

Examples of the n-type semiconductor material include electron-accepting organic semiconductor materials such as fullerene (e.g., $C_{60}$ and $C_{70}$) and fullerene derivatives. Fullerene has a soccer ball-like shape, which is energetically stable. Both the highest occupied molecular orbital level (HOMO level) and the LUMO level of fullerene are deep (low). Having a deep LUMO level, fullerene has an extremely high electron-accepting property (acceptor property). When π-electron conjugation (resonance) spreads on a plane as in benzene, an electron-donating property (donor property) usually increases; however, fullerene has a spherical shape, and thus has a high electron-accepting property although π-electron conjugation widely spread therein. The high electron-accepting property efficiently causes rapid charge separation and thus is useful for photoelectric conversion devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{71}BM$), [6,6]-phenyl-$C_{61}$-butyric acid methyl ester (abbreviation: $PC_{61}BM$), and 1',1",4',4"-tetrahydro-di[1,4]methanonaphthaleno[1,2:2',3',56,60:2",3"][5,6]fullerene-$C_{60}$ (abbreviation: ICBA).

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

The n-type semiconductor material is preferably an organic compound represented by any of General Formulae (Gb-1) to (Gb-3) below.

[Chemical Formula 34]

(Gb-1)

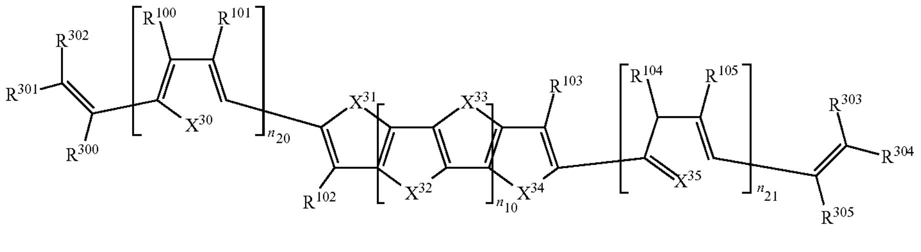

-continued (Gb-2)

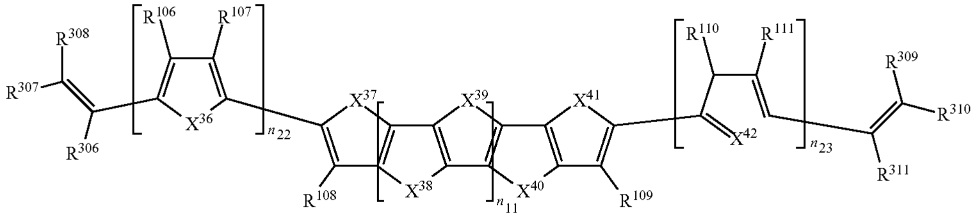

(Gb-3)

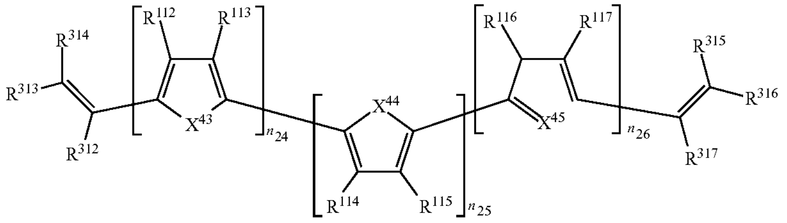

In General Formulae (Gb-1) to (Gb-3), each of $X^{30}$ to $X^{45}$ independently represents oxygen or sulfur. Each of $n_{10}$ and $n_{11}$ independently represents an integer of 0 to 4. Each of $n_{20}$ to $n_{26}$ independently represents an integer of 0 to 3. At least one of $n_{24}$ to $n_{26}$ represents an integer of 1 to 3. Each of $R^{100}$ to $R^{117}$ independently represents hydrogen, a cyano group, a substituted or unsubstituted alkyl group having 1 to 13 carbon atoms, a cycloalkyl group having 3 to 13 carbon atoms, a substituted or unsubstituted alkoxy group having 1 to 13 carbon atoms, a substituted or unsubstituted aryl group 10 having 6 to 30 carbon atoms, a substituted or unsubstituted heteroaryl group having 2 to 30 carbon atoms, a substituted or unsubstituted alkyl halide group having 1 to 13 carbon atoms, or halogen. Each of $R^{300}$ to $R^{317}$ independently represents hydrogen, a cyano group, fluorine, chlorine, a substituted or unsubstituted alkyl halide group having 1 to 13 carbon atoms, or a substituted or unsubstituted alkoxy group having 1 to 13 carbon atoms.

In General Formulae (Gb-1) to (Gb-3), each of $R^{100}$ to $R^{117}$ is preferably a substituent represented by any of Formulae (Rb-1) to (Rb-79) and Formulae (R-41) to (R-117) below. Note that * in the formula represents a bond.

In General Formulae (Gb-1) to (Gb-3), each of $R^{300}$ to $R^{317}$ is preferably a substituent represented by any of Formulae (Rb-1) to (Rb-4), Formula (Rb-7), and Formulae (Rb-33) to (Rb-72) below. Note that * in the formula represents a bond.

[Chemical Formula 35]

(Rb-1)

(Rb-2)

(Rb-3)

(Rb-4)

(Rb-5)

-continued (Rb-6)

(Rb-7)

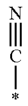

[Chemical Formula 36]

(Rb-8)

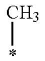

(Rb-9)

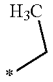

(Rb-10)

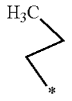

(Rb-11)

(Rb-12)

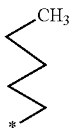

(Rb-13)

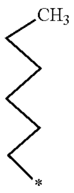

-continued
(Rb-14)
(Rb-15)
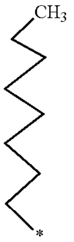
(Rb-16)
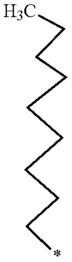
(Rb-17)
(Rb-18)
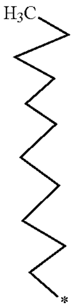
-continued
(Rb-19)
[Chemical Formula 37]
(Rb-20)
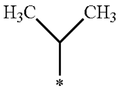
(Rb-21)
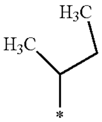
(Rb-22)
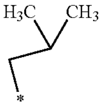
(Rb-23)
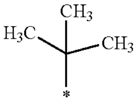
(Rb-24)
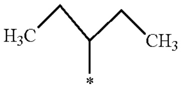
(Rb-25)
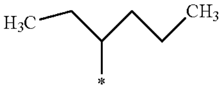
(Rb-26)
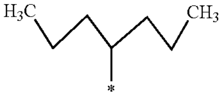
(Rb-27)
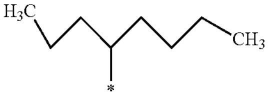
(Rb-28)
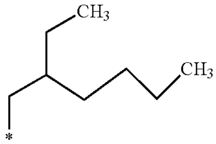
(Rb-29)
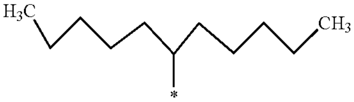

-continued
(Rb-30)
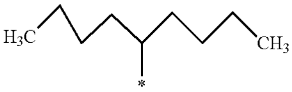
(Rb-31)
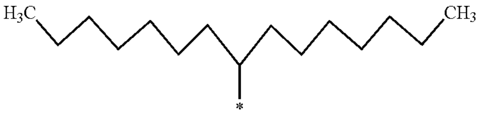
(Rb-32)
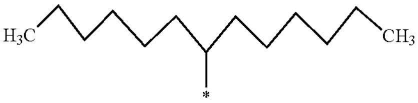
[Chemical Formula 38]
(Rb-33)
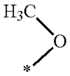
(Rb-34)
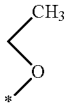
(Rb-35)
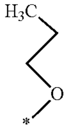
(Rb-36)
(Rb-37)
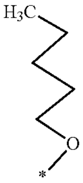
(Rb-38)
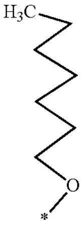
(Rb-39)
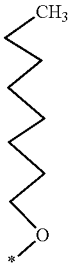
-continued
(Rb-40)
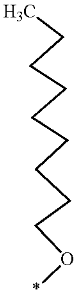
(Rb-41)
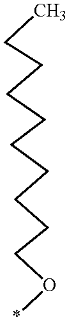
(Rb-42)
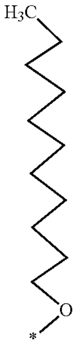
(Rb-43)
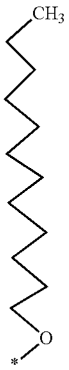

-continued
(Rb-44)
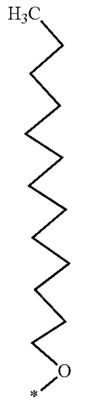
(Rb-45)
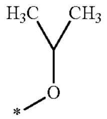
(Rb-46)
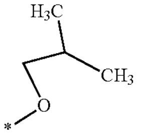
(Rb-47)
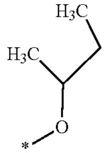
(Rb-48)
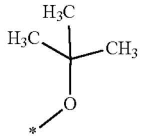
(Rb-49)
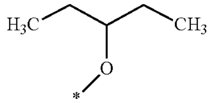
(Rb-50)
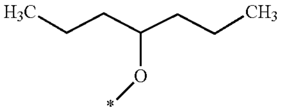
(Rb-51)
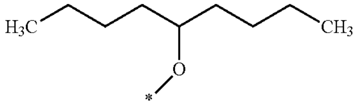
[Chemical Formula 39]
(Rb-52)
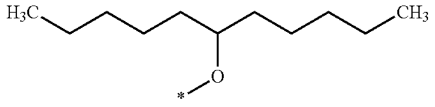
-continued
(Rb-53)
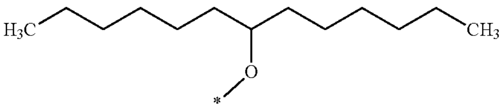
(Rb-54)
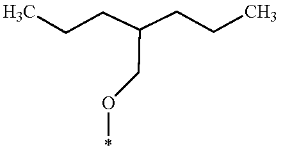
(Rb-55)
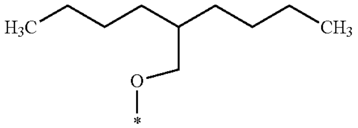
(Rb-56)
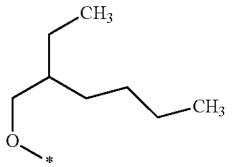
(Rb-57)
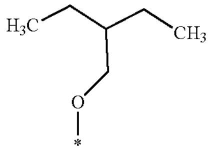
(Rb-58)
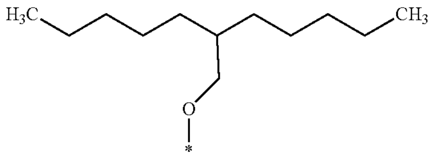
[Chemical Formula 40]
(Rb-59)
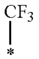
(Rb-60)
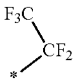
(Rb-61)
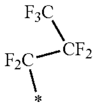
(Rb-62)
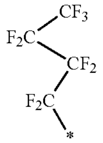
(Rb-63)
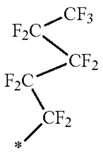

-continued
(Rb-64)
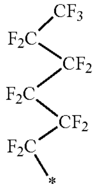
(Rb-65)
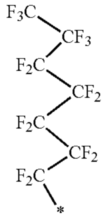
(Rb-66)
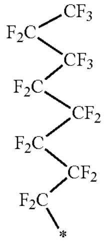
(Rb-67)
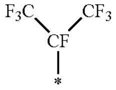
(Rb-68)
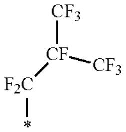
[Chemical Formula 41]
(Rb-69)
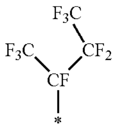
(Rb-70)
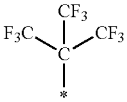
(Rb-71)
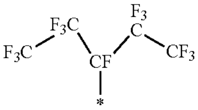
(Rb-72)
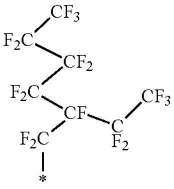
-continued
[Chemical Formula 42]
(Rb-73)
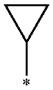
(Rb-74)
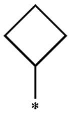
(Rb-75)
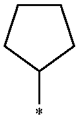
(Rb-76)
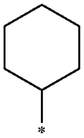
(Rb-77)
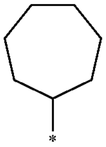
(Rb-78)
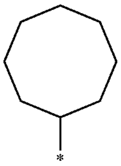
[Chemical Formula 43]
(Rb-79)
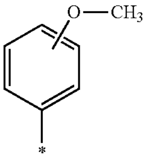
[Chemical Formula 44]
(R-41)
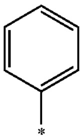
(R-42)
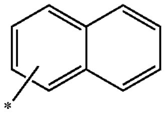
(R-43)
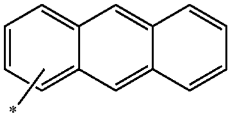

-continued
(R-44)
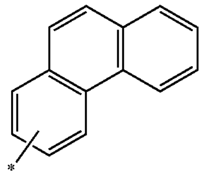
(R-45)
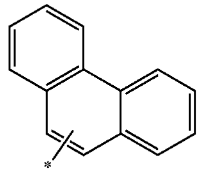
(R-46)
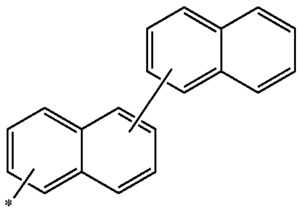
(R-47)
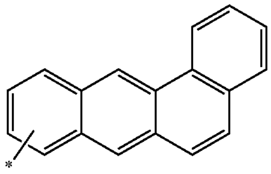
(R-48)
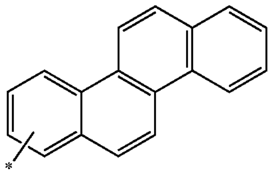
(R-49)
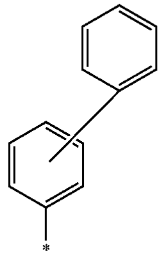
(R-50)
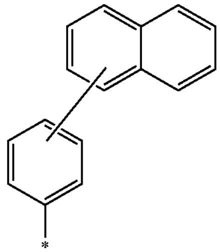
-continued
(R-51)
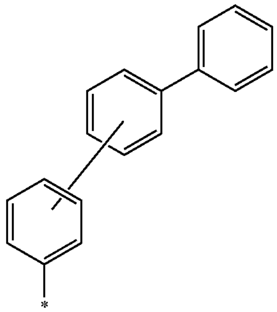
(R-52)
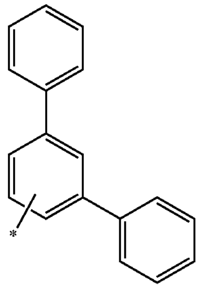
(R-53)
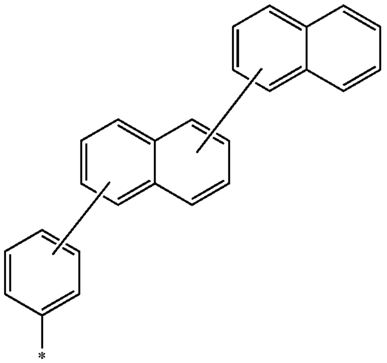
(R-54)
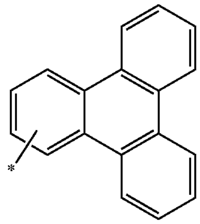
(R-55)
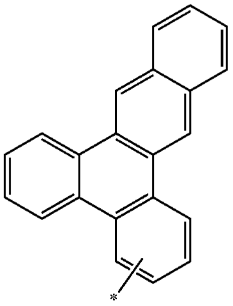

-continued
(R-56)
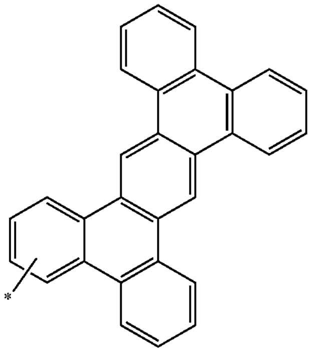
(R-57)
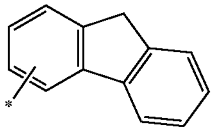
(R-58)
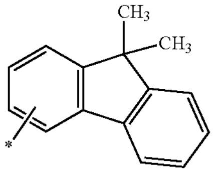
(R-59)
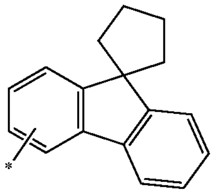
(R-60)
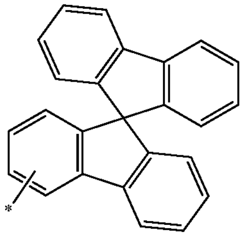
(R-61)
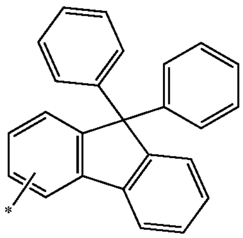
(R-62)
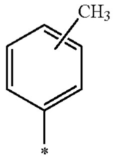
-continued
(R-63)
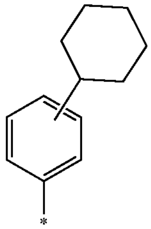
[Chemical Formula 45]
(R-64)
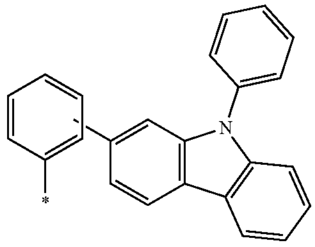
(R-65)
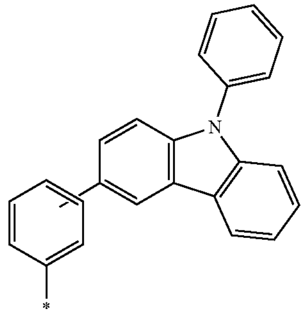
(R-66)
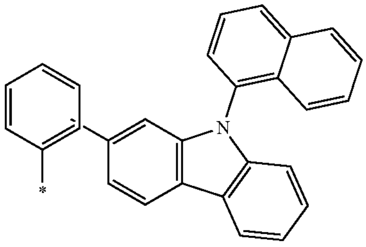
(R-67)
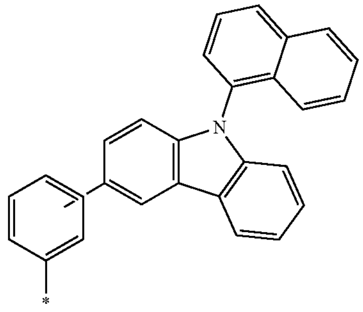

-continued
(R-68)
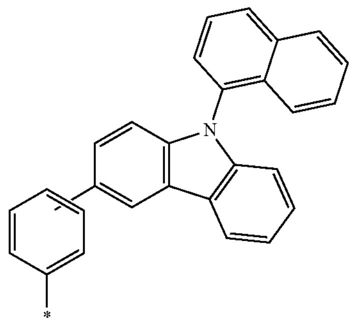
(R-69)
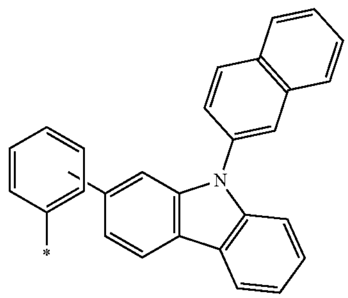
(R-70)
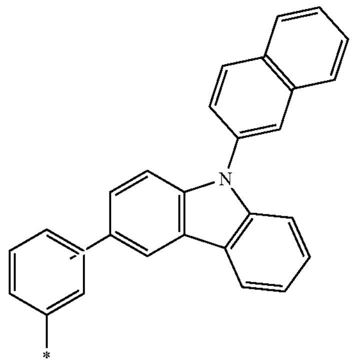
(R-71)
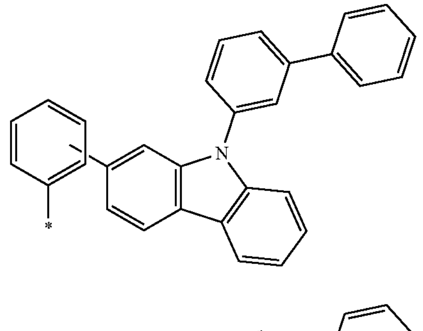
(R-72)
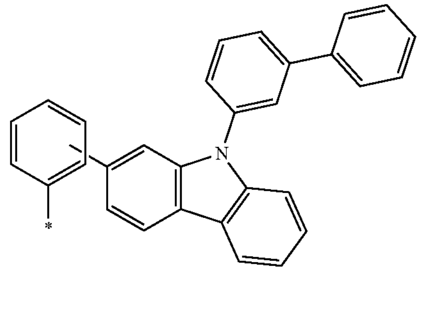
-continued
(R-72)
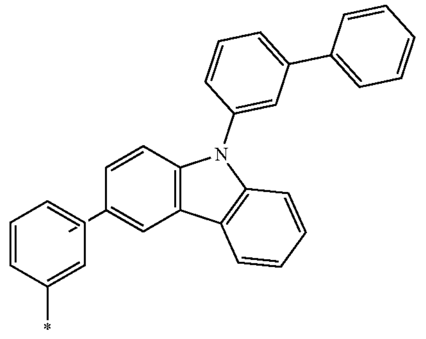
(R-73)
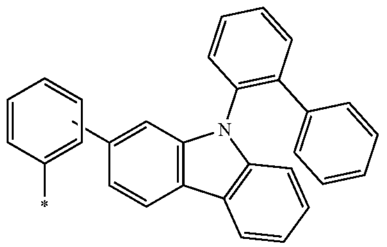
(R-74)
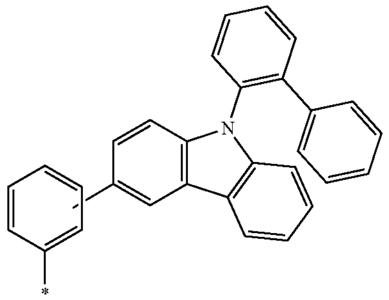
(R-75)
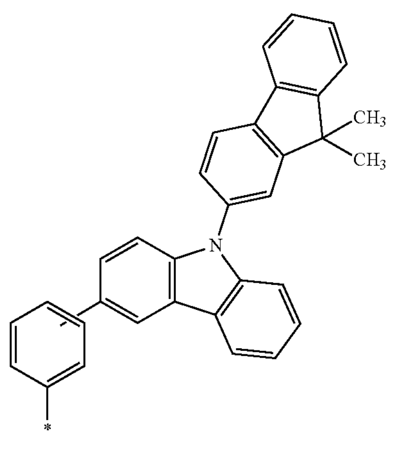

-continued
(R-76)
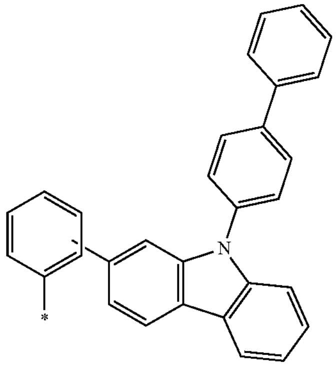
(R-77)
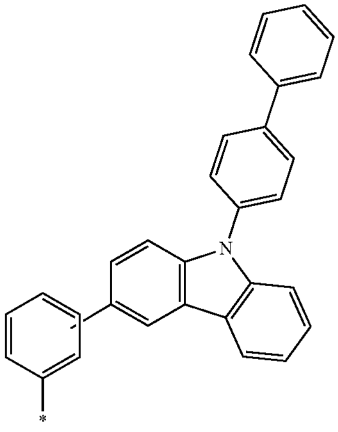
(R-78)
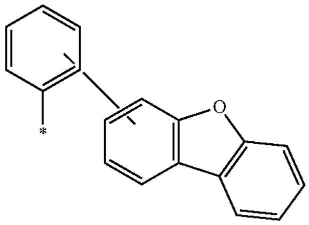
(R-79)
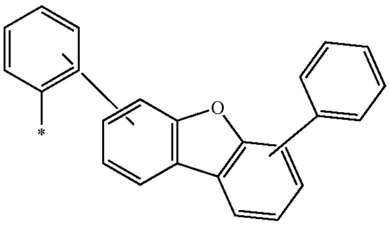
(R-80)
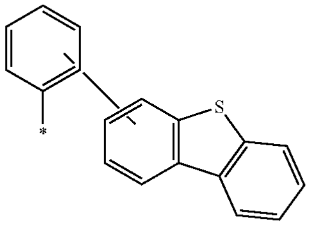
-continued
(R-81)
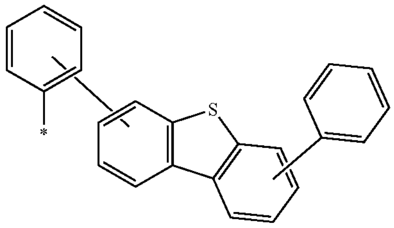
(R-82)
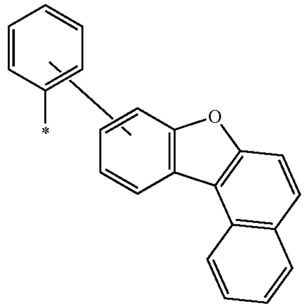
(R-83)
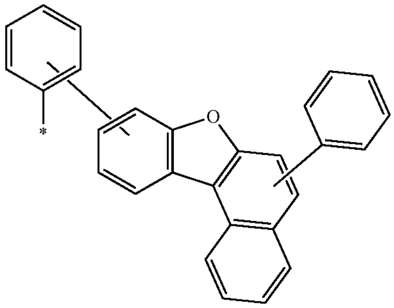
[Chemical Formula 46]
(R-84)
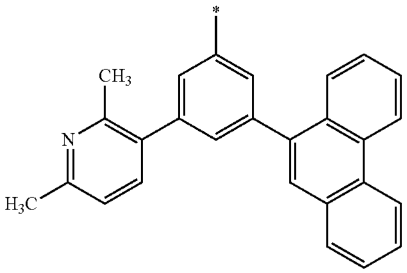
(R-85)
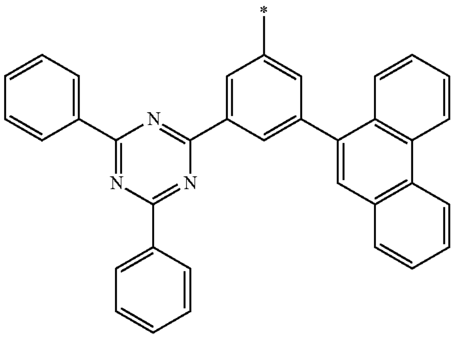

-continued
(R-86)
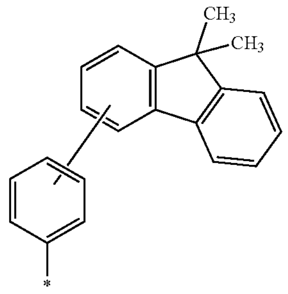
(R-87)
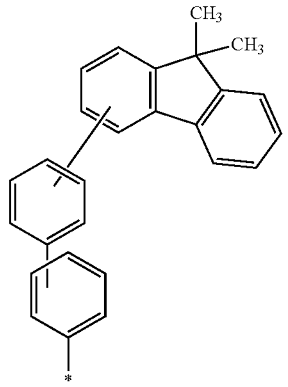
(R-88)
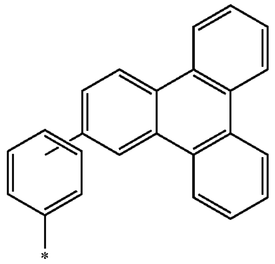
(R-89)
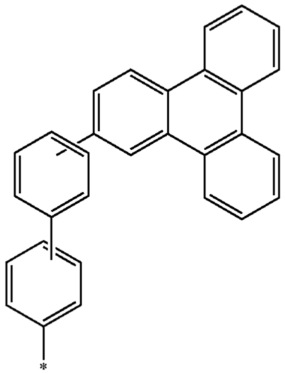
(R-90)
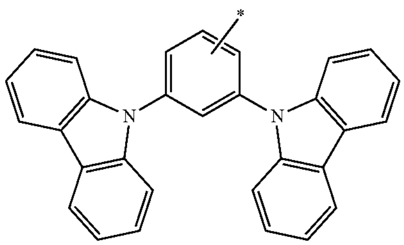
-continued
(R-91)
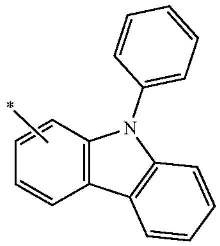
(R-92)
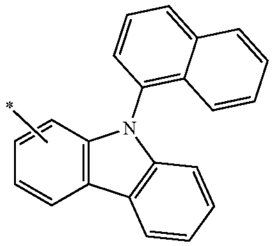
(R-93)
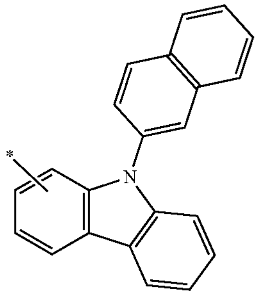
(R-94)
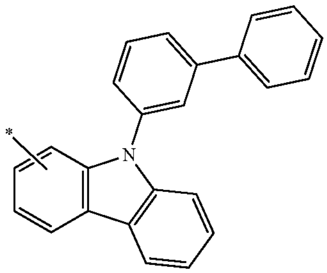
(R-95)
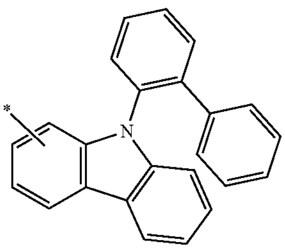

-continued
(R-96)
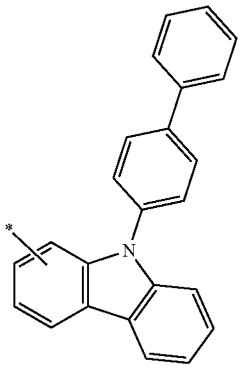
(R-97)
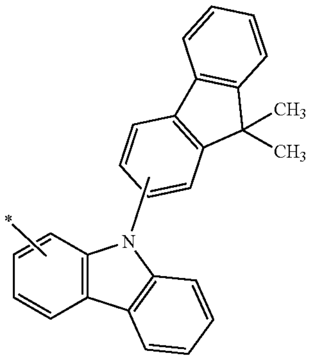
(R-98)
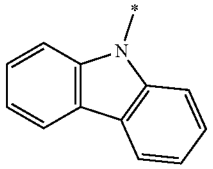
(R-99)
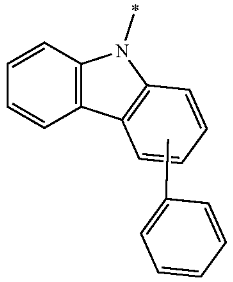
(R-100)
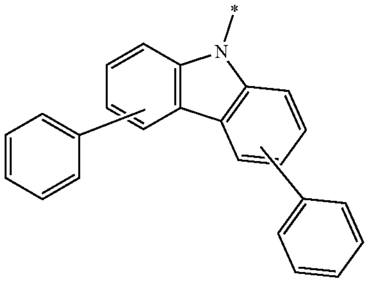
-continued
(R-101)
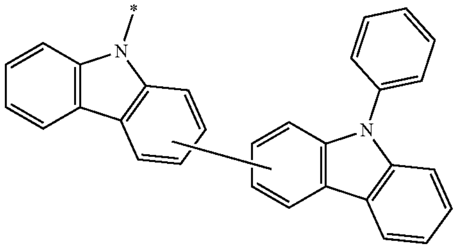
[Chemical Formula 47]
(R-102)
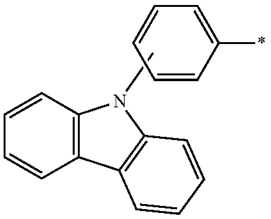
(R-103)
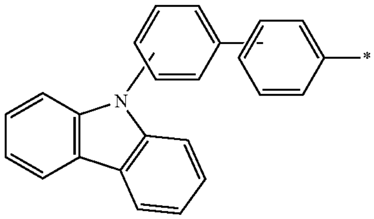
(R-104)
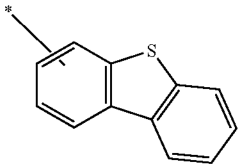
(R-105)
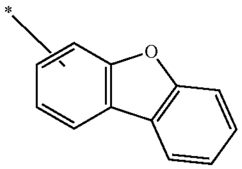
(R-106)
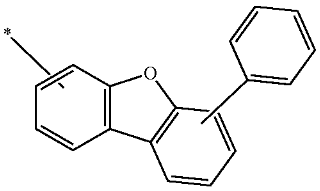
(R-107)
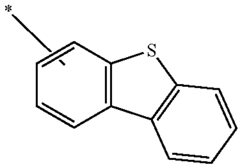

-continued
(R-108)
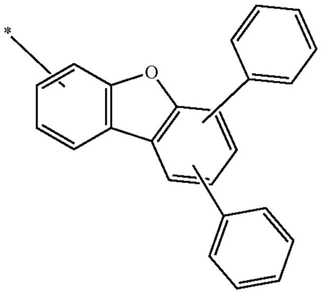
(R-109)
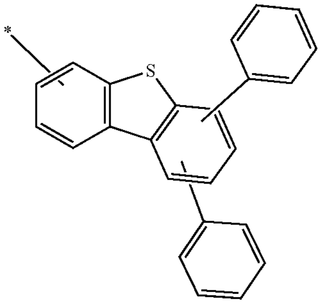
(R-110)
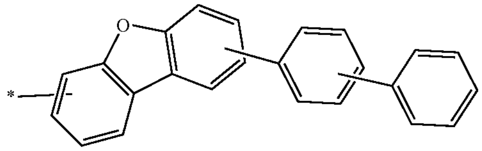
(R-111)
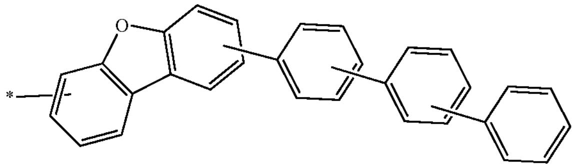
(R-112)
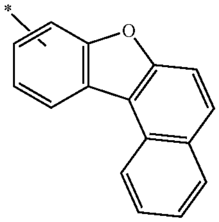
-continued
(R-113)
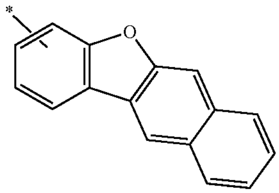
(R-114)
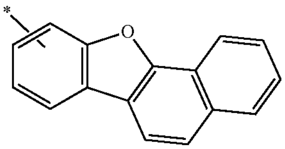
(R-115)
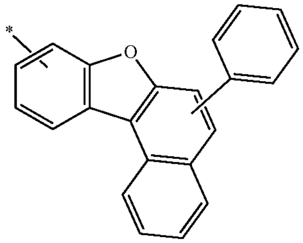
(R-116)
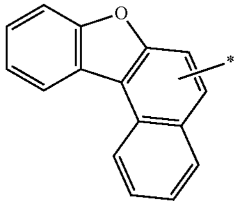
(R-117)
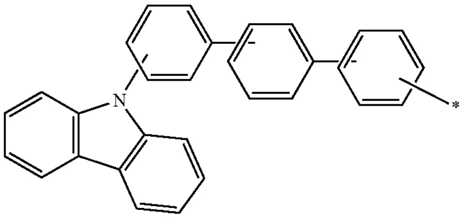
Next, specific examples of the n-type semiconductor material represented by General Formulae (Gb-1) to (Gb-3) are shown below.
[Chemical Formula 48]
(300)
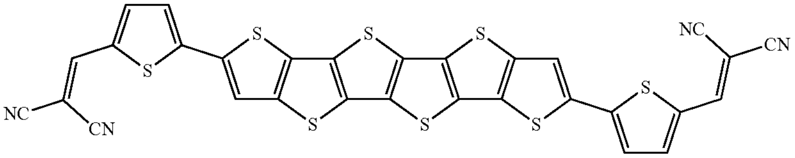
(301)
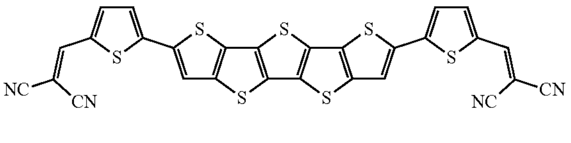
(302)
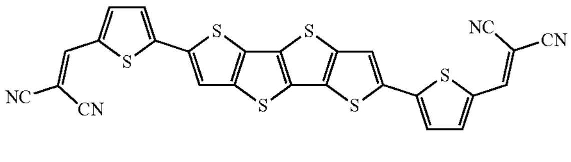

-continued
(303)
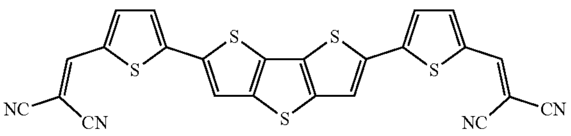
(304)
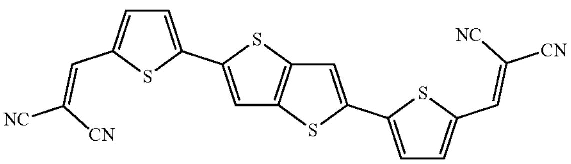
(305)
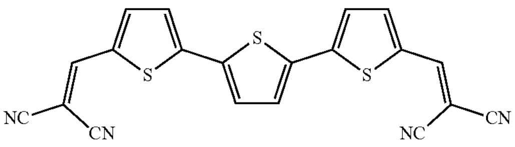
(306)
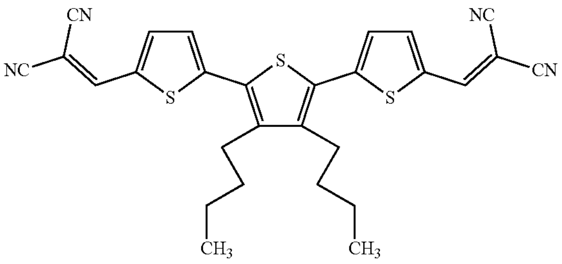
(307)
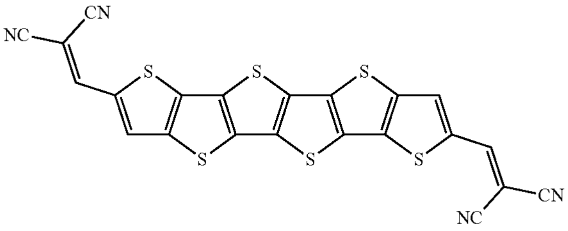
(308)
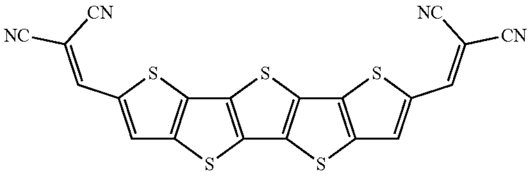
(309)
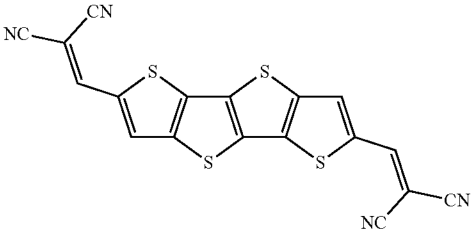
(310)
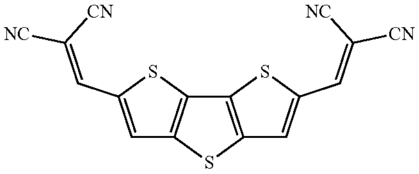
(311)
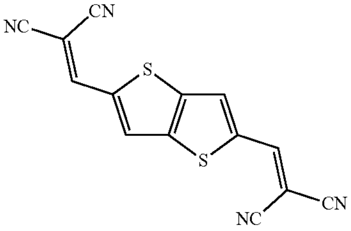
(312)
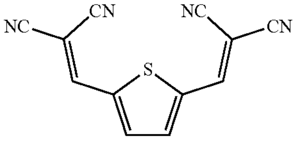

The organic compounds represented by Structural Formulae (300) to (312) are examples of the organic compounds (the n-type semiconductor materials) represented by General Formulae (Gb-1) to (Gb-3), and the specific examples are not limited thereto.

Alternatively, an organic compound represented by General Formula (Gc-1) below may be used as the n-type semiconductor material.

[Chemical Formula 49]

(Gc-1)

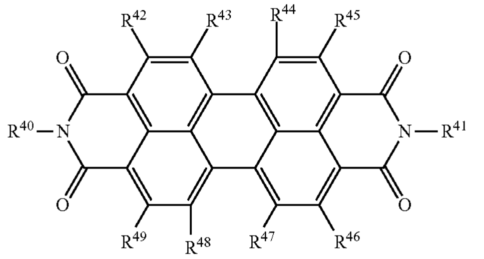

In General Formula (Gc-1), each of $R^{40}$ and $R^{41}$ independently represents hydrogen, a substituted or unsubstituted chain alkyl group having 1 to 13 carbon atoms, a branched alkyl group having 3 to 13 carbon atoms, a substituted or unsubstituted aryl group having 6 to 13 carbon atoms, or a substituted or unsubstituted aromatic alkyl group having 6 to 13 carbon atoms. Each of $R^{42}$ to $R^{49}$ independently represents hydrogen, a substituted or unsubstituted alkyl group having 1 to 13 carbon atoms, a substituted or unsubstituted alkyl halide group having 1 to 13 carbon atoms, a substituted or unsubstituted cycloalkyl group having 3 to 13 carbon atoms, or halogen.

In General Formula (Gc-1), it is preferable that each of $R^{40}$ and $R^{41}$ independently represent a chain alkyl group having 2 to 12 carbon atoms. It is further preferable that each of $R^{40}$ and $R^{41}$ independently represent a branched alkyl group. In this case, solubility can be improved.

Next, specific examples of the n-type semiconductor material represented by General Formula (Gc-1) are shown below.

[Chemical Formula 50]

(400)

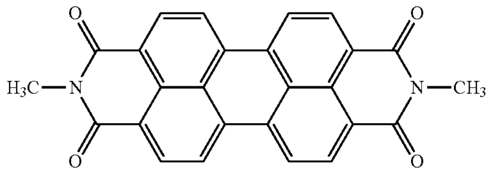

(401)

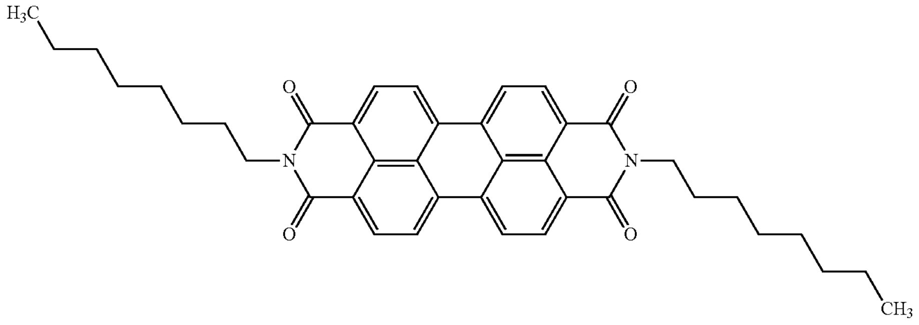

(402)

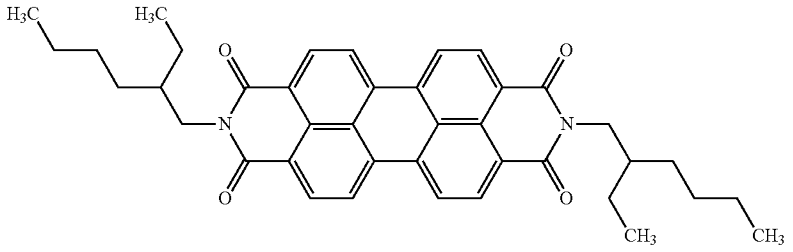

-continued (403)

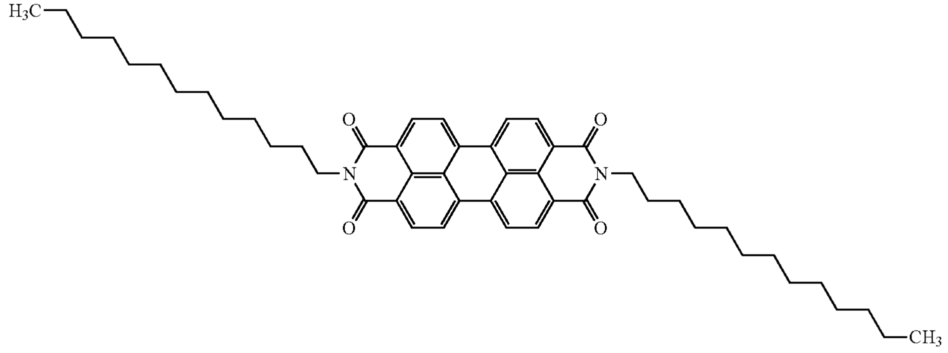

The organic compounds represented by Structural Formulae (400) to (403) are examples of the organic compound (the n-type semiconductor material) represented by General Formula (Gc-1), and the specific examples are not limited thereto.

The active layer 213 is preferably a stacked film of a first layer containing the p-type semiconductor material and a second layer containing the n-type semiconductor material.

In the light-emitting device having any of the aforementioned structures, the active layer 213 is preferably a mixed film containing the p-type semiconductor material and the n-type semiconductor material.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape may be used as the electron-accepting organic semiconductor material, and an organic semiconductor material having a substantially planar shape may be used as the electron-donating organic semiconductor material. Molecules of similar shapes tend to aggregate, and aggregated molecules of similar kinds, which have molecular orbital energy levels close to each other, can increase the carrier-transport property.

<Structure Body>

The structure body 220 receives electrons from the active layer 213 and supplies electrons to the second carrier-transport layer 214. Providing the structure body 220 in the photoelectric conversion device 200 can inhibit an increase in the driving voltage of the photoelectric conversion device 200. The structure and effect of the structure body 220 are described in Embodiment 1 in detail, and thus repeated description is omitted.

<Second Carrier-Transport Layer>

The second carrier-transport layer 214 transports electrons supplied from the structure body 220 to the second electrode 202, and contains an electron-transport material. The electron-transport material preferably has an electron mobility of $1\times10^{-6}$ $cm^2/Vs$ or higher. Note that other substances can also be used as long as the substances have an electron-transport property higher than a hole-transport property. In this specification and the like, the second carrier-transport layer is also referred to as an electron-transport layer in some cases.

As the electron-transport material, a π-electron deficient heteroaromatic compound can be used.

As the electron-transport material, any of the following materials can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

Alternatively, the electron-transport material is preferably a compound having a triazine ring.

Alternatively, the electron-transport material is preferably an organic compound represented by General Formula (Ge-1) below.

[Chemical Formula 51]

(Ge-1)

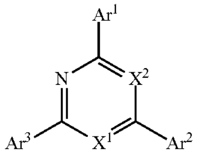

In General Formula (Ge-1), each of $Ar^1$ to $Ar^3$ independently represents hydrogen, a substituted or unsubstituted aryl group having 6 to 30 carbon atoms, or a substituted or unsubstituted heteroaryl group having 2 to 30 carbon atoms. Each of $X^1$ and $X^2$ independently represents carbon or nitrogen. In the case where one or both of $X^1$ and $X^2$ are carbon, the carbon is bonded to hydrogen, a substituted or unsubstituted aryl group having 6 to 30 carbon atoms, a substituted or unsubstituted heteroaryl group having 2 to 30 carbon atoms, a substituted or unsubstituted alkyl group having 1 to 20 carbon atoms, or a substituted or unsubstituted cycloalkyl group having 1 to 20 carbon atoms.

Alternatively, the electron-transport material is an organic compound represented by General Formula (Ge-2) below.

[Chemical Formula 52]

(Ge-2)

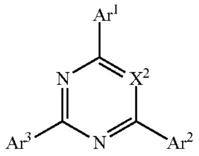

In General Formula (Ge-2), each of $Ar^1$ to $Ar^3$ independently represents a substituted or unsubstituted aryl group having 6 to 30 carbon atoms or a substituted or unsubstituted heteroaryl group having 2 to 30 carbon atoms, and $X^2$ represents carbon or nitrogen. In the case where $X^2$ is carbon, the carbon is bonded to hydrogen, a substituted or unsubstituted aryl group having 6 to 30 carbon atoms, a substituted or unsubstituted heteroaryl group having 2 to 30 carbon atoms, a substituted or unsubstituted alkyl group having 1 to 20 carbon atoms, or a substituted or unsubstituted cycloalkyl group having 1 to 20 carbon atoms.

Alternatively, the electron-transport material is an organic compound represented by General Formula (Ge-3) below.

[Chemical Formula 53]

(Ge-3)

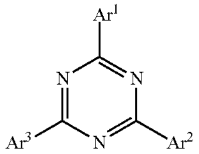

In General Formula (Ge-3), each of $Ar^1$ to $Ar^3$ independently represents a substituted or unsubstituted aryl group having 6 to 30 carbon atoms or a substituted or unsubstituted heteroaryl group having 2 to 30 carbon atoms.

Alternatively, the electron-transport material is an organic compound represented by General Formula (Ge-4) below.

[Chemical Formula 54]

(Ge-4)

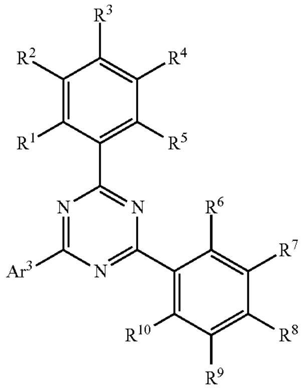

In General Formula (Ge-4), $Ar^3$ represents a substituted or unsubstituted aryl group having 6 to 30 carbon atoms or a substituted or unsubstituted heteroaryl group having 2 to 30 carbon atoms. Each of $R^1$ to $R^{10}$ independently represents hydrogen, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 2 to 30 carbon atoms.

Each of $R^1$ to $R^{10}$ in General Formula (Ge-4) represents, other than the above-described substituents, halogen, a substituted or unsubstituted alkyl halide group having 1 to 13 carbon atoms, a cyano group, or a substituted or unsubstituted alkoxy group having 1 to 13 carbon atoms.

Each of $R^1$ to $R^{10}$ in General Formula (Ge-4) is preferably a substituent represented by any of Formulae (R-1) to (R-38), Formulae (R-41) to (R-116), and Formulae (R-118) to (R-131) below.

Each of $Ar^1$ to $Ar^3$ in General Formulae (Ge-1) to (Ge-3) and $Ar^3$ in General Formula (Ge-4) is preferably a substituent represented by any of Formulae (R-41) to (R-116) and Formulae (R-118) to (R-131) below.

[Chemical Formula 55]

(R-1)

(R-2)

(R-3)

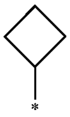

(R-4)

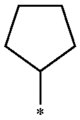

(R-5)

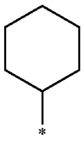

(R-6)

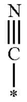

(R-7)

(R-8)

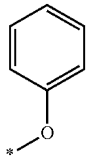

(R-9)

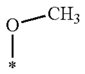

-continued
(R-10)
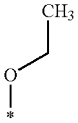
(R-11)
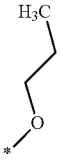
(R-12)
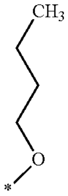
(R-13)
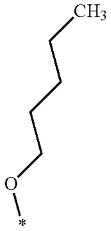
(R-14)
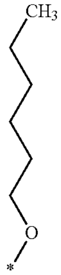
(R-15)
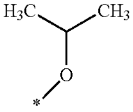
(R-16)
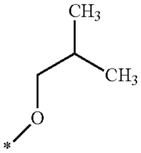
(R-17)
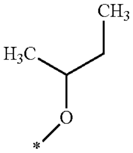
(R-18)
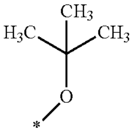
-continued
(R-19)
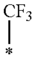
(R-20)
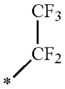
(R-21)
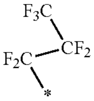
(R-22)
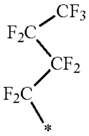
(R-23)
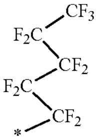
(R-24)
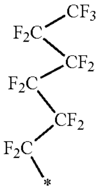
(R-25)
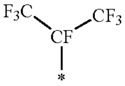
(R-26)
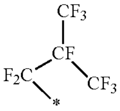
(R-27)
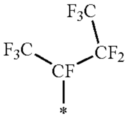
(R-28)
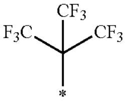
(R-29)
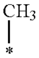
(R-30)
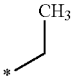
(R-31)

-continued
(R-32)
(R-33)
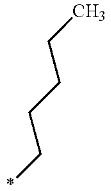
(R-34)
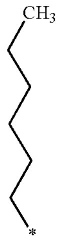
(R-35)
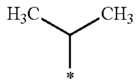
(R-36)
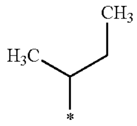
(R-37)
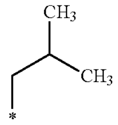
(R-38)
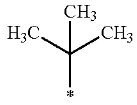
[Chemical Formula 56]
(R-41)
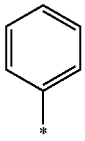
(R-42)
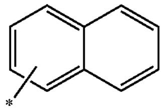
(R-43)
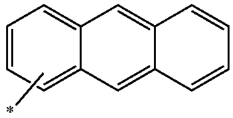
-continued
(R-44)
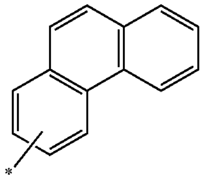
(R-45)
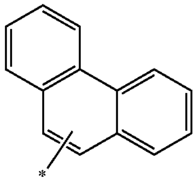
(R-46)
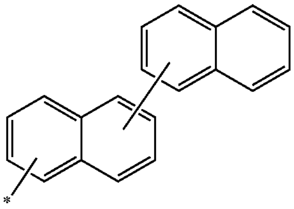
(R-47)
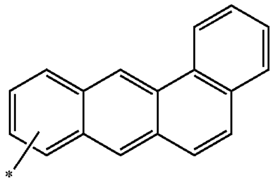
(R-48)
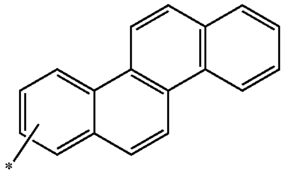
(R-49)
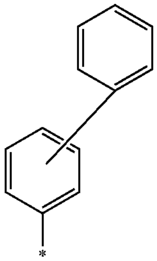
(R-50)
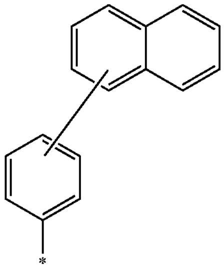

-continued
(R-51)
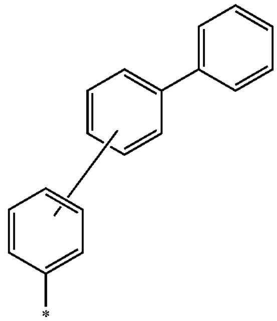
(R-52)
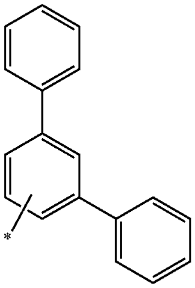
(R-53)
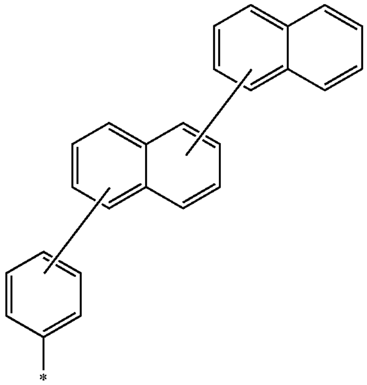
(R-54)
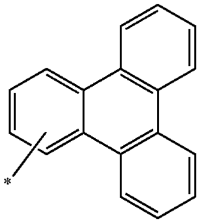
(R-55)
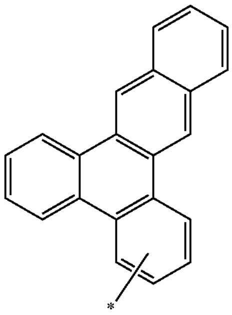
-continued
(R-56)
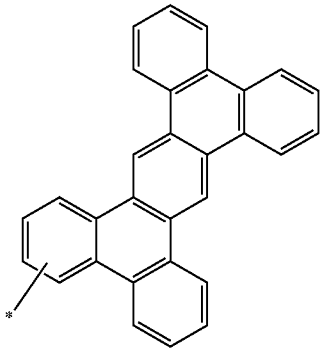
(R-57)
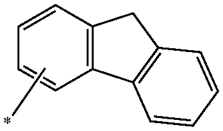
(R-58)
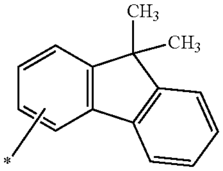
(R-59)
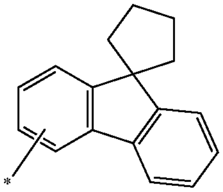
(R-60)
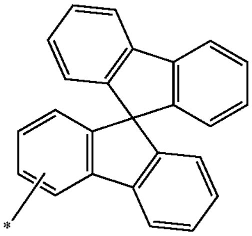
(R-61)
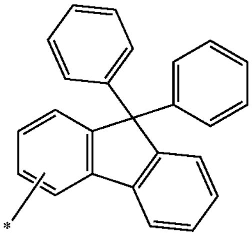
(R-62)
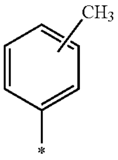

-continued
(R-63)
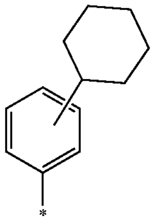
[Chemical Formula 57]
(R-64)
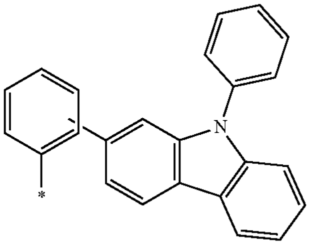
(R-65)
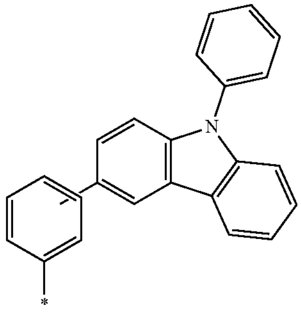
(R-66)
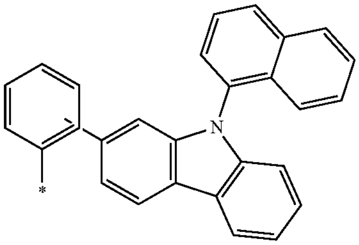
(R-67)
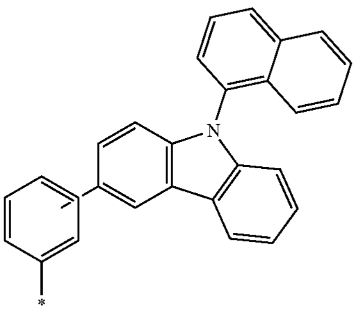
-continued
(R-68)
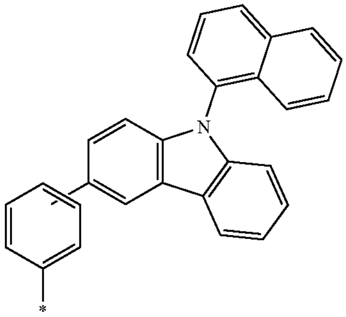
(R-69)
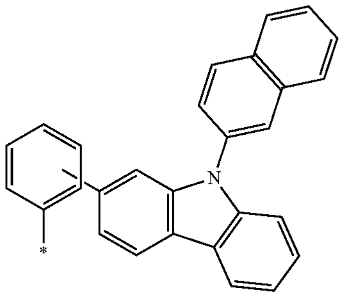
(R-70)
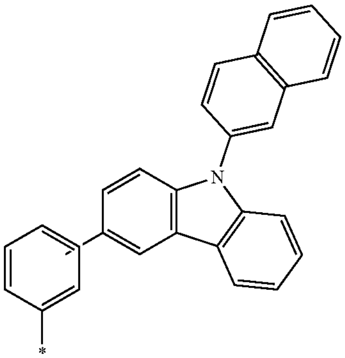
(R-71)
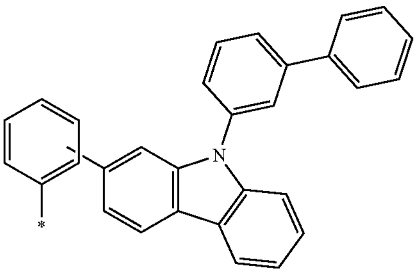
(R-72)
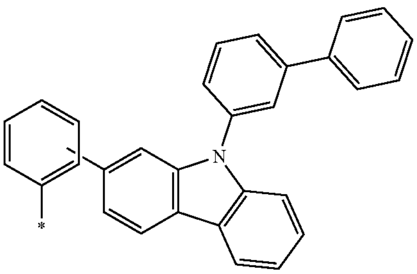

(R-72)
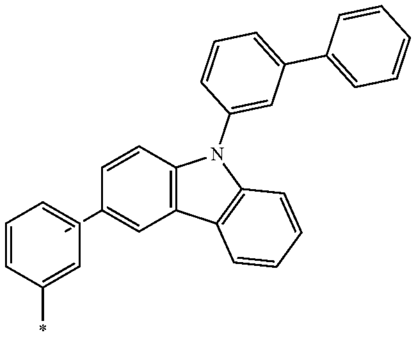
(R-73)
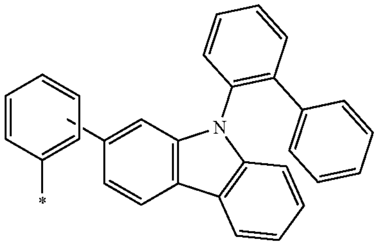
(R-74)
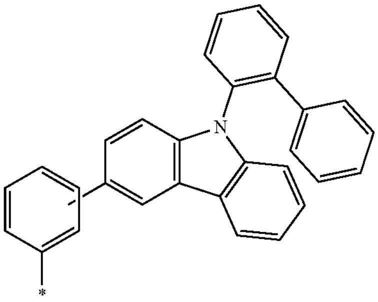
(R-75)
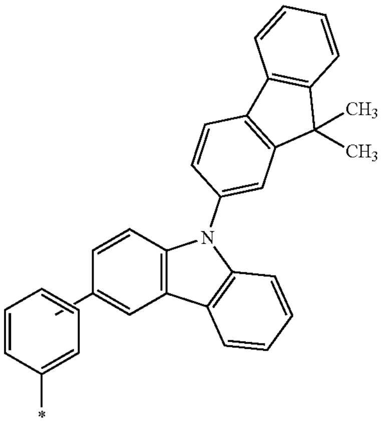
(R-76)
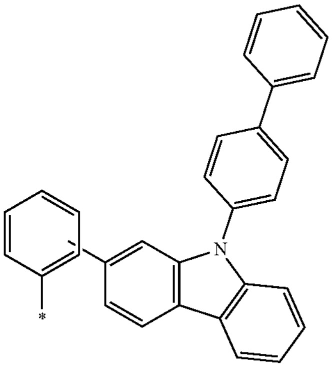
(R-77)
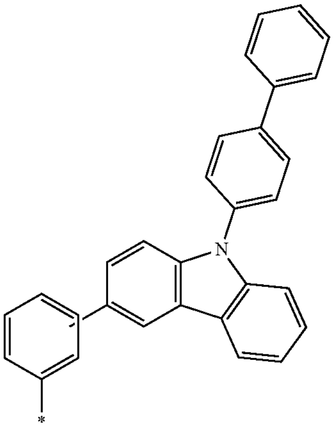
(R-78)
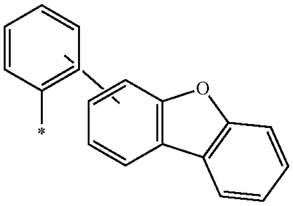
(R-79)
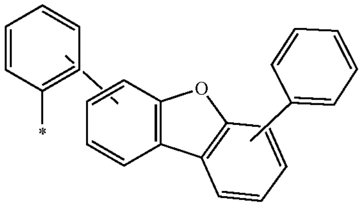
(R-80)
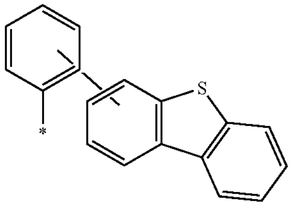

-continued
(R-81)
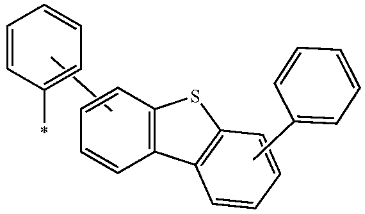
(R-82)
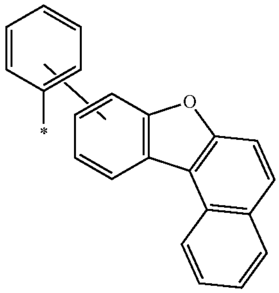
(R-83)
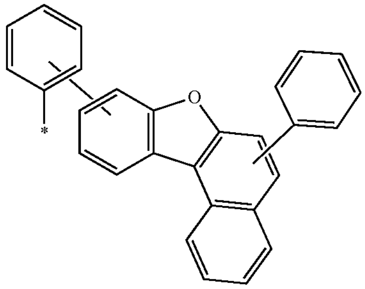
[Chemical Formula 58]
(R-84)
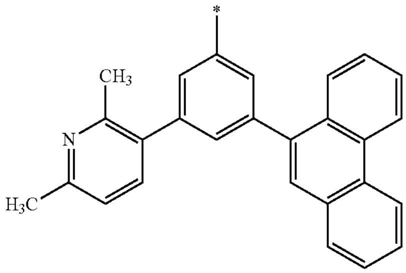
(R-85)
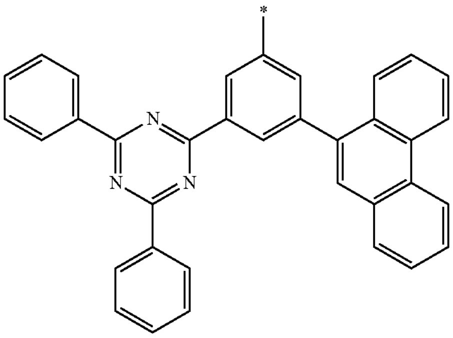
-continued
(R-86)
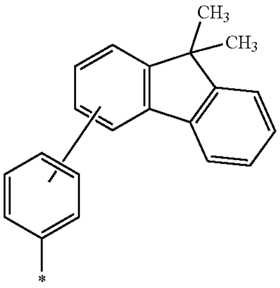
(R-87)
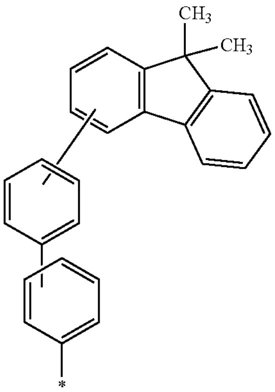
(R-88)
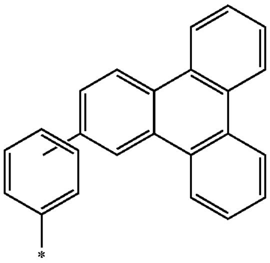
(R-89)
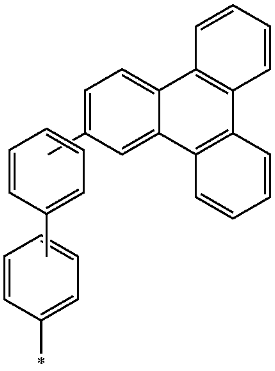
(R-90)
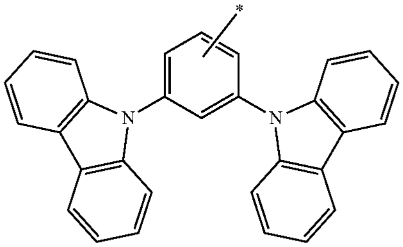

-continued
(R-91)
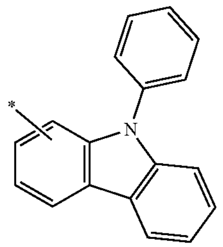
(R-92)
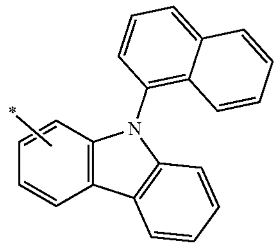
(R-93)
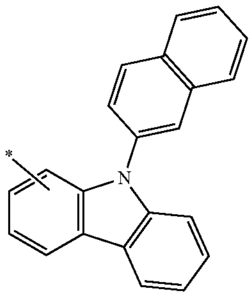
(R-94)
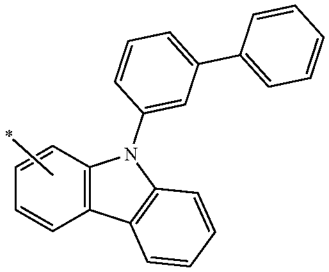
(R-95)
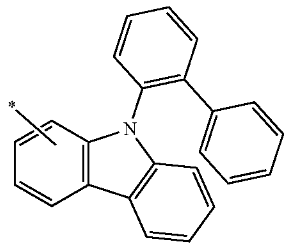
-continued
(R-96)
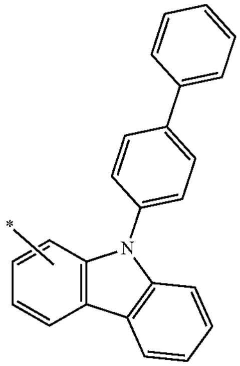
(R-97)
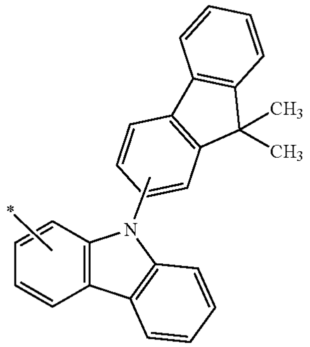
(R-98)
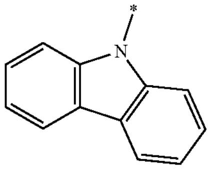
(R-99)
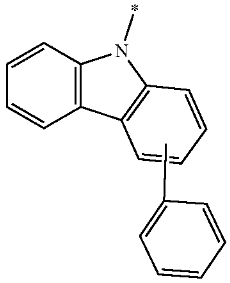
(R-100)
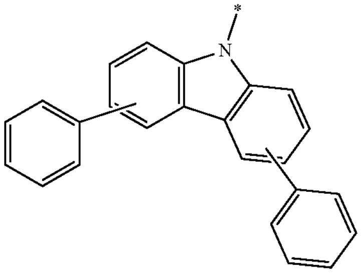

-continued
(R-101)
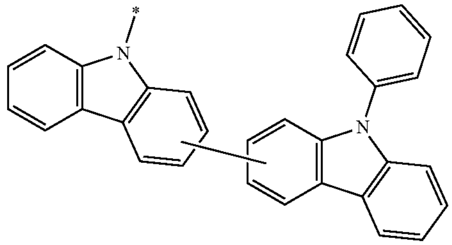
[Chemical Formula 59]
(R-102)
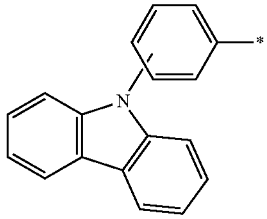
(R-103)
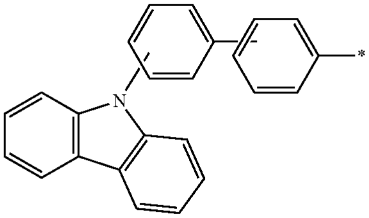
(R-104)
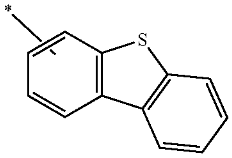
(R-105)
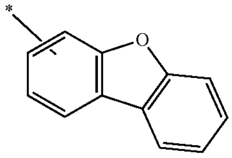
(R-106)
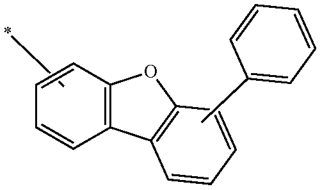
(R-107)
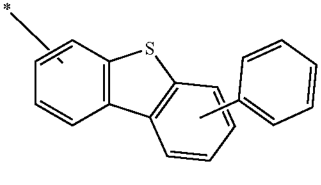
-continued
(R-108)
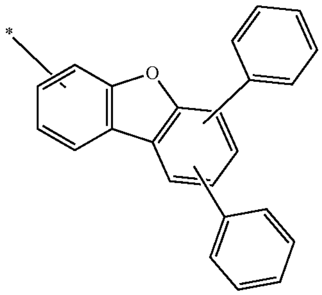
(R-109)
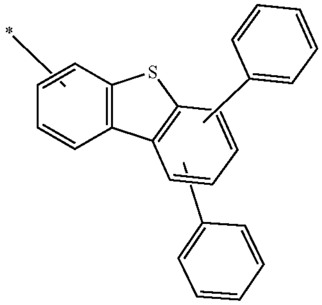
(R-110)
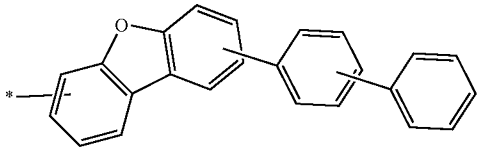
(R-111)
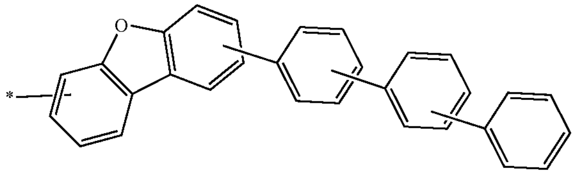
(R-112)
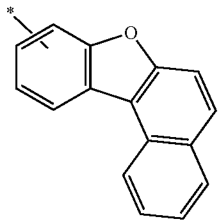
(R-113)
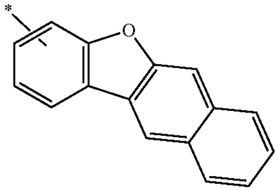
(R-114)
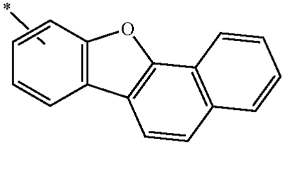

-continued
(R-115)
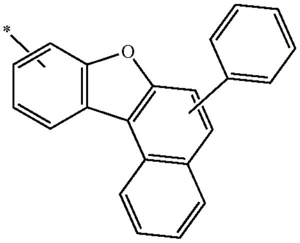
(R-116)
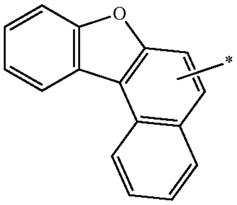
[Chemical Formula 60]
(R-118)
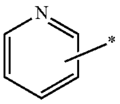
(R-119)
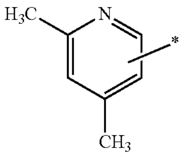
(R-120)
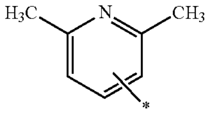
(R-121)
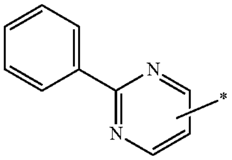
(R-122)
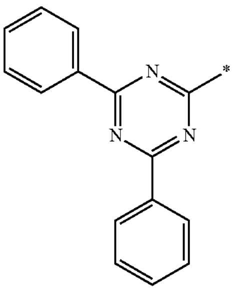
-continued
(R-123)
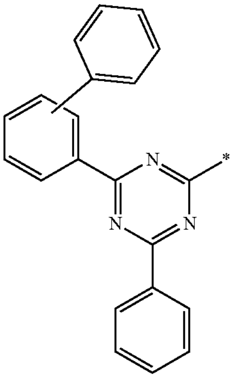
(R-124)
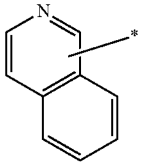
(R-125)
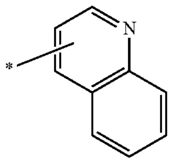
(R-126)
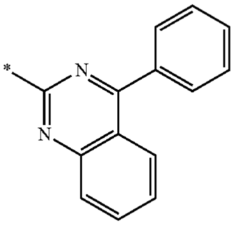
(R-127)
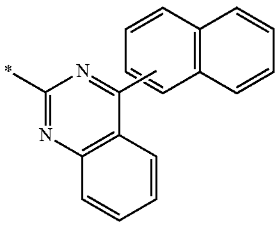
(R-128)
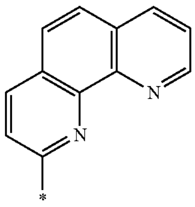
(R-129)
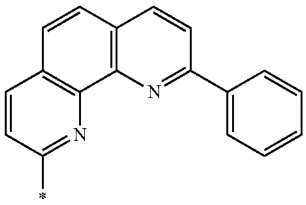

-continued
(R-130)
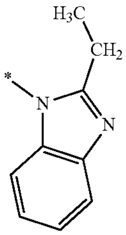
(R-131)
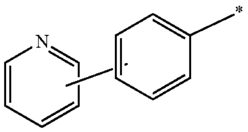
Next, specific examples of the electron-transport material having any of the above structures are shown below.
[Chemical Formula 61]
(500)
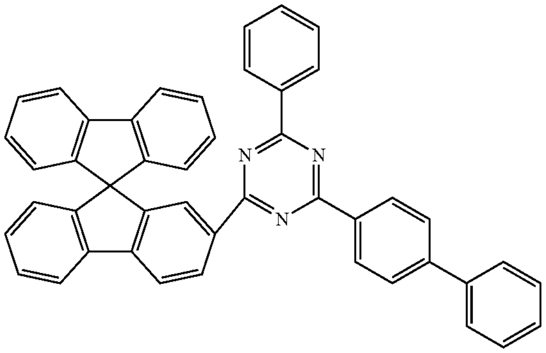
(501)
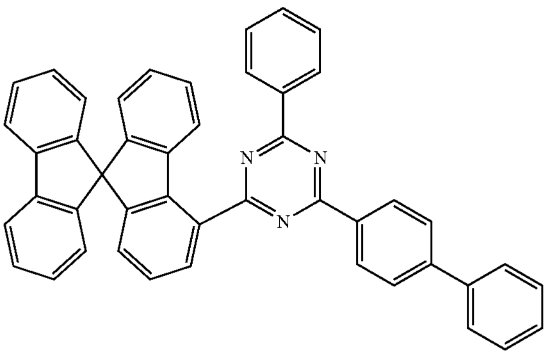
-continued
(502)
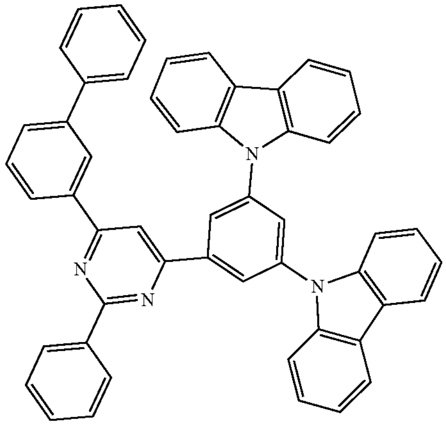
(503)
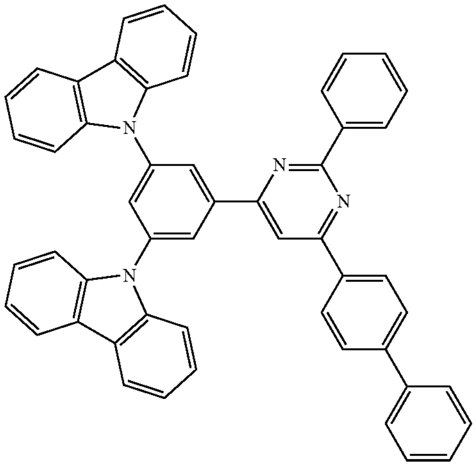
(504)
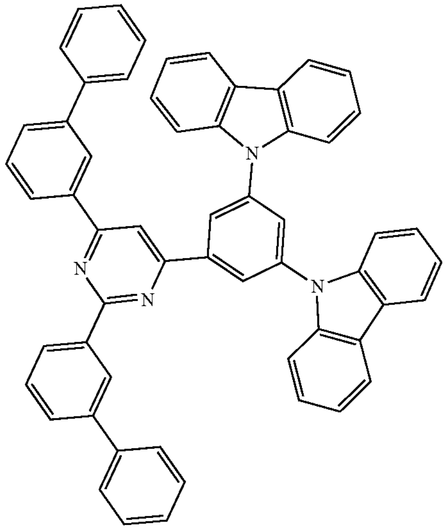

-continued
(505)
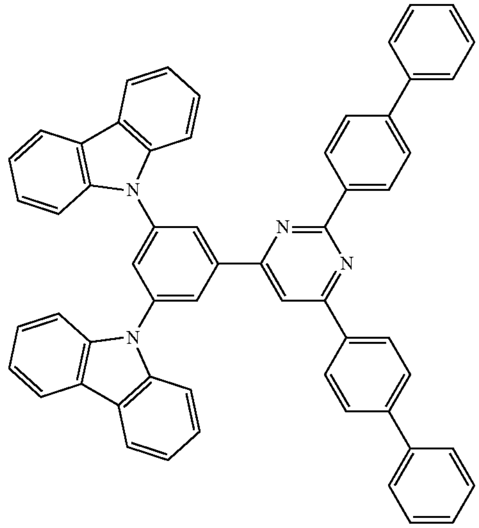
(506)
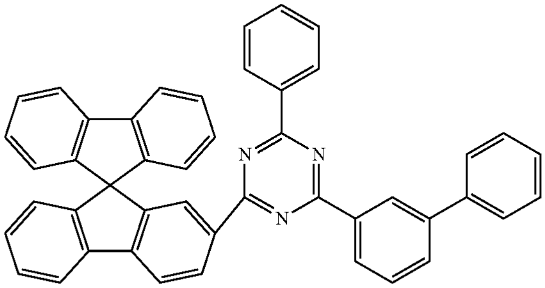
(507)
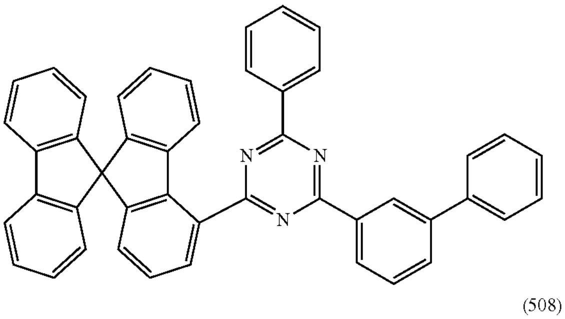
(508)
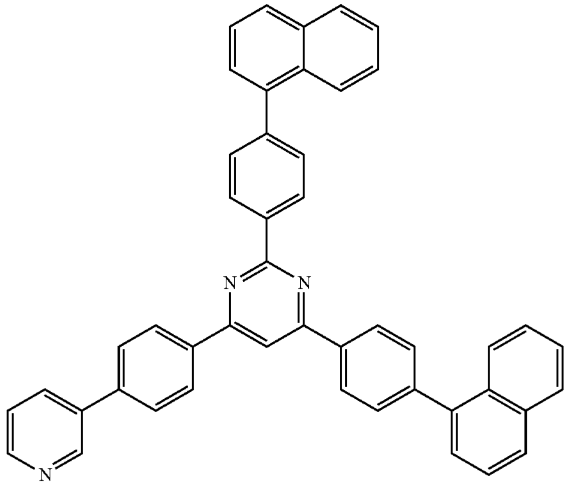
-continued
(509)
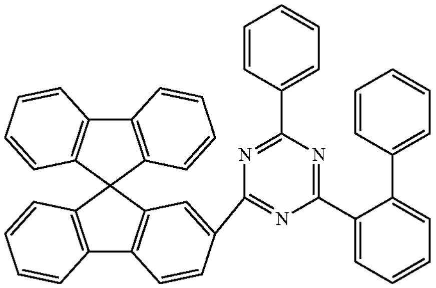
(510)
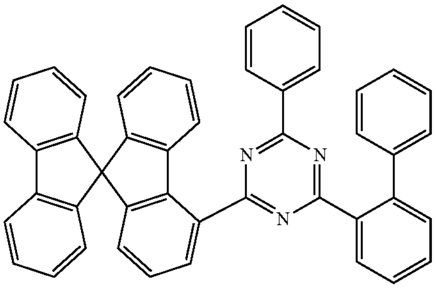
(511)
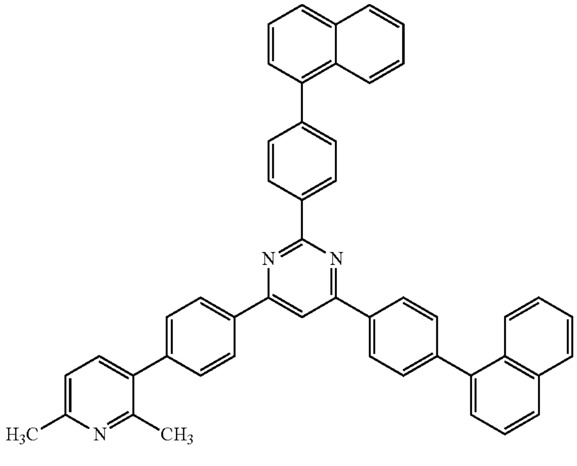
(512)
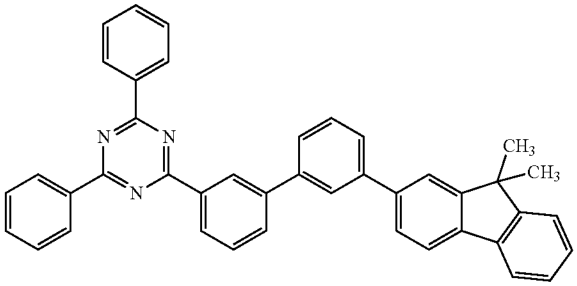

-continued
[Chemical Formula 62]
(513)
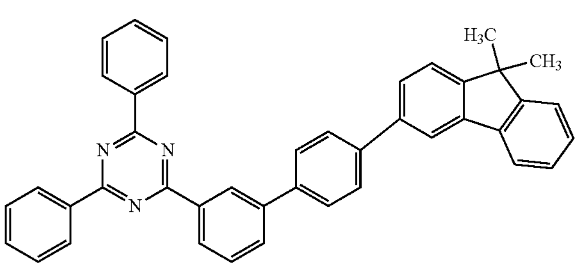
(514)
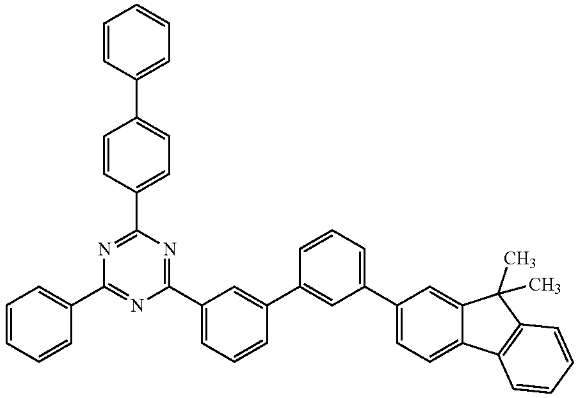
(515)
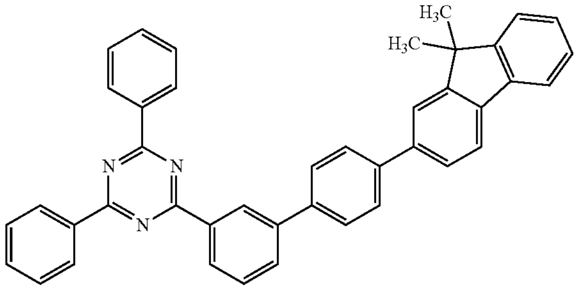
(516)
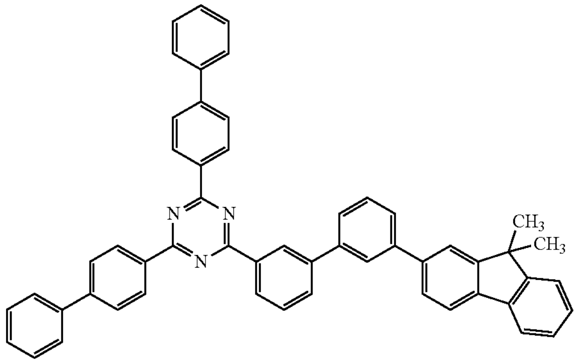
-continued
(517)
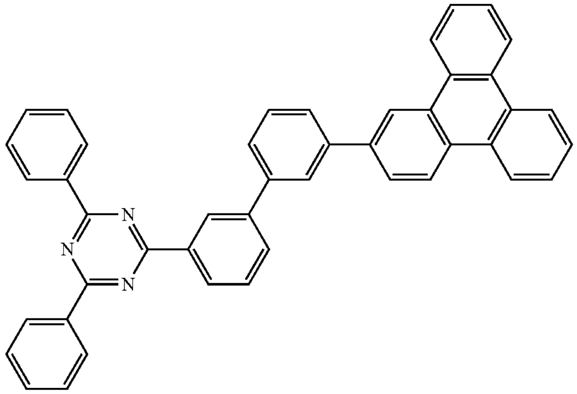
(518)
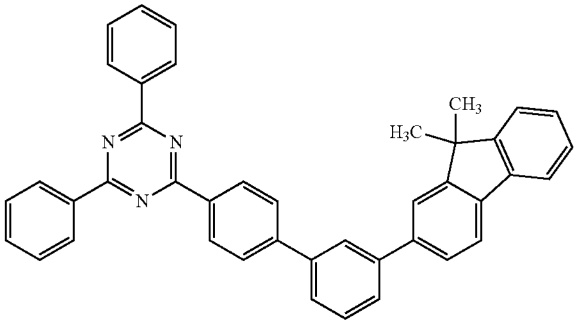
(519)
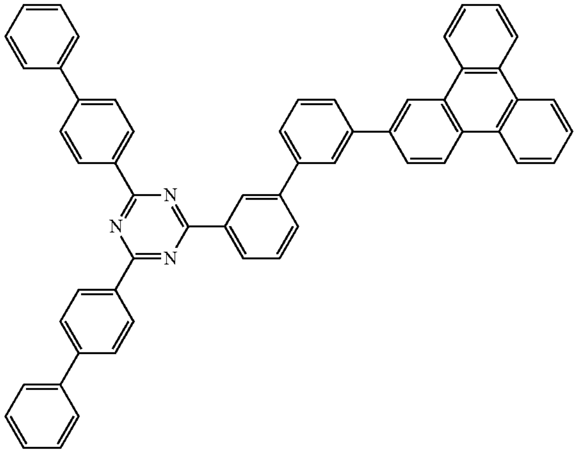
(520)
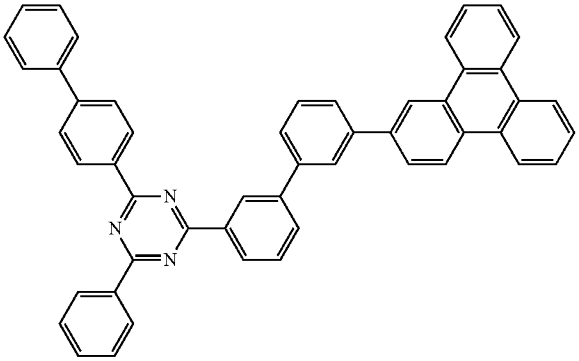

-continued (521)

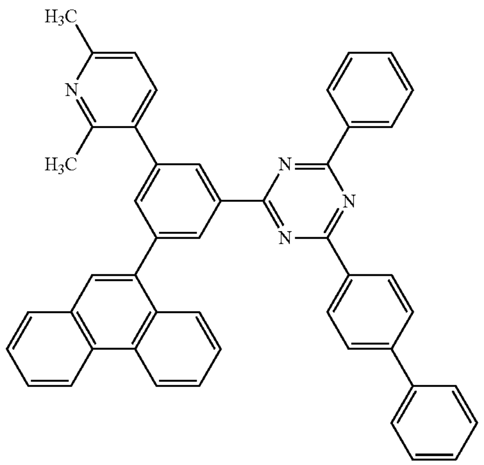

(522)

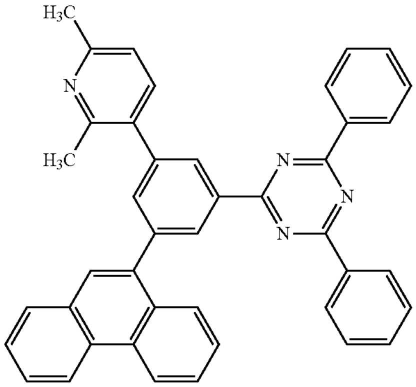

(523)

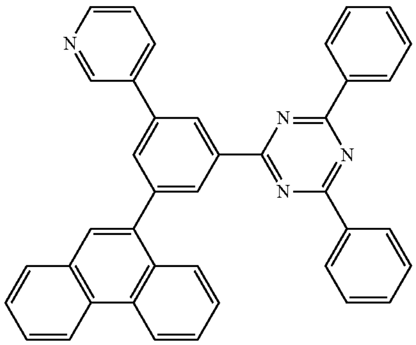

-continued (524)

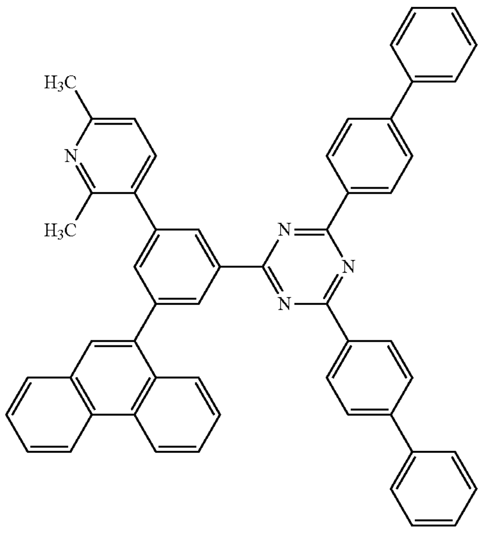

The organic compounds represented by Structural Formulae (500) to (524) are examples of the organic compounds represented by General Formulae (Ge-1) to (Ge-4), and the specific examples of the electron-transport materials are not limited thereto.

Alternatively, an organic compound represented by any of Structural Formulae (600) to (622) below can be used as the electron-transport materials.

[Chemical Formula 63]

(600)

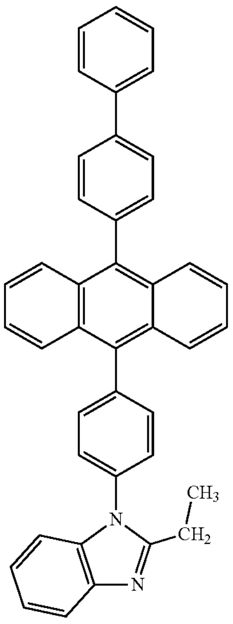

-continued
(601)
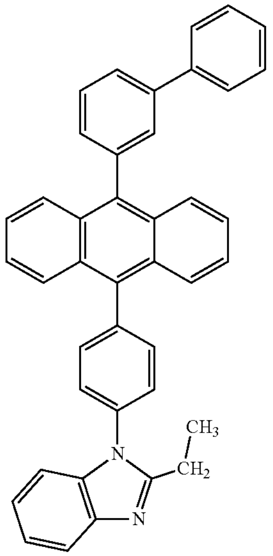
(602)
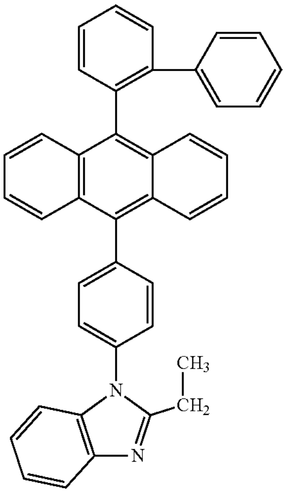
(603)
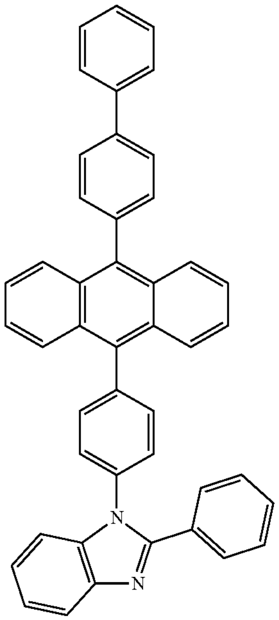
-continued
(604)
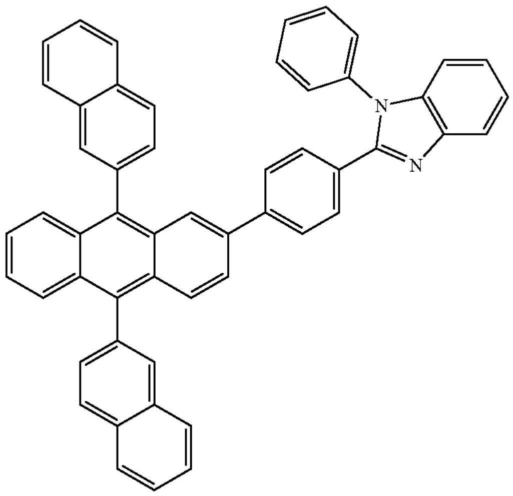
(605)
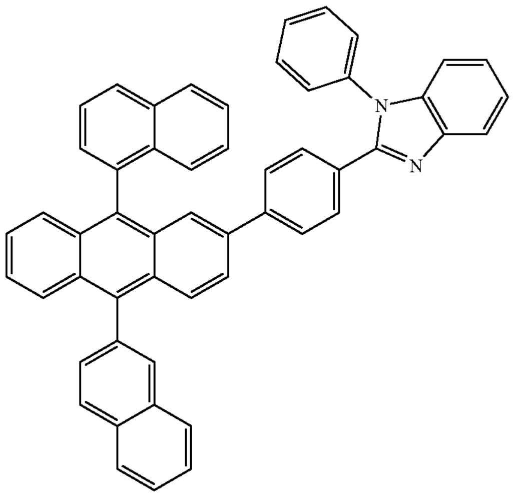
(606)
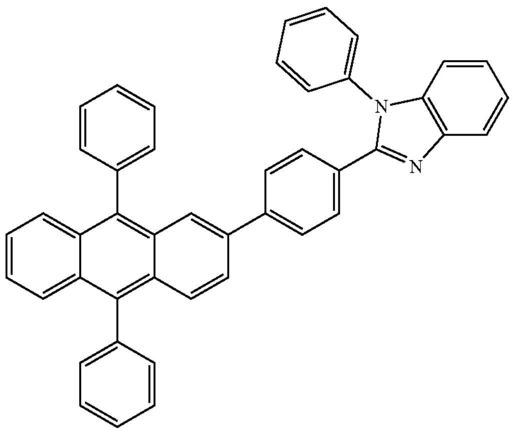

-continued
(607)
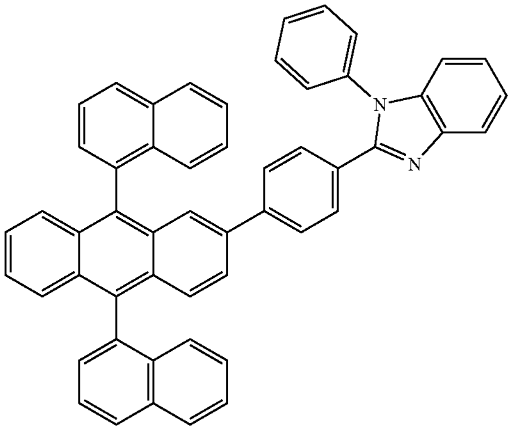
(608)
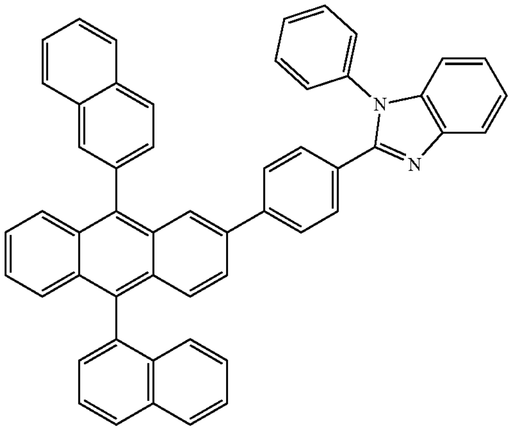
(609)
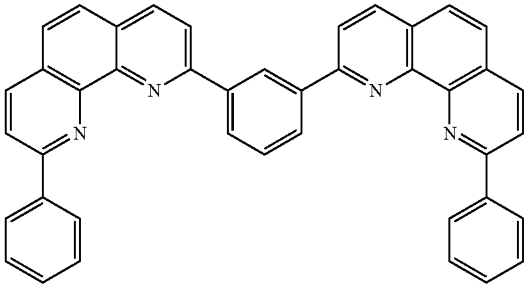
(610)
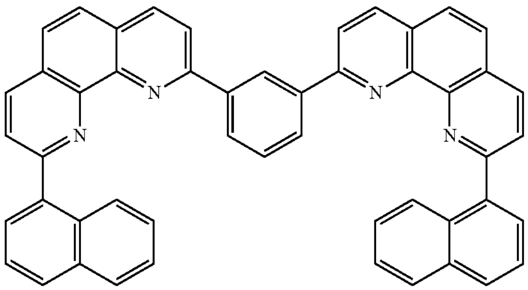
-continued
(611)
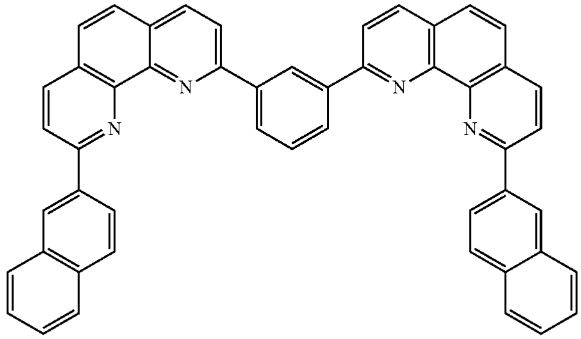
[Chemical Formula 64]
(612)
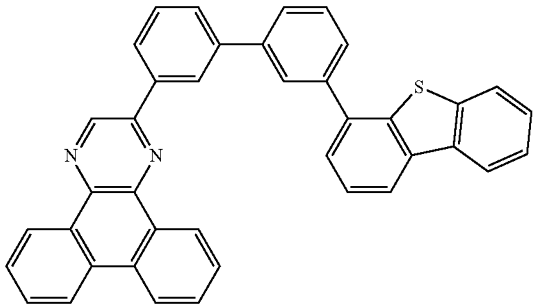
(613)
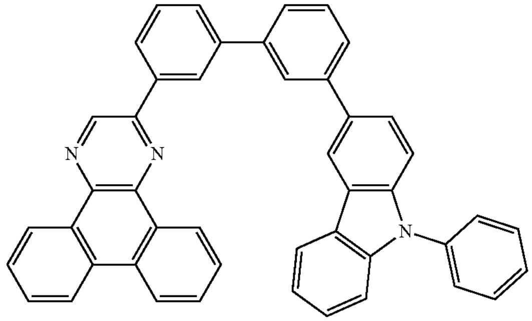
(614)
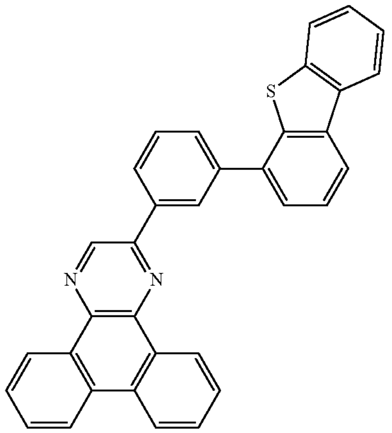

-continued (615)

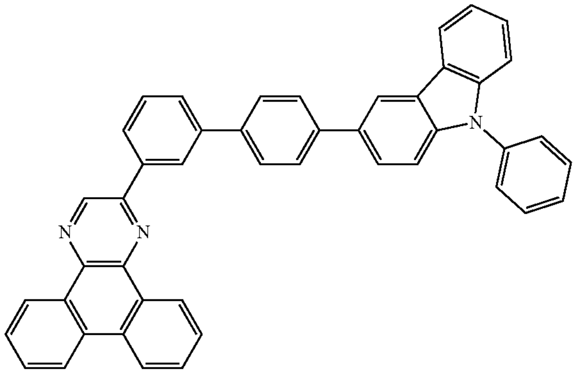

(616)

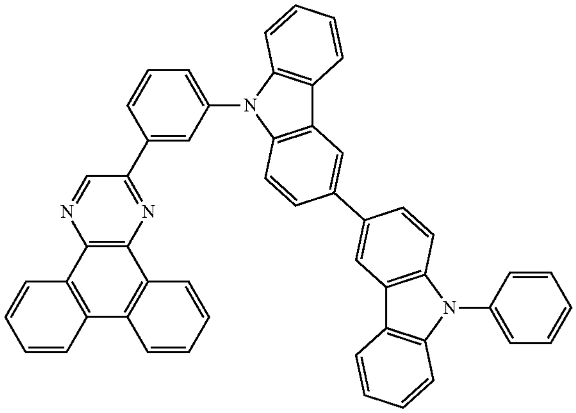

(617)

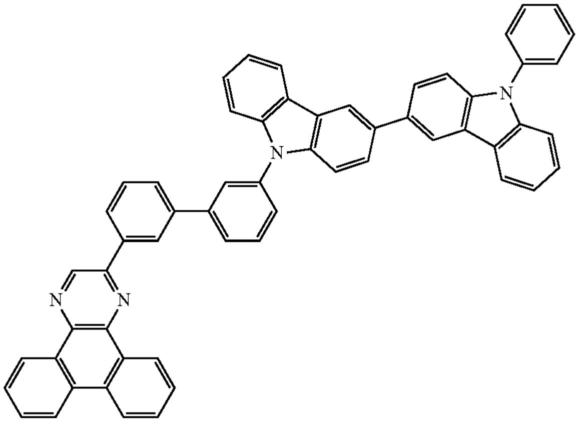

(618)

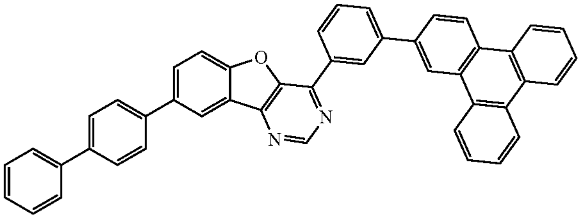

-continued (619)

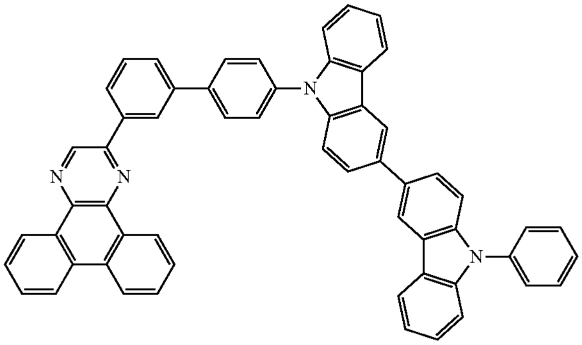

(620)

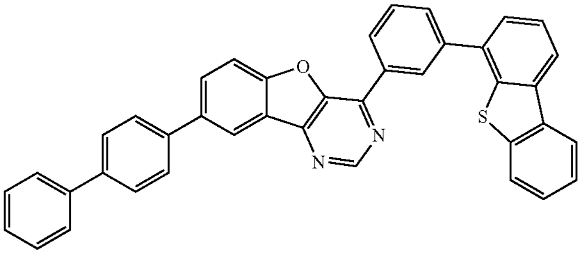

(621)

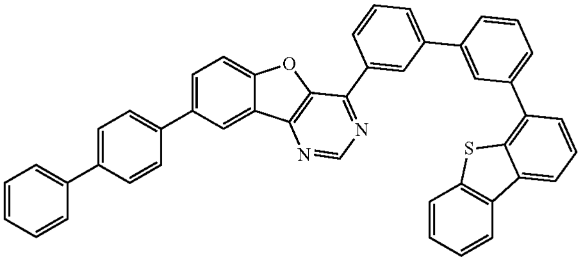

(622)

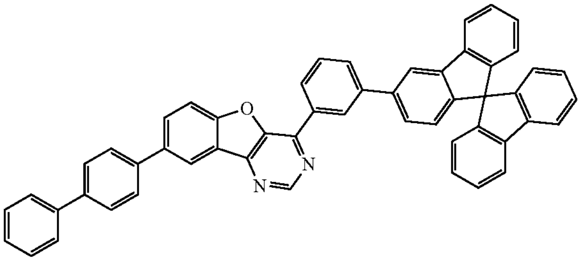

The second carrier-transport layer 214 can be formed using a material that can be used for an electron-transport layer 114 of the light-emitting device, which will be described in Embodiment 3.

The second carrier-transport layer 214 is not limited to a single layer and may be a stack of two or more layers each containing any of the above substances.

<Second Carrier-Injection Layer>

The second carrier-injection layer 215 is a layer for increasing the efficiency of electron injection from the photoelectric conversion layer 203 to the second electrode 202, and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The second carrier-injection layer 215 can be formed using a material that can be used for an electron-injection layer 115 of the light-emitting device, which will be described in Embodiment 3.

A structure in which a plurality of photoelectric conversion layers are stacked between a pair of electrodes (the structure is also referred to as a tandem structure) can be obtained by providing a charge-generation layer between two photoelectric conversion layers 203. In addition, three or more photoelectric conversion layers may be stacked with charge-generation layers each provided between adjacent photoelectric conversion layers. The charge-generation layer can be formed using a material that can be used for a charge-generation layer 106 of the light-emitting device, which will be described in Embodiment 3.

Materials that can be used for the layers (the first carrier-injection layer 211, the first carrier-transport layer 212, the active layer 213, the second carrier-transport layer 214, and the second carrier-injection layer 215) included in the photoelectric conversion layer 203 of the photoelectric conversion device described in this embodiment are not limited to the materials described in this embodiment, and other materials can be used in combination as long as the functions of the layers are fulfilled.

Note that in this specification and the like, the terms "layer" and "film" can be interchanged with each other as appropriate.

Note that the photoelectric conversion device of one embodiment of the present invention has a function of sensing visible light. The photoelectric conversion device of one embodiment of the present invention has sensitivity to visible light. The photoelectric conversion device of one embodiment of the present invention further preferably has a function of sensing visible light and infrared light. The photoelectric conversion device of one embodiment of the present invention preferably has sensitivity to visible light and infrared light.

In this specification and the like, a blue (B) wavelength range is greater than or equal to 400 nm and less than 490 nm, and blue (B) light has at least one emission spectrum peak in the wavelength range. A green (G) wavelength range is greater than or equal to 490 nm and less than 580 nm, and green (G) light has at least one emission spectrum peak in the wavelength range. A red (R) wavelength range is greater than or equal to 580 nm and less than 700 nm, and red (R) light has at least one emission spectrum peak in the wavelength range. In this specification and the like, a visible light wavelength range is greater than or equal to 400 nm and less than 700 nm, and visible light has at least one emission spectrum peak in the wavelength range. An infrared (IR) wavelength range is greater than or equal to 700 nm and less than 900 nm, and infrared (IR) light has at least one emission spectrum peak in the wavelength range.

Figure 4A:
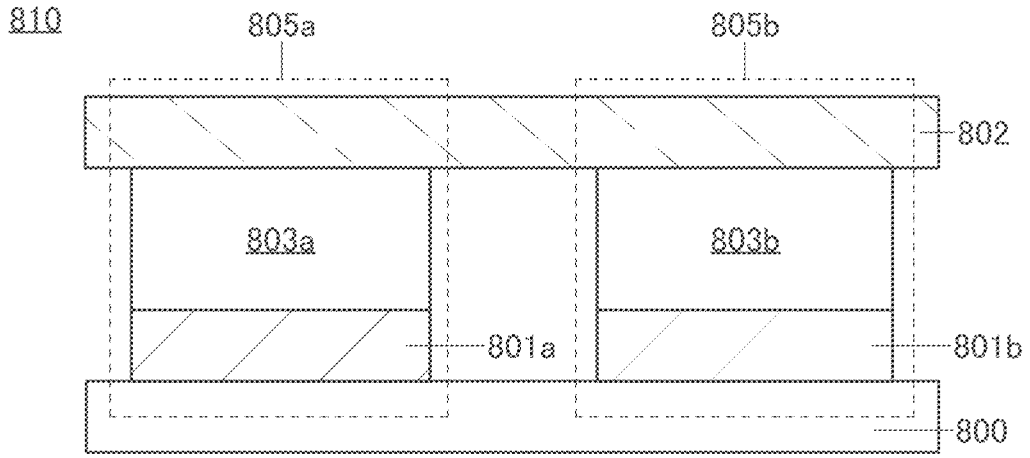
FIGS. 4A to 4C illustrate a light-emitting and light-receiving apparatus of one embodiment of the present invention.

The above-described photoelectric conversion device of one embodiment of the present invention can be used for a display apparatus including an organic EL device. In other words, the photoelectric conversion device of one embodiment of the present invention can be incorporated into a display apparatus including an organic EL device. As an example, FIG. 4A illustrates a schematic cross-sectional view of a light-emitting and light-receiving apparatus 810 in which a light-emitting device 805*a* and a photoelectric conversion device 805*b* are formed over the same substrate.

The light-emitting and light-receiving apparatus 810 includes the light-emitting device 805*a* and the photoelectric conversion device 805*b*, and thus has one or both of an imaging function and a sensing function in addition to a function of displaying an image.

The light-emitting device 805*a* has a function of emitting light (hereinafter, also referred to as a light-emitting function). The light-emitting device 805*a* includes an electrode 801*a*, an EL layer 803*a*, and an electrode 802. The EL layer 803*a* interposed between the electrode 801*a* and the electrode 802 at least includes a light-emitting layer. The light-emitting layer contains a light-emitting substance. The EL layer 803*a* emits light when a voltage is applied between the electrode 801*a* and the electrode 802. The EL layer 803*a* may include any of a variety of layers such as a hole-injection layer, a hole-transport layer, an electron-transport layer, an electron-injection layer, a carrier-blocking (hole-blocking or electron-blocking) layer, and a charge-generation layer, in addition to the light-emitting layer. For the light-emitting device 805*a*, a structure of a light-emitting device, which is an organic EL device to be described in Embodiment 3, can be employed.

The photoelectric conversion device 805*b* has a function of sensing light (hereinafter, also referred to as alight-receiving function). The photoelectric conversion device 805*b* includes an electrode 801*b*, a photoelectric conversion layer 803*b*, and the electrode 802. The photoelectric conversion layer 803*b* interposed between the electrode 801*b* and the electrode 802 at least includes an active layer. The photoelectric conversion device 805*b* functions as a photoelectric conversion device; when light is incident on the photoelectric conversion layer 803*b*, electric charge can be generated and extracted as a current. At this time, a voltage may be applied between the electrode 801*b* and the electrode 802. The amount of generated electric charge depends on the amount of the light incident on the photoelectric conversion layer 803*b*. For the photoelectric conversion device 805*b*, the structure of the above-described photoelectric conversion device 200 can be employed.

The photoelectric conversion device 805*b*, which is easily made thin, lightweight, and large in area and has a high degree of freedom for shape and design, can be used in a variety of display apparatuses. In addition, the EL layer 803*a* included in the light-emitting device 805*a* and the photoelectric conversion layer 803*b* included in the photoelectric conversion device 805*b* can be formed by the same method (e.g., a vacuum evaporation method) with the same manufacturing apparatus, which is preferable.

The electrode 801*a* and the electrode 801*b* are provided on the same plane. In FIG. 4A, the electrodes 801*a* and 801*b* are provided over a substrate 800. The electrodes 801*a* and 801*b* can be formed by processing a conductive film formed over the substrate 800 into an island shape, for example. In other words, the electrodes 801*a* and 801*b* can be formed through the same process.

As the substrate 800, a substrate having heat resistance high enough to withstand the formation of the light-emitting device 805*a* and the photoelectric conversion device 805*b* can be used. When an insulating substrate is used as the substrate 800, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 800, it is particularly preferable to use the insulating substrate or the semiconductor substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

The electrode 802 is formed of a layer shared by the light-emitting device 805*a* and the photoelectric conversion device 805*b*. As the electrode through which light enters or exits among these electrodes, a conductive film that transmits visible light and infrared light is used. As the electrode through which light neither enters nor exits, a conductive film that reflects visible light and infrared light is preferably used.

The electrode 802 in the display apparatus of one embodiment of the present invention functions as one of the electrodes in each of the light-emitting device 805*a* and the photoelectric conversion device 805*b*.

Figure 4B:
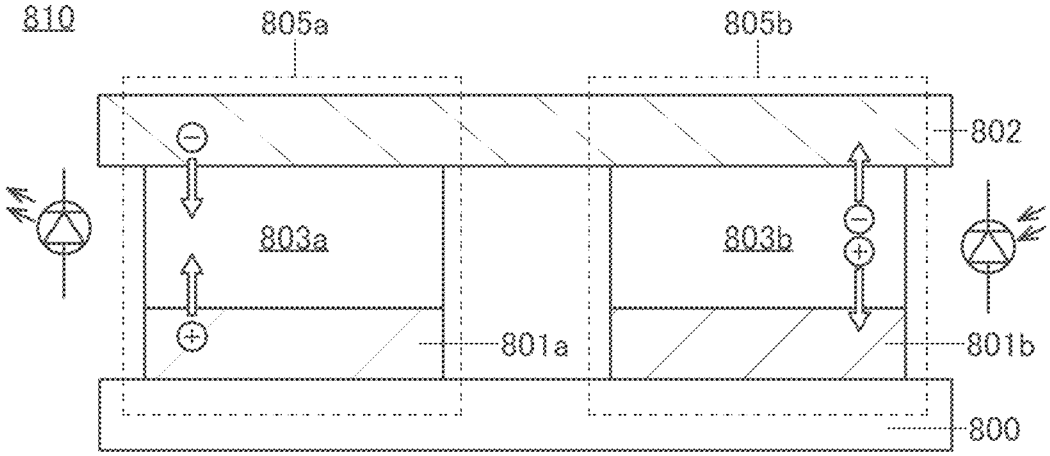

In FIG. 4B, the electrode 801*a* of the light-emitting device 805*a* has a potential higher than that of the electrode 802. In this case, the electrode 801*a* functions as an anode and the electrode 802 functions as a cathode in the light-emitting device 805*a*. The electrode 801*b* of the photoelectric conversion device 805*b* has a potential lower than that of the electrode 802. For easy understanding of the direction of current flow, FIG. 4B illustrates a circuit symbol of a light-emitting diode on the left of the light-emitting device 805*a* and a circuit symbol of a photodiode on the right of the photoelectric conversion device 805*b*. The flow directions of carriers (electrons and holes) in each device are also schematically indicated by arrows.

Figure 4C:
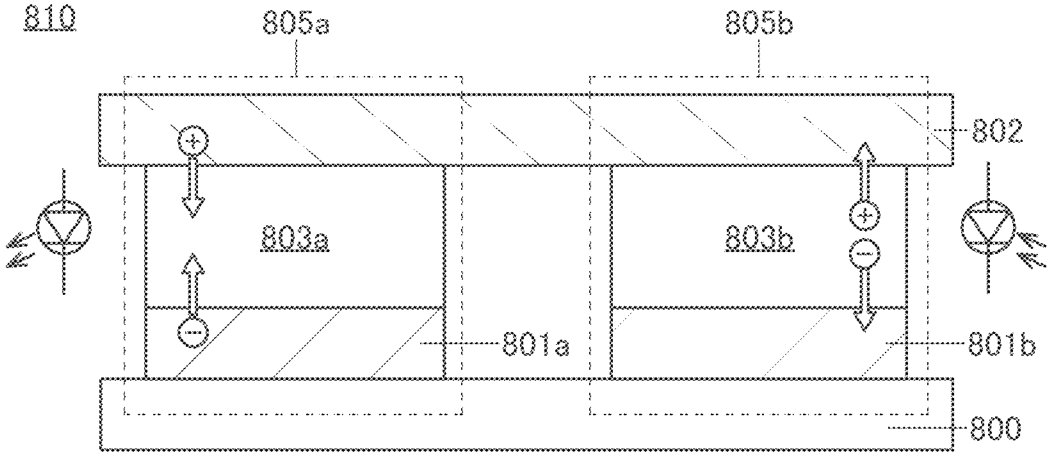

In FIG. 4C, the electrode 801*a* of the light-emitting device 805*a* has a potential lower than that of the electrode 802. In this case, the electrode 801*a* functions as a cathode and the electrode 802 functions as an anode in the light-emitting device 805*a*. The electrode 801*b* of the photoelectric conversion device 805*b* has a potential lower than that of the electrode 802 and a potential higher than that of the electrode 801*a*. For easy understanding of the direction of current flow, FIG. 4C illustrates a circuit symbol of a light-emitting diode on the left of the light-emitting device 805*a* and a circuit symbol of a photodiode on the right of the photoelectric conversion device 805*b*. The flow directions of carriers (electrons and holes) in each device are also schematically indicated by arrows.

Figure 5A:
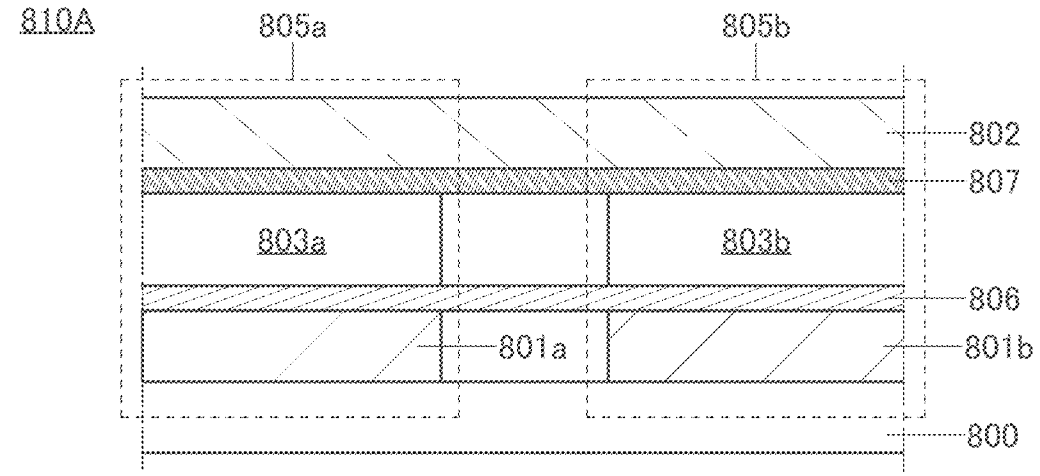
FIGS. 5A and 5B each illustrate a light-emitting and light-receiving apparatus of one embodiment of the present invention.

FIG. 5A illustrates a light-emitting and light-receiving apparatus 810A that is a variation example of the light-emitting and light-receiving apparatus 810. The light-emitting and light-receiving apparatus 810A is different from the light-emitting and light-receiving apparatus 810 in including a common layer 806 and a common layer 807. In the light-emitting device 805*a*, the common layers 806 and 807 function as part of the EL layer 803*a*. In the photoelectric conversion device 805*b*, the common layers 806 and 807 function as part of the photoelectric conversion layer 803*b*. The common layer 806 includes a hole-injection layer and a hole-transport layer, for example. The common layer 807 includes an electron-transport layer and an electron-injection layer, for example. The photoelectric conversion device 805*b* including the common layer 807 includes the structure body between the active layer and the common layer as described in Embodiment 1, and thus an increase in the driving voltage is inhibited and a photoelectric conversion device having favorable characteristics can be achieved.

With the common layers 806 and 807, a light-receiving element can be incorporated without a significant increase in the number of times of separate coloring, whereby the light-emitting and light-receiving apparatus 810A can be manufactured with a high throughput.

Figure 5B:
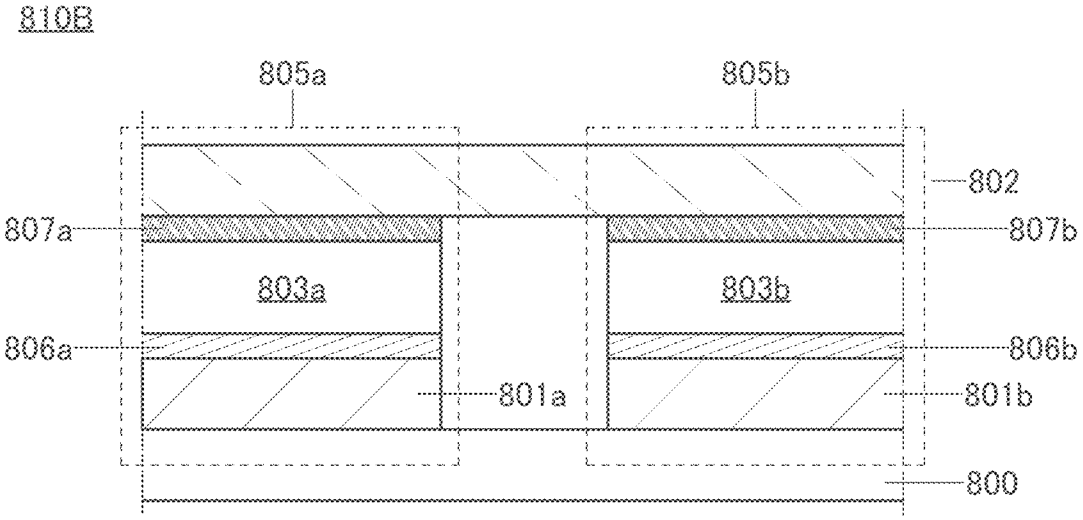

FIG. 5B illustrates a light-emitting and light-receiving apparatus 810B that is a variation example of the light-emitting and light-receiving apparatus 810. The light-emitting and light-receiving apparatus 810B is different from the light-emitting and light-receiving apparatus 810 in that the EL layer 803*a* includes a layer 806*a* and a layer 807*a* and the photoelectric conversion layer 803*b* includes a layer 806*b* and a layer 807*b*. The layers 806*a* and 806*b* are formed using different materials, and each include a hole-injection layer and a hole-transport layer, for example. Note that the layers 806*a* and 806*b* may be formed using the same material. The layers 807*a* and 807*b* are formed using different materials, and each include an electron-transport layer and an electron-injection layer, for example. Note that the layers 807*a* and 807*b* may be formed using the same material. The photoelectric conversion device 805*b* in which the layers 807*a* and 807*b* are formed using the same material includes the structure body between the active layer and the common layer as described in Embodiment 1, and thus an increase in the driving voltage is inhibited and a photoelectric conversion device having favorable characteristics can be achieved.

An optimum material for forming the light-emitting device 805*a* is selected for the layers 806*a* and 807*a* and an optimum material for forming the photoelectric conversion device 805*b* is selected for the layers 806*b* and 807*b*, whereby the light-emitting device 805*a* and the photoelectric conversion device 805*b* can have higher performance in the light-emitting and light-receiving apparatus 810B.

The resolution of the photoelectric conversion device 805*b* can be 100 ppi or more, preferably 200 ppi or more, further preferably 300 ppi or more, still further preferably 400 ppi or more, and yet further preferably 500 ppi or more, and 2000 ppi or less, 1000 ppi or less, or 600 ppi or less, for example. In particular, when the resolution of the photoelectric conversion device 805*b* is 200 ppi or more and 600 ppi or less, preferably 300 ppi or more and 600 ppi or less, the light-emitting and light-receiving apparatus of one embodiment of the present invention can be suitably used for image capturing of a fingerprint. In fingerprint authentication with the light-emitting and light-receiving apparatus 810, the increased resolution of the photoelectric conversion device 805*b* enables, for example, highly accurate extraction of the minutiae of fingerprints; thus, the accuracy of the fingerprint authentication can be increased. The resolution is preferably 500 ppi or more, in which case the authentication conforms to the standard by the National Institute of Standards and Technology (NIST) or the like. On the assumption that the resolution of the photoelectric conversion device is 500 ppi, the size of each pixel is 50.8 μm, which is adequate for image capturing of a fingerprint ridge distance (typically, greater than or equal to 300 μm and less than or equal to 500 μm).

The structures described in this embodiment can be used in appropriate combination with any of the structures described in the other embodiments.

Embodiment 3

In this embodiment, other structures of the light-emitting devices described in Embodiment 2 will be described with reference to FIGS. 6A to 6E.

<<Basic Structure of Light-Emitting Device>>

Figure 6A:
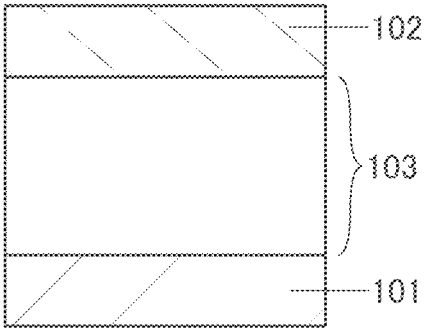
FIGS. 6A to 6E each illustrate a structure of a light-emitting device of an embodiment.

Basic structures of the light-emitting device are described. FIG. 6A illustrates a light-emitting device including, between a pair of electrodes, an EL layer including a light-emitting layer. Specifically, an EL layer 103 is interposed between the first electrode 101 and the second electrode 102.

Figure 6B:
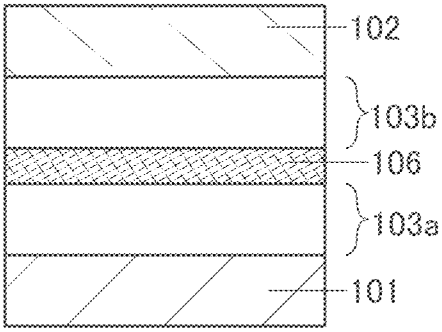

FIG. 6B illustrates a light-emitting device that has a stacked-layer structure (tandem structure) in which a plurality of EL layers (two EL layers 103*a* and 103*b* in FIG. 6B) are provided between a pair of electrodes and the charge-generation layer 106 is provided between the EL layers. A light-emitting device having a tandem structure enables fabrication of a light-emitting apparatus that can be driven at a low voltage and has low power consumption.

The charge-generation layer 106 has a function of injecting electrons into one of the EL layers 103*a* and 103*b* and injecting holes into the other of the EL layers 103*a* and 103*b* when a potential difference is caused between the first electrode 101 and the second electrode 102. Thus, when a voltage is applied in FIG. 6B such that the potential of the first electrode 101 is higher than that of the second electrode 102, the charge-generation layer 106 injects electrons into the EL layer 103*a* and injects holes into the EL layer 103*b*.

Note that in terms of light extraction efficiency, the charge-generation layer 106 preferably has a property of transmitting visible light (specifically, the charge-generation layer 106 preferably has a visible light transmittance of 40% or more). The charge-generation layer 106 functions even if it has lower conductivity than the first electrode 101 or the second electrode 102.

Figure 6C:
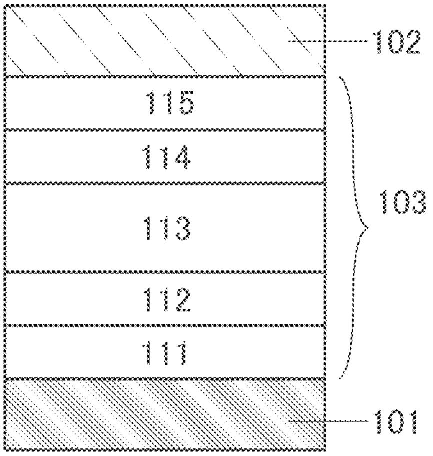

FIG. 6C illustrates a stacked-layer structure of the EL layer 103 in the light-emitting device of one embodiment of the present invention. In this case, the first electrode 101 is regarded as functioning as an anode and the second electrode 102 is regarded as functioning as a cathode. The EL layer 103 has a structure in which the hole-injection layer 111, the hole-transport layer 112, the light-emitting layer 113, the electron-transport layer 114, and the electron-injection layer 115 are sequentially stacked over the first electrode 101. Note that the light-emitting layer 113 may have a stacked-layer structure of a plurality of light-emitting layers that emit light of different colors. For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. The structure in which a plurality of light-emitting layers that emit light of the same color are stacked can sometimes achieve higher reliability than a single-layer structure. In the case where a plurality of EL layers are provided as in the tandem structure illustrated in FIG. 6B, the layers in each EL layer are sequentially stacked from the anode side as described above. When the first electrode 101 is the cathode and the second electrode 102 is the anode, the stacking order of the layers in the EL layer 103 is reversed. Specifically, the layer 111 over the first electrode 101 serving as the cathode is an electron-injection layer; the layer 112 is an electron-transport layer; the layer 113 is a light-emitting layer; the layer 114 is a hole-transport layer; and the layer 115 is a hole-injection layer.

The light-emitting layer 113 included in the EL layers (103, 103*a*, and 103*b*) contains an appropriate combination of a light-emitting substance and a plurality of substances, so that fluorescent or phosphorescent light of a desired emission color can be obtained. The light-emitting layer 113 may have a stacked-layer structure having different emission colors. In that case, light-emitting substances and other substances are different between the stacked light-emitting layers. Alternatively, the plurality of EL layers (103*a* and 103*b*) in FIG. 6B may exhibit their respective emission colors. Also in that case, the light-emitting substances and other substances are different between the stacked light-emitting layers.

The light-emitting device of one embodiment of the present invention can have a micro optical resonator (microcavity) structure when, for example, the first electrode 101 is a reflective electrode and the second electrode 102 is a semi-transmissive and semi-reflective electrode in FIG. 6C. Thus, light from the light-emitting layer 113 in the EL layer 103 can be resonated between the electrodes and light obtained through the second electrode 102 can be intensified.

Note that when the first electrode 101 of the light-emitting device is a reflective electrode having a stacked-layer structure of a reflective conductive material and a light-transmitting conductive material (transparent conductive film), optical adjustment can be performed by adjusting the thickness of the transparent conductive film. Specifically, when the wavelength of light obtained from the light-emitting layer 113 is $\lambda$, the optical path length between the first electrode 101 and the second electrode 102 (the product of the thickness and the refractive index) is preferably adjusted to be $m\lambda/2$ (m is a natural number) or close to $m\lambda/2$.

To amplify desired light (wavelength: $\lambda$) obtained from the light-emitting layer 113, it is preferable to adjust each of the optical path length from the first electrode 101 to a region where the desired light is obtained in the light-emitting layer 113 (light-emitting region) and the optical path length from the second electrode 102 to the region where the desired light is obtained in the light-emitting layer 113 (light-emitting region) to be $(2m'+1)\lambda/4$ (m' is a natural number) or close to $(2m'+1)\lambda/4$. Here, the light-emitting region means a region where holes and electrons are recombined in the light-emitting layer 113.

By such optical adjustment, the spectrum of specific monochromatic light obtained from the light-emitting layer 113 can be narrowed and light emission with high color purity can be obtained.

In the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102. Furthermore, the optical path length between the first electrode 101 and the light-emitting layer that emits the desired light is, to be exact, the optical path length between the reflective region in the first electrode 101 and the light-emitting region in the light-emitting layer that emits the desired light. However, it is difficult to precisely determine the reflective region in the first electrode 101 and the light-emitting region in the light-emitting layer that emits the desired light; thus, it is assumed that the above effect can be sufficiently obtained wherever the reflective region and the light-emitting region may be set in the first electrode 101 and the light-emitting layer that emits the desired light, respectively.

Figure 6D:
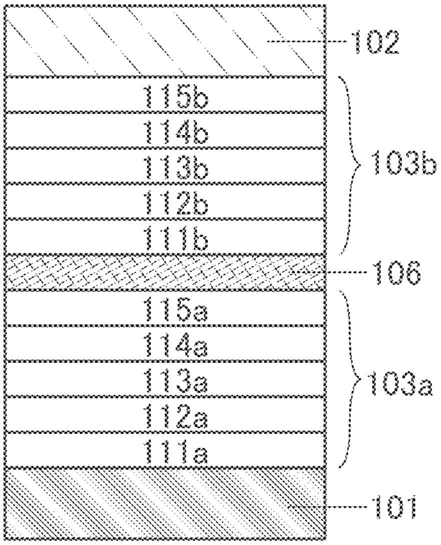

The light-emitting device illustrated in FIG. 6D is a light-emitting device having a tandem structure. Owing to a microcavity structure of the light-emitting device, light (monochromatic light) with different wavelengths from the EL layers (103*a* and 103*b*) can be extracted. Thus, separate coloring for obtaining a plurality of emission colors (e.g., R, G, and B) is not necessary. Therefore, high resolution can be easily achieved. A combination with coloring layers (color filters) is also possible. Furthermore, the emission intensity of light with a specific wavelength in the front direction can be increased, whereby power consumption can be reduced.

Figure 6E:
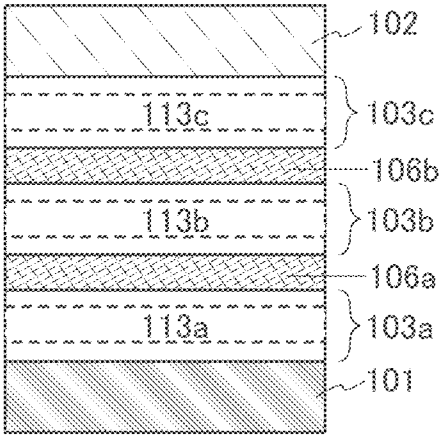

The light-emitting device illustrated in FIG. 6E is an example of the light-emitting device having the tandem structure illustrated in FIG. 6B, and includes three EL layers (103*a*, 103*b*, and 103*c*) stacked with charge-generation layers (106*a* and 106*b*) interposed therebetween, as illustrated in FIG. 6E. The three EL layers (103*a*, 103*b*, and 103*c*) include respective light-emitting layers (113*a*, 113*b*, and 113*c*), and the emission colors of the light-emitting layers can be selected freely. For example, each of the light-emitting layer 113*a* and the light-emitting layer 113*c* can emit blue light, and the light-emitting layer 113*b* can emit red light, green light, or yellow light. For another example, the light-emitting layer 113*a* can emit red light, the light-emitting layer 113*b* can emit blue light, green light, or yellow light, and the light-emitting layer 113*c* can emit red light.

In the light-emitting device of one embodiment of the present invention, at least one of the first electrode 101 and the second electrode 102 is a light-transmitting electrode (e.g., a transparent electrode or a semi-transmissive and semi-reflective electrode). In the case where the light-transmitting electrode is a transparent electrode, the transparent electrode has a visible light transmittance higher than or equal to 40%. In the case where the light-transmitting electrode is a semi-transmissive and semi-reflective electrode, the semi-transmissive and semi-reflective electrode has a visible light reflectance higher than or equal to 20% and lower than or equal to 80%, preferably higher than or equal to 40% and lower than or equal to 70%. These electrodes preferably have a resistivity of $1\times10^{-2}$ Ωcm or less.

When one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ Ωcm or less.

<<Specific Structure of Light-Emitting Device>>

Next, a specific structure of the light-emitting device of one embodiment of the present invention will be described. Here, the description is made using FIG. 6D illustrating the tandem structure. Note that the structure of the EL layer applies also to the structure of the light-emitting devices having a single structure in FIG. 6A and FIG. 6C. When the light-emitting device in FIG. 6D has a microcavity structure, the first electrode 101 is formed as a reflective electrode and the second electrode 102 is formed as a semi-transmissive and semi-reflective electrode. Thus, a single-layer structure or a stacked-layer structure can be formed using one or more kinds of desired electrode materials. Note that the second electrode 102 is formed after formation of the EL layer 103*b*, with the use of a material selected as described above.

<First Electrode and Second Electrode>

As materials for the first electrode 101 and the second electrode 102, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device in FIG. 6D, when the first electrode 101 is the anode, a hole-injection layer 111*a* and a hole-transport layer 112*a* of the EL layer 103*a* are sequentially stacked over the first electrode 101 by a vacuum evaporation method. After the EL layer 103*a* and the charge-generation layer 106 are formed, a hole-injection layer 111*b* and a hole-transport layer 112*b* of the EL layer 103*b* are sequentially stacked over the charge-generation layer 106 in a similar manner.

<Hole-Injection Layer>

The hole-injection layers (111, 111*a*, and 111*b*) inject holes from the first electrode 101 serving as the anode or the charge-generation layers (106, 106*a*, and 106*b*) to the EL layers (103, 103*a*, and 103*b*) and contain an organic acceptor material or a material having a high hole-injection property.

The organic acceptor material allows holes to be generated in another organic compound whose HOMO level is close to the LUMO level of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, and a hexaazatriphenylene derivative, can be used. Examples of the organic acceptor material include 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. Note that among organic acceptor materials, a compound in which electron-withdrawing groups are bonded to fused aromatic rings each having a plurality of heteroatoms, such as HAT-CN, is particularly preferable because it has a high acceptor property and stable film quality against heat. Besides, a [3]radialene derivative having an electron-with-drawing group (particularly a cyano group or a halogen group such as a fluoro group), which has a very high electron-accepting property, is preferable; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

As the material having a high hole-injection property, an oxide of a metal belonging to Group 4 to Group 8 of the periodic table (e.g., a transition metal oxide such as molybdenum oxide, vanadium oxide, ruthenium oxide, tungsten oxide, or manganese oxide) can be used. Specific examples include molybdenum oxide, vanadium oxide, niobium oxide, tantalum oxide, chromium oxide, tungsten oxide, manganese oxide, and rhenium oxide. Among these oxides, molybdenum oxide is preferable because it is stable in the air, has a low hygroscopic property, and is easily handled. Other examples include phthalocyanine (abbreviation: $H_2Pc$) and a phthalocyanine-based compound such as copper phthalocyanine (abbreviation: CuPc).

Other examples include aromatic amine compounds, which are low molecular compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis[4-bis(3-methylphenyl)aminophenyl]-N,N'-diphenyl-4,4'-diaminobiphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

As the material having a high hole-injection property, a mixed material containing a hole-transport material and the above-described organic acceptor material (electron-accepting material) can be used. In that case, the organic acceptor material extracts electrons from the hole-transport material, so that holes are generated in the hole-injection layer 111 and the holes are injected into the light-emitting layer 113 through the hole-transport layer 112. Note that the hole-injection layer 111 may be formed to have a single-layer structure using a mixed material containing a hole-transport material and an organic acceptor material (electron-accepting material), or a stacked-layer structure of a layer containing a hole-transport material and a layer containing an organic acceptor material (electron-accepting material).

The hole-transport material preferably has a hole mobility higher than or equal to $1\times10^{-6}$ $cm^2/Vs$ in the case where the square root of the electric field strength [V/cm] is 600. Note that any other substance can also be used as long as the substance has a hole-transport property higher than an electron-transport property.

As the hole-transport material, materials having a high hole-transport property, such as a compound having a π-electron rich heteroaromatic ring (e.g., a carbazole derivative, a furan derivative, or a thiophene derivative) and an aromatic amine (an organic compound having an aromatic amine skeleton), are preferable.

Examples of the carbazole derivative (an organic compound having a carbazole ring) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: PNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]-9,9'-spirobi[9H-fluoren]-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl) phenylaniline (abbreviation: YGAIBP), N,N'-bis[4-(carbazol-9-yl)phenyl]-N,N'-diphenyl-9,9-dimethylfluorene-2,7-diamine (abbreviation: YGA2F), 4,4',4"-tris(carbazol-9-yl) triphenylamine (abbreviation: TCTA), N-(9,9-diphenyl-9H-fluoren-2-yl)-N,9-diphenyl-9H-carbazol-3-amine (abbreviation: PCAFLP(2)), and N-(9,9-diphenyl-9H-fluoren-2-yl)-N,9-diphenyl-9H-carbazol-2-amine (abbreviation: PCAFLP(2)-02).

Other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (an organic compound having a furan ring) include 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

Specific examples of the thiophene derivative (an organic compound having a thiophene ring) include an organic compound having a thiophene ring, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(4-biphenyl)-N-(4-[(9-phenyl)-9H-fluoren-9-yl]-phenyl)-9,9-dimethyl-9H-fluoren-2-amine (abbreviation: FBiFLP), N,N,N',N'-tetrakis(4-biphenyl)-1,1-biphenyl-4,4'-diamine (abbreviation: BBA2BP), N,N-bis(9,9-dimethyl-9H-fluoren-2-yl)-9,9'-spirobi[9H-fluoren]-4-amine (abbreviation: $SF_4FAF$), N-(9,9-dimethyl-9H-fluoren-2-yl)-N-(9,9-dimethyl-2-[N'-phenyl-N'-(9,9-dimethyl-9H-fluoren-2-yl)amino]-9H-fluoren-7-yl)phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), bis-biphenyl-4'-(carbazol-9-yl)biphenylamine (abbreviation: YGBBi1BP), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Other examples of the hole-transport material include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine](abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

Note that the hole-transport material is not limited to the above examples, and any of a variety of known materials may be used alone or in combination as the hole-transport material.

The hole-injection layers (111, 111*a*, and 111*b*) can be formed by any of known film formation methods such as a vacuum evaporation method.

<Hole-Transport Layer>

The hole-transport layers (112, 112*a*, and 112*b*) transport the holes, which are injected from the first electrode 101 by the hole-injection layers (111, 111*a*, and 111*b*), to the light-emitting layers (113, 113*a*, and 113*b*). Note that the hole-transport layers (112, 112*a*, and 112*b*) contain a hole-transport material. Thus, the hole-transport layers (112,

112*a*, and 112*b*) can be formed using a hole-transport material that can be used for the hole-injection layers (111, 111*a*, and 111*b*).

Note that in the light-emitting device of one embodiment of the present invention, the organic compound used for the hole-transport layers (112, 112*a*, and 112*b*) can also be used for the light-emitting layers (113, 113*a*, and 113*b*). The use of the same organic compound for the hole-transport layers (112, 112*a*, and 112*b*) and the light-emitting layers (113, 113*a*, and 113*b*) is preferable, in which case holes can be efficiently transported from the hole-transport layers (112, 112*a*, and 112*b*) to the light-emitting layers (113, 113*a*, and 113*b*).

<Light-Emitting Layer>

The light-emitting layers (113, 113*a*, 113*b*, and 113*c*) contain a light-emitting substance. Note that as a light-emitting substance that can be used in the light-emitting layers (113, 113*a*, 113*b*, and 113*c*), a substance whose emission color is blue, violet, bluish violet, green, yellowish green, yellow, orange, red, or the like can be used as appropriate. When a plurality of light-emitting layers are provided, the use of different light-emitting substances for the light-emitting layers enables a structure that exhibits different emission colors (e.g., white light emission obtained by a combination of complementary emission colors). Furthermore, one light-emitting layer may have a stacked-layer structure of layers containing different light-emitting substances.

The light-emitting layers (113, 113*a*, 113*b*, and 113*c*) may each contain one or more kinds of organic compounds (e.g., a host material) in addition to a light-emitting substance (guest material).

In the case where a plurality of host materials are used in the light-emitting layers (113, 113*a*, 113*b*, and 113*c*), a second host material that is additionally used is preferably a substance having a larger energy gap than a known guest material and a first host material. Preferably, the lowest singlet excitation energy level (S1 level) of the second host material is higher than that of the first host material, and the lowest triplet excitation energy level (T1 level) of the second host material is higher than that of the guest material. Preferably, the lowest triplet excitation energy level (T1 level) of the second host material is higher than that of the first host material. With such a structure, an exciplex can be formed by the two kinds of host materials. To form an exciplex efficiently, it is particularly preferable to combine a compound that easily accepts holes (hole-transport material) and a compound that easily accepts electrons (electron-transport material). With the above structure, high efficiency, a low voltage, and a long lifetime can be achieved at the same time.

As an organic compound used as the host material (including the first host material and the second host material), organic compounds such as the hole-transport materials usable in the hole-transport layers (112, 112*a*, and 112*b*) and electron-transport materials usable in electron-transport layers (114, 114*a*, and 114*b*) described later can be used as long as they satisfy requirements for the host material used in the light-emitting layer. Another example is an exciplex formed by two or more kinds of organic compounds (the first host material and the second host material). An exciplex whose excited state is formed by two or more kinds of organic compounds has an extremely small difference between the S1 level and the T1 level and functions as a TADF material capable of converting triplet excitation energy into singlet excitation energy. In an example of a preferable combination of two or more kinds of organic compounds forming an exciplex, one of the two or more kinds of organic compounds has a x-electron deficient heteroaromatic ring and the other has a π-electron rich heteroaromatic ring. A phosphorescent substance such as an iridium-, rhodium-, or platinum-based organometallic complex or a metal complex may be used as one component of the combination for forming an exciplex.

There is no particular limitation on the light-emitting substances that can be used for the light-emitting layers (113, 113*a*, 113*b*, and 113*c*), and a light-emitting substance that converts singlet excitation energy into light in the visible light range or a light-emitting substance that converts triplet excitation energy into light in the visible light range can be used.

<<Light-Emitting Substance that Converts Singlet Excitation Energy into Light>>

The following substances that emit fluorescent light (fluorescent substances) can be given as examples of the light-emitting substance that converts singlet excitation energy into light and can be used in the light-emitting layers (113, 113*a*, 113*b*, and 113*c*): a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of pyrene derivatives include N,N'-bis(3-methylphenyl)-N,N'-bis[3-(9-phenyl-9H-fluoren-9-yl)phenyl]pyrene-1,6-diamine (abbreviation: 1,6mMemFLPAPm), (N,N'-diphenyl-N,N'-bis[4-(9-phenyl-9H-fluoren-9-yl)phenyl]pyrene-1,6-diamine) (abbreviation: 1,6FLPAPm), N,N'-bis(dibenzofuran-2-yl)-N,N'-diphenylpyrene-1,6-diamine (abbreviation: 1,6FrAPm), N,N'-bis(dibenzothiophen-2-yl)-N,N'-diphenylpyrene-1,6-diamine (abbreviation: 1,6TbAPm), N,N'-(pyrene-1,6-diyl)bis[(N-phenylbenzo[b]naphtho[1,2-d]furan)-6-amine](abbreviation: 1,6BnfAPm), N,N'-(pyrene-1,6-diyl)bis[(N-phenylbenzo[b]naphtho[1,2-d]furan)-8-amine] (abbreviation: 1,6BnfAPm-02), and N,N'-(pyrene-1,6-diyl)bis[(6,N-diphenylbenzo[b]naphtho[1,2-d]furan)-8-amine] (abbreviation: 1,6BnfAPm-03).

In addition, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 4,4'-bis(diphenylamino)-1,1'-biphenyl (abbreviation: TBP), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), and N-[4-(9,10-diphenyl-2-anthryl)phenyl]-N,N',N'-triphenyl-1,4-phenylenediamine (abbreviation: 2DPAPPA).

It is also possible to use, for example, N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPm-03, 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). In particular, pyrenediamine compounds such as 1,6FLPAPm, 1,6mMemFLPAPm, and 1,6BnfAPm-03 can be used, for example.

<<Light-Emitting Substance that Converts Triplet Excitation Energy into Light>>

Examples of the light-emitting substance that converts triplet excitation energy into light and can be used in the light-emitting layer 113 include substances that emit phosphorescent light (phosphorescent substances) and thermally activated delayed fluorescent (TADF) materials that exhibit thermally activated delayed fluorescence.

A phosphorescent substance is a compound that emits phosphorescent light but does not emit fluorescent light at a temperature higher than or equal to a low temperature (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), or a rare earth metal complex, for example. Specifically, the phosphorescent substance preferably contains a transition metal element. It is particularly preferable that the phosphorescent substance contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

<<Phosphorescent Substance (from 450 nm to 570 nm, Blue or Green)>>

As examples of a phosphorescent substance which emits blue or green light and whose emission spectrum has a peak wavelength of greater than or equal to 450 nm and less than or equal to 570 nm, the following substances can be given.

Examples include organometallic complexes having a 4H-triazole ring, such as tris(2-[5-(2-methylphenyl)-4-(2,6-dimethylphenyl)-4H-1,2,4-triazol-3-yl-κ$N^2$]phenyl-KC)iridium(III) (abbreviation: $[Ir(mpptz\text{-}dmp)_3]$), tris(5-methyl-3,4-diphenyl-4H-1,2,4-triazolato)iridium(III) (abbreviation: $[Ir(Mptz)_3]$), tris[4-(3-biphenyl)-5-isopropyl-3-phenyl-4H-1,2,4-triazolato]iridium(III) (abbreviation: $[Ir(iPrptz\text{-}3b)_3]$), and tris[3-(5-biphenyl)-5-isopropyl-4-phenyl-4H-1,2,4-triazolato]iridium(III) (abbreviation: $[Ir(iPr5btz)_3]$); organometallic complexes having a 1H-triazole ring, such as tris[3-methyl-1-(2-methylphenyl)-5-phenyl-1H-1,2,4-triazolato]iridium(III) (abbreviation: $[Ir(Mptz1\text{-}mp)_3]$) and tris(1-methyl-5-phenyl-3-propyl-1H-1,2,4-triazolato)iridium(III) (abbreviation: $[Ir(Prptz1\text{-}Me)_3]$); organometallic complexes having an imidazole ring, such as fac-tris[1-(2,6-diisopropylphenyl)-2-phenyl-1H-imidazole]iridium(III) (abbreviation: $[Ir(iPrpim)_3]$) and tris[3-(2,6-dimethylphenyl)-7-methylimidazo[1,2-f]phenanthridinato]iridium(III) (abbreviation: $[Ir(dmpimpt\text{-}Me)_3]$); and organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis(2-[3',5'-bis(trifluoromethyl)phenyl]pyridinato-N,$C^{2'}$)iridium(III) picolinate (abbreviation: $[Ir(CF_3ppy)_2(pic)]$), and bis[2-(4',6'-difluorophenyl)pyridinato-N,$C^{2'}$]iridium(III) acetylacetonate (abbreviation: FIr(acac)).

<<Phosphorescent Substance (from 495 nm to 590 nm, Green or Yellow)>>

As examples of a phosphorescent substance which emits green or yellow light and whose emission spectrum has a peak wavelength of greater than or equal to 495 nm and less than or equal to 590 nm, the following substances can be given.

Examples include organometallic iridium complexes having a pyrimidine ring, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)$_4$-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato)bis(4,6-dimethyl-2-[6-(2,6-dimethylphenyl)-4-pyrimidinyl-κ$N^3$]phenyl-KC)iridium(III) (abbreviation: $[Ir(dmppm\text{-}dmp)_2(acac)]$), and (acetylacetonato)bis(4,6-diphenylpyrimidinato)iridium(III) (abbreviation: $[Ir(dppm)_2(acac)]$); organometallic iridium complexes having a pyrazine ring, such as (acetylacetonato)bis(3,5-dimethyl-2-phenylpyrazinato)iridium(III) (abbreviation: $[Ir(mppr\text{-}Me)_2(acac)]$) and (acetylacetonato)bis(5-isopropyl-3-methyl-2-phenylpyrazinato)iridium(III) (abbreviation: $[Ir(mppr\text{-}iPr)_2(acac)]$); organometallic iridium complexes having a pyridine ring, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), bis[2-(2-pyridinyl-κN)phenyl-κC][2-(4-phenyl-2-pyridinyl-κN)phenyl-κC]iridium(III) (abbreviation: $[Ir(ppy)_2(4dppy)]$), bis[2-(2-pyridinyl-κN)phenyl-κC][2-(4-methyl-5-phenyl-2-pyridinyl-κN)phenyl-κC], [2-$d_3$-methyl-8-(2-pyridinyl-κN)benzofuro[2,3-b]pyridine-κC]bis[2-(5-$d_3$-methyl-2-pyridinyl-κ$N^2$)phenyl-κC]iridium(III) (abbreviation: Ir(5mppy-$d_3$)$_2$(mbfpypy-$d_3$)), {2-(methyl-$d_3$)-8-[4-(1-methylethyl-1-d)-2-pyridinyl-κN]benzofuro[2,3-b]pyridin-7-yl-κC}bis(5-(methyl-$d_3$)-2-[5-(methyl-$d_3$)-2-pyridinyl-κN]phenyl-KC)iridium(III) (abbreviation: Ir(5mtpy-$d_6$)$_2$(mbfpypy-iPr-$d_4$)), [2-$d_3$-methyl-(2-pyridinyl-κN)benzofuro[2,3-b]pyridine-κC]bis[2-(2-pyridinyl-κN)phenyl-κC]iridium(III) (abbreviation: Ir(ppy)$_2$(mbfpypy-$d_3$)), and [2-(4-methyl-5-phenyl-2-pyridinyl-κN)phenyl-κC]bis[2-(2-pyridinyl-κN)phenyl-κC]iridium(III) (abbreviation: Ir(ppy)$_2$(mdppy)); organometallic complexes such as bis(2,4-diphenyl-1,3-oxazolato-N,$C^{2'}$)iridium(III) acetylacetonate (abbreviation: $[Ir(dpo)_2(acac)]$), bis(2-[4'-(perfluorophenyl)phenyl]pyridinato-N,$C^{2'}$)iridium(III) acetylacetonate (abbreviation: $[Ir(p\text{-}PF\text{-}ph)_2(acac)]$), and bis(2-phenylbenzothiazolato-N,$C^{2'}$)iridium(III) acetylacetonate (abbreviation: $[Ir(bt)_2(acac)]$); and a rare earth metal complex such as tris(acetylacetonato) (monophenanthroline)terbium(III) (abbreviation: $[Tb(acac)_3(Phen)]$).

<<Phosphorescent Substance (from 570 nm to 750 nm, Yellow or Red)>>

As examples of a phosphorescent substance which emits yellow or red light and whose emission spectrum has a peak wavelength of greater than or equal to 570 nm and less than or equal to 750 nm, the following substances can be given.

Examples include organometallic complexes having a pyrimidine ring, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), and (dipivaloylmethanato)bis[4,6-di(naphthalen-1-yl)pyrimidinato]iridium(III) (abbreviation: $[Ir(dlnpm)_2(dpm)]$); organometallic complexes having a pyrazine ring, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), bis(4,6-dimethyl-2-[3-(3,5-dimethylphenyl)-5-phenyl-2-pyrazinyl-κN]phenyl-κC)(2,6-dimethyl-3,5-heptanedionato-κ$^2$O,O')iridium(III) (abbreviation: $[Ir(dmdppr\text{-}P)_2(dibm)]$), bis(4,6-dimethyl-2-[5-(4-cyano-2,6-dimethylphenyl)-3-(3,5-dimethylphenyl)-2-pyrazinyl-κN]phenyl-KC)(2,2,6,6-tetramethyl-3,5-heptanedionato-κ$^2$O,O')iridium(III) (abbreviation: $[Ir(dmdppr\text{-}dmCP)_2(dpm)]$), bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptanedionato-κ$^2$O,O')iridium(III) (abbreviation: $[Ir(dmdppr\text{-}dmp)_2(dpm)]$), (acetylacetonato)bis[2-methyl-3-phenylquinoxalinato-N,$C^{2'}$]iridium(III) (abbreviation: $[Ir(mpq)_2(acac)]$), (acetylacetonato)bis(2,3-diphenylquinoxalinato-N,$C^{2'}$)iridium(III) (abbreviation: $[Ir(dpq)_2(acac)]$), and (acetylacetonato)bis[2,3-bis(4-fluorophenyl)quinoxalinato]iridium(III) (abbreviation: $[Ir(Fdpq)_2(acac)]$); organometallic complexes having a pyridine ring, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), and bis[4,6-dimethyl-2-(2-quinolinyl-κN)phenyl-κC](2,4-pentanedionato-κ$^2$O,O')iridium(III) (abbreviation: $[Ir(dmpqn)_2(acac)]$); a platinum complex such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$).

<<TADF Material>>

Any of materials described below can be used as the TADF material. The TADF material is a material that has a small difference between its S1 and T1 levels (preferably less than or equal to 0.2 eV), enables up-conversion of a triplet excited state into a singlet excited state (i.e., reverse intersystem crossing) using a little thermal energy, and efficiently emits light (fluorescent light) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Note that delayed fluorescence by the TADF material refers to light emission having a spectrum similar to that of normal fluorescent light and an extremely long lifetime. The lifetime is longer than or equal to $1\times10^{-6}$ seconds, preferably longer than or equal to $1\times10^{-3}$ seconds.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

[Chemical Formula 65]

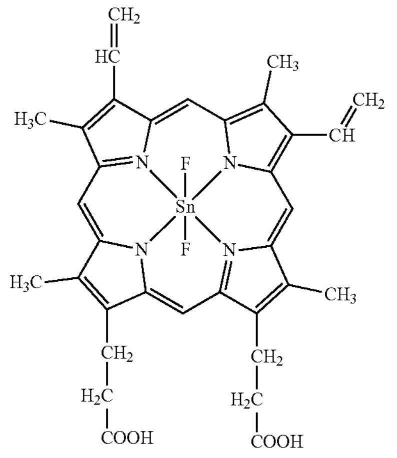

$SnF_2$(Proto IX)

-continued

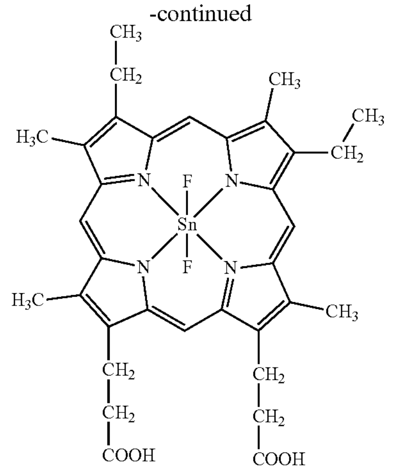

$SnF_2$(Meso IX)

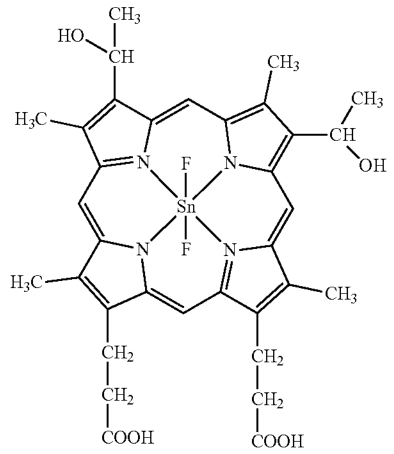

$SnF_2$(Hemato IX)

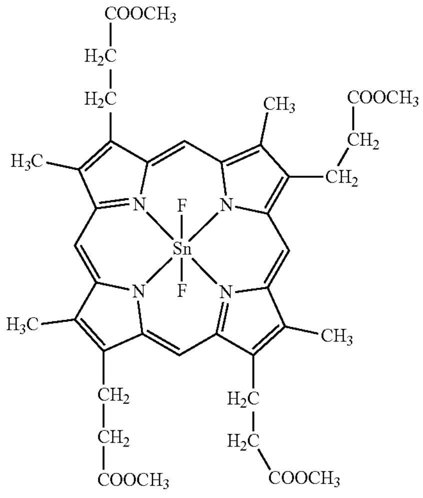

$SnF_2$(Copro III-4Me)

-continued

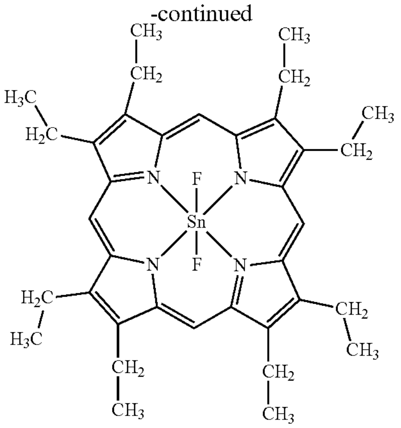

$SnF_2$(OEP)

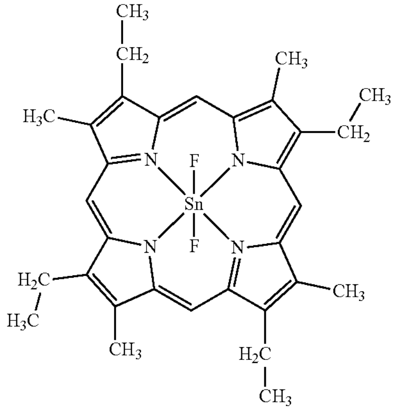

$SnF_2$(Etio I)

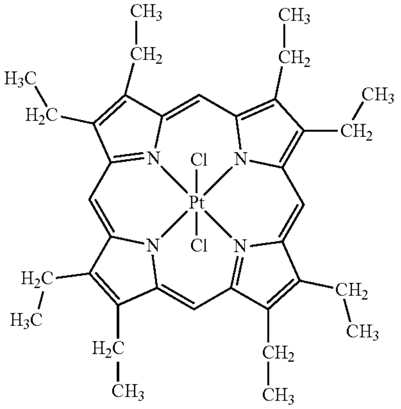

$PtCl_2OEP$

Alternatively, a heteroaromatic compound including a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-

10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) may be used.

Note that a substance in which a π-electron rich heteroaromatic compound is directly bonded to a π-electron deficient heteroaromatic compound is particularly preferable because both the donor property of the π-electron rich heteroaromatic compound and the acceptor property of the π-electron deficient heteroaromatic compound are improved and the energy difference between the singlet excited state and the triplet excited state becomes small. As the TADF material, a TADF material in which the singlet and triplet excited states are in thermal equilibrium (TADF100) may be used. Since such a TADF material enables a short emission lifetime (excitation lifetime), an efficiency decrease of a light-emitting element in a high-luminance region can be inhibited.

[Chemical Formula 66]

PIC-TRZ

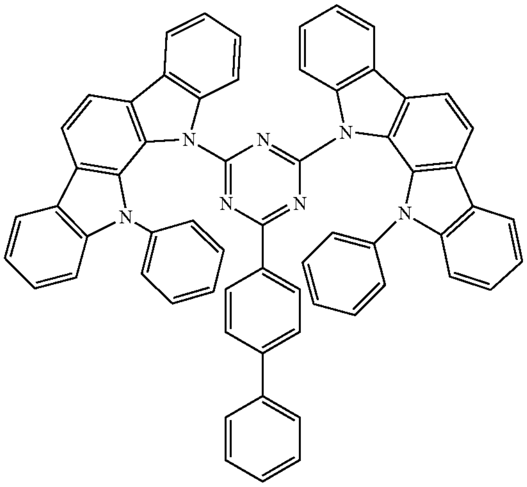

PXZ-TRZ

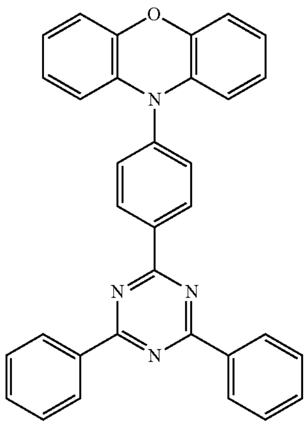

-continued

PPZ-3TPT

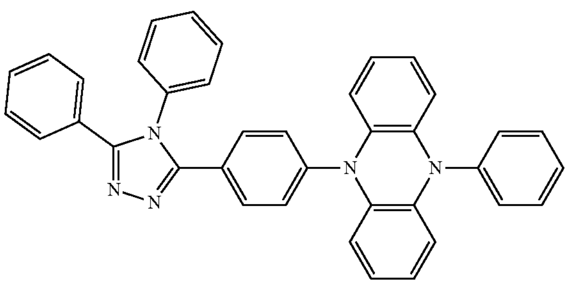

PCCzPTzn

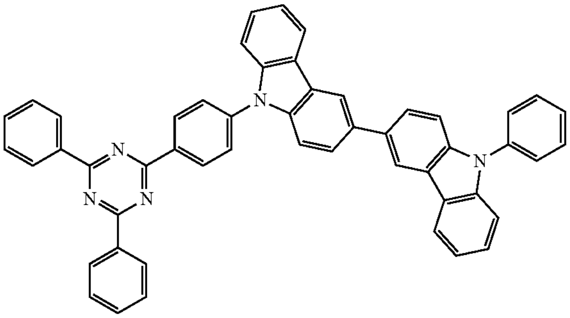

ACRSA

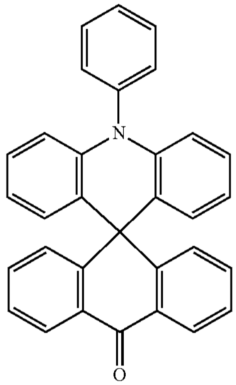

ACRXTN

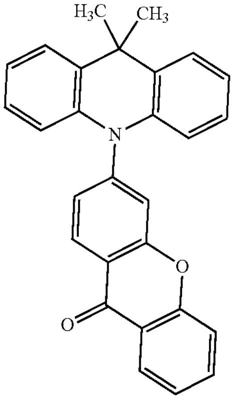

-continued

DMAC-DPS

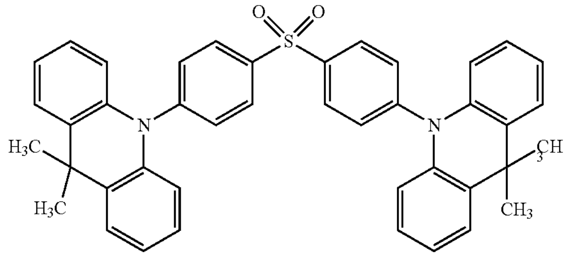

4PCCzPBfpm

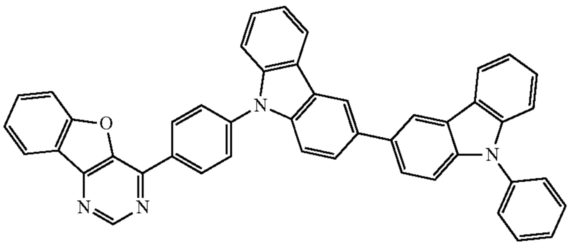

mPCCzPTzn-02

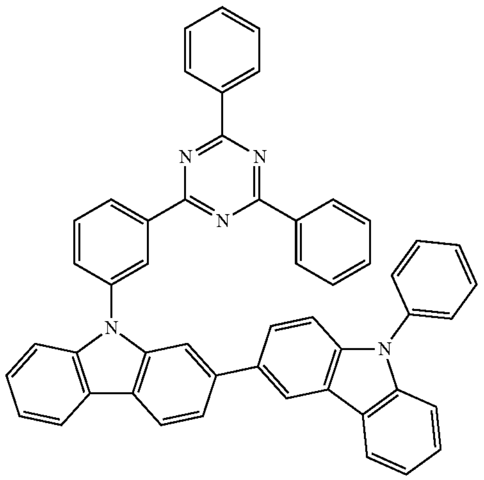

4PCCzBfpm

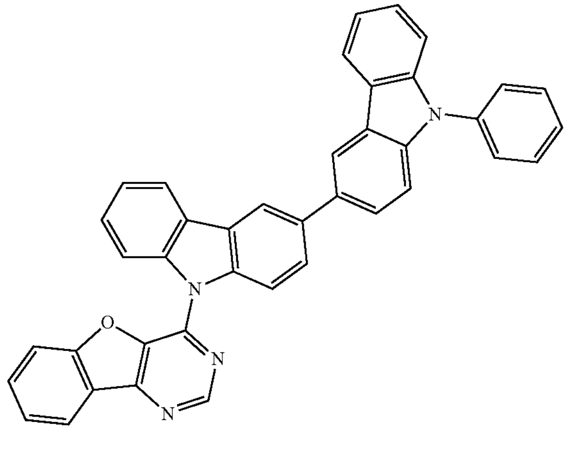

-continued

TADF100

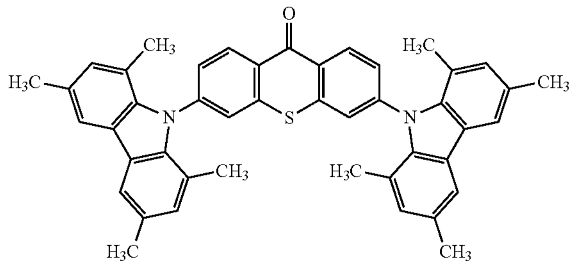

In addition to the above, another example of a material having a function of converting triplet excitation energy into light is a nano-structure of a transition metal compound having a perovskite structure. In particular, a nano-structure of a metal halide perovskite material is preferable. The nano-structure is preferably a nanoparticle or a nanorod.

As the organic compound (e.g., the host material) used in combination with the above-described light-emitting substance (guest material) in the light-emitting layers (113, 113*a*, 113*b*, and 113*c*), one or more kinds selected from substances having a larger energy gap than the light-emitting substance (guest material) are used.

<<Host Material for Fluorescence>>

In the case where the light-emitting substance used in the light-emitting layers (113, 113*a*, 113*b*, and 113*c*) is a fluorescent substance, an organic compound (a host material) used in combination with the fluorescent substance is preferably an organic compound that has a high energy level in a singlet excited state and has a low energy level in a triplet excited state, or an organic compound having a high fluorescence quantum yield. Therefore, the hole-transport material (described above) or the electron-transport material (described below) described in this embodiment, for example, can be used as long as it is an organic compound that satisfies such a condition.

In terms of a preferable combination with the light-emitting substance (fluorescent substance), examples of the organic compound (host material), some of which overlap the above specific examples, include fused polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound (host material) that is preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-(4-[4-(10-phenyl-9-anthryl)phenyl]phenyl)-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N",N",N'",N'"-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-

(9,10-diphenyl-2-anthryl)phenyl]-benzo[b]naphtho[1,2-d]furan (abbreviation: 2mBnfPPA), 9-phenyl-10-(4-(9-phenyl-9H-fluoren-9-yl)biphenyl-4'-yl)anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9-(1-naphthyl)-10-(2-naphthyl)anthracene (abbreviation: α,β-ADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(1-naphthyl)-10-[4-(2-naphthyl)phenyl]anthracene (abbreviation: αN-βNPAnth), 9-(2-naphthyl)-10-[3-(2-naphthyl)phenyl]anthracene (abbreviation: βN-mβNPAnth), 1-[4-(10-[1,1'-biphenyl]-4-yl-9-anthracenyl)phenyl]-2-ethyl-1H-benzimidazole (abbreviation: EtBImPBPhA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

<<Host Material for Phosphorescence>>

In the case where the light-emitting substance used in the light-emitting layers (113, 113*a*, 113*b*, and 113*c*) is a phosphorescent substance, an organic compound having triplet excitation energy (an energy difference between a ground state and a triplet excited state) which is higher than that of the light-emitting substance is preferably selected as the organic compound (host material) used in combination with the phosphorescent substance. Note that when a plurality of organic compounds (e.g., a first host material and a second host material (or an assist material)) are used in combination with a light-emitting substance so that an exciplex is formed, the plurality of organic compounds are preferably mixed with the phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferably employed, and it is particularly preferable to combine a compound that easily accepts holes (hole-transport material) and a compound that easily accepts electrons (electron-transport material).

In terms of a preferable combination with the light-emitting substance (phosphorescent substance), examples of the organic compounds (the host material and the assist material), some of which overlap the above specific examples, include an aromatic amine (an organic compound having an aromatic amine skeleton), a carbazole derivative (an organic compound having a carbazole ring), a dibenzothiophene derivative (an organic compound having a dibenzothiophene ring), a dibenzofuran derivative (an organic compound having a dibenzofuran ring), an oxadiazole derivative (an organic compound having an oxadiazole ring), a triazole derivative (an organic compound having a triazole ring), a benzimidazole derivative (an organic compound having a benzimidazole ring), a quinoxaline derivative (an organic compound having a quinoxaline ring), a dibenzoquinoxaline derivative (an organic compound having a dibenzoquinoxaline ring), a pyrimidine derivative (an organic compound having a pyrimidine ring), a triazine derivative (an organic compound having a triazine ring), a pyridine derivative (an organic compound having a pyridine ring), a bipyridine derivative (an organic compound having a bipyridine ring), a phenanthroline derivative (an organic compound having a phenanthroline ring), a furodiazine derivative (an organic compound having a furodiazine ring), and zinc- and aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylene-2-yl)phenyl]dibenzothiophene (abbreviation: mDBTPTp-II). Such derivatives are preferable as the host material.

Other examples of preferable host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the quinazoline derivative, and the phenanthroline derivative, which are organic compounds having a high electron-transport property, include an organic compound including a heteroaromatic ring having a polyazole ring, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs), an organic compound including a heteroaromatic ring having a pyridine ring, such as bathophenanthroline (abbreviation: BPhen), bathocuproine (abbreviation: BCP), or 2,9-di(naphthalen-2-yl)-4,7-diphenyl-1,10-phenanthroline (abbreviation: NBPhen), 2-[3-(dibenzothiophen-4-yl)phenyl]dibenzo[f,h]quinoxaline (abbreviation: 2mDBTPDBq-II), 2-[3-(3'-dibenzothiophen-4-yl)biphenyl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-{4-[9,10-di(2-naphthyl)-2-anthryl]phenyl}-1-phenyl-1H-benzimidazole (abbreviation: ZADN), and 2-[4'-(9-phenyl-9H-carbazol-3-yl)-3,1'-biphenyl-1-yl]dibenzo[f,h]quinoxaline (abbreviation: 2mpPCBPDBq). Such organic compounds are preferable as the host material.

Among the above organic compounds, specific examples of the pyridine derivative, the diazine derivative (including the pyrimidine derivative, the pyrazine derivative, and the pyridazine derivative), the triazine derivative, and the furodiazine derivative, which are organic compounds having a high electron-transport property, include organic compounds including a heteroaromatic ring having a diazine ring, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)]bis(9H-carbazole) (abbreviation: 4,6mCzBP2Pm), 2-[3'-(9,9-dimethyl-9H-fluoren-2-yl)-1,1'-biphenyl-3-yl]-4,6-diphenyl-1,3,5-triazine (abbreviation: mFBPTzn), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-[3'-(dibenzothiophen-4-yl)biphenyl-3-yl]naphtho[1l',2':4,5]furo[2,3-b]pyrazine (abbreviation: 9mDBtBPNfpr), 9-[(3'-dibenzothiophen-4-yl)biphenyl-4-yl]naphtho[1l',2':4,5]furo[2,3-b]pyrazine (abbreviation: 9pmDBtBPNfpr), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylene-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 3-[9-(4,6-diphenyl-1,3,5-triazin-2-yl)-2-dibenzofuranyl]-9-phenyl-9H-carbazole (abbreviation: PCDBfTzn), 2-[1,1'-biphenyl]-3-yl-4-phenyl-6-(8-[1,1':4',1"-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl]-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm). Such organic compounds are preferable as the host material.

Among the above organic compounds, specific examples of metal complexes that are organic compounds having a high electron-transport property include zinc- and aluminum-based metal complexes, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq), and metal complexes having a quinoline ring or a benzoquinoline ring. Such metal complexes are preferable as the host material.

Moreover, high molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)] (abbreviation: PF-BPy) are preferable as the host material.

Examples of organic compounds having bipolar properties, a high hole-transport property and a high electron-transport property, which can be used as the host material, include organic compounds having a diazine ring, such as 9-phenyl-9'-(4-phenyl-2-quinazolinyl)-3,3'-bi-9H-carbazole (abbreviation: PCCzQz), 2-[4'-(9-phenyl-9H-carbazol-3-yl)-3,1'-biphenyl-1-yl]dibenzo[f,h]quinoxaline (abbreviation: 2mpPCBPDBq), 5-[3-(4,6-diphenyl-1,3,5-triazin-2-yl)phenyl]-7,7-dimethyl-5H,7H-indeno[2,1-b]carbazole (abbreviation: mINc(II)PTzn), 11-(4-[1,1'-biphenyl]-4-yl-6-phenyl-1,3,5-triazin-2-yl)-11,12-dihydro-12-phenyl-indolo[2,3-a]carbazole (abbreviation: BP-Icz(II)Tzn), and 7-[4-(9-phenyl-9H-carbazol-2-yl)quinazolin-2-yl]-7H-dibenzo[c,g]carbazole (abbreviation: PC-cgDBCzQz).

<Electron-Transport Layer>

The electron-transport layers (114, 114*a*, and 114*b*) transport the electrons, which are injected from the second electrode 102 or the charge-generation layers (106, 106*a*, and 106*b*) by electron-injection layers (115, 115*a*, and 115*b*) described later, to the light-emitting layers (113, 113*a*, 113*b*, and 113*c*). It is preferable that the electron-transport material used in the electron-transport layers (114, 114*a*, and 114*b*) be a substance having an electron mobility higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. The electron-transport layers (114, 114*a*, and 114*b*) can function even with a single-layer structure and may have a stacked-layer structure including two or more layers. A photolithography process performed over the electron-transport layer including the above-described mixed material, which has heat resistance, can inhibit an adverse effect of the thermal process on the device characteristics.

<<Electron-Transport Material>>

As the electron-transport material that can be used for the electron-transport layers (114, 114*a*, and 114*b*), an organic compound having a high electron-transport property can be used, and for example, a heteroaromatic compound can be used. The heteroaromatic compound refers to a cyclic compound containing at least two different kinds of elements in a ring. Examples of cyclic structures include a three-membered ring, a four-membered ring, a five-membered ring, and a six-membered ring, among which a five-membered ring and a six-membered ring are particularly preferable. The elements contained in the heteroaromatic compound are preferably one or more of nitrogen, oxygen, and sulfur, in addition to carbon. In particular, a heteroaromatic compound containing nitrogen (a nitrogen-containing heteroaromatic compound) is preferable, and any of materials having a high electron-transport property (electron-transport materials), such as a nitrogen-containing heteroaromatic compound and a π-electron deficient heteroaromatic compound including the nitrogen-containing heteroaromatic compound, is preferably used.

The heteroaromatic compound is an organic compound having at least one heteroaromatic ring.

The heteroaromatic ring has any one of a pyridine ring, a diazine ring, a triazine ring, a polyazole ring, an oxazole ring, a thiazole ring, and the like. A heteroaromatic ring having a diazine ring includes a heteroaromatic ring having a pyrimidine ring, a pyrazine ring, a pyridazine ring, or the like. A heteroaromatic ring having a polyazole ring includes a heteroaromatic ring having an imidazole ring, a triazole ring, or an oxadiazole ring.

The heteroaromatic ring includes a fused heteroaromatic ring having a fused ring structure. Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of the heteroaromatic compound having a five-membered ring structure, which is a heteroaromatic compound containing carbon and one or more of nitrogen, oxygen, sulfur, and the like, include a heteroaromatic compound having an imidazole ring, a heteroaromatic compound having a triazole ring, a heteroaromatic compound having an oxazole ring, a heteroaromatic compound having an oxadiazole ring, a heteroaromatic compound having a thiazole ring, and a heteroaromatic compound having a benzimidazole ring.

Examples of the heteroaromatic compound having a six-membered ring structure, which is a heteroaromatic compound containing carbon and one or more of nitrogen, oxygen, sulfur, and the like, include a heteroaromatic compound having a heteroaromatic ring, such as a pyridine ring, a diazine ring (including a pyrimidine ring, a pyrazine ring, a pyridazine ring, or the like), a triazine ring, or a polyazole ring. Other examples include a heteroaromatic compound having a bipyridine structure and a heteroaromatic compound having a terpyridine structure, although they are included in examples of a heteroaromatic compound in which pyridine rings are connected.

Examples of the heteroaromatic compound having a fused ring structure including the above six-membered ring structure as a part include a heteroaromatic compound having a fused heteroaromatic ring such as a quinoline ring, a benzoquinoline ring, a quinoxaline ring, a dibenzoquinoxaline ring, a phenanthroline ring, a furodiazine ring (including a structure in which an aromatic ring is fused to a furan ring of a furodiazine ring), or a benzimidazole ring.

Specific examples of the above-described heteroaromatic compound having a five-membered ring structure (a polyazole ring (including an imidazole ring, a triazole ring, or an oxadiazole ring), an oxazole ring, a thiazole ring, or a benzimidazole ring) include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOs).

Specific examples of the above-described heteroaromatic compound having a six-membered ring structure (including a heteroaromatic ring having a pyridine ring, a diazine ring, a triazine ring, or the like) include a heteroaromatic compound including a heteroaromatic ring having a pyridine ring, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB), a heteroaromatic compound including a heteroaromatic ring having a triazine ring, such as 2-(4-[3-(N-phenyl-9H-carbazol-3-yl)-9H-carbazol-9-yl]phenyl)-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylene-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 3-[9-(4,6-diphenyl-1,3,5-triazin-2-yl)-2-dibenzofuranyl]-9-phenyl-9H-carbazole (abbreviation: PCDBfTzn), 2-[1,1'-biphenyl]-3-yl-4-phenyl-6-(8-[1,1':4',1''-terphenyl]-4-yl-1-dibenzofuranyl)-1,3,5-triazine (abbreviation: mBP-TPDBfTzn), 2-{3-[3-(dibenzothiophen-4-yl)phenyl]phenyl}-4,6-diphenyl-1,3,5-triazine (abbreviation: mDBtBPTzn), or mFBPTzn, and a heteroaromatic compound including a heteroaromatic ring having a diazine (pyrimidine) ring, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 4,6mCzBP2Pm, 6-(1,1'-biphenyl-3-yl)-4-[3,5-bis(9H-carbazol-9-yl)phenyl]-2-phenylpyrimidine (abbreviation: 6mBP-4Cz2PPm), 4-[3,5-bis(9H-carbazol-9-yl)phenyl]-2-phenyl-6-(1,1'-biphenyl-4-yl)pyrimidine (abbreviation: 6BP-4Cz2PPm), 4-[3-(dibenzothiophen-4-yl)phenyl]-8-(naphthalen-2-yl)-[1]benzofuro[3,2-d]pyrimidine (abbreviation: 8βN-4mDBtPBfpm), 8BP-4mDBtPBfpm, 9mDBtBPNfpr, 9pmDBtBPNfpr, 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2': 4,5]furo[3,2-d]pyrimidine (abbreviation: 8mDBtBPNfpm), or 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm). Note that the above aromatic compounds including a heteroaromatic ring include a heteroaromatic compound having a fused heteroaromatic ring.

Other examples include a heteroaromatic compound including a heteroaromatic ring having a diazine (pyrimidine) ring, such as 2,2'-(pyridine-2,6-diyl)bis(4-phenylbenzo[h]quinazoline) (abbreviation: 2,6(P-Bqn)2Py), 2,2'-(2,2'-bipyridine-6,6'-diyl)bis(4-phenylbenzo[h]quinazoline) (abbreviation: 6,6'(P-Bqn)2BPy), 2,2'-(pyridine-2,6-diyl)bis(4-[4-(2-naphthyl)phenyl]-6-phenylpyrimidine) (abbreviation: 2,6(NP-PPm)2Py), or 6-(1,1'-biphenyl-3-yl)-4-[3,5-bis(9H-carbazol-9-yl)phenyl]-2-phenylpyrimidine (abbreviation: 6mBP-4Cz2PPm), and a heteroaromatic compound including a heteroaromatic ring having a triazine ring, such as 2,4,6-tris(3'-(pyridin-3-yl)biphenyl-3-yl)-1,3,5-triazine (abbreviation: TmPPPyTz), 2,4,6-tris(2-pyridyl)-1,3,5-triazine (abbreviation: 2Py3Tz), or 2-[3-(2,6-dimethyl-3-pyridyl)-5-(9-phenanthryl)phenyl]-4,6-diphenyl-1,3,5-triazine (abbreviation: mPn-mDMePyPTzn).

Specific examples of the above-described heteroaromatic compound having a fused ring structure including the above six-membered ring structure as a part (a heteroaromatic compound having a fused ring structure) include a heteroaromatic compound having a quinoxaline ring, such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), 2,2'-(pyridine-2,6-diyl)bis(4-phenylbenzo[h]quinazoline) (abbreviation: 2,6(P-Bqn)2Py), 2-[3-(dibenzothiophen-4-yl)phenyl]dibenzo[f,h]quinoxaline (abbreviation: 2mDBTPDBq-II), 2-[3-(3'-dibenzothiophen-4-yl)biphenyl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), or 2mpPCBPDBq.

For the electron-transport layers (114, 114*a*, and 114*b*), any of the metal complexes given below as well as the heteroaromatic compounds described above can be used. Examples of the metal complexes include a metal complex having a quinoline ring or a benzoquinoline ring, such as tris(8-quinolinolato)aluminum(III) (abbreviation: $Alq_3$), $Almq_3$, 8-quinolinolatolithium(I) (abbreviation: Liq), $BeBq_2$, bis(2-methyl-8-quinolinolato) (4-phenylphenolato) aluminum(III) (abbreviation: BAlq), or bis(8-quinolinolato) zinc(II) (abbreviation: Znq), and a metal complex having an oxazole ring or a thiazole ring, such as bis[2-(2-benzoxazolyl)phenolato]zinc(II) (abbreviation: ZnPBO) or bis[2-(2-benzothiazolyl)phenolato]zinc(II) (abbreviation: ZnBTZ).

High-molecular compounds such as poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy) can be used as the electron-transport material.

Each of the electron-transport layers (114, 114*a*, and 114*b*) is not limited to a single layer and may be a stack of two or more layers each containing any of the above substances.

<Electron-Injection Layer>

The electron-injection layers (115, 115*a*, and 115*b*) contain a substance having a high electron-injection property. The electron-injection layers (115, 115*a*, and 115*b*) are layers for increasing the efficiency of electron injection from the second electrode 102 or the charge-generation layers (106, 106*a*, and 106*b*) and are preferably formed using a material whose value of the LUMO level has a small difference (0.5 eV or less) from the work function of a material used for the second electrode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), an oxide of lithium ($LiO_x$), or cesium carbonate. A rare earth metal and a compound thereof such as erbium fluoride ($ErF_3$) and ytterbium (Yb) can also be used. To form the electron-injection layers (115, 115*a*, and 115*b*), a plurality of kinds of materials given above may be mixed or stacked. Electride may also be used for the electron-injection layers (115, 115*a*, and 115*b*). Examples of the electride include a substance in which electrons are added at high concentration to calcium oxide-aluminum oxide. Any of the substances used for the electron-transport layers (114, 114*a*, and 114*b*), which are given above, can also be used.

A mixed material in which an organic compound and an electron donor (donor) are mixed may also be used for the electron-injection layers (115, 115*a*, and 115*b*). Such a mixed material is excellent in an electron-injection property and an electron-transport property because electrons are generated in the organic compound by the electron donor. The organic compound here is preferably a material excellent in transporting the generated electrons; specifically, for example, the above-described electron-transport materials used for the electron-transport layers (114, 114*a*, and 114*b*), such as a metal complex and a heteroaromatic compound, can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable; for example, lithium oxide, calcium oxide, barium oxide, and the like are given. Alternatively, a Lewis base such as magnesium oxide can be used. Further alternatively, an organic compound such as tetrathiafulvalene (abbreviation: TF) can be used. Alternatively, a stack of two or more of these materials may be used.

A mixed material in which an organic compound and a metal are mixed may also be used for the electron-injection layers (115, 115*a*, and 115*b*). The organic compound used here preferably has a LUMO level higher than or equal to −3.6 eV and lower than or equal to −2.3 eV. Moreover, a material having an unshared electron pair is preferable.

Thus, as the organic compound used in the above mixed material, a mixed material obtained by mixing a metal and the heteroaromatic compound given above as the material that can be used for the electron-transport layer may be used. Preferable examples of the heteroaromatic compound include materials having an unshared electron pair, such as a heteroaromatic compound having a five-membered ring structure (e.g., an imidazole ring, a triazole ring, an oxazole ring, an oxadiazole ring, a thiazole ring, or a benzimidazole ring), a heteroaromatic compound having a six-membered ring structure (e.g., a pyridine ring, a diazine ring (including a pyrimidine ring, a pyrazine ring, a pyridazine ring, or the like), a triazine ring, a bipyridine ring, or a terpyridine ring), and a heteroaromatic compound having a fused ring structure including a six-membered ring structure as a part (e.g., a quinoline ring, a benzoquinoline ring, a quinoxaline ring, a dibenzoquinoxaline ring, or a phenanthroline ring). Since the materials are specifically described above, description thereof is omitted here.

As a metal used for the above mixed material, a transition metal belonging to Group 5, Group 7, Group 9, or Group 11 or a material belonging to Group 13 of the periodic table is preferably used, and examples include Ag, Cu, Al, and In. Here, the organic compound forms a singly occupied molecular orbital (SOMO) with the transition metal.

To amplify light obtained from the light-emitting layer 113*b*, for example, the optical path length between the second electrode 102 and the light-emitting layer 113*b* is preferably less than one fourth of the wavelength λ of light emitted from the light-emitting layer 113*b*. In that case, the optical path length can be adjusted by changing the thickness of the electron-transport layer 114*b* or the electron-injection layer 115*b*.

When the charge-generation layer 106 is provided between the two EL layers (103*a* and 103*b*) as in the light-emitting device in FIG. 6D, a structure in which a plurality of EL layers are stacked between the pair of electrodes (the structure is also referred to as a tandem structure) can be obtained.

<Charge-Generation Layer>

The charge-generation layer 106 has a function of injecting electrons into the EL layer 103*a* and injecting holes into the EL layer 103*b* when voltage is applied between the first electrode (anode) 101 and the second electrode (cathode) 102. The charge-generation layer 106 may have either a structure in which an electron acceptor (acceptor) is added to a hole-transport material or a structure in which an electron donor (donor) is added to an electron-transport material. Alternatively, both of these layers may be stacked. Note that forming the charge-generation layer 106 with the use of any of the above materials can inhibit an increase in driving voltage caused by the stack of the EL layers.

In the case where the charge-generation layer 106 has a structure in which an electron acceptor is added to a hole-transport material, which is an organic compound, any of the materials described in this embodiment can be used as the hole-transport material. Examples of the electron acceptor include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide.

In the case where the charge-generation layer 106 has a structure in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

Although FIG. 6D illustrates the structure in which two EL layers 103 are stacked, three or more EL layers may be stacked with charge-generation layers each provided between two adjacent EL layers.

<Substrate>

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic resin, polypropylene, polyester, polyvinyl fluoride, polyvinyl chloride, polyamide, polyimide, aramid, an epoxy resin, an inorganic vapor deposition film, and paper.

For fabrication of the light-emitting device in this embodiment, a gas phase method such as an evaporation method or a liquid phase method such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the layers having various functions (the hole-injection layer 111, the hole-transport layer 112, the light-emitting layer 113, the electron-transport layer 114, and the electron-injection layer 115) included in the EL layers of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Materials that can be used for the layers (the hole-injection layer 111, the hole-transport layer 112, the light-emitting layer 113, the electron-transport layer 114, and the electron-injection layer 115) included in the EL layer 103 of the light-emitting device described in this embodiment are not limited to the materials described in this embodiment, and other materials can be used in combination as long as the functions of the layers are fulfilled.

The structures described in this embodiment can be used in combination with any of the structures described in the other embodiments as appropriate.

Embodiment 4

In this embodiment, specific structure examples of a light-emitting and light-receiving apparatus of one embodiment of the present invention and an example of the manufacturing method will be described.

<Structure Example of Light-Emitting and Light-Receiving Apparatus 700>

Figure 7A:
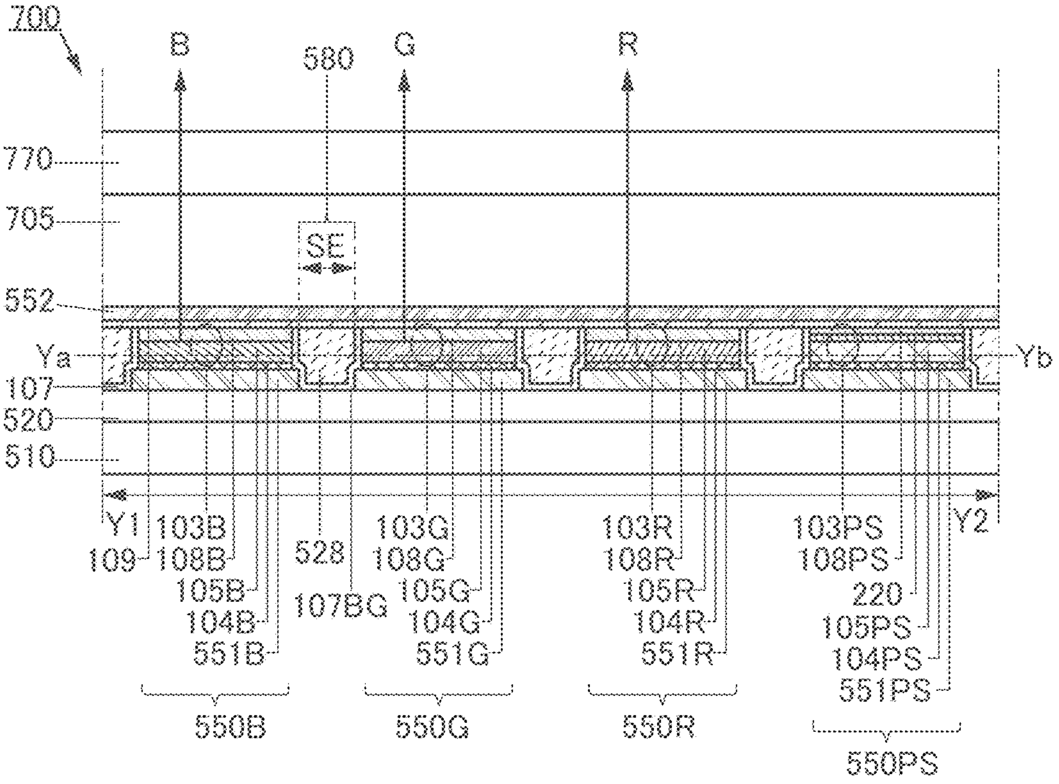
FIGS. 7A to 7D illustrate a light-emitting and light-receiving apparatus of an embodiment.

A light-emitting and light-receiving apparatus 700 illustrated in FIG. 7A includes a light-emitting device 550B, a light-emitting device 550G, a light-emitting device 550R, and a photoelectric conversion device 550PS. The light-emitting device 550B, the light-emitting device 550G, the light-emitting device 550R, and the photoelectric conversion device 550PS are formed over a functional layer 520 provided over a first substrate 510. The functional layer 520 includes, for example, circuits such as driver circuits that are composed of a plurality of transistors, and wirings that electrically connect these circuits. Note that these driver circuits are electrically connected to the light-emitting device 550B, the light-emitting device 550G, the light-emitting device 550R, and the photoelectric conversion device 550PS, for example, to drive them. The light-emitting and light-receiving apparatus 700 includes an insulating layer 705 over the functional layer 520 and the devices (the light-emitting devices and the photoelectric conversion device), and the insulating layer 705 has a function of attaching a second substrate 770 and the functional layer 520.

The light-emitting device 550B, the light-emitting device 550G, the light-emitting device 550R, and the photoelectric conversion device 550PS each have any of the device structures described in Embodiments 1 and 3. Described here is the case where the light-emitting devices have different EL layers 103 illustrated in FIG. 6A from each other and the photoelectric conversion device has the structure illustrated in FIG. 3C.

In this specification and the like, a structure in which light-emitting layers in light-emitting devices of different colors (for example, blue (B), green (G), and red (R)) and a photoelectric conversion layer in a photoelectric conversion device are separately formed or separately patterned is sometimes referred to as a side-by-side (SBS) structure. Although the light-emitting device 550B, the light-emitting device 550G, the light-emitting device 550R, and the photoelectric conversion device 550PS are arranged in this order in the light-emitting and light-receiving apparatus 700 illustrated in FIG. 7A, one embodiment of the present invention is not limited to this structure. For example, in the light-emitting and light-receiving apparatus 700, these devices may be arranged in the order of the light-emitting device 550R, the light-emitting device 550G, the light-emitting device 550B, and the photoelectric conversion device 550PS.

In FIG. 7A, the light-emitting device 550B includes an electrode 551B, an electrode 552, and an EL layer 103B. The light-emitting device 550G includes an electrode 551G, the electrode 552, and an EL layer 103G. The light-emitting device 550R includes an electrode 551R, the electrode 552, and an EL layer 103R. The photoelectric conversion device 550PS includes an electrode 551PS, the electrode 552, and a photoelectric conversion layer 103PS. Note that a specific structure of each layer of the photoelectric conversion device is as described in Embodiment 1. In addition, a specific structure of each layer of the light-emitting device is as described in Embodiment 3. The EL layer 103B, the EL layer 103G, and the EL layer 103R each have a stacked-layer structure of layers having different functions including their respective light-emitting layers (105B, 105G, and 105R). In addition, the photoelectric conversion layer 103PS has a stacked-layer structure of layers having different functions including an active layer 105PS. FIG. 7A illustrates a case where the EL layer 103B includes a hole-injection/transport layer 104B, a light-emitting layer 105B, an electron-transport layer 108B, and an electron-injection layer 109; the EL layer 103G includes a hole-injection/transport layer 104G, a light-emitting layer 105G, an electron-transport layer 108G, and the electron-injection layer 109; the EL layer 103R includes a hole-injection/transport layer 104R, a light-emitting layer 105R, an electron-transport layer 108R, and the electron-injection layer 109; and the photoelectric conversion layer 103PS includes a first transport layer 104PS, the active layer 105PS, the structure body 220, a second transport layer 108PS, and the electron-injection layer 109. However, the present invention is not limited thereto. Although in FIG. 7A, the structure body 220 is illustrated to have a layer shape, the structure body 220 includes projections as described in Embodiment 1. Note that each of the hole-injection/transport layers (104B, 104G, and 104R) represents a layer having the functions of the hole-injection layer and the hole-transport layer described in Embodiment 3, and may have a stacked-layer structure.

Note that the electron-transport layers (108B, 108G, and 108R) and the second transport layer 108PS may have a function of blocking holes moving from the anode side to the cathode side through the light-emitting layers (105B, 105G, and 105R). The electron-injection layer 109 may have a stacked-layer structure in which some or all of layers are formed using different materials.

As illustrated in FIG. 7A, an insulating layer 107 may be formed on side surfaces (or end portions) of the hole-injection/transport layers (104B, 104G, and 104R), the light-emitting layers (105B, 105G, and 105R), and the electron-transport layers (108B, 108G, and 108R) included in the EL layers (103B, 103G, and 103R), and side surfaces (or end portions) of the first transport layer 104PS, the active layer 105PS, and the second transport layer 108PS included in the photoelectric conversion layer 103PS. The insulating layer 107 is formed in contact with the side surfaces (or the end portions) of the EL layers (103B, 103G, and 103R) and the photoelectric conversion layer 103PS. This can inhibit entry of oxygen, moisture, or constituent elements thereof into the inside through the side surfaces of the EL layers (103B, 103G, and 103R) and the photoelectric conversion layer 103PS. For the insulating layer 107, aluminum oxide, magnesium oxide, hafnium oxide, gallium oxide, indium gallium zinc oxide, silicon nitride, or silicon nitride oxide can be used, for example. Some of the above-described materials may be stacked to form the insulating layer 107. The insulating layer 107 can be formed by a sputtering method, a CVD method, an MBE method, a PLD method, an ALD method, or the like and is formed preferably by an ALD method, which achieves favorable coverage. Note that the insulating layer 107 continuously covers the side surfaces (or the end portions) of part of the EL layers (103B, 103G, and 103R) of adjacent light-emitting devices and part of the photoelectric conversion layer 103PS of the photoelectric conversion device. For example, in FIG. 7A, the side surfaces of part of the EL layer 103B of the light-emitting device 550B and part of the EL layer 103G of the light-emitting device 550G are covered with an insulating layer 107BG. In a region covered with the insulating layer 107BG, a partition wall 528 formed using an insulating material is preferably formed, as illustrated in FIG. 7A.

In addition, the electron-injection layer 109 is formed over the electron-transport layers (108B, 108G, and 108R) that are parts of the EL layers (103B, 103G, and 103R), the second transport layer 108PS that is part of the photoelectric conversion layer 103PS, and the insulating layer 107. Note that the electron-injection layer 109 may have a stacked-layer structure of two or more layers (for example, stacked layers having different electric resistances).

The electrode 552 is formed over the electron-injection layer 109. Note that the electrodes (551B, 551G, and 551R) and the electrode 552 include overlap regions. The light-emitting layer 105B is provided between the electrode 551B and the electrode 552, the light-emitting layer 105G is provided between the electrode 551G and the electrode 552, the light-emitting layer 105R is provided between the electrode 551R and the electrode 552, and the photoelectric conversion layer 103PS is provided between the electrode 551PS and the electrode 552.

The EL layers (103B, 103G, and 103R) illustrated in FIG. 7A each have a structure similar to that of the EL layer 103 described in Embodiment 3. The photoelectric conversion layer 103PS has a structure similar to that of the photoelectric conversion layer 203 described in Embodiment 1. The light-emitting layer 105B can emit blue light, the light-emitting layer 105G can emit green light, and the light-emitting layer 105R can emit red light, for example.

The partition walls 528 are provided between the electrodes (551B, 551G, 551R, and 551PS), part of the EL layers (103B, 103G, and 103R), and part of the photoelectric conversion layer 103PS. As illustrated in FIG. 7A, the partition walls 528 are in contact with the side surfaces (or the end portions) of the electrodes (551B, 551G, 551R, and 551PS), parts of the EL layers (103B, 103G, and 103R), and part of the photoelectric conversion layer 103PS of the devices with the insulating layer 107 therebetween.

In each of the EL layers and the photoelectric conversion layer, particularly the hole-injection layer, which is included in the hole-transport region between the anode and the light-emitting layer and between the anode and the active layer, often has high conductivity; thus, a hole-injection layer formed as a layer shared by adjacent light-emitting devices might cause crosstalk. Thus, as described in this structure example, the partition walls 528 formed using an insulating material are provided between the EL layers and between the EL layer and the photoelectric conversion layer, which can inhibit occurrence of crosstalk between adjacent devices (between the photoelectric conversion device and the light-emitting device, between the light-emitting devices, or between the photoelectric conversion devices).

In the manufacturing method described in this embodiment, side surfaces (or end portions) of the EL layer and the photoelectric conversion layer are exposed in the patterning step. This may promote deterioration of the EL layer and the photoelectric conversion layer by allowing the entry of oxygen, water, or the like through the side surfaces (or the end portions) of the EL layer and the photoelectric conversion layer. Hence, providing the partition wall 528 can inhibit the deterioration of the EL layer and the photoelectric conversion layer in the manufacturing process.

Furthermore, a depressed portion formed between adjacent devices (between the photoelectric conversion device and the light-emitting device, between the light-emitting devices, or between the photoelectric conversion devices) can be flattened by provision of the partition wall 528. When the depressed portion is flattened, disconnection of the electrode 552 formed over the EL layers and the photoelectric conversion layer can be inhibited. Examples of an insulating material used to form the partition wall 528 include organic materials such as an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Other examples include organic materials such as polyvinyl alcohol (PVA), polyvinyl butyral, polyvinyl pyrrolidone, polyethylene glycol, polyglycerin, pullulan, water-soluble cellulose, and alcohol-soluble polyamide resin. A photosensitive resin such as a photoresist can also be used. Examples of the photosensitive resin include positive-type materials and negative-type materials.

With the use of the photosensitive resin, the partition wall 528 can be fabricated by only light exposure and developing steps. The partition wall 528 may be fabricated using a negative photosensitive resin (e.g., a resist material). In the case where an insulating layer containing an organic material is used as the partition wall 528, a material absorbing visible light is suitably used. When such a material absorbing visible light is used for the partition wall 528, light emission from the EL layer can be absorbed by the partition wall 528, leading to a reduction in light leakage (stray light) to an adjacent EL layer or photoelectric conversion layer. Accordingly, a display panel with high display quality can be provided.

For example, the difference between the top-surface level of the partition wall 528 and the top-surface level of any of the EL layer 103B, the EL layer 103G, the EL layer 103R, and the photoelectric conversion layer 103PS is preferably 0.5 times or less, further preferably 0.3 times or less the thickness of the partition wall 528. The partition wall 528 may be provided such that the top-surface level of any of the EL layer 103B, the EL layer 103G, the EL layer 103R, and the photoelectric conversion layer 103PS is higher than the top-surface level of the partition wall 528, for example. Alternatively, the partition wall 528 may be provided such that the top-surface level of the partition wall 528 is higher than the top-surface level of any of the EL layer 103B, the EL layer 103G, the EL layer 103R, and the photoelectric conversion layer 103PS, for example.

When electrical continuity is established between the EL layer 103B, the EL layer 103G, the EL layer 103R, and the photoelectric conversion layer 103PS in a light-emitting and light-receiving apparatus (display panel) with a high resolution more than 1000 ppi, crosstalk occurs, resulting in a narrower color gamut that the light-emitting and light-receiving apparatus is capable of reproducing. Providing the partition wall 528 in a high-resolution display panel with more than 1000 ppi, preferably more than 2000 ppi, or further preferably in an ultrahigh-resolution display panel with more than 5000 ppi allows the display panel to express vivid colors.

Figure 7B:
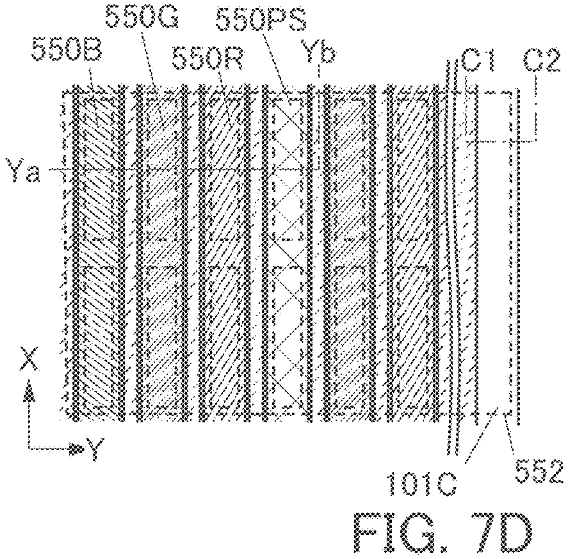
Figure 7C:
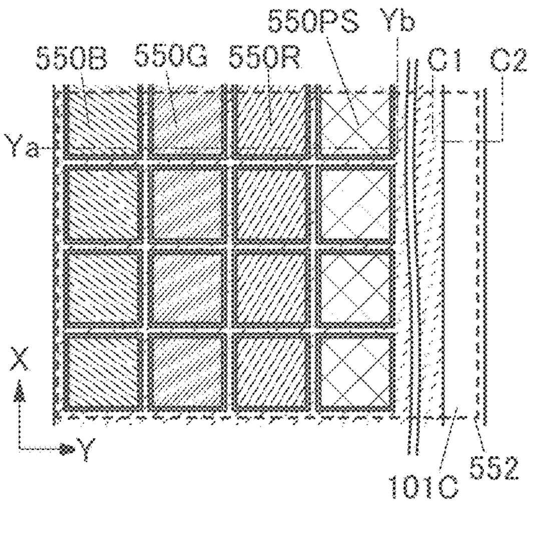

FIGS. 7B and 7C are each a schematic top view of the light-emitting and light-receiving apparatus 700 taken along the dashed-dotted line Ya-Yb in the cross-sectional view of FIG. 7A. Specifically, the light-emitting device 550B, the light-emitting device 550G, and the light-emitting device 550R are arranged in a matrix. Note that FIG. 7B illustrates what is called a stripe arrangement, in which the light-emitting devices of the same color are arranged in the X-direction. FIG. 7C illustrates a structure in which the light-emitting devices of the same color are arranged in the X-direction and separated by patterning for each pixel. Note that the arrangement method of the light-emitting devices is not limited thereto; another method such as a delta, zigzag, PenTile, or diamond arrangement may also be used.

The EL layers (the EL layer 103B, the EL layer 103G, and the EL layer 103R) and the photoelectric conversion layer 103PS are processed to be separated by patterning using a photolithography method; hence, a light-emitting and light-receiving apparatus (display panel) with a high resolution can be fabricated. The end portions (side surfaces) of the EL layer processed by patterning using a photolithography method have substantially the same surface (or are positioned on substantially the same plane). In this case, the widths (SE) of spaces 580 between the EL layers and between the EL layer and the photoelectric conversion layer are each preferably 5 μm or less, further preferably 1 μm or less.

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as described in this structure example can suppress occurrence of crosstalk between adjacent light-emitting devices.

Figure 7D:
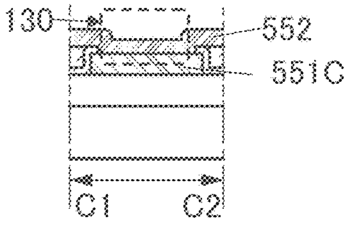

FIG. 7D is a schematic cross-sectional view taken along the dashed-dotted line C1-C2 in FIGS. 7B and 7C. FIG. 7D illustrates a connection portion 130 where a connection electrode 551C and the electrode 552 are electrically connected to each other. In the connection portion 130, the electrode 552 is provided over and in contact with the connection electrode 551C. The partition wall 528 is provided to cover an end portion of the connection electrode 551C.

<Example of Method for Manufacturing Light-Emitting and Light-Receiving Apparatus>

Figure 8A:
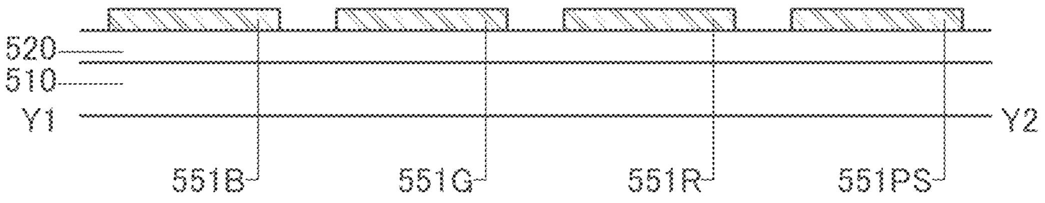
FIGS. 8A to 8C illustrate a method for manufacturing a light-emitting and light-receiving apparatus of an embodiment.

The electrode 551B, the electrode 551G, the electrode 551R, and the electrode 551PS are formed as illustrated in FIG. 8A. For example, a conductive film is formed over the functional layer 520 over the first substrate 510 and processed into predetermined shapes by a photolithography method.

The conductive film can be formed by any of a sputtering method, a chemical vapor deposition (CVD) method, a molecular beam epitaxy (MBE) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

The conductive film may be processed by a nanoimprinting method, a sandblasting method, a lift-off method, or the like as well as a photolithography method described above. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development. The former method involves heat treatment steps such as pre-applied bake (PAB) after resist application and post-exposure bake (PEB) after light exposure. In one embodiment of the present invention, a lithography method is used not only for processing of a conductive film but also for processing of a thin film used for formation of an EL layer (a film made of an organic compound or a film partly including an organic compound).

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when light exposure is performed by scanning with a beam such as an electron beam.

For etching of a thin film using a resist mask, a dry etching method, a wet etching method, a sandblast method, or the like can be used.

Figure 8B:
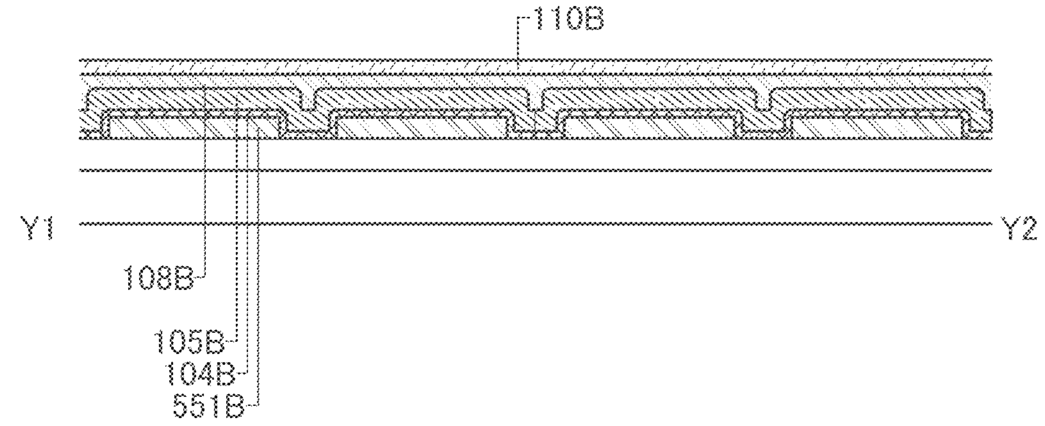

Subsequently, as illustrated in FIG. 8B, the hole-injection/transport layer 104B, the light-emitting layer 105B, and the electron-transport layer 108B are formed over the electrode 551B, the electrode 551G, the electrode 551R, and the electrode 551PS. Note that the hole-injection/transport layer 104B, the light-emitting layer 105B, and the electron-transport layer 108B can be formed using a vacuum evaporation method, for example. Furthermore, a sacrifice layer 110B is formed over the electron-transport layer 108B. For the formation of the hole-injection/transport layer 104B, the light-emitting layer 105B, and the electron-transport layer 108B, any of the materials described in Embodiment 3 can be used.

For the sacrifice layer 110B, it is preferable to use a film highly resistant to etching treatment performed on the hole-injection/transport layer 104B, the light-emitting layer 105B, and the electron-transport layer 108B, i.e., a film having high etching selectivity with respective to the hole-injection/transport layer 104B, the light-emitting layer 105B, and the electron-transport layer 108B. The sacrifice layer 110B preferably has a stacked-layer structure of a first sacrifice layer and a second sacrifice layer which have different etching selectivities. For the sacrifice layer 110B, it is possible to use a film that can be removed by a wet etching method, which causes less damage to the EL layer 103B. In wet etching, oxalic acid or the like can be used as an etching material.

For the sacrifice layer 110B, an inorganic film such as a metal film, an alloy film, a metal oxide film, a semiconductor film, or an inorganic insulating film can be used, for example. The sacrifice layer 110B can be formed by any of a variety of film formation methods such as a sputtering method, an evaporation method, a CVD method, and an ALD method.

For the sacrifice layer 110B, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

A metal oxide such as indium gallium zinc oxide (also referred to as In—Ga—Zn oxide or IGZO) can be used for the sacrifice layer 110B. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

For the sacrifice layer 110B, an inorganic insulating material such as aluminum oxide, hafnium oxide, or silicon oxide can be used.

The sacrifice layer 110B is preferably formed using a material that can be dissolved in a solvent chemically stable with respect to at least the electron-transport layer 108B that is in the uppermost position. Specifically, a material that can be dissolved in water or alcohol can be suitably used for the sacrifice layer 110B. In formation of the sacrifice layer 110B, it is preferable that application of such a material dissolved in a solvent such as water or alcohol be performed by a wet process and followed by heat treatment for evaporating the solvent. At this time, the heat treatment is preferably performed under a reduced-pressure atmosphere, in which case the solvent can be removed at a low temperature in a short time and thermal damage to the hole-injection/transport layer 104B, the light-emitting layer 105B, and the electron-transport layer 108B can be accordingly reduced.

In the case where the sacrifice layer 110B having a stacked-layer structure is formed, the stacked-layer structure can include the first sacrifice layer formed using any of the above-described materials and the second sacrifice layer thereover.

The second sacrifice layer in that case is a film used as a hard mask for etching of the first sacrifice layer. In processing the second sacrifice layer, the first sacrifice layer is exposed. Thus, a combination of films having greatly different etching rates is selected for the first sacrifice layer and the second sacrifice layer. Thus, a film that can be used for the second sacrifice layer can be selected in accordance with the etching conditions of the first sacrifice layer and those of the second sacrifice layer.

For example, in the case where the second sacrifice layer is etched by dry etching involving a fluorine-containing gas (also referred to as a fluorine-based gas), the second sacrifice layer can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a film of a metal oxide such as IGZO or ITO can be given as an example of a film having a high etching selectivity to the second sacrifice layer (i.e., a film with a low etching rate) in the dry etching involving the fluorine-based gas, and can be used for the first sacrifice layer.

Note that the material for the second sacrifice layer is not limited to the above and can be selected from a variety of materials in accordance with the etching conditions of the first sacrifice layer and those of the second sacrifice layer. For example, any of the films that can be used for the first sacrifice layer can be used for the second sacrifice layer.

For the second sacrifice layer, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, an oxide film can be used for the second sacrifice layer. Typically, it is possible to use a film of an oxide or an oxynitride such as silicon oxide, silicon oxynitride, aluminum oxide, aluminum oxynitride, hafnium oxide, or hafnium oxynitride.

Figure 8C:
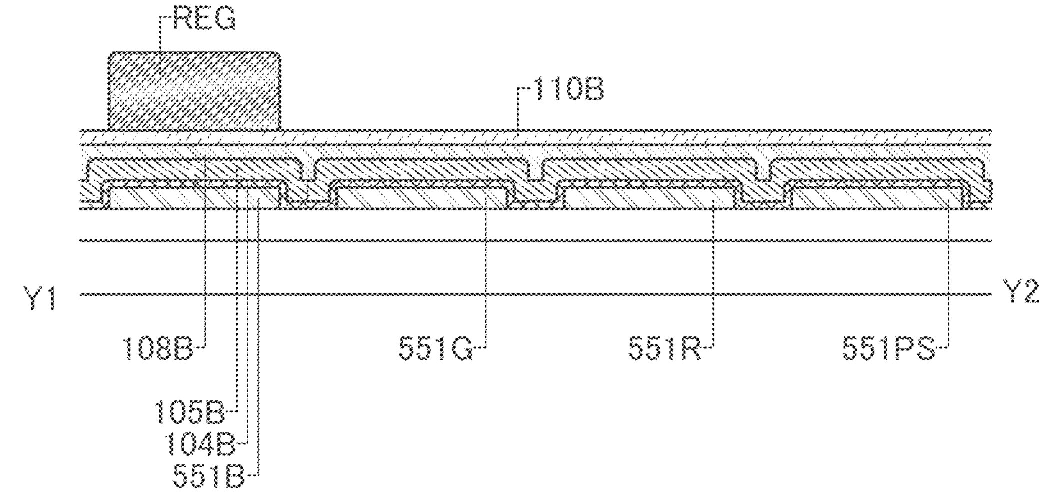

Next, as illustrated in FIG. 8C, a resist is applied onto the sacrifice layer 110B, and the resist having a desired shape (a resist mask REG) is formed by a photolithography method. Such a method involves heat treatment steps such as pre-applied bake (PAB) after the resist application and post-exposure bake (PEB) after light exposure. The temperature reaches approximately 100° C. during the PAB, and approximately 120° C. during the PEB, for example. Therefore, the light-emitting device should be resistant to such high treatment temperatures.

Figure 9A:
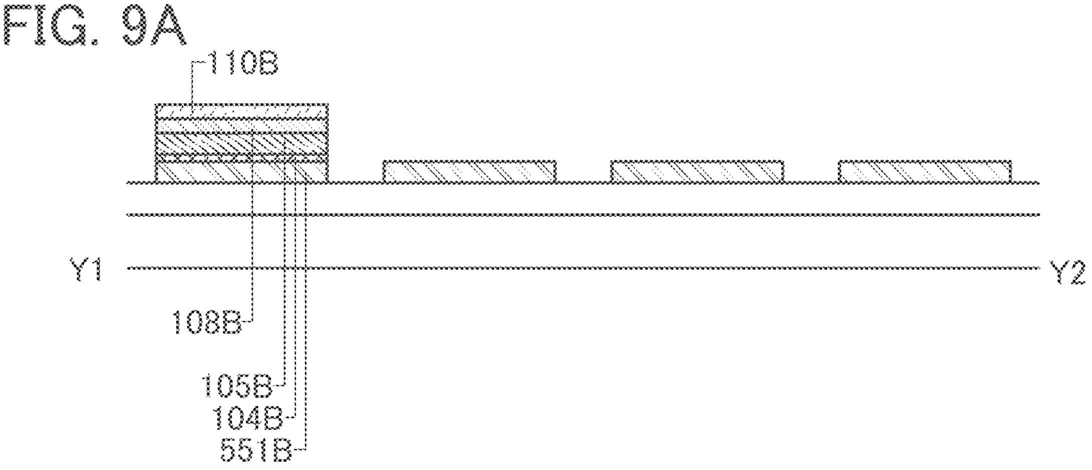
FIGS. 9A to 9C illustrate a method for manufacturing a light-emitting and light-receiving apparatus of an embodiment.

Next, part of the sacrifice layer 110B that is not covered with the resist mask REG is removed by etching using the resist mask REG, the resist mask REG is removed, and then the hole-injection/transport layer 104B, the light-emitting layer 105B, and the electron-transport layer 108B that are not covered with the sacrifice layer are removed by etching, so that the hole-injection/transport layer 104B, the light-emitting layer 105B, and the electron-transport layer 108B are processed to have side surfaces (or have their side surfaces exposed) over the electrode 551B or have belt-like shapes extending in the direction intersecting the sheet of the diagram. Note that dry etching is preferably employed for the etching. Note that in the case where the sacrifice layer 110B has the aforementioned stacked-layer structure of the first sacrifice layer and the second sacrifice layer, the hole-injection/transport layer 104B, the light-emitting layer 105B, and the electron-transport layer 108B may be processed into a predetermined shape in the following manner: part of the second sacrifice layer is etched using the resist mask REG, the resist mask REG is then removed, and part of the first sacrifice layer is etched using the second sacrifice layer as a mask. The structure illustrated in FIG. 9A is obtained through these etching steps.

Figure 9B:
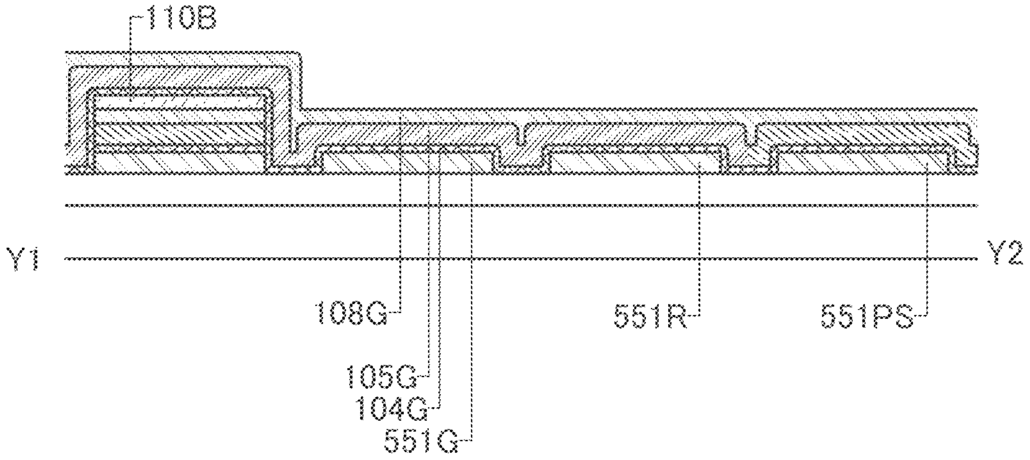

Subsequently, as illustrated in FIG. 9B, the hole-injection/transport layer 104G, the light-emitting layer 105G, and the electron-transport layer 108G are formed over the sacrifice layer 110B, the electrode 551G, the electrode 551R, and the electrode 551PS. The hole-injection/transport layer 104G, the light-emitting layer 105G, and the electron-transport layer 108G can be formed using any of the materials described in Embodiment 3. Note that the hole-injection/transport layer 104G, the light-emitting layer 105G, and the electron-transport layer 108G can be formed by a vacuum evaporation method, for example.

Figure 9C:
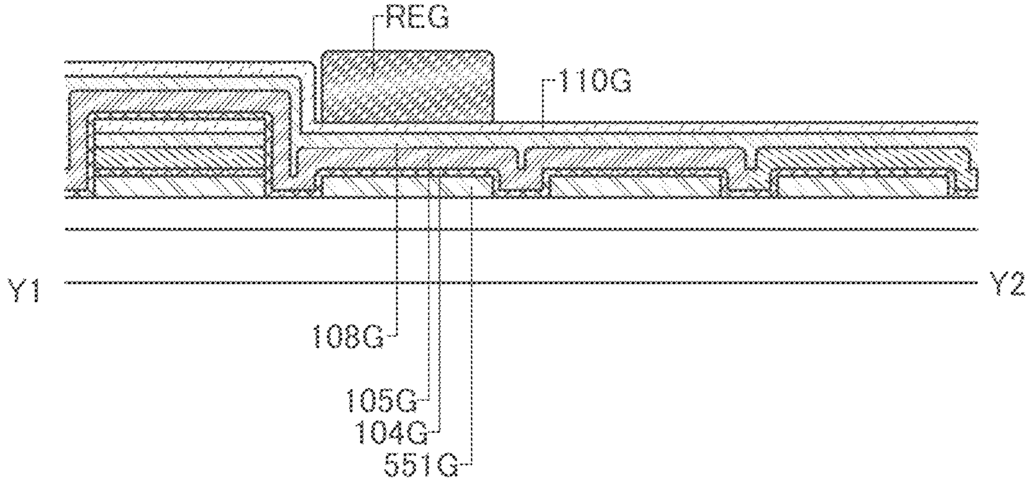
Figure 10A:
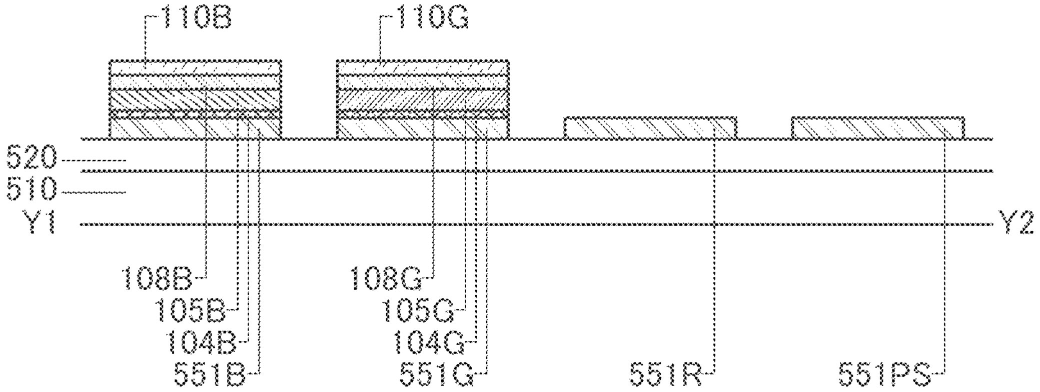
FIGS. 10A to 10C illustrate a method for manufacturing a light-emitting and light-receiving apparatus of an embodiment.

Next, as illustrated in FIG. 9C, the sacrifice layer 110G is formed over the electron-transport layer 108G, a resist is applied onto the sacrifice layer 110G, and the resist having a desired shape (the resist mask REG) is formed by a lithography method. Part of the sacrifice layer 110G that is not covered with the obtained resist mask is removed by etching, the resist mask is removed, and then parts of the hole-injection/transport layer 104G, the light-emitting layer 105G, and the electron-transport layer 108G that are not covered with the sacrifice layer are removed by etching. Thus, the hole-injection/transport layer 104G, the light-emitting layer 105G, and the electron-transport layer 108G are processed to have side surfaces (or have their side surfaces exposed) over the electrode 551G or have belt-like shapes extending in the direction intersecting the sheet of the diagram. Note that dry etching is preferably employed for the etching. Note that the sacrifice layer 110G can be formed using a material similar to that for the sacrifice layer 110B. In the case where the sacrifice layer 110G has the aforementioned stacked-layer structure of the first sacrifice layer and the second sacrifice layer, the hole-injection/transport layer 104G, the light-emitting layer 105G, and the electron-transport layer 108G may be processed into a predetermined shape in the following manner: part of the second sacrifice layer is etched using the resist mask, the resist mask is then removed, and part of the first sacrifice layer is etched using the second sacrifice layer as a mask. The structure illustrated in FIG. 10A is obtained through these etching steps.

Figure 10B:
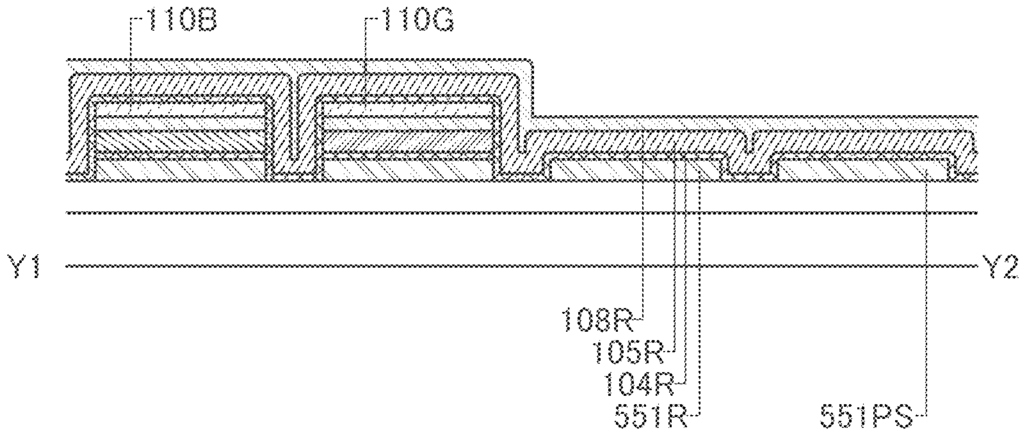

Next, as illustrated in FIG. 10B, the hole-injection/transport layer 104R, the light-emitting layer 105R, and the electron-transport layer 108R are formed over the sacrifice layer 110B, the sacrifice layer 110G, the electrode 551R, and the electrode 551PS. The hole-injection/transport layer 104R, the light-emitting layer 105R, and the electron-transport layer 108R can be formed using any of the materials described in Embodiment 3. The hole-injection/transport layer 104R, the light-emitting layer 105R, and the electron-transport layer 108R can be formed by a vacuum evaporation method, for example.

Figure 10C:
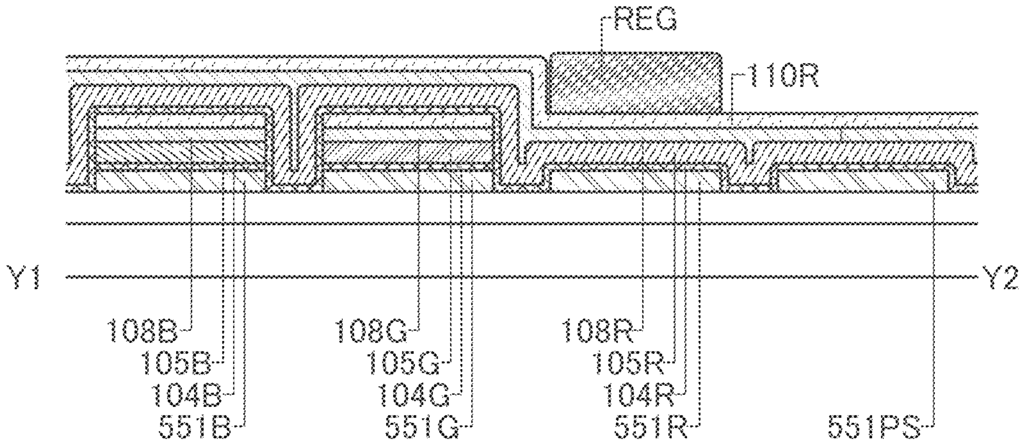
Figure 11A:
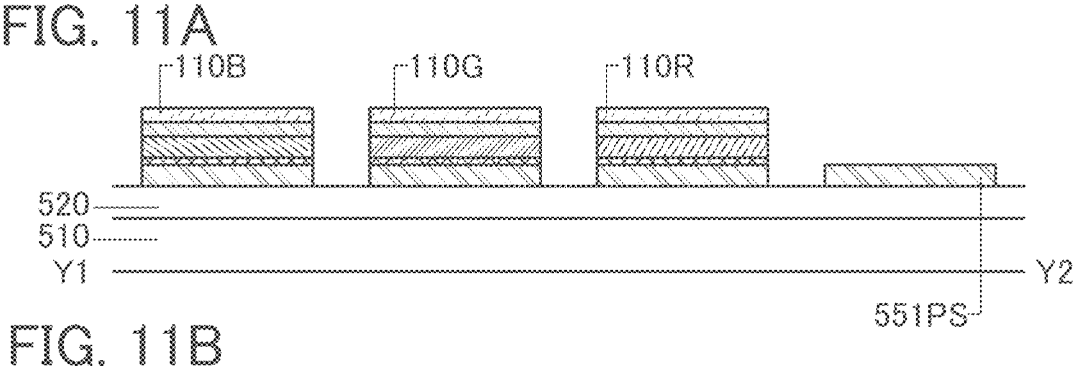
FIGS. 11A to 11D illustrate a method for manufacturing a light-emitting and light-receiving apparatus of an embodiment.

Next, as illustrated in FIG. 10C, the sacrifice layer 110R is formed over the electron-transport layer 108R, a resist is applied onto the sacrifice layer 110R, and the resist having a desired shape (the resist mask REG) is formed by a photolithography method. Part of the sacrifice layer 110R that is not covered with the obtained resist mask is removed by etching, the resist mask is removed, and then the hole-injection/transport layer 104R, the light-emitting layer 105R, and the electron-transport layer 108R that are not covered with the sacrifice layer are removed by etching. Thus, the hole-injection/transport layer 104R, the light-emitting layer 105R, and the electron-transport layer 108R are processed to have side surfaces (or have their side surfaces exposed) over the electrode 551R or have belt-like shapes extending in the direction intersecting the sheet of the diagram. Note that dry etching is preferably employed for the etching. Note that the sacrifice layer 110R can be formed using a material similar to that for the sacrifice layer 110B. In the case where the sacrifice layer 110R has the aforementioned stacked-layer structure of the first sacrifice layer and the second sacrifice layer, the hole-injection/transport layer 104R, the light-emitting layer 105R, and the electron-transport layer 108R may be processed into a predetermined shape in the following manner: part of the second sacrifice layer is etched using the resist mask, the resist mask is then removed, and part of the first sacrifice layer is etched using the second sacrifice layer as a mask. The structure illustrated in FIG. 11A is obtained through these etching steps.

Figure 11B:
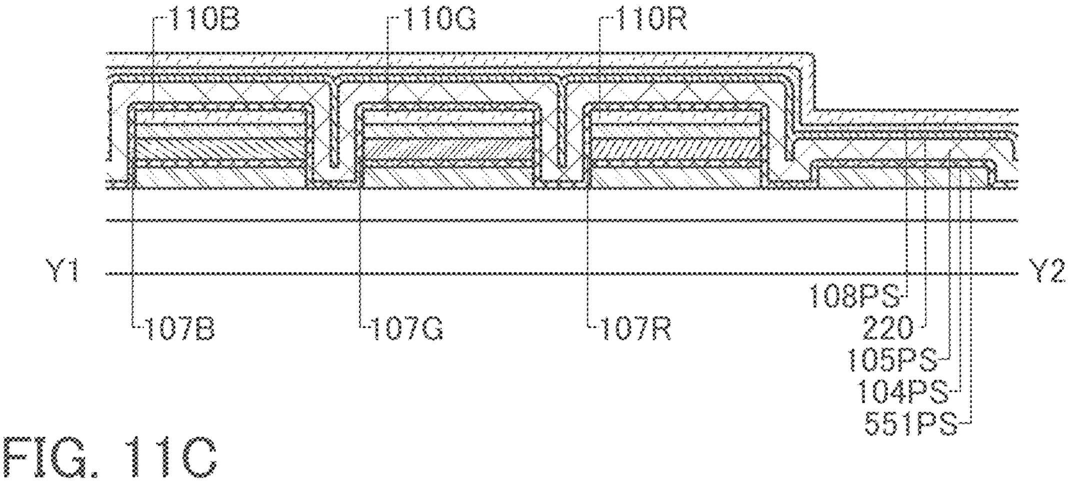

Next, as illustrated in FIG. 11B, the first transport layer 104PS, the active layer 105PS, the structure body 220, and the second transport layer 108PS are formed over the sacrifice layer 110B, the sacrifice layer 110G, the sacrifice layer 110R, and the electrode 551PS. The first transport layer 104PS, the active layer 105PS, the structure body 220, and the second transport layer 108PS can be formed using any of the materials described in Embodiment 1. Note that the first transport layer 104PS, the active layer 105PS, the structure body 220, and the second transport layer 108PS can be formed by a vacuum evaporation method, for example.

Figure 11C:
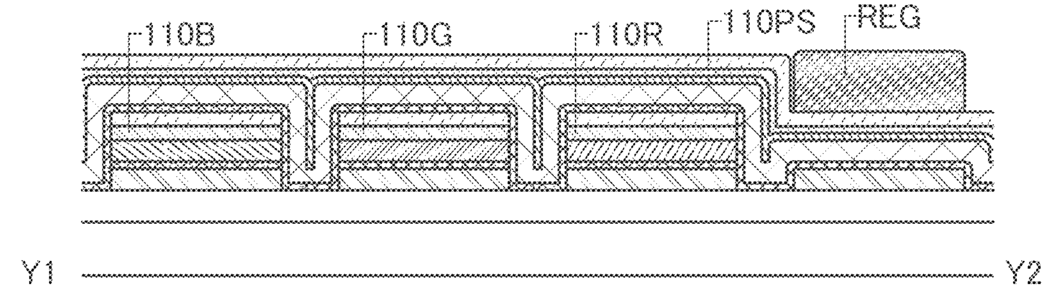
Figure 11D:
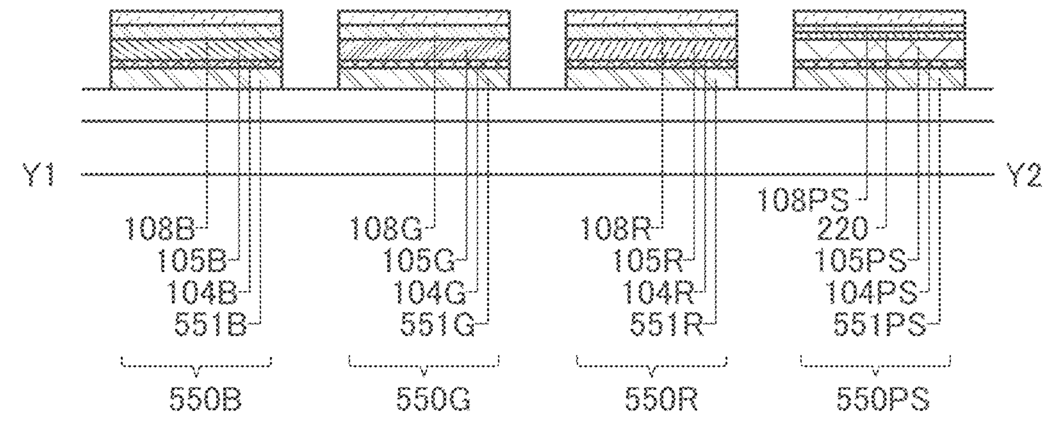

Next, as illustrated in FIG. 11C, the sacrifice layer 110PS is formed over the second transport layer 108PS, a resist is applied onto the sacrifice layer 110PS, and the resist having a desired shape (the resist mask REG) is formed by a photolithography method. Part of the sacrifice layer 110PS that is not covered with the obtained resist mask is removed by etching, the resist mask is removed, and then parts of the first transport layer 104PS, the active layer 105PS, and the second transport layer 108PS that are not covered with the sacrifice layer 110PS are removed by etching. Thus, the first transport layer 104PS, the active layer 105PS, and the second transport layer 108PS are processed to have side surfaces (or have their side surfaces exposed) over the electrode 551PS or have belt-like shapes extending in the direction intersecting the sheet of the diagram. Note that dry etching is preferably employed for the etching. Note that the sacrifice layer 110PS can be formed using a material similar to that for the sacrifice layer 110B. In the case where the sacrifice layer 110PS has the aforementioned stacked-layer structure of the first sacrifice layer and the second sacrifice layer, the first transport layer 104PS, the active layer 105PS, and the second transport layer 108PS may be processed into a predetermined shape in the following manner: part of the second sacrifice layer is etched using the resist mask, the resist mask is then removed, and part of the first sacrifice layer is etched using the second sacrifice layer as a mask. The structure illustrated in FIG. 11D is obtained through these etching steps.

Figure 12A:
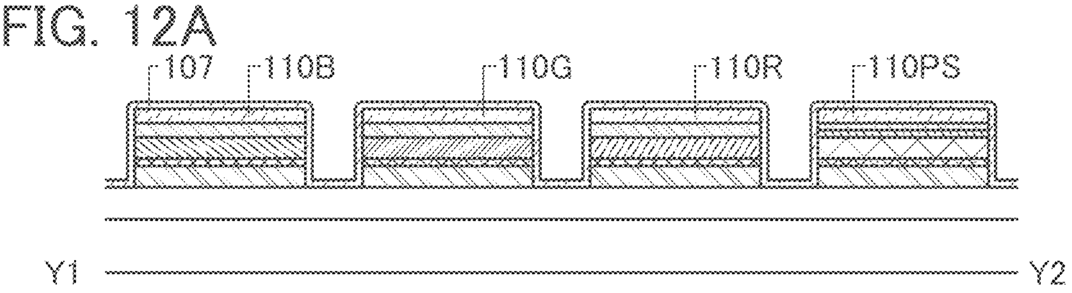
FIGS. 12A to 12E illustrate a method for manufacturing a light-emitting and light-receiving apparatus of an embodiment.

Next, as illustrated in FIG. 12A, the insulating layer 107 is formed over the sacrifice layer 110B, the sacrifice layer 110G, the sacrifice layer 110R, and the sacrifice layer 110PS.

Note that the insulating layer 107 can be formed by an ALD method, for example. In this case, as illustrated in FIG. 12A, the insulating layer 107 is formed to be in contact with the side surfaces (end portions) of the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the structure body 220, and the second transport layer 108PS of the photoelectric conversion device. This can inhibit entry of oxygen, moisture, or constituent elements thereof into the inside through the side surfaces of the layers. Examples of the material used for the insulating layer 107 include aluminum oxide, magnesium oxide, hafnium oxide, gallium oxide, indium gallium zinc oxide, silicon nitride, and silicon nitride oxide.

Figure 12B:
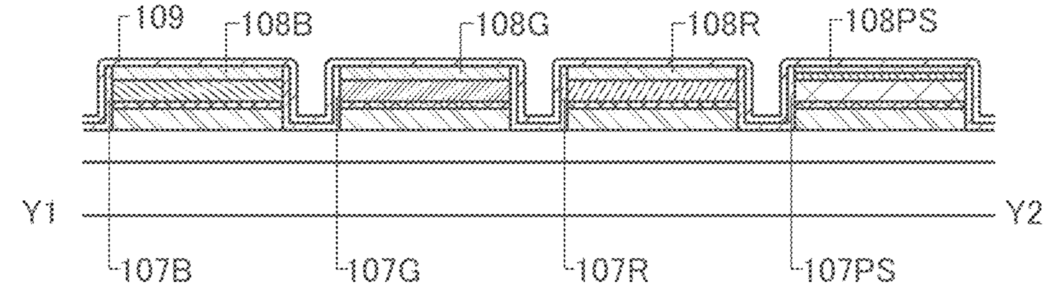

Next, as illustrated in FIG. 12B, the sacrifice layers (110B, 110G, 110R, and 110PS) are removed, and then, the electron-injection layer 109 is formed over the insulating layers (107B, 107G, 107R, and 107PS), the electron-transport layers (108B, 108G, and 108R), and the second transport layer 108PS. The electron-injection layer 109 can be formed using any of the materials described in Embodiment 3. The electron-injection layer 109 is formed by a vacuum evaporation method, for example. The electron-injection layer 109 is formed over the electron-transport layers (108B, 108G, and 108R) and the second transport layer 108PS. The electron-injection layer 109 is in contact with the side surfaces (end portions) of the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the structure body 220, and the second transport layer 108PS of the photoelectric conversion device with the insulating layers (107B, 107G, 107R, and 107PS) therebetween.

Figure 12C:
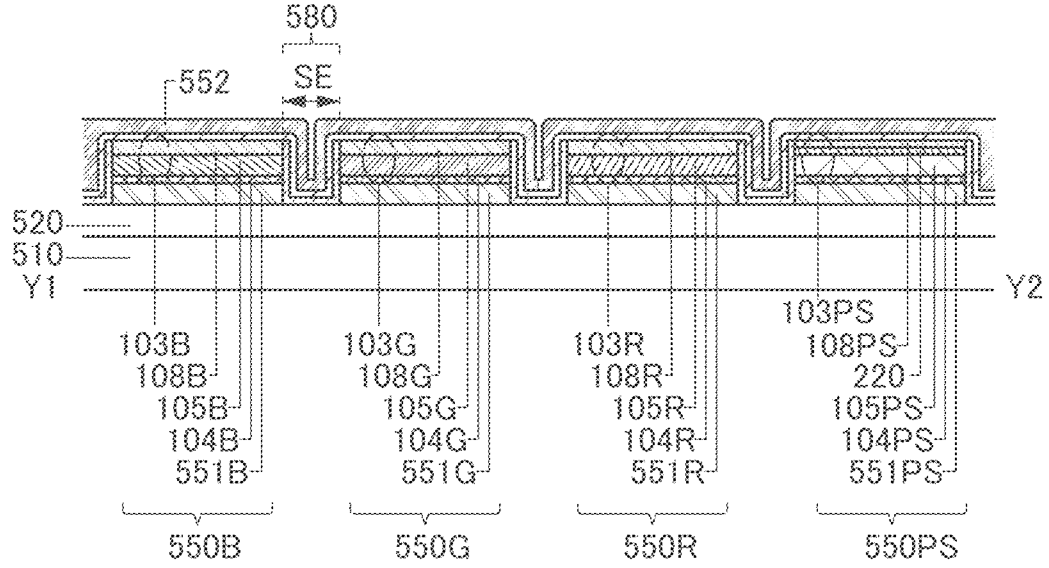

Next, as illustrated in FIG. 12C, the electrode 552 is formed. The electrode 552 is formed by a vacuum evaporation method, for example. The electrode 552 is formed over the electron-injection layer 109. Note that the electrode 552 is in contact with the side surfaces (end portions) of the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the structure body 220, and the second transport layer 108PS of the photoelectric conversion device with the electron-injection layer 109 and the insulating layers (107B, 107G, 107R, and 107PS) therebetween. This can prevent electrical short circuits between the electrode 552 and each of the following layers: the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the structure body 220, and the second transport layer 108PS of the photoelectric conversion device.

Through the above steps, the EL layer 103B, the EL layer 103G, the EL layer 103R, and the photoelectric conversion layer 103PS in the light-emitting device 550B, the light-emitting device 550G, the light-emitting device 550R, and the photoelectric conversion device 550PS can be processed to be separated from each other.

The EL layers (the EL layer 103B, the EL layer 103G, and the EL layer 103R) and the photoelectric conversion layer 103PS are processed to be separated by patterning using a photolithography method; hence, a light-emitting and light-receiving apparatus (display panel) with a high resolution can be fabricated. End portions (side surfaces) of the EL layer processed by patterning using a photolithography method have substantially the same surface (or are positioned on substantially the same plane).

Each of the hole-injection/transport layers (104B, 104G, and 104R) of the EL layers and the first transport layer 104PS of the photoelectric conversion layer often has high conductivity, and thus might cause crosstalk when formed as a layer shared by adjacent light-emitting devices. Therefore, processing the EL layers to be separated by patterning using a photolithography method as described in this structure example can inhibit occurrence of crosstalk between light-emitting devices that are adjacent to each other and between the light-emitting device and the photoelectric conversion device that are adjacent to each other.

In this structure example, the hole-injection/transport layers (104B, 104G, and 104R), the light-emitting layers (105B, 105G, and 105R), and the electron-transport layers (108B, 108G, and 108R) of the EL layers (the EL layer

103B, the EL layer 103G, and the EL layer 103R) included in the light-emitting devices and the first transport layer 104PS, the active layer 105PS, the structure body 220, and the second transport layer 108PS of the photoelectric conversion layer 103PS included in the photoelectric conversion device are processed to be separated by patterning using a photolithography method; thus, the end portions (side surfaces) of the processed EL layer have substantially the same surface (or are positioned on substantially the same plane).

In addition, the hole-injection/transport layers (104B, 104G, and 104R), the light-emitting layers (105B, 105G, and 105R), and the electron-transport layers (108B, 108G, and 108R) of the EL layers (the EL layer 103B, the EL layer 103G, and the EL layer 103R) included in the light-emitting devices and the first transport layer 104PS, the active layer 105PS, the structure body 220, and the second transport layer 108PS of the photoelectric conversion layer 103PS included in the photoelectric conversion device are processed to be separated by patterning using a photolithography method. Thus, the space 580 is provided between the processed end portions (side surfaces) of adjacent light-emitting devices. In FIG. 12C, when the space 580 is denoted by a distance SE between the EL layers of adjacent light-emitting devices, decreasing the distance SE increases the aperture ratio and the resolution. By contrast, as the distance SE is increased, the effect of the difference in the fabrication process between the adjacent light-emitting devices becomes permissible, which leads to an increase in manufacturing yield. Since the light-emitting device fabricated according to this specification are suitable for a miniaturization process, the distance SE between the EL layers of adjacent light-emitting devices can be longer than or equal to 0.5 μm and shorter than or equal to 5 μm, preferably longer than or equal to 1 μm and shorter than or equal to 3 μm, further preferably longer than or equal to 1 μm and shorter than or equal to 2.5 μm, and still further preferably longer than or equal to 1 μm and shorter than or equal to 2 μm. Typically, the distance SE is preferably longer than or equal to 1 μm and shorter than or equal to 2 μm (e.g., 1.5 μm or a neighborhood thereof).

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

Note that the island-shaped EL layers of the light-emitting and light-receiving apparatus having the MML structure are formed by not patterning using a metal mask but processing after formation of an EL layer. Thus, a light-emitting and light-receiving apparatus with a higher resolution or a higher aperture ratio than a conventional one can be achieved. Moreover, EL layers can be formed separately for each color, which enables extremely clear images; thus, a light-emitting and light-receiving apparatus with a high contrast and high display quality can be achieved. Furthermore, provision of a sacrifice layer over an EL layer can reduce damage on the EL layer during the manufacturing process and increase the reliability of the light-emitting device.

Note that in the case where the EL layer is processed into an island shape, a structure in which processing is performed directly above the light-emitting layer by photolithography can be considered. In that case, damage to the light-emitting layer (e.g., processing damage) might significantly degrade the reliability. In view of the above, in the manufacture of the light-emitting and light-receiving apparatus of one embodiment of the present invention, a sacrificial layer or the like is preferably formed over a second carrier-transport layer or a second carrier-injection layer above the light-emitting layer, followed by the processing of the light-emitting layer into an island shape. Such a method provides a highly reliable display panel.

In FIG. 7A and FIG. 12C, the widths of the EL layers (103B, 103G, and 103R) are substantially equal to those of the electrodes (551B, 551G, and 551R) in the light-emitting device 550B, the light-emitting device 550G, and the light-emitting device 550R, and the width of the photoelectric conversion layer 103PS is substantially equal to that of the electrode 551PS in the photoelectric conversion device 550PS; however, one embodiment of the present invention is not limited thereto.

Figure 12D:
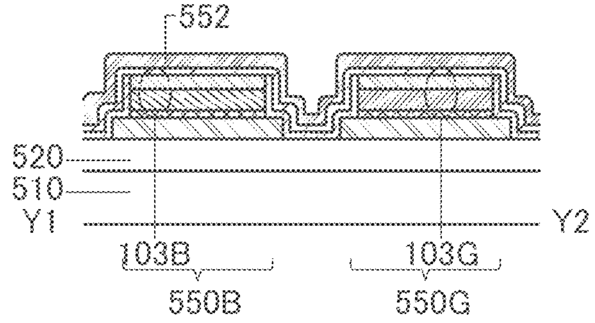

In the light-emitting device 550B, the light-emitting device 550G, and the light-emitting device 550R, the widths of the EL layers (103B, 103G, and 103R) may be smaller than those of the electrodes (551B, 551G, and 551R). In the photoelectric conversion device 550PS, the width of the photoelectric conversion layer 103PS may be smaller than that of the electrode 551PS. FIG. 12D illustrates an example in which the widths of the EL layers (103B and 103G) are smaller than those of the electrodes (551B and 551G) in the light-emitting device 550B and the light-emitting device 550G.

Figure 12E:
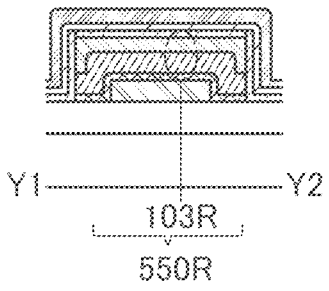

In the light-emitting device 550B, the light-emitting device 550G, and the light-emitting device 550R, the widths of the EL layers (103B, 103G, and 103R) may be larger than those of the electrodes (551B, 551G, and 551R). In the photoelectric conversion device 550PS, the width of the photoelectric conversion layer 103PS may be larger than that of the electrode 551PS. FIG. 12E illustrates an example in which the width of the EL layer 103R is larger than that of the electrode 551R in the light-emitting device 550R.

The structures described in this embodiment can be used in combination with any of the structures described in the other embodiments as appropriate.

Embodiment 5

In this embodiment, a light-emitting and light-receiving apparatus 720 is described with reference to FIGS. 13A to 13F, FIGS. 14A to 14C, and FIG. 15. The light-emitting and light-receiving apparatus 720 illustrated in FIGS. 13A to 13F, FIGS. 14A to 14C, and FIG. 15 includes any of the photoelectric conversion devices and the light-emitting devices described in Embodiments 1 and 3 and therefore is a light-emitting and light-receiving apparatus. Furthermore, the light-emitting and light-receiving apparatus 720 described in this embodiment can be used in a display portion of an electronic appliance or the like and therefore can also be referred to as a display panel or a display apparatus. Moreover, the light-emitting and light-receiving apparatus has a structure in which the light-emitting device is used as a light source and the photoelectric conversion device receives light from the light-emitting device.

Furthermore, the light-emitting and light-receiving apparatus of this embodiment can have high definition or large size. Therefore, the light-emitting and light-receiving apparatus of this embodiment can be used, for example, in display portions of electronic appliances such as a digital camera, a digital video camera, a digital photo frame, a mobile phone, a portable game machine, a smart phone, a wristwatch terminal, a tablet terminal, a portable information terminal, and an audio reproducing apparatus, in addition to display portions of electronic appliances with a relatively large screen, such as a television apparatus, a desktop or laptop personal computer, a monitor of a computer or the like, digital signage, and a large game machine such as a pachinko machine.

Figure 13A:
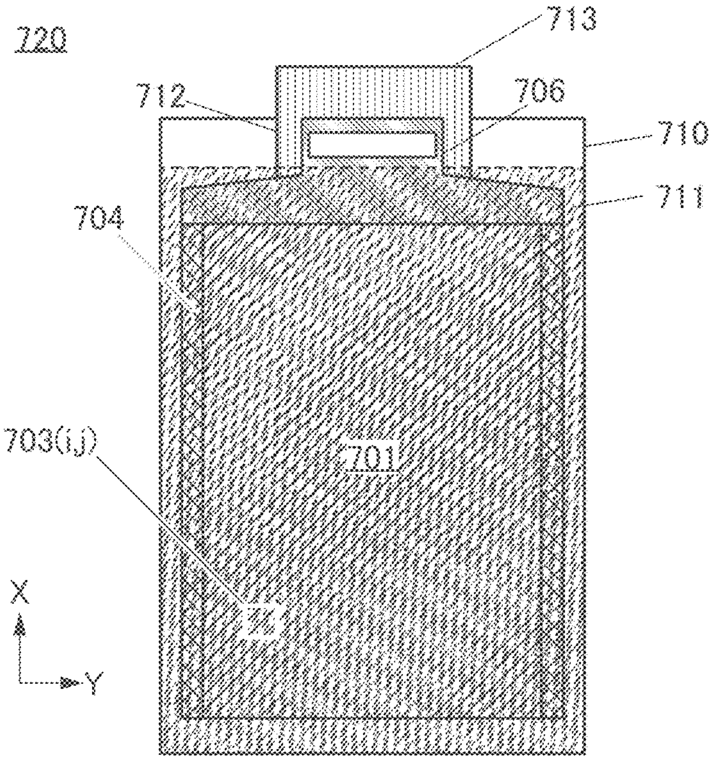
FIGS. 13A to 13F illustrate an apparatus of an embodiment and pixel arrangements.

FIG. 13A is a top view of the light-emitting and light-receiving apparatus 720.

Figure 13B:
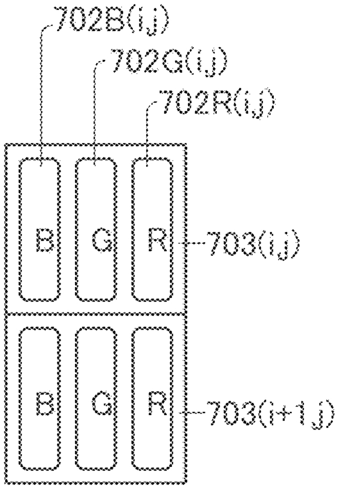

In FIG. 13A, the light-emitting and light-receiving apparatus 720 has a structure in which a substrate 710 and a substrate 711 are attached to each other. In addition, the light-emitting and light-receiving apparatus 720 includes a display region 701, a circuit 704, a wiring 706, and the like. Note that the display region 701 includes a plurality of pixels. As illustrated in FIG. 13B, a pixel 703(*i, j*) and a pixel 703(*i*+1, j) are adjacent to each other.

Furthermore, in the example of the light-emitting and light-receiving apparatus 720 illustrated in FIG. 13A, the substrate 710 is provided with an integrated circuit (IC) 712 by a chip on glass (COG) method, a chip on film (COF) method, or the like. As the IC 712, an IC including a scan line driver circuit, a signal line driver circuit, or the like can be used, for example. In the example illustrated in FIG. 13A, an IC including a signal line driver circuit is used as the IC 712, and a scan line driver circuit is used as the circuit 704.

The wiring 706 has a function of supplying signals and power to the display region 701 and the circuit 704. The signals and power are input to the wiring 706 from the outside through a flexible printed circuit (FPC) 713 or to the wiring 706 from the IC 712. Note that the light-emitting and light-receiving apparatus 720 is not necessarily provided with the IC. The IC may be mounted on the FPC by a COF method or the like.

FIG. 13B illustrates the pixel 703(*i, j*) and the pixel 703(*i*+1, j) of the display region 701. A plurality of kinds of subpixels including light-emitting devices that emit different color light from each other can be included in the pixel 703(*i, j*). Alternatively, a plurality of subpixels including light-emitting devices that emit light of the same color may be included in addition to the above. Three kinds of subpixels can be included in a pixel, for example. The three subpixels can be of three colors of red (R), green (G), and blue (B) or of three colors of yellow (Y), cyan (C), and magenta (M), for example. Alternatively, the pixel can include four kinds of subpixels. The four subpixels can be of four colors of R, G, B, and white (W) or of four colors of R, G, B, and Y, for example. Specifically, the pixel 703(*i, j*) can consist of a subpixel 702B(i, j) for blue display, a subpixel 702G(i, j) for green display, and a subpixel 702R(i, j) for red display.

Other than the subpixels including the light-emitting devices, a subpixel including a photoelectric conversion device may also be provided.

Figure 13C:
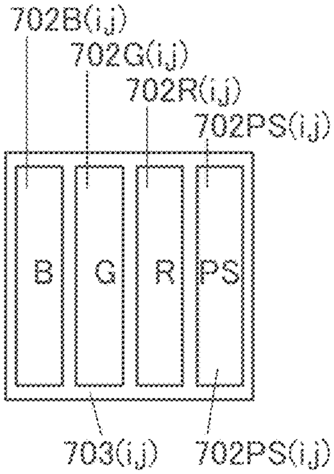
Figure 13D:
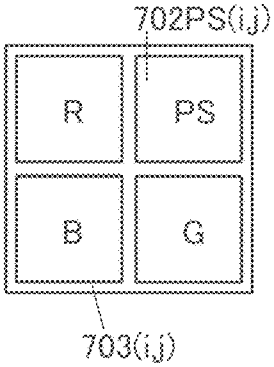
Figure 13E:
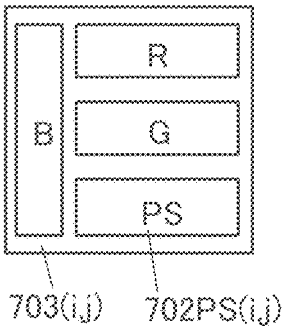

FIGS. 13C to 13F illustrate various layout examples of the pixel 703(*i, j*) including a subpixel 702PS(i, j) including a photoelectric conversion device. The pixel arrangement in FIG. 13C is stripe arrangement, and the pixel arrangement in FIG. 13D is matrix arrangement. The pixel arrangement in FIG. 13E has a structure where three subpixels (the subpixels R, G, and PS) are vertically arranged next to one subpixel (the subpixel B). In the pixel arrangement in FIG. 13F, the vertically oriented three subpixels G, B, and R are arranged laterally, and the subpixel PS and the horizontally oriented subpixel IR are arranged laterally below the three subpixels. Note that the wavelength of light detected by the subpixel 702PS(i, j) is not particularly limited; however, the photoelectric conversion device included in the subpixel 702PS(i, j) preferably has sensitivity to light emitted by the light-emitting device included in the subpixel 702R(i, j), the subpixel 702G(i, j), the subpixel 702B(i, j), or the subpixel 702IR(i, j). For example, the photoelectric conversion device preferably detects one or more kinds of light in blue, violet, bluish violet, green, yellowish green, yellow, orange, red, and infrared wavelength ranges, and the like.

Figure 13F:
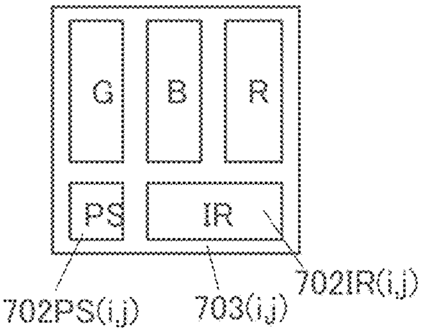

Furthermore, as illustrated in FIG. 13F, a subpixel 702IR (i, j) that emits infrared rays may be added to any of the above-described sets of subpixels in the pixel 703(*i, j*). Specifically, the subpixel that emits light including light with a wavelength of higher than or equal to 650 nm and lower than or equal to 1000 nm may be used in the pixel 703(*i, j*).

Note that the arrangement of subpixels is not limited to the structures illustrated in FIGS. 13B to 13F and a variety of arrangement methods can be employed. The arrangement of subpixels may be stripe arrangement, S-stripe arrangement, matrix arrangement, delta arrangement, Bayer arrangement, or PenTile arrangement, for example.

Furthermore, top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. The top surface shape of a subpixel herein refers to a top surface shape of a light-emitting region of a light-emitting device.

Furthermore, in the case where not only a light-emitting device but also a photoelectric conversion device is included in a pixel, the pixel has a light-receiving function and thus can detect a contact or approach of an object while displaying an image. For example, an image can be displayed by using all the subpixels included in a light-emitting apparatus; or light can be emitted by some of the subpixels as a light source and an image can be displayed by using the remaining subpixels.

Note that the light-receiving area of the subpixel 702PS(i, j) is preferably smaller than the light-emitting areas of the other subpixels. A smaller light-receiving area leads to a narrower image-capturing range, prevents a blur in a captured image, and improves the definition. Thus, by using the subpixel 702PS(i, j), high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel 702PS(i, j).

Moreover, the subpixel 702PS(i, j) can be used in a touch sensor (also referred to as a direct touch sensor), a near touch sensor (also referred to as a hover sensor, a hover touch sensor, a contactless sensor, or a touchless sensor), or the like. For example, the subpixel 702PS(i, j) preferably detects infrared light. Thus, touch sensing is possible even in a dark place.

Here, the touch sensor or the near touch sensor can detect an approach or contact of an object (e.g., a finger, a hand, or a pen). The touch sensor can detect the object when the light-emitting and light-receiving apparatus and the object come in direct contact with each other. Furthermore, the near touch sensor can detect the object even when the object is not in contact with the light-emitting and light-receiving apparatus. For example, the light-emitting and light-receiving apparatus can preferably detect the object when the distance between the light-emitting and light-receiving apparatus and the object is more than or equal to 0.1 mm and less than or equal to 300 mm, preferably more than or equal to 3 mm and less than or equal to 50 mm. With this structure, light-emitting and light-receiving apparatus can be controlled without the object directly contacting with the light-emitting and light-receiving apparatus. In other words, the light-emitting and light-receiving apparatus can be controlled in a contactless (touchless) manner. With the above-described structure, the light-emitting and light-receiving apparatus can be operated with a reduced risk of being dirty or damaged, or without direct contact between the object and a dirt (e.g., dust, bacteria, or a virus) attached to the light-emitting and light-receiving apparatus.

For high-resolution image capturing, the subpixel 702PS (i, j) is preferably provided in every pixel included in the light-emitting and light-receiving apparatus. Meanwhile, in the case where the subpixel 702PS(i, j) is used in a touch sensor, a near touch sensor, or the like, high accuracy is not required as compared to the case of capturing an image of a fingerprint or the like; accordingly, the subpixel 702PS(i, j) is provided in some subpixels in the light-emitting and light-receiving apparatus. When the number of subpixels 702PS(i, j) included in the light-emitting and light-receiving apparatus is smaller than the number of subpixels 702R(i, j) or the like, higher detection speed can be achieved.

Next, an example of a pixel circuit of a subpixel including the light-emitting device is described with reference to FIG. 14A. A pixel circuit 530 illustrated in FIG. 14A includes a light-emitting device (EL) 550, a transistor M15, a transistor M16, a transistor M17, and a capacitor C3. Note that a light-emitting diode can be used as the light-emitting device 550. In particular, any of the light-emitting devices described in Embodiments 1 and 3 is preferably used as the light-emitting device 550.

Figure 14A:
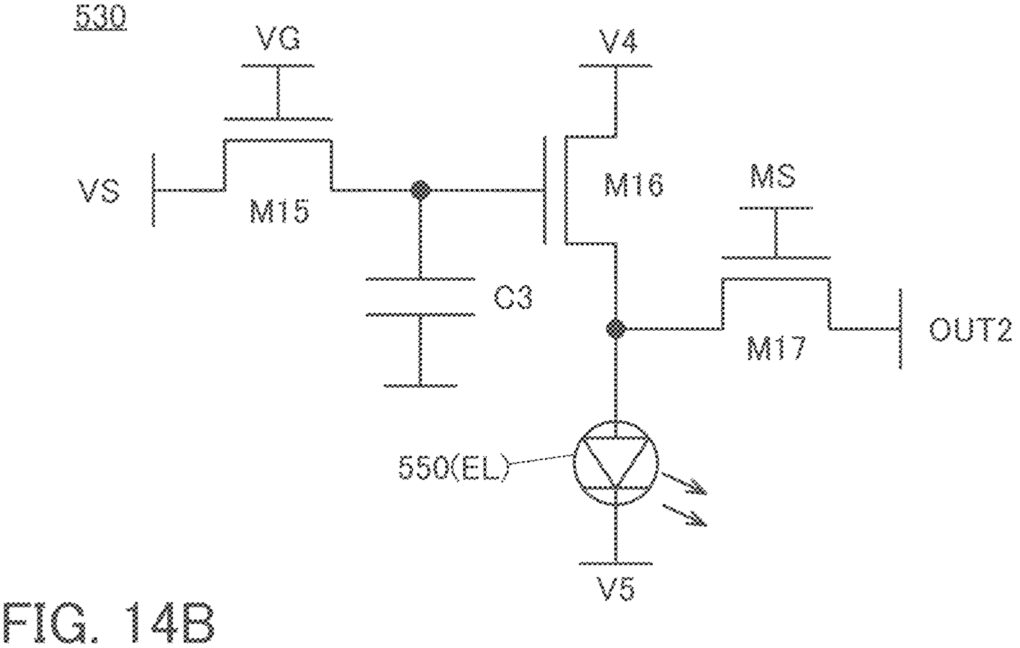
FIGS. 14A to 14C illustrate pixel circuits of an embodiment.

In FIG. 14A, a gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and agate of the transistor M16. One of a source and a drain of the transistor M16 is electrically connected to a wiring V4, and the other is electrically connected to an anode of the light-emitting device 550 and one of a source and a drain of the transistor M17. A gate of the transistor M17 is electrically connected to a wiring MS, and the other of the source and the drain of the transistor M17 is electrically connected to a wiring OUT2. A cathode of the light-emitting device 550 is electrically connected to a wiring V5.

A constant potential is supplied to the wiring V4 and the wiring V5. In the light-emitting device 550, the anode side can have a high potential and the cathode side can have a lower potential than the anode side. The transistor M15 is controlled by a signal supplied to the wiring VG and functions as a selection transistor for controlling a selection state of the pixel circuit 530. The transistor M16 functions as a driving transistor that controls a current flowing through the light-emitting device 550 in accordance with a potential supplied to the gate of the transistor M16. When the transistor M15 is on, a potential supplied to the wiring VS is supplied to the gate of the transistor M16, and the luminance of the light-emitting device 550 can be controlled in accordance with the potential. The transistor M17 is controlled by a signal supplied to the wiring MS and has a function of outputting a potential between the transistor M16 and the light-emitting device 550 to the outside through the wiring OUT2.

Figure 14B:
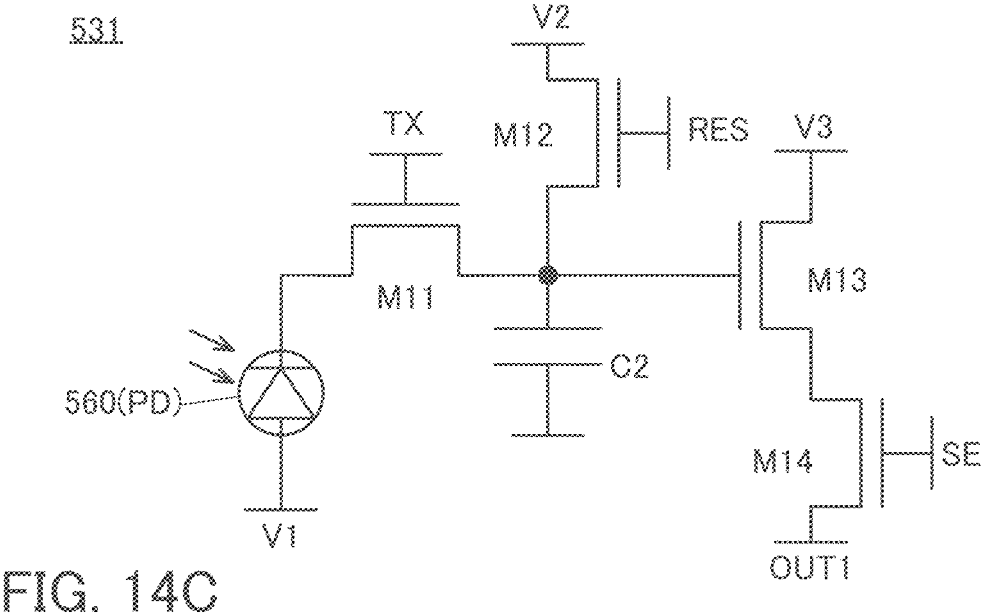

Here, a transistor in which a metal oxide (an oxide semiconductor) is used in a semiconductor layer where a channel is formed is preferably used as transistors M15, M16, and M17 included in the pixel circuit 530 in FIG. 14A and transistors M11, M12, M13, and M14 included in a pixel circuit 531 in FIG. 14B.

A transistor using a metal oxide having a wider band gap and a lower carrier density than silicon can achieve an extremely low off-state current. Such a low off-state current enables retention of charges accumulated in a capacitor that is connected in series with the transistor for a long time. Therefore, it is particularly preferable to use a transistor including an oxide semiconductor as the transistors M11, M12, and M15 each of which is connected in series with a capacitor C2 or the capacitor C3. When each of the other transistors also includes an oxide semiconductor, manufacturing cost can be reduced.

Alternatively, transistors using silicon as a semiconductor in which a channel is formed can be used as the transistors M11 to M17. It is particularly preferable to use silicon with high crystallinity such as single crystal silicon or polycrystalline silicon because high field-effect mobility can be achieved and higher-speed operation can be performed.

Alternatively, a transistor including an oxide semiconductor may be used as at least one of the transistors M11 to M17, and transistors including silicon may be used as the other transistors.

Next, an example of a pixel circuit of a subpixel including a photoelectric conversion device is described with reference to FIG. 14B. The pixel circuit 531 illustrated in FIG. 14B includes a photoelectric conversion device (PD) 560, the transistor M11, the transistor M12, the transistor M13, the transistor M14, and the capacitor C2. In the example illustrated here, a photodiode is used as the photoelectric conversion device (PD) 560.

In FIG. 14B, an anode of the photoelectric conversion device (PD) 560 is electrically connected to a wiring V1, and a cathode of the light-receiving device (PD) 560 is electrically connected to one of a source and a drain of the transistor M11. Agate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the photoelectric conversion device (PD) 560 is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with a current flowing through the photoelectric conversion device (PD) 560. The transistor M13 functions as an amplifier transistor for outputting a signal corresponding to the potential of the node. The transistor M14 is controlled by a signal supplied to the wiring SE and functions as a selection transistor for reading an output corresponding to the potential of the node by an external circuit connected to the wiring OUT1.

Although n-channel transistors are illustrated in FIGS. 14A and 14B, p-channel transistors can alternatively be used.

The transistors included in the pixel circuit 530 and the transistors included in the pixel circuit 531 are preferably formed side by side over the same substrate. It is particularly preferable that the transistors included in the pixel circuit 530 and the transistors included in the pixel circuit 531 be periodically arranged in one region.

One or more layers including the transistor and/or the capacitor are preferably provided to overlap with the photoelectric conversion device (PD) 560 or the light-emitting device (EL) 550. Thus, the effective area of each pixel circuit can be reduced, and a high-resolution light-receiving portion or display portion can be achieved.

Figure 14C:
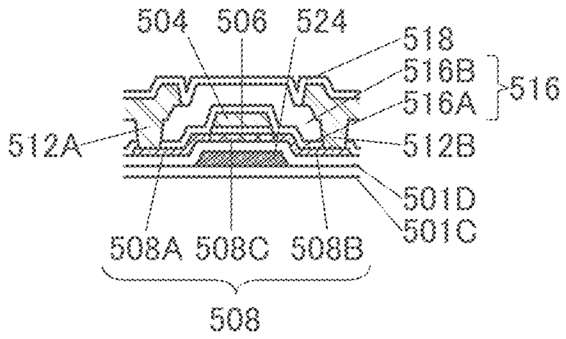

FIG. 14C illustrates an example of a specific structure of a transistor that can be used in the pixel circuit described with reference to FIGS. 14A and 14B. As the transistor, a bottom-gate transistor, a top-gate transistor, or the like can be used as appropriate.

The transistor illustrated in FIG. 14C includes a semiconductor film 508, a conductive film 504, an insulating film 506, a conductive film 512A, and a conductive film 512B. The transistor is formed over an insulating film 501C, for example. The transistor also includes an insulating film 516 (an insulating film 516A and an insulating film 516B) and an insulating film 518.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C and has a function of a first gate electrode.

The insulating film 506 includes a region positioned between the semiconductor film 508 and the conductive film 504. The insulating film 506 has a function of a first gate insulating film.

The conductive film 512A has one of a function of a source electrode and a function of a drain electrode, and the conductive film 512B has the other.

A conductive film 524 can be used in the transistor. The semiconductor film 508 is positioned between the conductive film 504 and a region included in the conductive film 524. The conductive film 524 has a function of a second gate electrode. An insulating film 501D is positioned between the semiconductor film 508 and the conductive film 524 and has a function of a second gate insulating film.

The insulating film 516 functions as, for example, a protective film covering the semiconductor film 508. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 516, for example.

For the insulating film 518, a material that has a function of inhibiting diffusion of oxygen, hydrogen, water, an alkali metal, an alkaline earth metal, and the like is preferably used. Specifically, the insulating film 518 can be formed using silicon nitride, silicon oxynitride, aluminum nitride, or aluminum oxynitride, for example. In each of silicon oxynitride and aluminum oxynitride, the number of nitrogen atoms contained is preferably larger than the number of oxygen atoms contained.

Note that in a step of forming the semiconductor film used in the transistor of the pixel circuit, the semiconductor film used in the transistor of the driver circuit can be formed. A semiconductor film having the same composition as the semiconductor film used in the transistor of the pixel circuit can be used in the driver circuit, for example.

For the semiconductor film 508, a semiconductor containing a Group 14 element can be used. Specifically, a semiconductor containing silicon can be used for the semiconductor film 508.

Hydrogenated amorphous silicon can be used for the semiconductor film 508. Microcrystalline silicon or the like can also be used for the semiconductor film 508. In such cases, it is possible to provide an apparatus having less display unevenness than an apparatus (including a light-emitting apparatus, a display panel, a display apparatus, and a light-emitting and light-receiving apparatus) using polysilicon for the semiconductor film 508, for example. Moreover, it is easy to increase the size of the apparatus.

Polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that in the case of employing a transistor using hydrogenated amorphous silicon for the semiconductor film 508.

For another example, the reliability of the transistor can be higher than that of a transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over a substrate where the pixel circuit is formed. The number of components of an electronic appliance can be reduced.

Single crystal silicon can be used for the semiconductor film 508. In this case, for example, the resolution can be higher than that of a light-emitting apparatus (or a display panel) using hydrogenated amorphous silicon for the semiconductor film 508. For another example, it is possible to provide a light-emitting apparatus having less display unevenness than a light-emitting apparatus using polysilicon for the semiconductor film 508. For another example, smart glasses or a head-mounted display can be provided.

A metal oxide can be used for the semiconductor film 508. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of an electronic device can be reduced. Furthermore, power consumption for driving can be reduced.

An oxide semiconductor can be used for the semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

The use of an oxide semiconductor for the semiconductor film achieves a transistor having lower leakage current in the off state than a transistor using amorphous silicon for the semiconductor film. Thus, a transistor using an oxide semiconductor for the semiconductor film is preferably used as a switch or the like. Note that a circuit in which a transistor using an oxide semiconductor for the semiconductor film is used as a switch is capable of retaining the potential of a floating node for a longer time than a circuit in which a transistor using amorphous silicon for the semiconductor film is used as a switch.

In the case of using an oxide semiconductor in a semiconductor film, the light-emitting and light-receiving apparatus 720 includes a light-emitting device including an oxide semiconductor in its semiconductor film and having a metal maskless (MML) structure. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, a high chroma, and a high contrast ratio in an image displayed on the display apparatus. When the leakage current that might flow through the transistor and the lateral leakage current that might flow between light-emitting elements are extremely low, display with little leakage of light at the time of black display (so-called black floating) (such display is also referred to as deep black display) can be achieved.

In particular, in the case where a light-emitting device having an MML structure employs the above-described SBS structure, a layer provided between light-emitting elements (for example, also referred to as an organic layer or a common layer which is commonly used between the light-emitting elements) is disconnected; accordingly, display with no or extremely small lateral leakage can be achieved.

Figure 15:
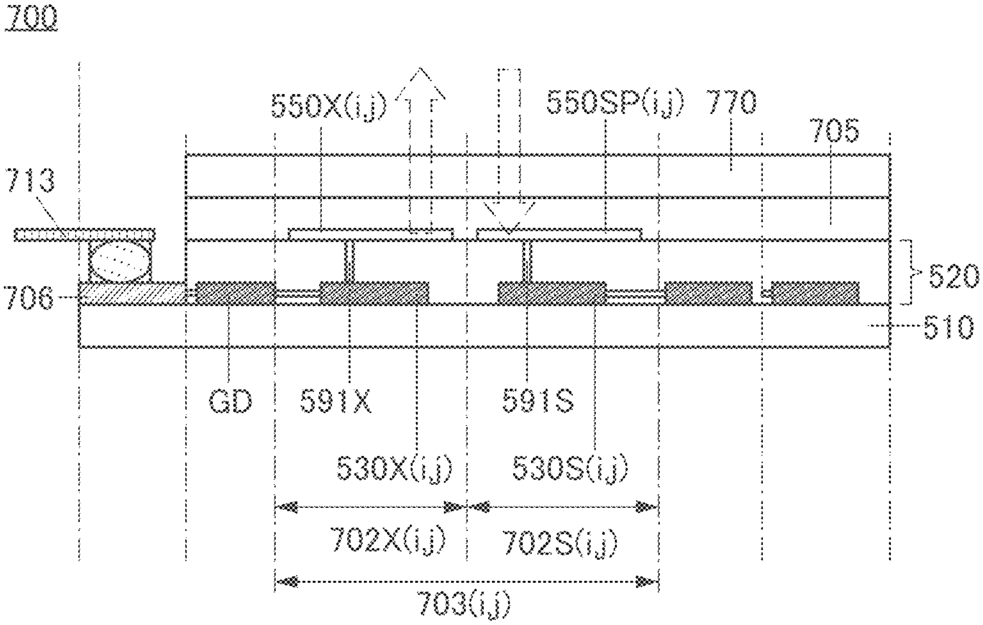
FIG. 15 illustrates a light-emitting apparatus of an embodiment.

Next, a cross-sectional view of a light-emitting and light-receiving apparatus is shown. FIG. 15 is a cross-sectional view of the light-emitting and light-receiving apparatus illustrated in FIG. 13A.

FIG. 15 is a cross-sectional view of part of a region including the FPC 713 and the wiring 706 and part of the display region 701 including the pixel 703(*i, j*).

In FIG. 15, the light-emitting and light-receiving apparatus 700 includes the functional layer 520 between the first substrate 510 and the second substrate 770. The functional layer 520 includes, as well as the above-described transistors (M11, M12, M13, M14, M15, M16, and M17), the capacitor (C2 and C3), and the like described with reference to FIGS. 14A to 14C, wirings (VS, VG, V1, V2, V3, V4, and V5) electrically connected to these components, for example. Although the functional layer 520 includes a pixel circuit 530X(i, j), a pixel circuit 530S(i, j), and a circuit GD in FIG. 15, one embodiment of the present invention is not limited thereto.

Furthermore, each pixel circuit (e.g., the pixel circuit 530X(i, j) and the pixel circuit 530S(i, j) in FIG. 15) included in the functional layer 520 is electrically connected to a light-emitting device and a photoelectric conversion device (e.g., a light-emitting device 550X(i, j) and a photoelectric conversion device 550PS(i, j) in FIG. 15) formed over the functional layer 520. Specifically, the light-emitting device 550X(i, j) is electrically connected to the pixel circuit 530X(i, j) through a wiring 591X, and the photoelectric conversion device 550PS(i, j) is electrically connected to the pixel circuit 530S(i, j) through a wiring 591S. The insulating layer 705 is provided over the functional layer 520, the light-emitting devices, and the photoelectric conversion device, and has a function of attaching the second substrate 770 and the functional layer 520.

As the second substrate 770, a substrate where touch sensors are arranged in a matrix can be used. For example, a substrate provided with capacitive touch sensors or optical touch sensors can be used as the second substrate 770. Thus, the light-emitting and light-receiving apparatus of one embodiment of the present invention can be used as a touch panel.

The structures described in this embodiment can be used in appropriate combination with any of the structures described in the other embodiments.

Embodiment 6

In this embodiment, structures of electronic devices of embodiments of the present invention will be described with reference to FIGS. 16A to 16E, FIGS. 17A to 17E, and FIGS. 18A and 18B. Note that the electronic devices described in this embodiment can each include a light-emitting and light-receiving apparatus of one embodiment of the present invention.

Figure 16A:
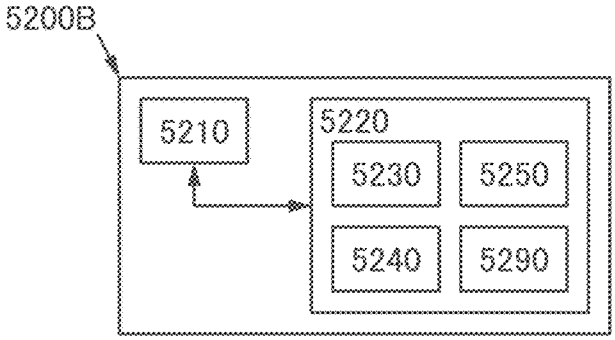
FIGS. 16A to 16E illustrate electronic devices of an embodiment.
Figure 16B:
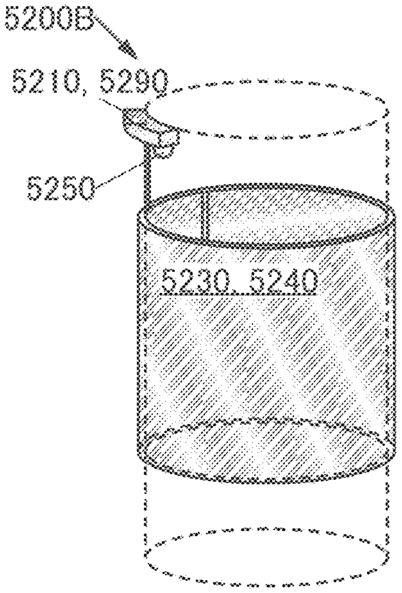
Figure 16C:
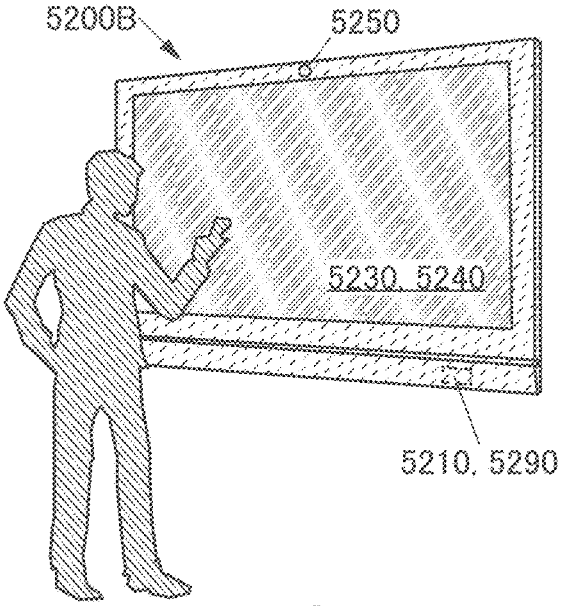
Figure 16D:
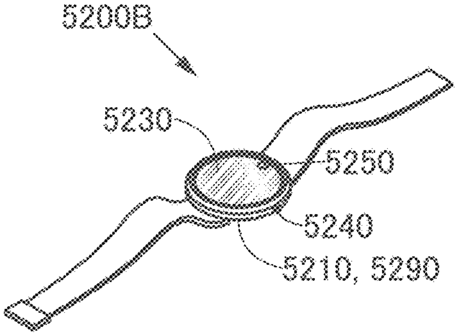
Figure 16E:
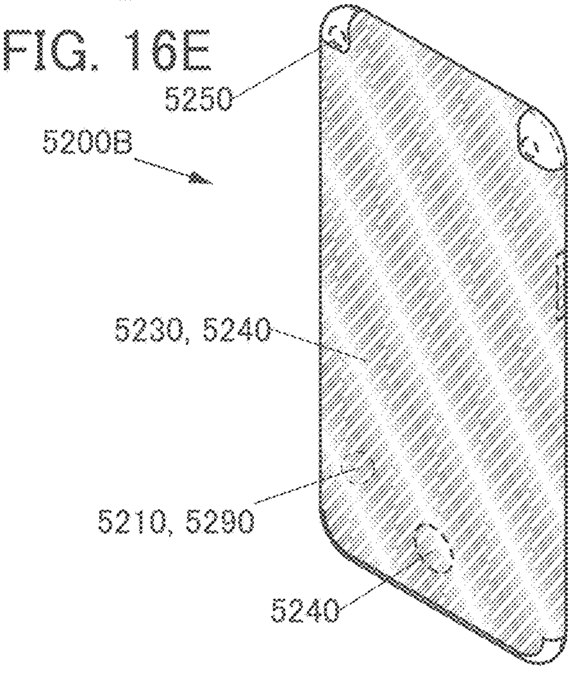
Figure 17A:
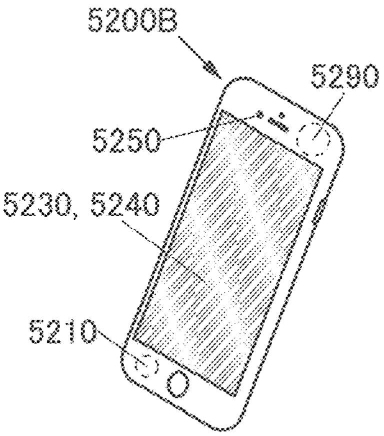
FIGS. 17A to 17E illustrate electronic devices of an embodiment.
Figure 17B:
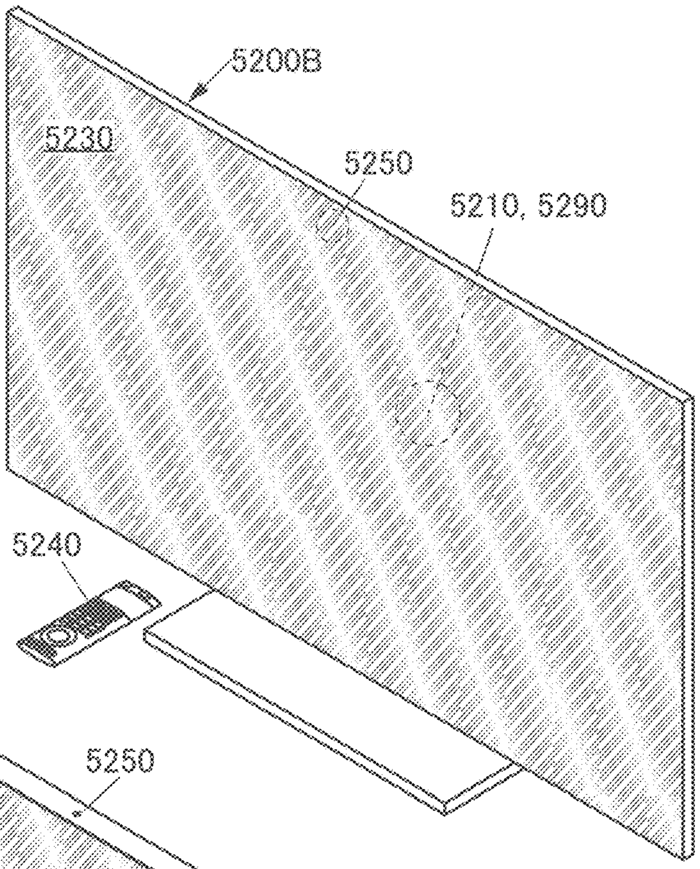
Figure 17C:
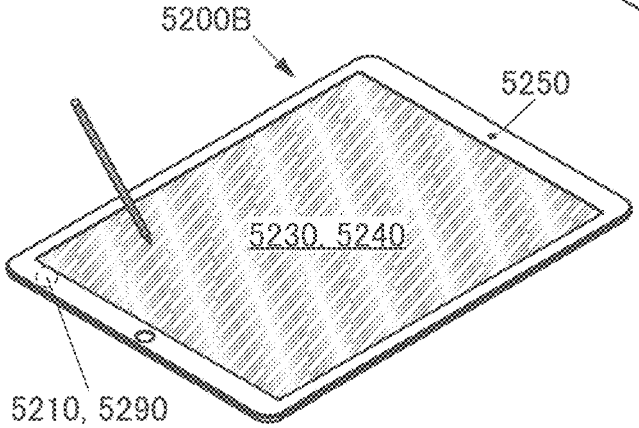
Figure 17D:
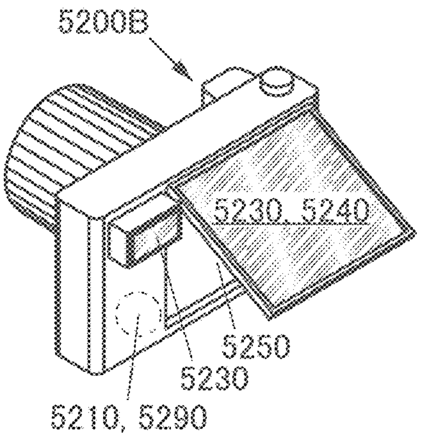
Figure 17E:
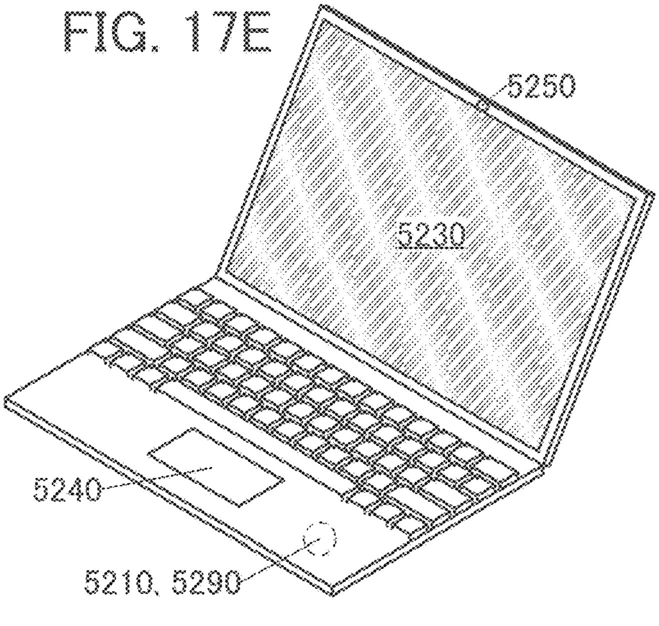
Figure 18A:
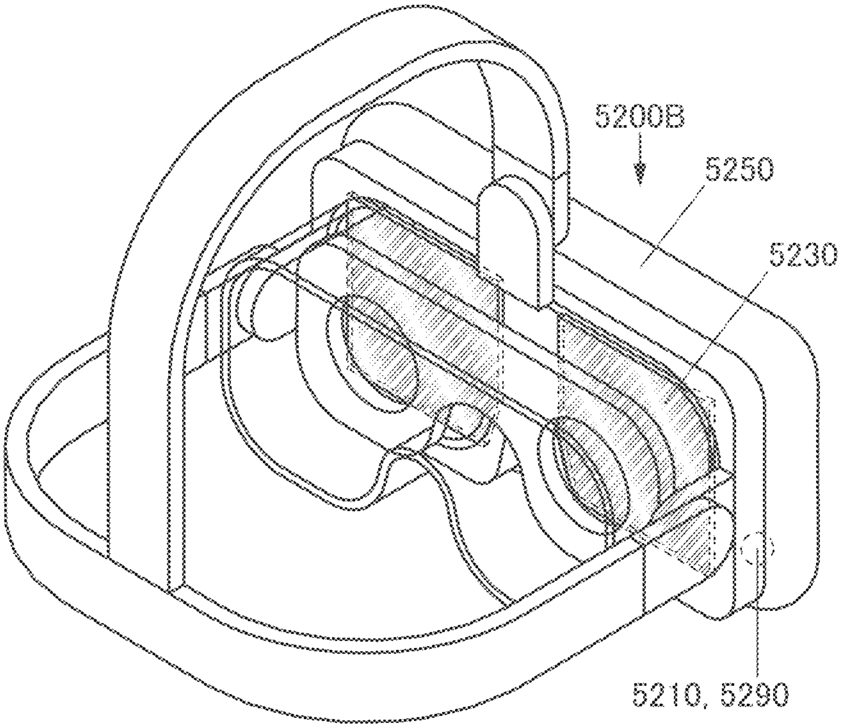
FIGS. 18A and 18B illustrate electronic devices of an embodiment.
Figure 18B:
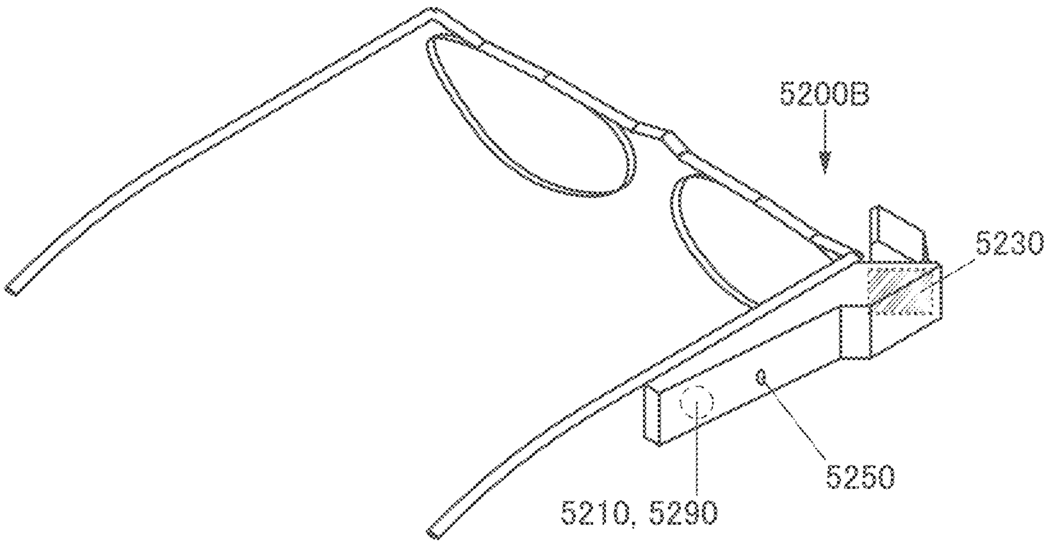

FIGS. 16A to 16E, FIGS. 17A to 17E, and FIGS. 18A and 18B each illustrate a structure of the electronic device of one embodiment of the present invention. FIG. 16A is a block diagram of the electronic device and FIGS. 16B to 16E are perspective views illustrating structures of the electronic device. FIGS. 17A to 17E are perspective views illustrating structures of the electronic device. FIGS. 18A and 18B are perspective views illustrating structures of the electronic device.

An electronic device 5200B described in this embodiment includes an arithmetic device 5210 and an input/output device 5220 (see FIG. 16A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the electronic device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in Embodiment 4 can be used for the display unit 5230.

The sensor unit 5250 has a function of supplying sensing data. For example, the sensor unit 5250 has a function of sensing a surrounding environment where the electronic device is used and supplying the sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, near field communication, or the like.

FIG. 16B illustrates an electronic device having an outer shape along a cylindrical column or the like. An example of such an electronic device is digital signage. The display panel of one embodiment of the present invention can be used for the display unit 5230. The electronic device may have a function of changing its display method in accordance with the illuminance of a usage environment. The electronic device has a function of changing the displayed content when sensing the existence of a person. Thus, for example, the electronic device can be provided on a column of a building. The electronic device can display advertising, guidance, or the like. The electronic device can be used for digital signage or the like.

FIG. 16C illustrates an electronic device having a function of generating image data on the basis of the path of a pointer used by the user. Examples of such an electronic device include an electronic blackboard, an electronic bulletin board, and digital signage. Specifically, a display panel with a diagonal size of 20 inches or longer, preferably 40 inches or longer, further preferably 55 inches or longer can be used. A plurality of display panels can be arranged and used as one display region. Alternatively, a plurality of display panels can be arranged and used as a multiscreen.

FIG. 16D illustrates an electronic device that is capable of receiving data from another device and displaying the data on the display unit 5230. An example of such an electronic device is a wearable electronic device. Specifically, the electronic device can display several options, and the user can choose some from the options and send a reply to the data transmitter. As another example, the electronic device has a function of changing its display method in accordance with the illuminance of a usage environment. Thus, for example, power consumption of the wearable electronic device can be reduced. As another example, the wearable electronic device can display an image so as to be suitably used even in an environment under strong external light, e.g., outdoors in fine weather.

FIG. 16E illustrates an electronic device including the display unit 5230 having a surface gently curved along a side surface of a housing. An example of such an electronic device is a mobile phone. The display unit 5230 includes a display panel that has a function of displaying images on the front surface, the side surfaces, the top surface, and the rear surface, for example. Thus, a mobile phone can display data on not only its front surface but also its side surfaces, top surface, and rear surface, for example.

FIG. 17A illustrates an electronic device that is capable of receiving data via the Internet and displaying the data on the display unit 5230. An example of such an electronic device is a smartphone. For example, the user can check a created message on the display unit 5230 and send the created message to another device. As another example, the electronic device has a function of changing its display method in accordance with the illuminance of a usage environment. Thus, power consumption of the smartphone can be reduced. As another example, it is possible to obtain a smartphone which can display an image such that the smartphone can be suitably used in an environment under strong external light, e.g., outdoors in fine weather.

FIG. 17B illustrates an electronic device that can use a remote controller as the input unit 5240. An example of such an electronic device is a television system. For example, data received from a broadcast station or via the Internet can be displayed on the display unit 5230. The electronic device can take an image of the user with the sensor unit 5250 and transmit the image of the user. The electronic device can acquire a viewing history of the user and provide it to a cloud service. The electronic device can acquire recommendation data from a cloud service and display the data on the display unit 5230. A program or a moving image can be displayed on the basis of the recommendation data. As another example, the electronic device has a function of changing its display method in accordance with the illuminance of a usage environment. Accordingly, it is possible to obtain a television system which can display an image such that the television system can be suitably used even when irradiated with strong external light that enters the room from the outside in fine weather.

FIG. 17C illustrates an electronic device that is capable of receiving educational materials via the Internet and displaying them on the display unit 5230. An example of such an electronic device is a tablet computer. The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, an image signal can be received from another electronic device and displayed on the display unit 5230. When the electronic device is placed on a stand or the like, the display unit 5230 can be used as a sub-display. Thus, for example, it is possible to obtain a tablet computer which can display an image such that the tablet computer is suitably used even in an environment under strong external light, e.g., outdoors in fine weather.

FIG. 17D illustrates an electronic device including a plurality of display units 5230. An example of such an electronic device is a digital camera. For example, the display unit 5230 can display an image that the sensor unit 5250 is capturing. A captured image can be displayed on the sensor unit. A captured image can be decorated using the input unit 5240. A message can be attached to a captured image. A captured image can be transmitted via the Internet. The electronic device has a function of changing shooting conditions in accordance with the illuminance of a usage environment. Accordingly, for example, it is possible to obtain a digital camera that can display a subject such that an image is suitably viewed even in an environment under strong external light, e.g., outdoors in fine weather.

FIG. 17E illustrates an electronic device in which the electronic device of this embodiment is used as a master to control another electronic device used as a slave. An example of such an electronic device is a portable personal computer. For example, part of image data can be displayed on the display unit 5230 and another part of the image data can be displayed on a display unit of another electronic device. Image signals can be supplied. Data written from an input unit of another electronic device can be obtained with the communication unit 5290. Thus, a large display region can be utilized in the case of using a portable personal computer, for example.

FIG. 18A illustrates an electronic device including the sensor unit 5250 that senses an acceleration or a direction. An example of such an electronic device is a goggles-type electronic device. The sensor unit 5250 can supply data on the position of the user or the direction in which the user faces. The electronic device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on the goggles-type electronic device, for example.

FIG. 18B illustrates an electronic device including an imaging device and the sensor unit 5250 that senses an acceleration or a direction. An example of such an electronic device is a glasses-type electronic device. The sensor unit 5250 can supply data on the position of the user or the direction in which the user faces. The electronic device can generate image data in accordance with the position of the user or the direction in which the user faces. Accordingly, the data can be shown together with a real-world scene, for example. Alternatively, an augmented reality image can be displayed on the glasses-type electronic device.

Note that this embodiment can be combined with any of the other embodiments in this specification as appropriate.

Example 1

This example describes measurement results of the characteristics of fabricated photoelectric conversion devices (devices 1 to 4).

Structural formulae of organic compounds used for the devices 1 to 4 are shown below.

[Chemical Formula 67]

(i)

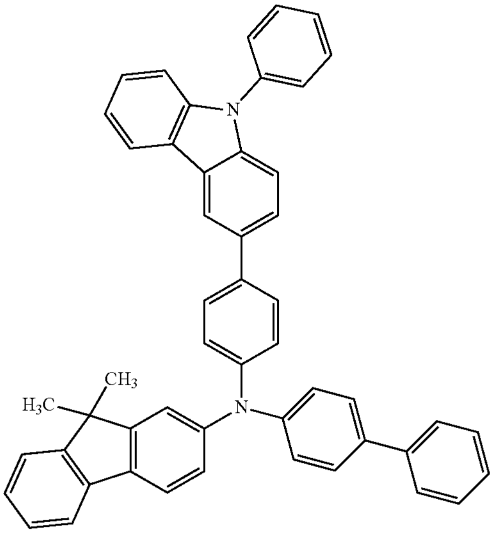

PCBBiF

-continued (ii)

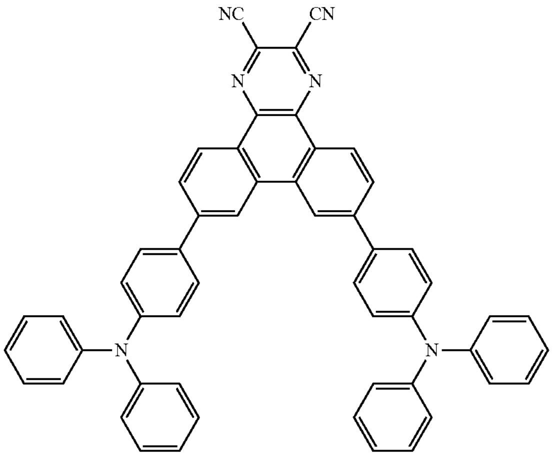

TPA-DCPP (iii)

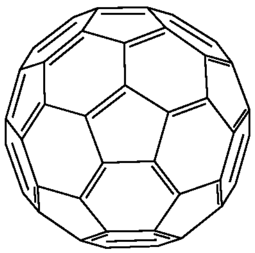

C60

(iv)

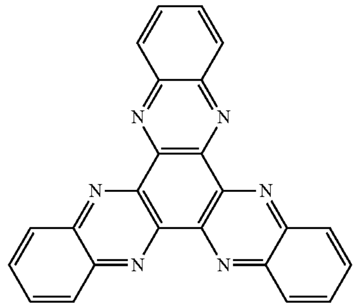

HATNA (v)

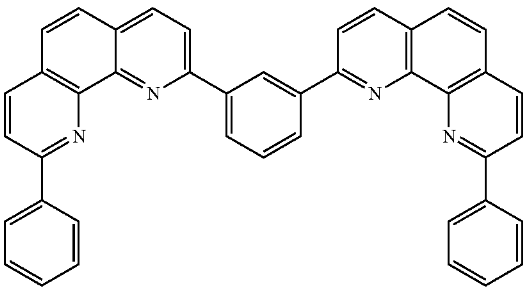

mPPhen2P

-continued (vi)

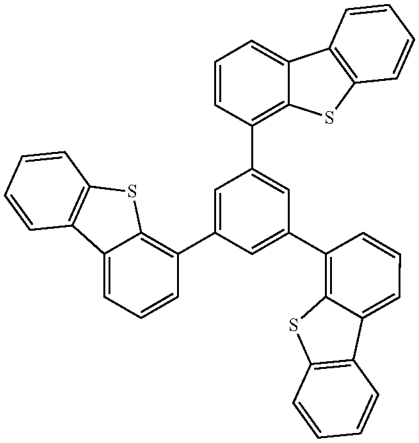

DBT3P-II (Method for Fabricating Device 1)

Figure 19A:
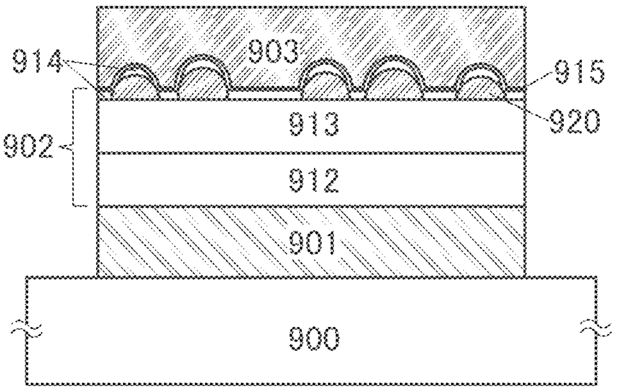
FIGS. 19A and 19B illustrate structures of devices 1 to 8.

The device 1 has a structure in which a hole-transport layer 912, an active layer 913, a structure body 920, an electron-transport layer 914, and an electron-injection layer 915 are sequentially stacked over a first electrode 901 formed over a glass substrate 900, and a second electrode 903 is stacked over the electron-injection layer 915, as illustrated in FIG. 19A.

First, a reflective film was formed over the glass substrate 900. Specifically, the reflective film was formed to a thickness of 100 nm by a sputtering method using an alloy containing silver (Ag), palladium (Pd), and copper (Cu) (abbreviation: APC) as a target. After that, indium oxide-tin oxide containing silicon or silicon oxide (abbreviation: ITSO) was deposited by a sputtering method, whereby the first electrode 901 was formed. The thickness of the first electrode 901 was 100 nm and the electrode area was 4 $mm^2$ (2 mm×2 mm).

Next, in pretreatment for forming the device over the substrate, a surface of the substrate was washed with water and baking was performed at 200° C. for 1 hour. Then, the substrate was transferred into a vacuum evaporation apparatus where the pressure was reduced to approximately $10^{-4}$ Pa, and vacuum baking was performed at 180° C. for 60 minutes in a heating chamber of the vacuum evaporation apparatus. After that, natural cooling was performed to 30° C. or lower.

Then, the substrate provided with the first electrode 901 was fixed to a substrate holder provided in the vacuum evaporation apparatus such that the surface on which the first electrode 901 was formed faced downward. Over the first electrode 901, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) above was deposited to a thickness of 40 nm by an evaporation method using resistance heating, whereby the hole-transport layer 912 was formed.

Next, over the hole-transport layer 912, 4,4'-(2,3-dicyanodibenzo[f,h]quinoxaline-7,10-diyl)bis(triphenylamine) (abbreviation: TPA-DCPP) represented by Structural Formula (ii) above and C60 fullerene represented by Structural Formula (iii) above were deposited by co-evaporation to a thickness of 60 nm so that a weight ratio can be 0.8:0.2 (=TPA-DCPP: C60), whereby the active layer 913 was formed.

Then, over the active layer 913, diquinoxalino[l2,3-a:2',3'-c]phenazine (abbreviation: HATNA) represented by Structural Formula (iv) above was deposited by evaporation to a thickness corresponding to 15 nm, whereby the structure body 920 was formed.

Next, over the structure body 920, 2,2'-(1,3-phenylene) bis(9-phenyl-1,10-phenanthroline) (abbreviation: mPPhen2P) represented by Structural Formula (v) above was deposited by evaporation to a thickness of 20 nm, whereby the electron-transport layer 914 was formed.

Then, over the electron-transport layer 914, lithium fluoride (LiF) and ytterbium (Yb) were deposited by co-evaporation to a thickness of 1.5 nm so that a volume ratio can be 1:0.5, whereby the electron-injection layer 915 was formed.

Next, over the electron-injection layer 915, Ag and Mg were deposited by co-evaporation to a thickness of 15 nm so that a volume ratio can be Ag:Mg=1:0.1, whereby the second electrode 903 was formed. Lastly, as a cap layer, 4,4',4"-(benzene-1,3,5-triyl)tri(dibenzothiophene) (abbreviation: DBT3P-II) represented by Structural Formula (vi) above was deposited by evaporation to a thickness of 80 nm, whereby the device 1 was fabricated. Note that the second electrode 903 is a semi-transmissive and semi-reflective electrode having functions of transmitting light and reflecting light.

Next, methods for fabricating the devices 2 to 4 will be described.

(Method for Fabricating Device 2)

The device 2 was fabricated in a manner similar to that of the device 1 except that the structure body 920 in the device 1 was not formed.

(Method for Fabricating Device 3)

The device 3 was fabricated in a manner similar to that of the device 1 except that the electron-transport layer 914 in the device 1 was not formed.

(Method for Fabricating Device 4)

The device 4 was fabricated in a manner similar to that of the device 1 except that the structure body 920 and the electron-transport layer 914 in the device 1 were not formed.

The element structures of the devices 1 to 4 are listed in the following table.

TABLE 1

| | Film thickness (nm) | Device 1 | Device 2 | Device 3 | Device 4 |
|---|---|---|---|---|---|
| Cap layer | 80 | DBT3P-II | | | |
| Second electrode | 15 | Ag:Mg (3:0.3) | | | |
| Electron-injection layer | 1.5 | LiF:Yb (1:0.5) | | | |
| Electron-transport layer | 20 | mPPhen2P | | — | — |
| Structure body | — | HATNA 15 nm | — | HATNA 20 nm | — |

TABLE 1-continued

| | Film thickness (nm) | Device 1 | Device 2 | Device 3 | Device 4 |
|---|---|---|---|---|---|
| Active layer | 60 | TPA-DCPP:C60 (0.8:0.2) | | | |
| Hole-transport layer | 50 | PCBBiF | | | |
| First electrode | 100 | NITO | | | |
| Reflective electrode | 100 | APC | | | |

Furthermore, the LUMO levels of the materials used for the active layers, the structure bodies, and the electron-transport layers of the devices 1 to 4 are listed in the following table. The LUMO levels were obtained by cyclic voltammetry (CV) measurement. An electrochemical analyzer (ALS model 600A or 600C, produced by BAS Inc.) was used for the measurement. According to the table, the devices 1 to 4 are each a photoelectric conversion device having a large difference between the LUMO level of the acceptor material of the active layer and the LUMO level of the material of the electron-transport layer.

TABLE 2

| | LUMO level |
|---|---|
| C60 | −4.25 eV |
| HATNA | −3.50 eV |
| mPPhen2P | −2.71 eV |

Figure 20:
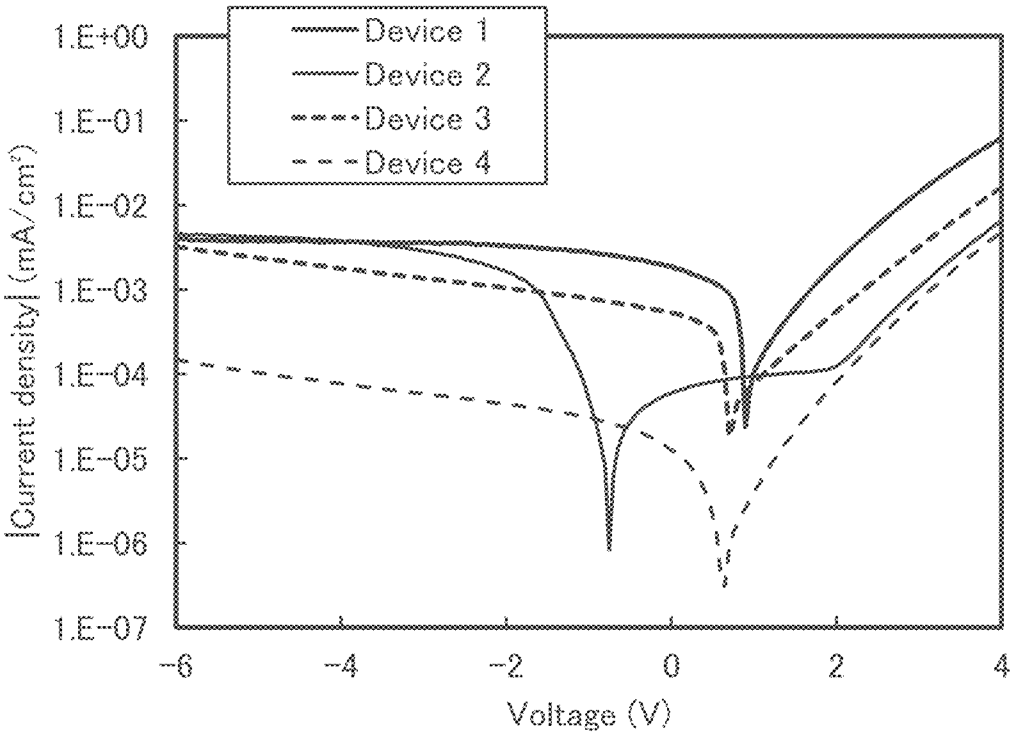
FIG. 20 shows voltage-current density characteristics of the devices 1 to 4 in the state of being irradiated with light.
Figure 21:
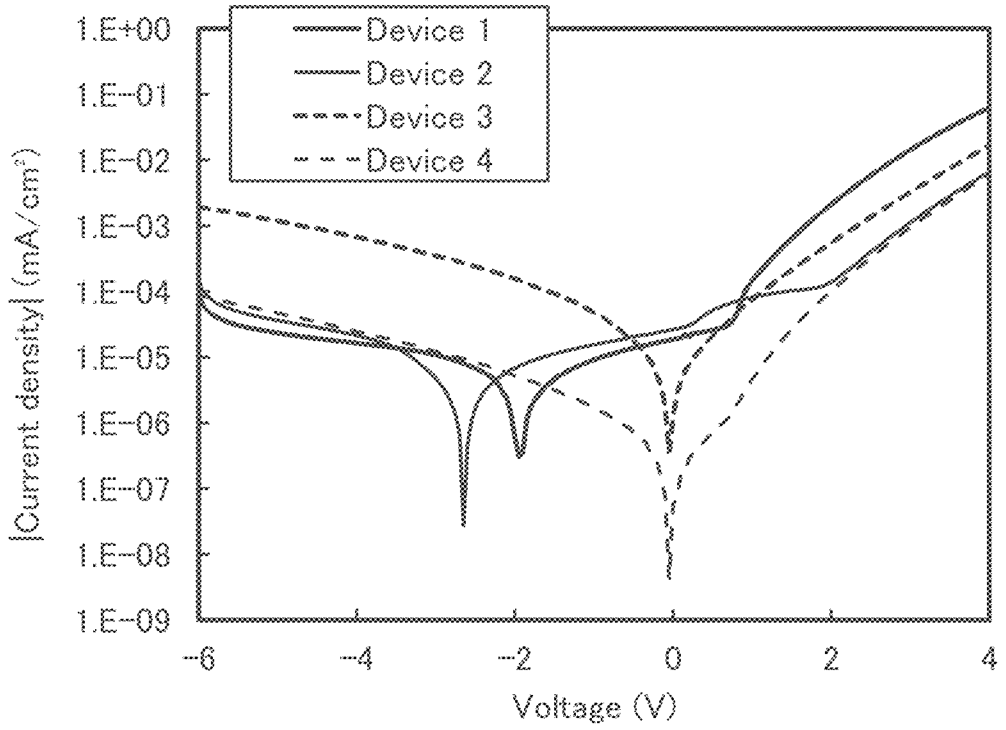
FIG. 21 shows voltage-current density characteristics of the devices 1 to 4 in a dark state.

Next, the measurement results of current density-voltage characteristics of the devices 1 to 4 fabricated by the above fabrication methods are shown in FIG. 20 and FIG. 21. The measurement was performed under each of the following conditions: in a state where irradiation with monochromatic light having a wavelength λ of 550 nm is performed at an irradiance of 12.5 $\mu W/cm^2$ (FIG. 20) and in a dark state (FIG. 21).

It is found that in the device 2 having a conventional structure in which the structure body 920 was not formed and the electron-transport layer 914 was provided, the driving voltage was significantly increased. Furthermore, it is found that in the device 4 in which neither the structure body 920 nor the electron-transport layer 914 was not formed, the current density was significantly decreased, and characteristics as a photoelectric conversion device were significantly decreased.

Meanwhile, favorable results in both the driving voltage and the current density were shown in the devices 1 and 3 each provided with the structure body 920 over the active layer 913. In the device 1 in which both the structure body 920 and the electron-transport layer 914 were formed, the active layer 913 was not in direct contact with the electrode (electron-injection layer), and thus a decrease in the current density was able to be inhibited and extremely favorable characteristics were shown.

Example 2

This example describes measurement results of the characteristics of fabricated photoelectric conversion devices (devices 10 to 13).

Structural formulae of organic compounds used for the devices 10 to 13 are shown below.

[Chemical Formula 68]

(i)

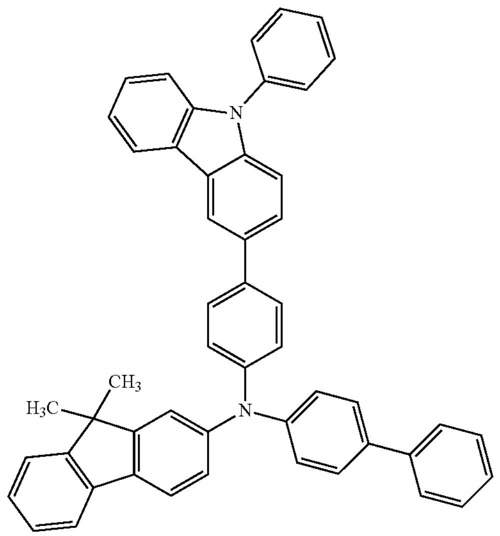

PCBBiF (ii)

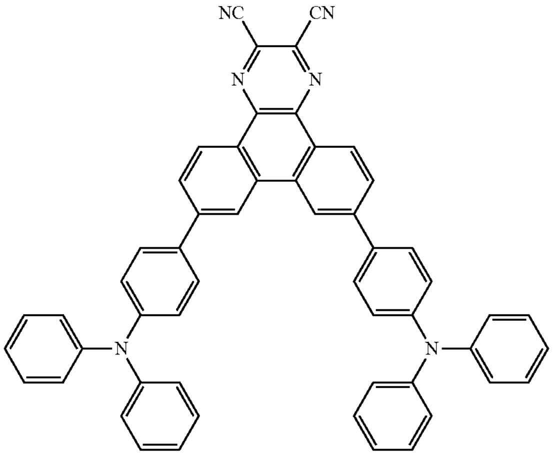

TPA-DCPP (iii)

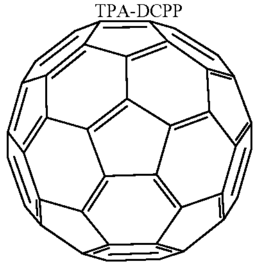

C60

-continued (vii)

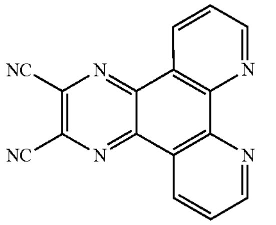

PPDN (v)

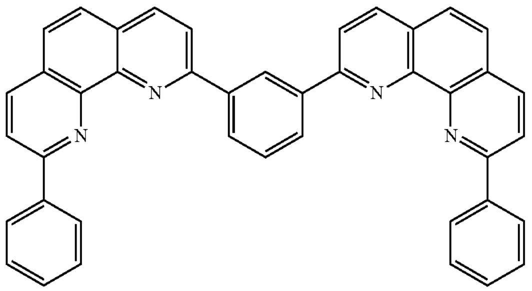

mPPhen2P (vi)

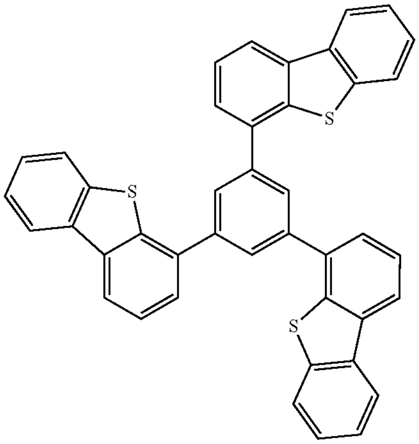

DBT3P-II (Method for Fabricating Devices 10A to 10D)

The device 10 has a structure in which the hole-transport layer 912, the active layer 913, the structure body 920, the electron-transport layer 914, and the electron-injection layer 915 are sequentially stacked over the first electrode 901 formed over the glass substrate 900, and the second electrode 903 is stacked over the electron-injection layer 915, as illustrated in FIG. 19A.

First, a reflective film was formed over the glass substrate 900. Specifically, the reflective film was formed to a thickness of 100 nm by a sputtering method using an alloy containing silver (Ag), palladium (Pd), and copper (Cu) (abbreviation: APC) as a target. After that, indium oxide-tin oxide containing silicon or silicon oxide (abbreviation: ITSO) was deposited by a sputtering method, whereby the first electrode 901 was formed. The thickness of the first electrode 901 was 100 nm and the electrode area was 4 $mm^2$ (2 mm×2 mm).

Next, in pretreatment for forming the device over the substrate, a surface of the substrate was washed with water and baking was performed at 200° C. for 1 hour. Then, the substrate was transferred into a vacuum evaporation apparatus where the pressure was reduced to approximately $10^{-4}$ Pa, and vacuum baking was performed at 180° C. for 60 minutes in a heating chamber of the vacuum evaporation apparatus. After that, natural cooling was performed to 30° C. or lower.

Then, the substrate provided with the first electrode 901 was fixed to a substrate holder provided in the vacuum evaporation apparatus such that the surface on which the first electrode 901 was formed faced downward. Over the first electrode 901, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) was deposited to a thickness of 40 nm by an evaporation method using resistance heating, whereby the hole-transport layer 912 was formed.

Next, over the hole-transport layer 912, 4,4'-(2,3-dicyanodibenzo[f,h]quinoxaline-7,10-diyl)bis(triphenylamine) (abbreviation: TPA-DCPP) represented by Structural Formula (ii) above and C60 fullerene represented by Structural Formula (iii) above were deposited by co-evaporation to a thickness of 60 nm so that a weight ratio can be 0.8:0.2 (=TPA-DCPP: C60), whereby the active layer 913 was formed.

Next, over the active layer 913, pyrazino[2,3-f][1,10]phenanthroline-2,3-dicarbonitrile (abbreviation: PPDN) represented by Structural Formula (vii) was deposited by evaporation to a thickness corresponding to 1 nm, whereby the structure body 920 was formed.

Next, over the structure body 920, 2,2'-(1,3-phenylene)bis(9-phenyl-1,10-phenanthroline) (abbreviation: mPPhen2P) represented by Structural Formula (v) above was deposited by evaporation to thicknesses of 10 nm, 20 nm, 30 nm, and 40 nm in the devices 10A, 10B, 10C, and 10D, respectively; whereby the electron-transport layer 914 was formed.

Then, over the electron-transport layer 914, lithium fluoride (LiF) and ytterbium (Yb) were deposited by co-evaporation to a thickness of 1.5 nm so that a volume ratio can be 1:0.5, whereby the electron-injection layer 915 was formed.

Next, over the electron-injection layer 915, Ag and Mg were deposited by co-evaporation to a thickness of 15 nm so that a volume ratio can be Ag:Mg=1:0.1, whereby the second electrode 903 was formed. Lastly, as a cap layer, 4,4',4"-(benzene-1,3,5-triyl)tri(dibenzothiophene) (abbreviation: DBT3P-II) represented by Structural Formula (vi) above was deposited by evaporation to a thickness of 80 nm, whereby the devices 10A to 10D were each fabricated. Note that the second electrode 903 is a semi-transmissive and semi-reflective electrode having functions of transmitting light and reflecting light.

Next, methods for fabricating the devices 11A to 11D, devices 12A to 12D, and devices 13A to 13D are described.

(Method for Fabricating Devices 11A to 11D)

The devices 11A to 11D were each fabricated in a manner similar to that of the devices 10A to 10D except that the structure bodies 920 in the devices 10A to 10D were each formed to have a thickness corresponding to 5 nm.

(Method for Fabricating Devices 12A to 12D)

The devices 12A to 12D were each fabricated in a manner similar to that of the devices 10A to 10D except that the structure bodies 920 in the devices 10A to 10D were each formed to have a thickness corresponding to 15 nm.

(Method for Fabricating Devices 13A to 13D)

The devices 13A to 13D were each fabricated in a manner similar to that of the devices 10A to 10D except that the structure bodies 920 in the devices 10A to 10D were not formed.

The element structures of the devices 10A to 10D, the devices 11A to 11D, the devices 12A to 12D, and the devices 13A to 13D are listed in the following table.

TABLE 3

| | Film thickness (nm) | Device 10 | Device 11 | Device 12 | Device 13 |
|---|---|---|---|---|---|
| Cap layer | 80 | DBT3P-II | | | |
| Second electrode | 15 | Ag:Mg (3:0.3) | | | |
| Electron-injection layer | 1.5 | LiF:Yb (1:0.5) | | | |
| Electron-transport layer | *1 | mPPhen2P | | | |
| Structure body | — | PPDN | | | |
| | | 1 nm | 5 nm | 15 nm | 0 nm |
| Active layer | 60 | TPA-DCPP:C60 (0.8:0.2) | | | |
| Hole-transport layer | 50 | PCBBiF | | | |
| First electrode | 100 | NITO | | | |
| Reflective electrode | 100 | APC | | | |

*1 A 10 nm, B 20 nm, C 30 nm, D 40 nm

Furthermore, the LUMO levels of the materials used for the active layers, the structure bodies, and the electron-transport layers of the devices 10A to 10D, the devices 11A to 11D, the devices 12A to 12D, and the devices 13A to 13D are listed in the following table. The LUMO levels were obtained by cyclic voltammetry (CV) measurement. An electrochemical analyzer (ALS model 600A or 600C, produced by BAS Inc.) was used for the measurement. According to the table, the devices 10A to 10D, the devices 11A to 11D, the devices 12A to 12D, and the devices 13A to 13D are each a photoelectric conversion device having a large difference between the LUMO level of the acceptor material of the active layer and the LUMO level of the material of the electron-transport layer.

TABLE 4

| | LUMO level |
|---|---|
| C60 | −4.25 eV |
| PPDN | −3.83 eV |
| mPPhen2P | −2.71 eV |

Next, the measurement results of current density-voltage characteristics of the devices 10A to 10D, the devices 11A to 11D, the devices 12A to 12D, and the devices 13A to 13D fabricated by the above fabrication methods are shown in FIGS. 22A to 22D. The measurement was performed in a state where irradiation with monochromatic light having a wavelength λ of 550 nm was performed at an irradiance of 12.5 $\mu W/cm^2$. Note that FIG. 22A shows the results of the devices 10A, 11A, 12A, and 13A each of which includes the electron-transport layer 914 having a thickness of 10 nm; FIG. 22B shows the results of the devices 10B, 11B, 12B, and 13B each of which includes the electron-transport layer 914 having a thickness of 20 nm; FIG. 22C shows the results of the devices 10C, 11C, 12C, and 13C each of which includes the electron-transport layer 914 having a thickness of 30 nm; and FIG. 22D shows the results of the devices 10D, 11D, 12D, and 13D each of which includes the electron-transport layer 914 having a thickness of 40 nm.

It is found from FIGS. 22B to 22D that although the driving voltage of each of the devices 13B to 13D in which the structure body 920 was not formed is increased as the thickness of the electron-transport layer 914 becomes large, an increase in the driving voltage is inhibited by the provision of the structure body 920. Meanwhile, in FIG. 22A showing the results of the case of the electron-transport layer 914 having a thickness of 10 nm, the characteristics do not vary depending on whether the structure body 920 is included or not. This indicates that electrons flow by the tunnel effect that is due to the small thickness of the electron-transport layer 914.

From the above, it was found that when the structure body 920 is formed to make the electron-transport layer 914 thinner to a thickness of approximately less than or equal to 10 nm or make the electron-transport layer 914 disconnected, whereby a photoelectric conversion device having favorable characteristics is obtained even when the photoelectric conversion device shares a carrier-transport layer with a light-emitting device.

Figure 23:
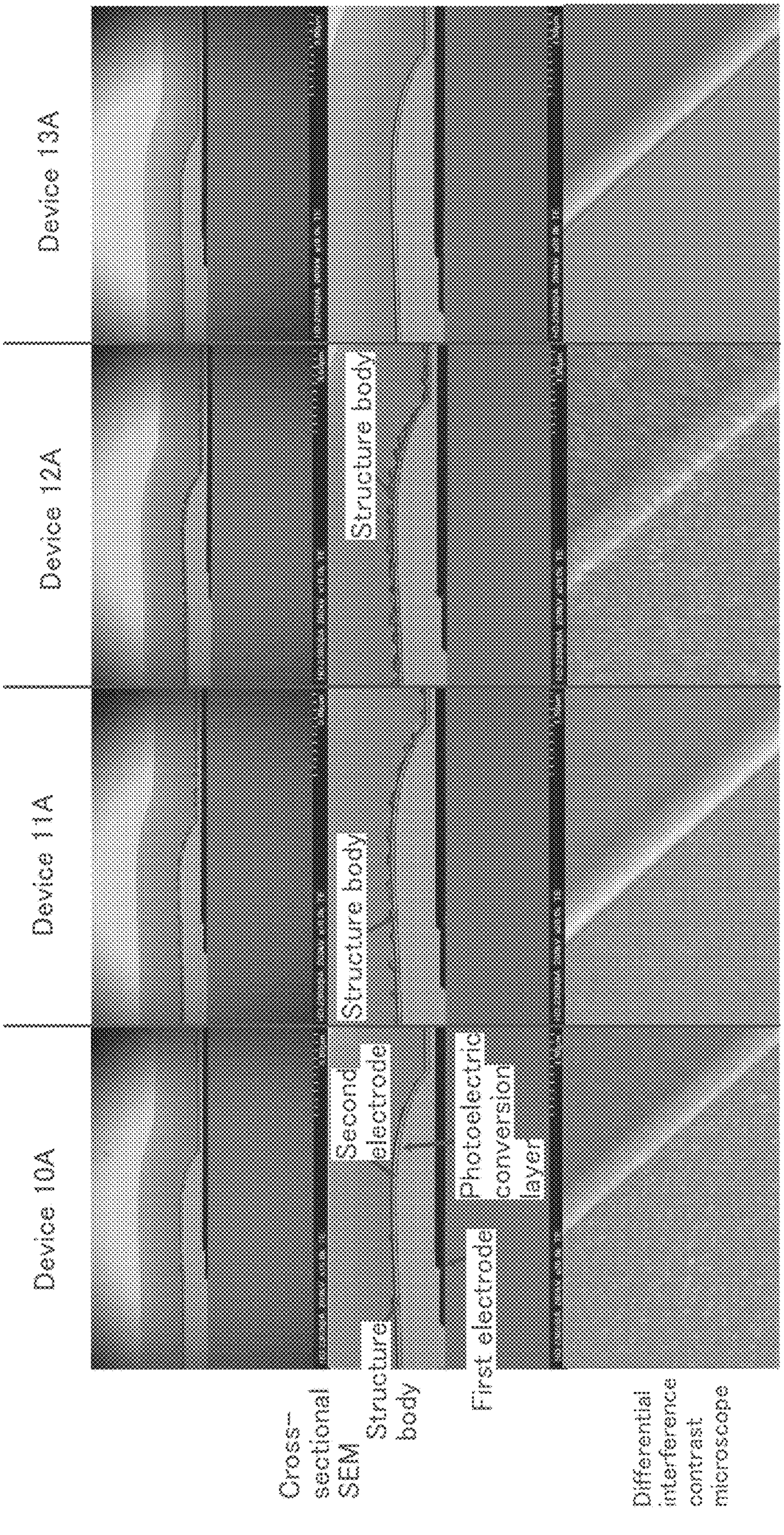
FIG. 23 shows cross-sectional SEM images and differential interference contrast micrographs of devices 10A to 13A.

Next, FIG. 23 shows cross-sectional scanning electron microscope (SEM) images and differential interference contrast micrographs of the devices 10A, 11A, and 12A.

Accordingly, it was found that in the devices 10A, 11A, and 12A in which the structure bodies were formed of PPDN, projections each having a size of approximately 100 nm to 200 nm were formed, and the number of the structure bodies, not the size of each projection, was increased as the deposition amount was increased. Furthermore, it was observed that the upper portions of the structure bodies were covered with the second electrodes. Meanwhile, it was found that in the device 13A in which the structure body was not formed, such projections were not formed.

Example 3

This example describes measurement results of the characteristics of fabricated photoelectric conversion devices (devices 20 to 22).

Structural formulae of organic compounds used for the devices 20 to 22 are shown below.

[Chemical Formula 69]
(viii)
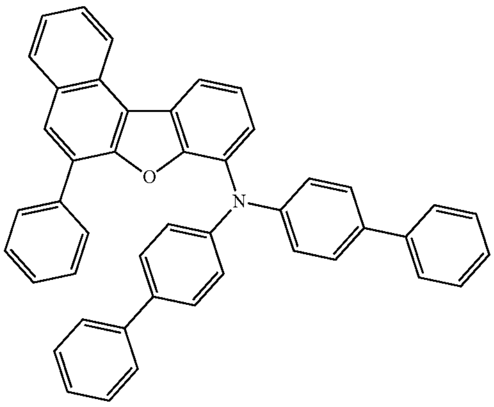
BBABnf
(ix)
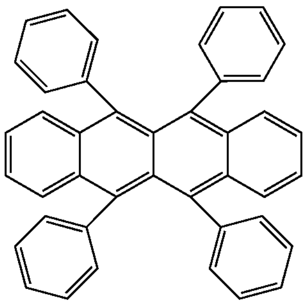
Rubrene
(vii)
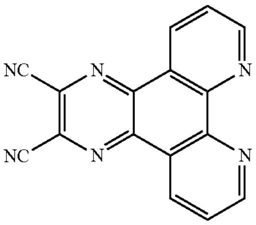
PPDN
(x)
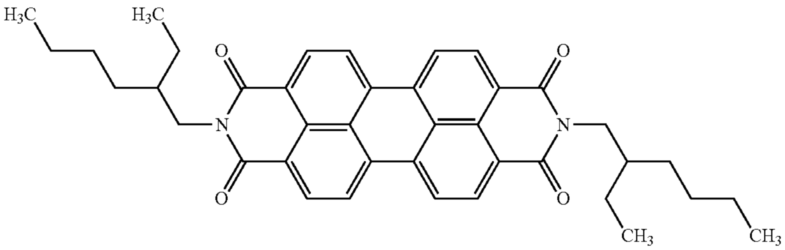
EtHex-PTCDI
(xi)
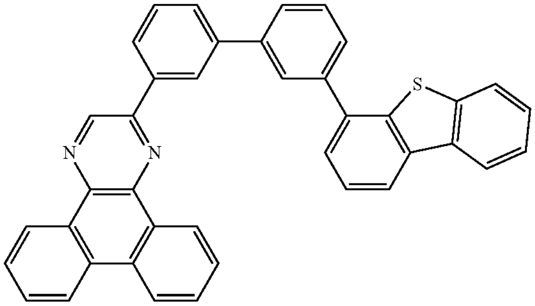
2mDBTBPDBq-II
(xii)
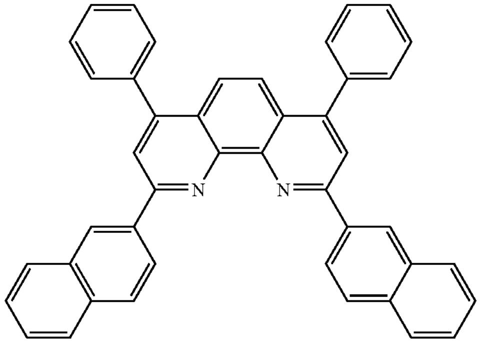
NBPhen -continued (iv)

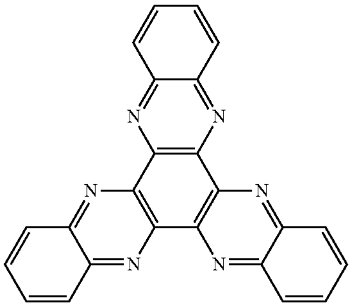

HATNA (vi)

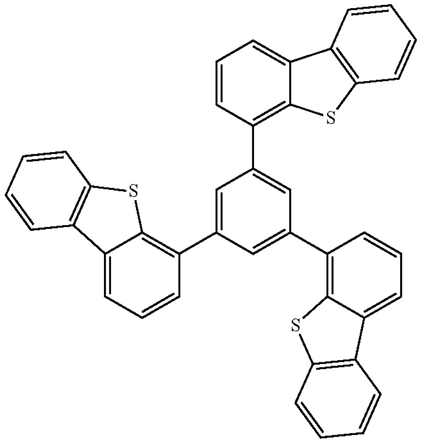

DBT3P-II (Method for Fabricating Device 20)

Figure 19B:
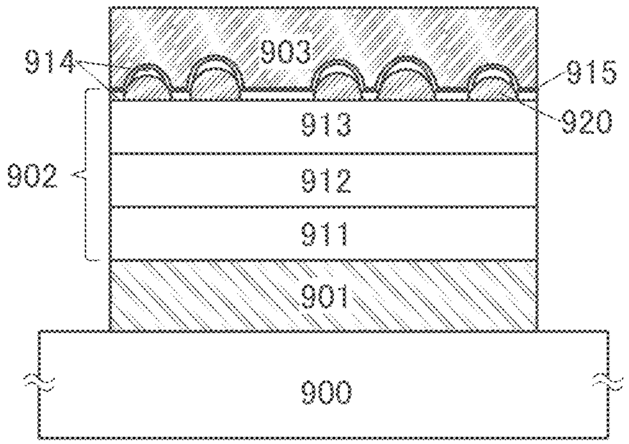

The device 20 has a structure in which a hole-injection layer 911, the hole-transport layer 912, the active layer 913, the structure body 920, the electron-transport layer 914, and the electron-injection layer 915 are sequentially stacked over the first electrode 901 formed over the glass substrate 900, and the second electrode 903 is stacked over the electron-injection layer 915, as illustrated in FIG. 19B.

First, a reflective film was formed over the glass substrate 900. Specifically, the reflective film was formed to a thickness of 100 nm by a sputtering method using an alloy containing silver (Ag), palladium (Pd), and copper (Cu) (abbreviation: APC) as a target. After that, indium oxide-tin oxide containing silicon or silicon oxide (abbreviation: ITSO) was deposited by a sputtering method, whereby the first electrode 901 was formed. The thickness of the first electrode 901 was 100 nm and the electrode area was 4 $mm^2$ (2 mm×2 mm).

Next, in pretreatment for forming the device over the substrate, a surface of the substrate was washed with water and baking was performed at 200° C. for 1 hour. Then, the substrate was transferred into a vacuum evaporation apparatus where the pressure was reduced to approximately $10^4$ Pa, and vacuum baking was performed at 180° C. for 60 minutes in a heating chamber of the vacuum evaporation apparatus. After that, natural cooling was performed to 30° C. or lower.

Next, the substrate provided with the first electrode 901 was fixed to a substrate holder provided in the vacuum evaporation apparatus such that the surface on which the first electrode 901 was formed faced downward. Then, N,N-bis(4-biphenyl)-6-phenylbenzo[b]naphtho[1,2-d]furan-8-amine (abbreviation: BBABnf) represented by Structural Formula (viii) above and an electron acceptor material (abbreviation: OCHD-003) containing fluorine and having a molecular weight of 672 were deposited on the first electrode 901 to a thickness of 11 nm by a co-evaporation method using resistance heating so that a weight ratio can be 1:0.1 (=BBABnf: OCHD-003), whereby the hole-injection layer 911 was formed.

After that, BBABnf was deposited by evaporation to a thickness of 40 nm to form the hole-transport layer 912.

Over the hole-transport layer 912, rubrene represented by Structural Formula (ix) above and N,N'-bis(2-ethylhexyl)-3,4,9,10-perylenetetracarboxylic diimide (abbreviation: EtHex-PTCDI) represented by Structural Formula (x) were deposited by co-evaporation to a thickness of 60 nm so that a weight ratio can be 0.5:0.5, whereby the active layer 913 was formed.

After that, pyrazino[2,3-f][1,10]phenanthroline-2,3-dicarbonitrile (abbreviation: PPDN) represented by Structural Formula (vii) was deposited by evaporation to a thickness corresponding to 15 nm over the active layer 913, whereby the structure body 920 was formed.

Then, over the structure body 920, 2-[3-(3'-dibenzothiophen-4-yl)biphenyl]dibenzo[f,h]quinoxaline (abbreviation: 2mDBTBPDBq-II) represented by Structural Formula (xi) above and 2,9-di(2-naphthyl)-4,7-diphenyl-1,10-phenanthroline (abbreviation: NBPhen) represented by Structural Formula (xii) above were sequentially deposited by evaporation to thicknesses of 20 nm and 20 nm, respectively; whereby the electron-transport layer 914 was formed.

Lithium fluoride (LiF) was deposited by evaporation to a thickness of 1 nm over the electron-transport layer 914, whereby the electron-injection layer 915 was formed.

Lastly, over the electron-injection layer 915, Ag and Mg were deposited by co-evaporation to a thickness of 10 nm so that a volume ratio can be Ag:Mg=3:0.3, whereby the second electrode 903 was formed; and as a cap layer, 4,4',4"-(benzene-1,3,5-triyl)tri(dibenzothiophene) (abbreviation: DBT3P-II) represented by Structural Formula (vi) above was deposited by evaporation to a thickness of 80 nm, whereby the device 20 was fabricated. Note that the second electrode 903 is a semi-transmissive and semi-reflective electrode having functions of transmitting light and reflecting light.

Next, methods for fabricating the devices 21 and 22 will be described.

(Method for Fabricating Device 21)

The device 21 was fabricated in a manner similar to that of the device 20 except that diquinoxalino[2,3-a:2',3'-c]phenazine (abbreviation: HATNA) represented by Structural Formula (iv) above was used instead of the material forming the structure body 920 in the device 20.

(Method for Fabricating Device 22)

The device 22 was fabricated in a manner similar to that of the device 20 except that the structure body 920 in the device 20 was formed by co-evaporation of PPDN and HATNA (1:1 in a weight ratio).

The element structures of devices 20 to 22 are listed in the following table.

TABLE 5

| | Film thickness (nm) | Device 20 | Device 21 | Device 22 |
|---|---|---|---|---|
| Cap layer | 80 | DBT3P-II | | |
| Second electrode | 10 | Ag:Mg (3:0.3) | | |
| Electron-injection layer | 1 | LiF | | |
| Electron-transport layer | 20 | NBPhen | | |
| | 20 | 2mDBTBPDBq-II | | |
| Structure body | 15 | PPDN | HATNA | PPDN:HATNA (1:1) |
| Active layer | 60 | Rubrene:EtHex-PTCDI (0.5:0.5) | | |
| Hole-transport layer | 40 | BBABnf | | |
| Hole-injection layer | 11 | BBABnf:OCHD-003 (1:0.1) | | |
| First electrode | 100 | NITO | | |
| Reflective electrode | 100 | APC | | |

Furthermore, the LUMO levels of the materials used for the active layers, the structure bodies, and the electron-transport layers of the devices 20 to 22 are listed in the following table. The LUMO levels were obtained by cyclic voltammetry (CV) measurement or photoelectron spectroscopy measurement. An electrochemical analyzer (ALS model 600A or 600C, produced by BAS Inc.) or a photoelectron spectrometer (AC-3 produced by Riken Keiki Co., Ltd.) was used for the measurement. According to the table, the devices 20 to 22 are each a photoelectric conversion device having a large difference between the LUMO level of the acceptor material of the active layer and the LUMO level of the material of the electron-transport layer.

TABLE 6

| | LUMO level |
|---|---|
| EtHex-PTCDI | −4.08 eV |
| HATNA | −3.50 eV |
| mPPhen2P | −2.71 eV |

Figure 24:
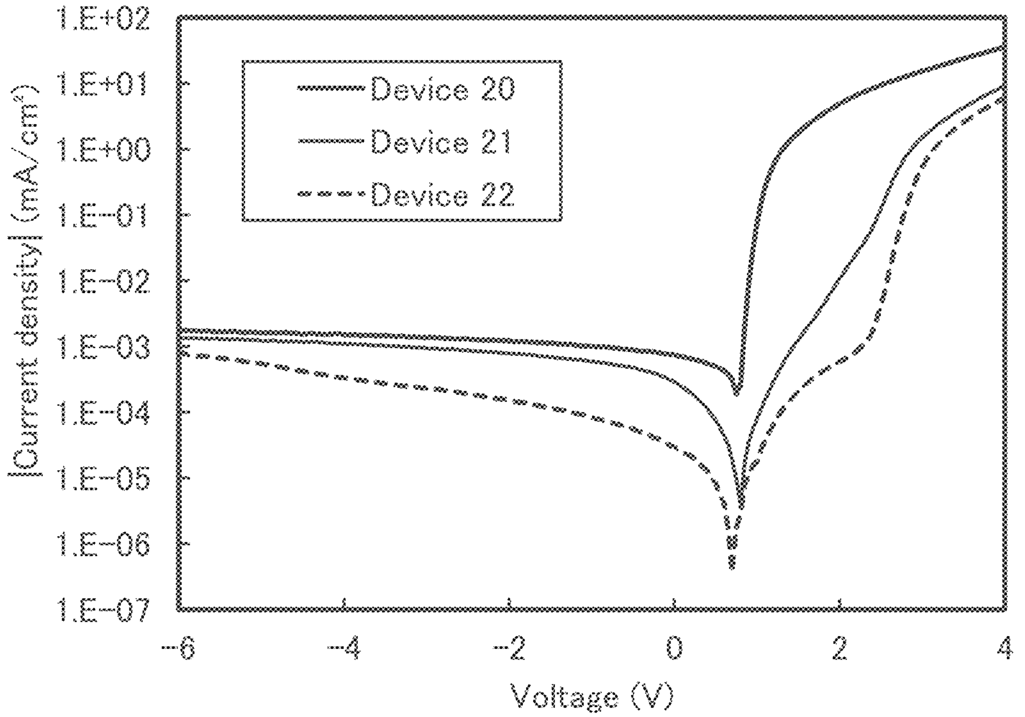
FIG. 24 shows voltage-current density characteristics of devices 20 to 22 in the state of being irradiated with light.
Figure 25:
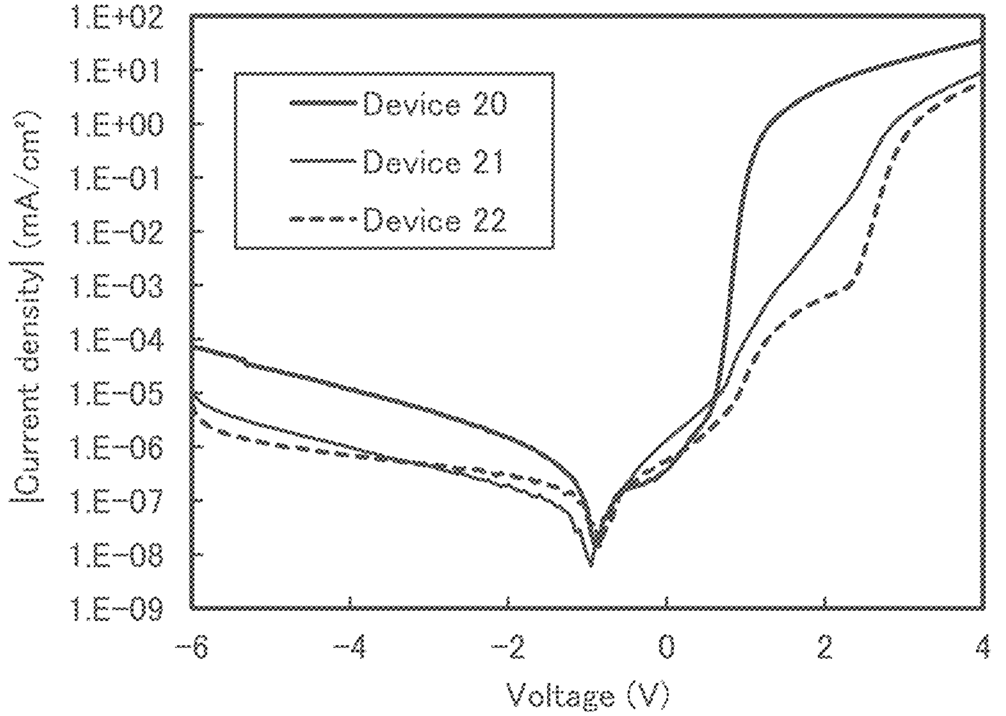
FIG. 25 shows voltage-current density characteristics of the devices 20 to 22 in a dark state.

Next, the measurement results of current density-voltage characteristics of the devices 20 to 22 fabricated by the above fabrication methods are shown in FIG. 24 and FIG. 25. The measurement was performed under each of the following conditions: in a state where irradiation with monochromatic light having a wavelength λ of 550 nm is performed at an irradiance of 12.5 $\mu W/cm^2$ (FIG. 24) and in a dark state (FIG. 25).

It is found from FIG. 24 and FIG. 25 that the characteristics of the device 22 in which PPDN and HATNA were deposited by co-evaporation is worse than the characteristics of the devices 20 and 21 in which PPDN or HATNA was used alone for the material of the structure body.

Figure 26A:
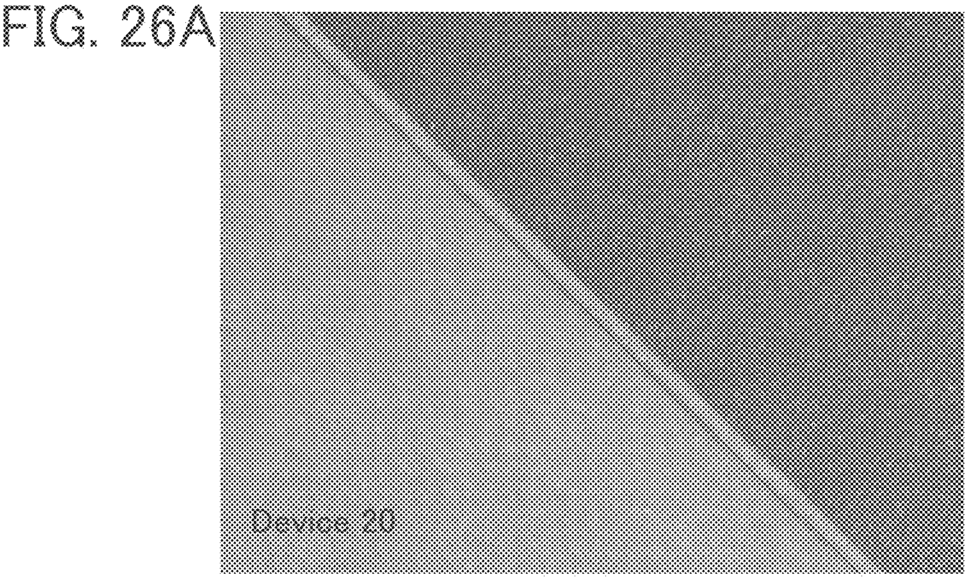
FIGS. 26A to 26C are micrographs of the devices 20 to 22.
Figure 26B:
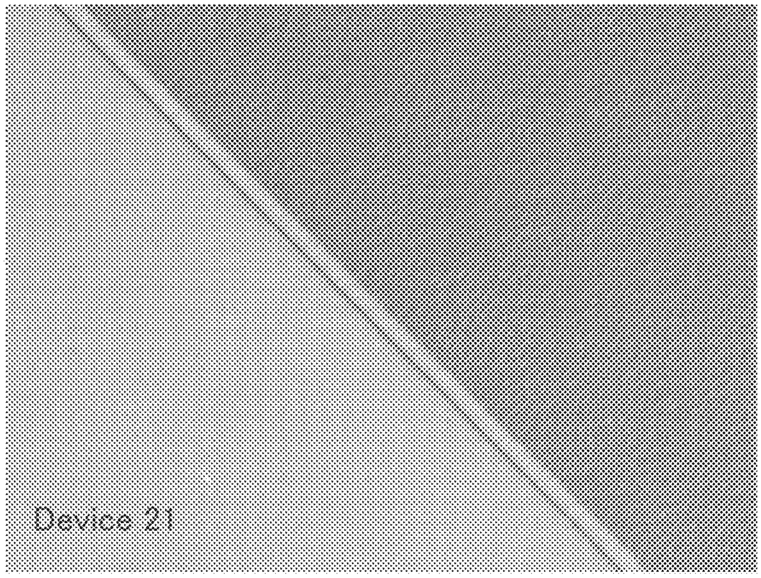
Figure 26C:
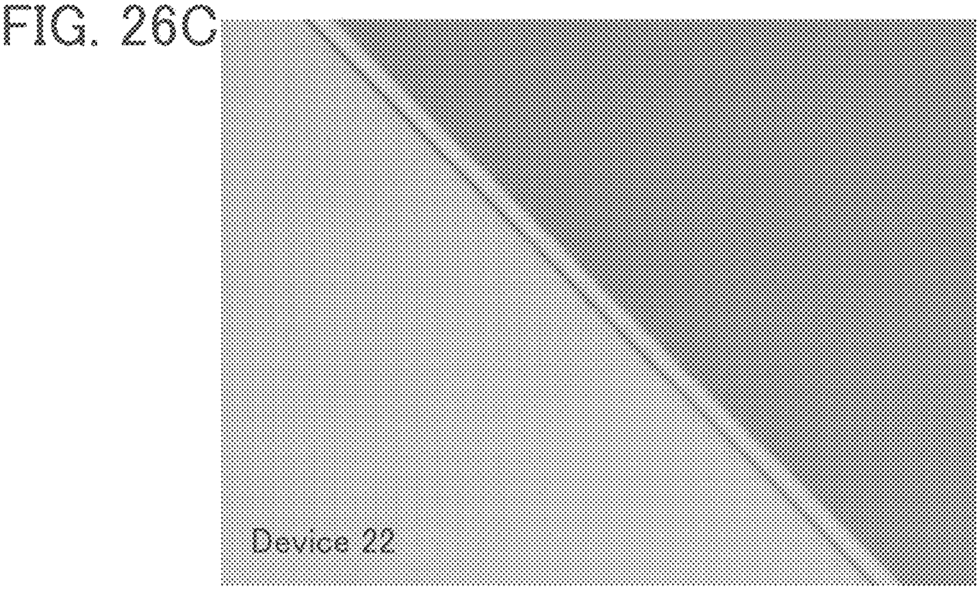

Here, micrographs of the devices 20 to 22 are shown in FIGS. 26A to 26C. In FIGS. 26A to 26C, although projections derived from the structure bodies are perceived in the devices 20 and 21, such projections are not perceived in the device 22. In the device 22, it is assumed that the mixed film of PPDN and HATNA increased the level of amorphousness, and projections were not formed.

Accordingly, it was found that in the devices 20 and 21 that are photoelectric conversion devices of one embodiment of the present invention, the formation of the structure body including projections enables lower voltage.

This application is based on Japanese Patent Application Serial No. 2022-075615 filed with Japan Patent Office on Apr. 29, 2022, the entire contents of which are hereby incorporated by reference.

What is claimed is:

1. A light-emitting and light-receiving apparatus comprising:
- a light-emitting device; and
- a photoelectric conversion device,
- wherein the light-emitting device comprises:
  - a first electrode;
  - a light-emitting layer over the first electrode;
  - a first layer over the light-emitting layer, the first layer comprising a first organic compound;
  - a second layer over the first layer, the second layer comprising a second organic compound; and
  - a second electrode over the second layer,
- wherein the photoelectric conversion device comprises:
  - a third electrode;
  - an active layer over the third electrode;
  - a structure body comprising a projection over the active layer;
  - a third layer over the active layer, the third layer comprising the first organic compound;
  - a fourth layer over the third layer, the fourth layer comprising the second organic compound; and
  - a fourth electrode over the fourth layer,
- wherein the structure body is in contact with the active layer and the fourth layer,
- wherein the structure body comprises a third organic compound,
- wherein the active layer comprises a fourth organic compound,
- wherein a lowest unoccupied molecular orbital (LUMO) level of the third organic compound is higher than a LUMO level of the fourth organic compound and lower than a LUMO level of the first organic compound, and
- wherein a difference between the LUMO level of the third organic compound and the LUMO level of the fourth organic compound is less than or equal to 0.5 eV.

2. The light-emitting and light-receiving apparatus according to claim 1, wherein the structure body has a shape satisfying one or both of a width of greater than or equal to 30 nm and lower than or equal to 5000 nm and a height of greater than or equal to 30 nm and lower than or equal to 5000 nm.

3. The light-emitting and light-receiving apparatus according to claim 1, wherein a density of the structure body is greater than or equal to $0.04/\mu m^2$ and lower than or equal to $0.4/\mu m^2$ in a region where the third electrode, the active layer, and the fourth electrode are overlapped with each other.

4. The light-emitting and light-receiving apparatus according to claim 1, wherein the LUMO level of the third organic compound is greater than or equal to −4.5 eV and less than or equal to −3.0 eV.

5. The light-emitting and light-receiving apparatus according to claim 1, wherein the first organic compound, the second organic compound, and the third organic compound have an electron-transport property.

* * * * *